United States Patent
Iwato et al.

(10) Patent No.: US 8,808,965 B2
(45) Date of Patent: Aug. 19, 2014

(54) PATTERN FORMING METHOD, PATTERN, CHEMICAL AMPLIFICATION RESIST COMPOSITION AND RESIST FILM

(75) Inventors: Kaoru Iwato, Shizuoka (JP); Shinji Tarutani, Shizuoka (JP); Yuichiro Enomoto, Shizuoka (JP); Sou Kamimura, Shizuoka (JP); Keita Kato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 24 days.

(21) Appl. No.: 13/522,147

(22) PCT Filed: Jan. 13, 2011

(86) PCT No.: PCT/JP2011/050905
§ 371 (c)(1),
(2), (4) Date: Jul. 13, 2012

(87) PCT Pub. No.: WO2011/087144
PCT Pub. Date: Jul. 21, 2011

(65) Prior Publication Data
US 2012/0288691 A1    Nov. 15, 2012

(30) Foreign Application Priority Data

Jan. 13, 2010   (JP) ................................ 2010-005341

(51) Int. Cl.
| | |
|---|---|
| G03F 7/004 | (2006.01) |
| G03F 7/40 | (2006.01) |
| G03F 7/20 | (2006.01) |
| G03F 7/32 | (2006.01) |
| G03F 7/038 | (2006.01) |

(52) U.S. Cl.
CPC ............ *G03F 7/0382* (2013.01); *G03F 7/0046* (2013.01); *G03F 7/2041* (2013.01); *G03F 7/0045* (2013.01); *G03F 7/325* (2013.01); *Y10S 430/114* (2013.01); *Y10S 430/128* (2013.01)
USPC ........ 430/270.1; 430/322; 430/331; 430/435; 430/436; 430/913; 430/927

(58) Field of Classification Search
USPC .............. 430/270.1, 913, 927, 322, 331, 435, 430/436
IPC ..................... G03F 7/00,7/004, 7/0045, 7/0046, G03F 7/382, 7/397, 7/2041, 7/325
See application file for complete search history.

(56) References Cited

U.S. PATENT DOCUMENTS

| | | | | |
|---|---|---|---|---|
| 7,291,441 B2* | 11/2007 | Sato | ............................ | 430/270.1 |
| 7,485,405 B2* | 2/2009 | Kato et al. | ................... | 430/270.1 |
| 7,541,131 B2* | 6/2009 | Kawanishi | ................. | 430/270.1 |
| 7,998,655 B2* | 8/2011 | Tsubaki | ..................... | 430/270.1 |
| 8,017,298 B2* | 9/2011 | Tsubaki | ..................... | 430/270.1 |
| 8,097,397 B2* | 1/2012 | Takayama et al. | .......... | 430/270.1 |
| 8,440,386 B2* | 5/2013 | Hatakeyama et al. | ...... | 430/270.1 |
| 2003/0113662 A1 | 6/2003 | Kato et al. | | |
| 2003/0203310 A1* | 10/2003 | Thackeray et al. | ......... | 430/270.1 |
| 2006/0079658 A1 | 4/2006 | Kato et al. | | |
| 2008/0182087 A1 | 7/2008 | Kato et al. | | |
| 2008/0187860 A1 | 8/2008 | Tsubaki et al. | | |
| 2008/0206668 A1 | 8/2008 | Hoshino et al. | | |
| 2008/0261150 A1* | 10/2008 | Tsubaki et al. | ............. | 430/270.1 |
| 2010/0330507 A1* | 12/2010 | Tsubaki et al. | ............... | 430/325 |
| 2011/0311914 A1* | 12/2011 | Kamimura et al. | ......... | 430/270.1 |
| 2012/0052449 A1* | 3/2012 | Kato et al. | ..................... | 430/325 |

FOREIGN PATENT DOCUMENTS

| | | |
|---|---|---|
| JP | 2000-206694 A | 7/2000 |
| JP | 2003-122005 A | 4/2003 |
| JP | 2006-133757 A | 5/2006 |
| JP | 2006-195050 A | 7/2006 |
| JP | 2006-259582 A | 9/2006 |
| JP | 2006-317803 A | 11/2006 |
| JP | 2008-184571 A | 8/2008 |
| JP | 2008-233877 A | 10/2008 |
| JP | 2008-292975 A | 12/2008 |
| JP | 2009-215423 A | 9/2009 |
| JP | 2009-251392 A | 10/2009 |
| JP | 2009-288344 A | 12/2009 |
| JP | 2010-237665 A | 10/2010 |

OTHER PUBLICATIONS

Office Action dated May 7, 2013 issued by the Japanese Patent Office in counterpart Japanese Patent Application No. 2010-005341.
International Search Report for PCT/JP2011/050905 dated Feb. 15, 2011 [PCT/ISA/210].
Written Opinion for PCT/JP2011/050905 dated Feb. 15, 2011 [PCT/ISA/237].
Office Action dated Apr. 1, 2014, issued by the Japanese Patent Office in counterpart Japanese Patent Application No. 2010-005341.

* cited by examiner

*Primary Examiner* — Amanda C Walke

(74) *Attorney, Agent, or Firm* — Sughrue Mion, PLLC

(57) ABSTRACT

A pattern forming method comprising (i) a step of forming a film from a chemical amplification resist composition (ii) a step of exposing the film, and (iii) a step of developing the exposed film by using an organic solvent-containing developer, wherein the chemical amplification resist composition contains (A) a resin containing a repeating unit having two or more hydroxyl groups, (B) a compound capable of generating an acid upon irradiation with an actinic ray or radiation, (C) a crosslinking agent and (D) a solvent; a pattern formed by the pattern forming method; a chemical amplification resist composition used in the pattern forming method; and a resist film formed using the chemical amplification resist composition.

27 Claims, No Drawings

PATTERN FORMING METHOD, PATTERN, CHEMICAL AMPLIFICATION RESIST COMPOSITION AND RESIST FILM

CROSS-REFERENCE TO RELATED APPLICATIONS

The entire disclosure of Japanese Patent Application No. 2010-5341 filed on Jan. 13, 2010, from which the benefit of foreign priority has been claimed in the present application, is incorporated herein by reference, as if fully set forth.

TECHNICAL FIELD

The present invention relates to a pattern forming method applicable to the process of producing a semiconductor such as IC or the production of a liquid crystal device or a circuit board such as thermal head and further to the lithography in other photo-fabrication processes, a chemical amplification resist composition used in the pattern forming method, and a resist film formed using the chemical amplification resist composition. More specifically, the present invention relates to a pattern forming method suitable for exposure by an ArF exposure apparatus, an ArF immersion-type projection exposure apparatus or an EUV exposure apparatus each using a light source that emits far ultraviolet light at a wavelength of 300 nm or less, a pattern formed by the pattern forming method, a chemical amplification resist composition used in the pattern forming method, and a resist film formed using the chemical amplification resist composition.

BACKGROUND ART

Since the advent of a resist for KrF excimer laser (248 nm), an image forming method called chemical amplification is used as an image forming method for a resist so as to compensate for sensitivity reduction caused by light absorption. For example, the image forming method by positive chemical amplification is an image forming method of decomposing an acid generator in the exposed area upon exposure with excimer laser, electron beam, extreme-ultraviolet light or the like to produce an acid, converting an alkali-insoluble group into an alkali-soluble group by using the generated acid as a reaction catalyst in the baking after exposure (PEB: Post Exposure Bake), and removing the exposed area with an alkali developer.

As for the alkali developer used in the method above, various alkali developers have been proposed, but an aqueous alkali developer of 2.38 mass % TMAH (an aqueous tetramethylammonium hydroxide solution) is being used for general purposes.

Also, due to miniaturization of a semiconductor device, the trend is moving into a shorter wavelength of the exposure light source and a higher numerical aperture (high NA) of the projection lens, and an exposure machine using an ArF excimer laser with a wavelength of 193 nm as a light source has been developed at present. Furthermore, for example, a so-called immersion method of filling a high refractive-index liquid (hereinafter sometimes referred to as an "immersion liquid") between the projection lens and the sample, and an EUV lithography of performing the exposure with ultraviolet light at a shorter wavelength (13.5 nm) have been heretofore proposed as a technique for raising the resolution.

However, it is actually very difficult to find out an appropriate combination of a resist composition, a developer, a rinsing solution and the like necessary for forming a pattern with overall good performance, and more improvements are being demanded. In particular, the resolved line width of the resist becomes finer, and this requires to improve the line edge roughness performance of line pattern and improve the in-plane uniformity of pattern dimension.

On the other hand, as well as a positive resist composition predominating at present, a negative chemical amplification resist composition for use in the pattern formation by alkali development is also being studied (see, for example, JP-A-2006-317803, JP-A-2006-259582, JP-A-2006-195050 and JP-A-2000-206694). Because, in the production of a semiconductor device or the like, patterns having various profiles such as line, trench and hole need to be formed and some patterns are difficult to form by the current positive resist.

In the pattern formation by alkali development using the conventional negative resist, it is demanded to more improve the line width variation (LWR) and other various performances, which are presumed to be ascribable mainly to swelling at the development.

A double developing process as a double patterning technology for further raising the resolution is described in JP-A-2008-292975, where by making use of a property that the polarity of a resin in a resist composition when exposed becomes a high polarity in a high light intensity region and is maintained at a low polarity in a low light intensity region, a high exposure region of a specific resist film is dissolved with a high-polarity developer and a low exposure region is dissolved with an organic solvent-containing developer, as a result, the region of medium exposure dose remains without being developed and a line-and-space pattern having a pitch half the pitch of the exposure mask is formed.

SUMMARY OF INVENTION

An object of the present invention is to solve the above-described problems and provide a pattern forming method capable of forming a pattern having high sensitivity and high resolution, suffering less line width variation (LWR) and being excellent in the exposure latitude (EL) and pattern profile, a pattern formed by the pattern forming method, a chemical amplification resist composition (chemical amplification negative resist composition), and a resist film formed using the chemical amplification resist composition.

The present invention has the following configurations, and the object above of the present invention can be attained by these configurations.

<1> A pattern forming method comprising:
 (i) a step of forming a film from a chemical amplification resist composition,
 (ii) a step of exposing the film, and
 (iii) a step of developing the exposed film by using an organic solvent-containing developer,
wherein the chemical amplification resist composition contains:
 (A) a resin containing a repeating unit having two or more hydroxyl groups,
 (B) a compound capable of generating an acid upon irradiation with an actinic ray or radiation,
 (C) a crosslinking agent, and
 (D) a solvent,
<2> The pattern forming method according to the above <1>, wherein the repeating unit having two or more hydroxyl groups is a repeating unit having two or more alcoholic hydroxyl groups.
<3> The pattern forming method according to the above <1> or <2>, wherein the resin (A) contains a repeating unit represented by the following formula (I):

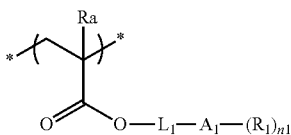

wherein Ra represents a hydrogen atom, a hydroxyl group, a halogen atom or an alkyl group which may be substituted with a hydroxyl group;

$L_1$ represents a single bond or a divalent linking group;

$A_1$ represents an (n1+1)-valent hydrocarbon group, $R_1$ represents a hydroxyl group or a hydroxyl group-containing organic group, and when a plurality of $R_1$'s are present, each $R_1$ may be the same as or different from every other $R_1$; and n1 represents an integer of 1 or more, provided that when n1 is 1, Ra represents a hydroxyl group or an alkyl group substituted with a hydroxyl group.

<4> The pattern forming method according to the above <3>, wherein in formula (I), the hydrocarbon group as $A_1$ is a linear or branched aliphatic hydrocarbon group.

<5> The pattern forming method according to the above <3>, wherein in formula (I), the hydrocarbon group as $A_1$ is a monocyclic or polycyclic alicyclic hydrocarbon group.

<6> The pattern forming method according to any one of the above <1> to <5>, wherein the resin (A) is a substantially alkali-insoluble resin.

<7> The pattern forming method according to any one of the above <1> to <6>, wherein the resin (A) contains a repeating unit having a lactone structure.

<8> The pattern forming method according to any one of the above <1> to <7>, wherein the resin (A) contains a repeating unit having an acid-decomposable group.

<9> The pattern forming method according to any one of the above <1> to <8>, wherein the crosslinking agent (C) contains at least one of a melamine-based crosslinking agent, a urea-based crosslinking agent, an alkylene urea-based crosslinking agent and a glycoluril-based crosslinking agent.

<10> The pattern forming method according to any one of the above <1> to <9>, wherein the developer contains at least one kind of an organic solvent selected from a ketone-based solvent, an ester-based solvent, an alcohol-based solvent, an amide-based solvent and an ether-based solvent.

<11> The pattern forming method according to any one of the above <1> to <10>, which further comprises:

(iv) a step of rinsing the film with a rinsing solution.

<12> The pattern forming method according to the above <11>, wherein the rinsing solution is at least one kind of an organic solvent selected from a hydrocarbon-based solvent, a ketone-based solvent, an ester-based solvent, an alcohol-based solvent, an amide-based solvent and an ether-based solvent.

<13> The pattern forming method according to any one of the above <1> to <12>, wherein out of repeating units in the resin (A), the repeating unit having an acid group accounts for 5 mol % or less.

<14> The pattern forming method according to any one of the above <1> to <13>, wherein exposure in the step (ii) is immersion exposure.

<15> A pattern formed by the pattern forming method claimed in any one of claims 1 to 14.

<16> A chemical amplification resist composition used for the pattern forming method claimed in any one of the above <1> to <14>.

<17> A chemical amplification resist composition comprising:

(A) a substantially alkali-insoluble resin containing a repeating unit having two or more hydroxyl groups, (B) a compound capable of generating an acid upon irradiation with an actinic ray or radiation, (C) a crosslinking agent, and (D) a solvent.

<18> The chemical amplification resist composition according to the above <17>, wherein the repeating unit having two or more hydroxyl groups is a unit having two or more alcoholic hydroxyl groups.

<19> The chemical amplification resist composition according to the above <17> or <18>, wherein the resin (A) contains a repeating unit represented by the following formula (I):

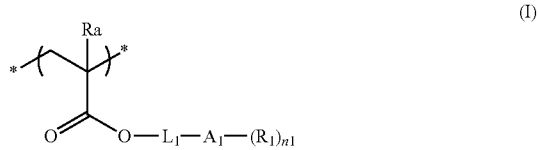

wherein Ra represents a hydrogen atom, a hydroxyl group, a halogen atom or an alkyl group which may be substituted with a hydroxyl group;

$L_1$ represents a single bond or a divalent linking group;

$A_1$ represents an (n1+1)-valent hydrocarbon group, $R_1$ represents a hydroxyl group or a hydroxyl group-containing organic group, and when a plurality of $R_1$'s are present, each $R_1$ may be the same as or different from every other $R_1$; and n1 represents an integer of 1 or more, provided that when n1 is 1, Ra represents a hydroxyl group or an alkyl group substituted with a hydroxyl group.

<20> The chemical amplification resist composition according to the above <19>, wherein in formula (I), the hydrocarbon group as $A_1$ is a linear or branched aliphatic hydrocarbon group.

<21> The chemical amplification resist composition according to the above <19>, wherein in formula (I), the hydrocarbon group as $A_1$ is a monocyclic or polycyclic alicyclic hydrocarbon group.

<22> The chemical amplification resist composition according to any one of the above <17> to <21>, wherein the resin (A) contains a repeating unit having a lactone structure.

<23> The chemical amplification resist composition according to any one of the above <17> to <22>, wherein the resin (A) contains a repeating unit having an acid-decomposable group.

<24> The chemical amplification resist composition according to any one of the above <17> to <23>, wherein the crosslinking agent (C) contains at least one of a melamine-based crosslinking agent, a urea-based crosslinking agent, an alkylene urea-based crosslinking agent and a glycoluril-based crosslinking agent.

<25> The chemical amplification resist composition according to any one of the above <17> to <24>, wherein out of repeating units in the resin (A), the repeating unit having an acid group accounts for 5 mol % or less.

<26> A resist film formed of the chemical amplification resist composition according to any one of the above <16> to <25>.

According to the present invention, a pattern forming method capable of forming a pattern having high sensitivity and high resolution, suffering less line width variation (LWR) and being excellent in the exposure latitude (EL) and pattern profile, a pattern formed by the pattern forming method, a chemical amplification resist composition (chemical amplification negative resist composition), and a resist film formed using the chemical amplification resist composition, can be provided.

DESCRIPTION OF EMBODIMENTS

The best mode for carrying out the present invention is described below.

In the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. In the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The chemical amplification resist composition for use in the pattern forming method of the present invention contains (A) a resin containing a repeating unit having two or more hydroxyl groups, (B) a compound capable of generating an acid upon irradiation with an actinic ray or radiation, (C) a crosslinking agent and (D) a solvent.

Also, the chemical amplification resist composition of the present invention contains (A) a substantially alkali-insoluble resin containing a repeating unit having two or more hydroxyl groups, (B) a compound capable of generating an acid upon irradiation with an actinic ray or radiation, (C) a crosslinking agent and (D) a solvent.

[1] Resin (A)

In the chemical amplification resist composition (chemical amplification negative resist composition) used in the pattern forming method of the present invention, the resin (A) containing a repeating unit having two or more hydroxyl groups is preferably substantially alkali-insoluble. The term "substantially alkali-insoluble" as used herein means that when a composition prepared by dissolving only the resin (A) in a solvent such as butyl acetate to have a solid content concentration of 4 mass % is coated on a silicon wafer to form a coating film (thickness: 100 nm) and the coating film is dipped in an aqueous 2.38 mass % tetramethylammonium hydroxide (TMAH) solution at room temperature (25° C.) for 1,000 seconds, the average dissolution rate (the rate of decrease in the film thickness) measured using a QCM (quartz crystal oscillator microbalance) sensor or the like is 1 nm/s or less, preferably 0.1 nm/s or less. Thanks to this resin, the resist film in the unexposed area exhibits good solubility in an organic solvent-containing developer.

Within a range keeping the resin substantially alkali-insoluble, the resin (A) may or may not contain a repeating unit having an acid group but preferably does not contain the repeating unit.

Examples of the acid group include a carboxyl group, a sulfonamide group, a sulfonylimide group, a bisulfonylimide group, and an aliphatic alcohol substituted with an electron-withdrawing group at the α-position (e.g., hexafluoroisopropanol, $—C(CF_3)_2OH$). The content of the repeating unit having an acid group in the resin (A) is preferably 10 mol % or less, more preferably 5 mol % or less. In the case where the resin (A) contains a repeating unit having an acid group, the content of the repeating unit having an acid group in the resin (A) is usually 1 mol % or more.

The electron-withdrawing group as used herein indicates a substituent having a propensity to attract an electron, for example, a substituent having a propensity to draw an electron from an atom located in proximity to the group in a molecule.

Specific examples of the electron-withdrawing group are the same as those in $Z_{ka1}$ of formula (KA-1) described later.

The resin need not have solubility by itself in an organic solvent-containing developer as long as a film formed using the resist composition dissolves in an organic solvent-containing developer. For example, depending on the property or content of other components contained in the resist composition, the resin may suffice if a film formed using the resist composition dissolves in an organic solvent-containing developer.

The resin (A) is generally synthesized by the polymerization, for example, radical polymerization, of a monomer having a partial structure to be polymerized and contains a repeating unit derived from the monomer having a partial structure to be polymerized. Examples of the partial structure to be polymerized include an ethylenically polymerizable partial structure.

(a1) Repeating Unit Having Two or More Hydroxyl Groups

The resin (A) for use in the present invention preferably contains (a1) a repeating unit having two or more hydroxyl groups.

By virtue of containing a repeating unit having two or more hydroxyl groups in the resin (A), a negative conversion reaction (a crosslinking reaction between a hydroxyl group of the resin (A) and a crosslinking agent) efficiently proceeds in the exposed area, whereby excessive diffusion of the acid generated from the compound (B) (for example, unintended diffusion of the acid into the unexposed area) is presumed to be suppressed. As a result, although the detailed operation mechanism is unclear, it is considered that small LWR, high sensitivity and resolution, and excellent exposure latitude (EL) and pattern profile are achieved in the organic solvent development.

The repeating unit having two or more hydroxyl groups preferably has from two to eight, more preferably from two to six, still more preferably from three to five, hydroxyl groups. In particular, when the repeating unit (a1) has three or more hydroxyl groups, the sensitivity can be more enhanced.

By setting the number of hydroxyl groups to 8 or less, solubility of the resin (A) for an organic solvent-containing developer can be unfailingly imparted, so that a good pattern can be more reliably formed without causing an unintended development failure.

When the resin (A) contains such a repeating unit, a hydroxyl group reacts with a crosslinking agent by the action of an acid, and not only the resist film becomes substantially insoluble for an organic solvent-containing developer but also enhancement of the adherence to substrate can be expected.

The repeating unit (a1) having two or more hydroxyl groups includes a repeating unit represented by formula (I):

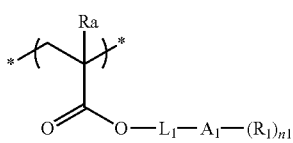

(I)

In formula (I), Ra represents a hydrogen atom, a hydroxyl group, a halogen atom or an alkyl group which may be substituted with a hydroxyl group.

$L_1$ represents a single bond or a divalent linking group.

$A_1$ represents an (n1+1)-valent hydrocarbon group.

$R_1$ represents a hydroxyl group or a hydroxyl group-containing organic group, and when a plurality of $R_1$'s are present, each $R_1$ may be the same as or different from every other $R_1$.

n1 represents an integer of 1 or more.

However, when n1 is 1, Ra represents a hydroxyl group or an alkyl group which may be substituted with a hydroxyl group, and is preferably an alkyl group which may be substituted with a hydroxyl group.

The halogen atom of Ra includes a fluorine atom, a chlorine atom, a bromine atom and an iodine atom.

The carbon number of the alkyl group which may be substituted with a hydroxyl group, of Ra is preferably from 1 to 4.

Ra is preferably a hydrogen atom, a methyl group, a hydroxymethyl group, a hydroxyl group or a trifluoromethyl group, more preferably a hydrogen atom or a methyl group.

The divalent linking group of $L_1$ includes —COO—, —OCO—, —CO—, —O—, —S—, —SO—, —SO$_2$—, an alkylene group, a cycloalkylene group, an alkenylene group, and a linking group formed by connecting a plurality of these members, and a linking group having a total carbon number of 12 or less is preferred.

The (n1+1)-valent hydrocarbon group of $A_1$ is preferably a linear or branched aliphatic hydrocarbon group or a monocyclic or polycyclic alicyclic hydrocarbon group. Here, the ring of the monocyclic or polycyclic alicyclic hydrocarbon group may contain, as an atom constituting the ring, a heteroatom such as oxygen.

The linear or branched aliphatic hydrocarbon group includes, for example, an alkyl group having a carbon number of 1 to 12, and an alkyl group having a carbon number of 2 to 6 is preferred.

The monocyclic alicyclic hydrocarbon group includes, for example, a group derived from a cycloalkyl group having a carbon number of 3 to 12, and a group derived from a cycloalkenyl group having a carbon number of 3 to 12, and a monocyclic hydrocarbon group having a carbon number of 3 to 7 is preferred.

Preferred examples of the (n1+1)-valent monocyclic alicyclic hydrocarbon group include groups derived from a cyclobutyl group, a cyclopentyl group, a cyclohexyl group, a cycloheptyl group, a cyclooctyl group or a 2-tetrahydropyranyl group.

The polycyclic alicyclic hydrocarbon group includes a ring assembly hydrocarbon group (e.g., bicyclohexyl) and a crosslinked cyclic hydrocarbon group. The crosslinked cyclic hydrocarbon group includes a bicyclic hydrocarbon group, a tricyclic hydrocarbon group, a tetracyclic hydrocarbon group and the like. The crosslinked cyclic hydrocarbon group also includes a condensed cyclic hydrocarbon group (for example, a group formed by fusing a plurality of 5- to 8-membered cycloalkane rings).

Preferred examples of the (n1+1)-valent polycyclic alicyclic hydrocarbon group include groups derived from a norbornyl group, an isobornyl group, a tricyclodecanyl group, a tetracyclododecanyl group, a hexacycloheptadecanyl group, an adamantyl group, a diamantyl group, a spirodecanyl group or a spiroundecanyl group. Among these, groups derived from an adamantyl group, a diamantyl group or a norbornyl group are more preferred.

The (n1+1)-valent hydrocarbon group of $A_1$ may be a linear or branched aliphatic hydrocarbon group or a monocyclic or polycyclic alicyclic hydrocarbon group but in view of dry etching resistance, is preferably a monocyclic or polycyclic alicyclic hydrocarbon group, more preferably a polycyclic alicyclic hydrocarbon group.

n1 is preferably an integer of 1 to 5, more preferably an integer of 1 to 3.

The hydroxyl group-containing organic group of $R_1$ is not particularly limited but includes a group represented by -$L_1$'-OH. Here, $L_1$' represents a divalent linking group, and specific examples thereof are the same as those described above for $L_1$. A hydroxyl group-containing alkoxy group (for example, a 2-hydroxyethoxy group) and a hydroxyl group-containing alkyl fluoride group (for example, a group represented by —CH$_2$C(CF$_3$)$_2$OH) are also preferred as the hydroxyl group-containing organic group.

In the repeating unit represented by formula (I), the alkyl group which may be substituted with a hydroxyl group as Ra, the divalent linking groups as $L_1$ and $L_1$', the (n1+1)-valent hydrocarbon group as $A_1$, and the hydroxyl group-containing organic group as $R_1$ each may further have a substituent other than a hydroxyl group, and examples of the substituent include a halogen atom and an alkyl group. The halogen atom is preferably a bromine atom, a chlorine atom or a fluorine atom, and the alkyl group is preferably a methyl group, an ethyl group, a butyl group or a tert-butyl group. This alkyl group may further have a substituent, and the substituent which the alkyl group may further have includes a halogen atom and an alkyl group.

The repeating unit (a1) having two or more hydroxyl groups is preferably a repeating unit having two or more alcoholic hydroxyl groups.

That is, each of two or more hydroxyl groups in the repeating unit (a1) preferably forms a structure having an alcoholic hydroxyl group.

The alcoholic hydroxyl group as used in the present invention is a hydroxyl group bonded to a hydrocarbon group and is not particularly limited as long as it is a hydroxyl group except for a hydroxyl group (phenolic hydroxyl group) bonded directly on an aromatic ring, but in the present invention, a hydroxyl group except for a hydroxyl group in an aliphatic alcohol substituted with an electron-withdrawing group at the α-position, described above as the acid group, is preferred. Because reaction efficiency with the crosslinking agent (C) is enhanced, the hydroxyl group is preferably a primary alcoholic hydroxyl group (a group where the carbon atom on which a hydroxyl group is substituted has two hydrogen atoms separately from the hydroxyl group) or a secondary alcoholic hydroxyl group where another electron-withdrawing group is not bonded to the carbon atom on which a hydroxyl group is substituted. The hydroxyl group is more preferably a primary alcoholic hydroxyl group, and in this case, the pattern obtained can have a better profile.

Examples of the alcoholic hydroxyl group-containing structure include a hydroxyalkyl group (preferably having a carbon number of 2 to 8, more preferably a carbon number of 2 to 4), a hydroxycycloalkyl group (preferably having a carbon number of 4 to 14), a hydroxyalkyl group-substituted cycloalkyl group (preferably having a total carbon number of 5 to 20), a hydroxyalkoxy group-substituted alkyl group (preferably having a total carbon number of 3 to 15), and a hydroxyalkoxy group-substituted cycloalkyl group (preferably having a total carbon number of 5 to 20). As described above, a residue structure of primary alcohol is preferred, and a structure represented by —$(CH_2)_n$—OH (n is an integer of 1 or more, more preferably an integer of 2 to 4) is more preferred.

The repeating unit (a1) is preferably a repeating unit derived from an ester of an acrylic acid in which the α-position (for example, Ra in formula (I)) of the main chain may be substituted, and is more preferably derived from a monomer having a structure corresponding to formula (I).

Examples of the repeating unit (a1) are illustrated below, but the present invention is not limited thereto.

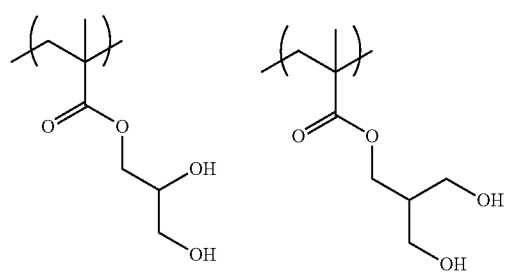

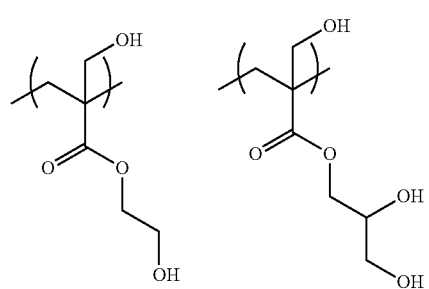

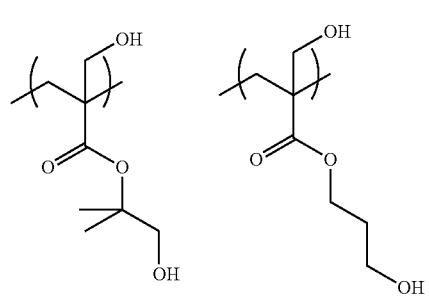

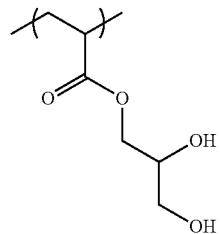

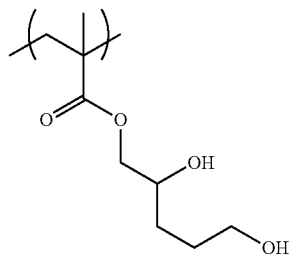

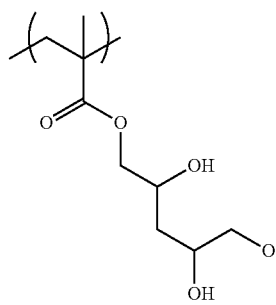

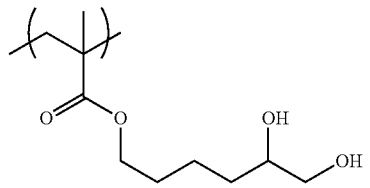

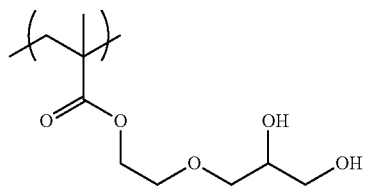

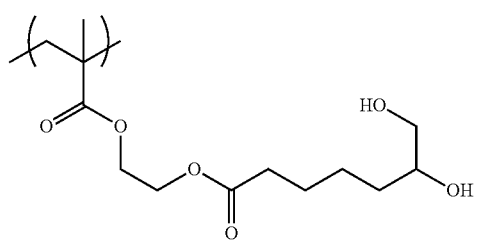

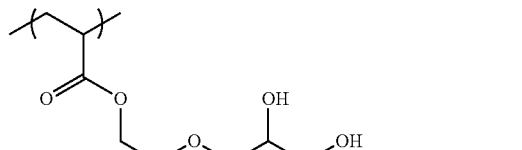

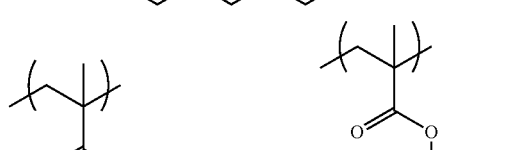

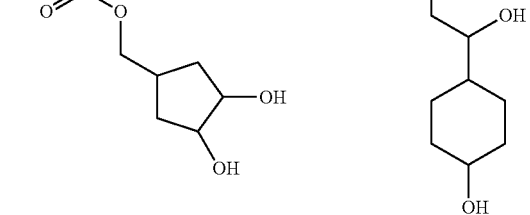

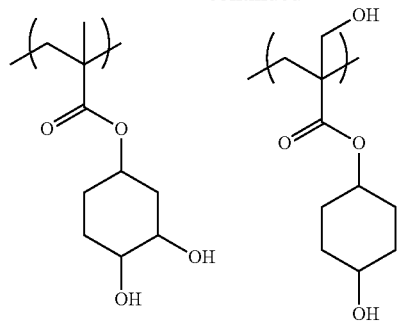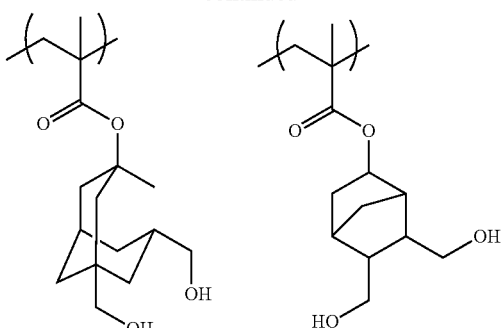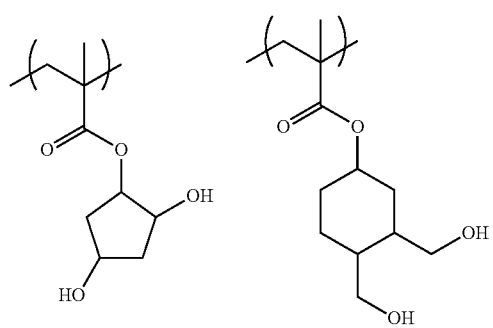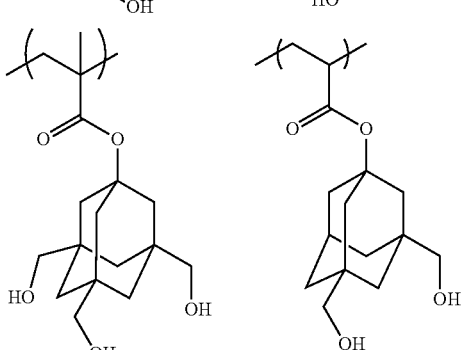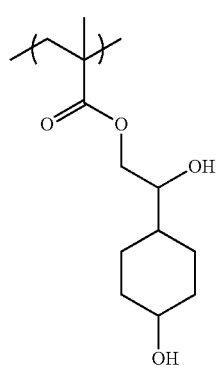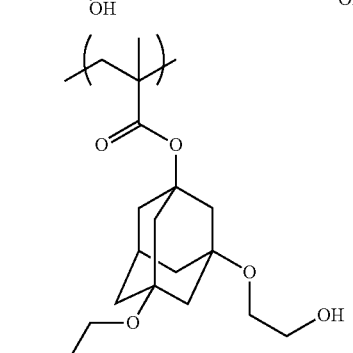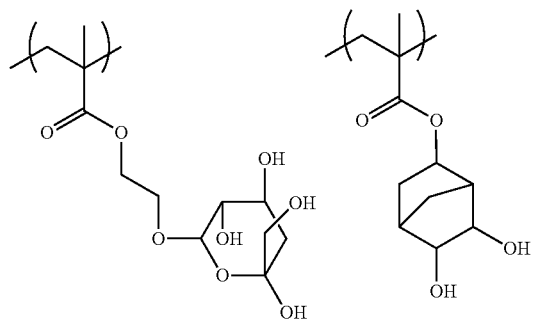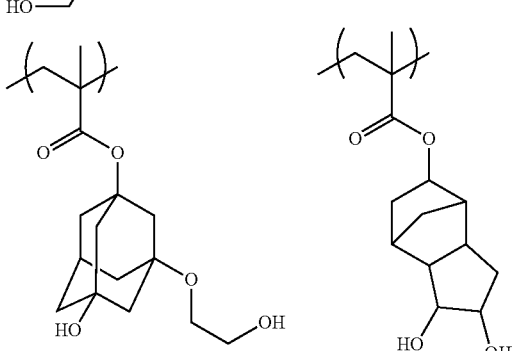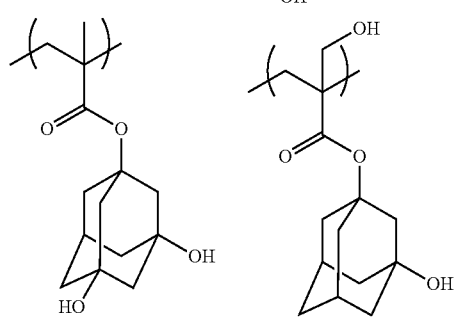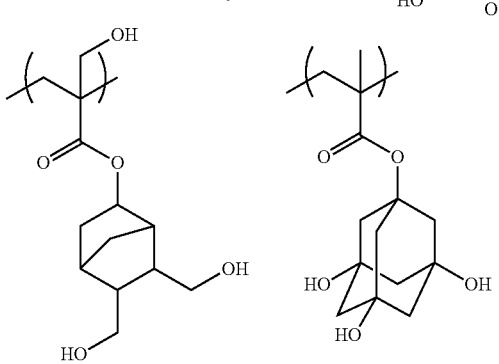

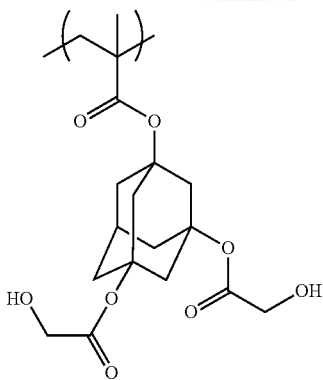

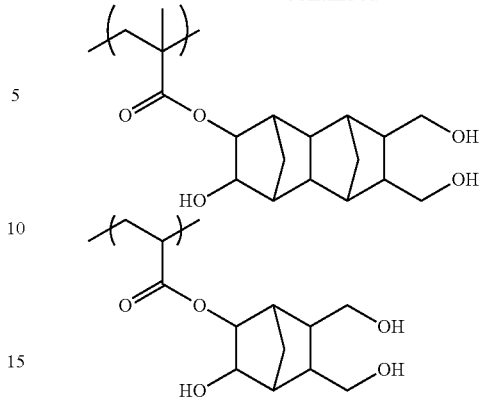

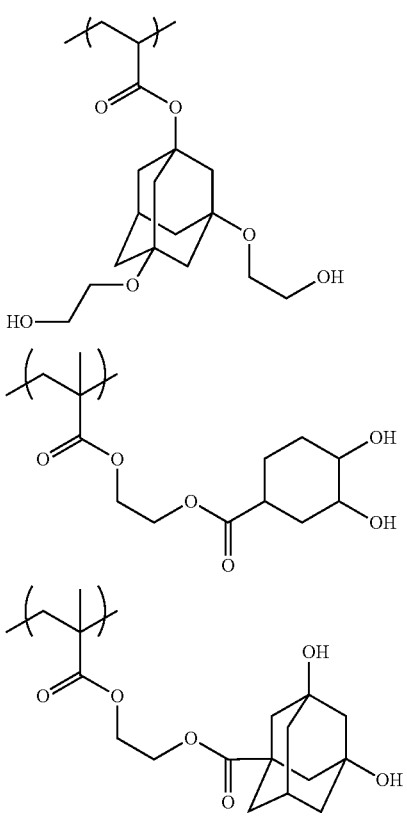

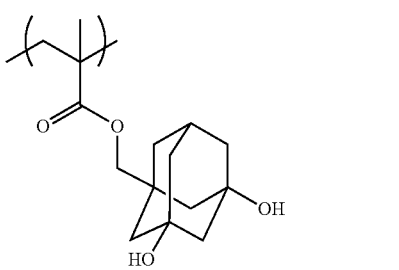

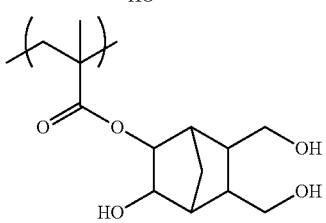

The repeating unit (a1) may have a structure where at least one of the later-described repeating units (a2) to (a4) has two hydroxyl groups. For example, in the (a4) repeating unit having an acid-decomposable group, the moiety capable of leaving by the action of an acid may have two hydroxyl groups. It is presumed that the crosslinking efficiency can be optimized by containing such a repeating unit. Specific examples of this structure include a structure where in formula (AI) described later, the moiety of atomic group —C(Rx$_1$)(Rx$_2$)(Rx$_3$) has two hydroxyl groups, more specifically, a structure where in the repeating unit represented by formula (2-1) described later, a plurality of R$_{10}$'s are present and at least two R$_{10}$'s are a hydroxyl group, a hydroxyl group-containing linear or branched alkyl group, or a hydroxyl group-containing cycloalkyl group.

(a2) Repeating Unit Having Nonpolar Group

The resin (A) preferably further contains (a2) a repeating unit having a nonpolar group. Thanks to this repeating unit, not only dissolving out of low molecular components from the resist film into the immersion liquid at the immersion exposure can be reduced but also the solubility of the resin at the development using an organic solvent-containing developer can be appropriately adjusted. The (a2) repeating unit having a nonpolar group is preferably a repeating unit not containing a polar group (for example, the above-described acid group, a hydroxyl group or a cyano group) in the repeating unit and is preferably a repeating unit free from the later-described acid-decomposable group and lactone structure. Such a repeating unit includes a repeating unit represented by formula (4) or (5).

(4)

(5)

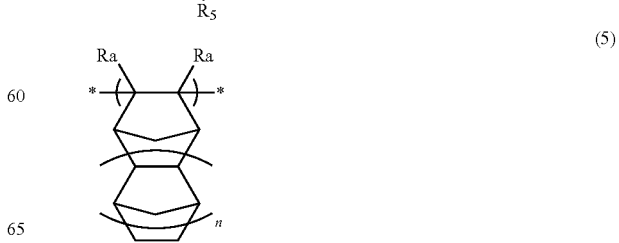

In the formulae, $R_5$ represents a hydrocarbon group having neither a hydroxyl group nor a cyano group.

Ra represents, when a plurality of Ra's are present, each independently represents, a hydrogen atom, a hydroxyl group, a halogen atom or an alkyl group (preferably having a carbon number of 1 to 4). The alkyl group of Ra may have a substituent. The substituent includes a hydroxyl group and a halogen atom. The halogen atom of Ra includes a fluorine atom, a chlorine atom, a bromine atom and an iodine atom. Ra is preferably a hydrogen atom, a methyl group, a trifluoromethyl group or a hydroxymethyl group, more preferably a hydrogen atom or a methyl group.

n represents an integer of 0 to 2.

$R_5$ preferably contains at least one cyclic structure.

The hydrocarbon group in $R_5$ includes, for example, a chain or branched hydrocarbon group, a monocyclic hydrocarbon group and a polycyclic hydrocarbon group. In view of dry etching resistance, $R_5$ preferably contains a monocyclic hydrocarbon group or a polycyclic hydrocarbon group, more preferably a polycyclic hydrocarbon group.

$R_5$ is preferably a group represented by $-L_4-A_4-(R_4)_{n4}$. $L_4$ represents a single bond or a divalent hydrocarbon group, preferably a single bond, an alkylene group (preferably having a carbon number of 1 to 3) or a cycloalkylene group (preferably having a carbon number of 5 to 7). $A_4$ represents a (n4+1)-valent hydrocarbon group, preferably a monocyclic or polycyclic alicyclic hydrocarbon group. n4 represents an integer of 0 to 5 and is preferably an integer of 0 to 3. $R_4$ represents a hydrocarbon group, preferably an alky group (preferably having a carbon number of 1 to 3) or a cycloalkyl group (preferably having a carbon number of 5 to 7).

The chain or branched hydrocarbon group includes, for example, an alkyl group having a carbon number of 3 to 12, and the monocyclic hydrocarbon group includes, for example, a cycloalkyl group having a carbon number of 3 to 12 and a cycloalkenyl group having a carbon number of 3 to 12. The monocyclic hydrocarbon group is preferably a monocyclic hydrocarbon group having a carbon number of 3 to 7.

The polycyclic hydrocarbon group includes a ring assembly hydrocarbon group (e.g., bicyclohexyl) and a crosslinked cyclic hydrocarbon group. The crosslinked cyclic hydrocarbon group include a bicyclic hydrocarbon group, a tricyclic hydrocarbon group, a tetracyclic hydrocarbon group and the like. The crosslinked cyclic hydrocarbon group also includes a condensed cyclic hydrocarbon group (for example, a group formed by fusing a plurality of 5- to 8-membered cycloalkane rings). The crosslinked cyclic hydrocarbon ring is preferably a norbornyl group or an adamantyl group.

These groups may have a substituent, and preferred examples of the substituent include a halogen atom and an alkyl group. The halogen atom is preferably a bromine atom, a chlorine atom or a fluorine atom, and the alkyl group is preferably a methyl group, an ethyl group, a butyl group or a tert-butyl group. This alkyl group may further have a substituent, and the substituent which the alkyl group may further have includes a halogen atom and an alkyl group.

Specific examples of the repeating unit having a nonpolar group are illustrated below, but the present invention is not limited thereto. In the formulae, Ra represents a hydrogen atom, a hydroxyl group, a halogen atom, or an alkyl group having a carbon number of 1 to 4 which may have a substituent. Preferred substituents which the alkyl group of Ra may have include a hydroxyl group and a halogen atom. The halogen atom of Ra includes a fluorine atom, a chlorine atom, a bromine atom and an iodine atom. Ra is preferably a hydrogen atom, a methyl group, a hydroxymethyl group or a trifluoromethyl group, more preferably a hydrogen atom or a methyl group.

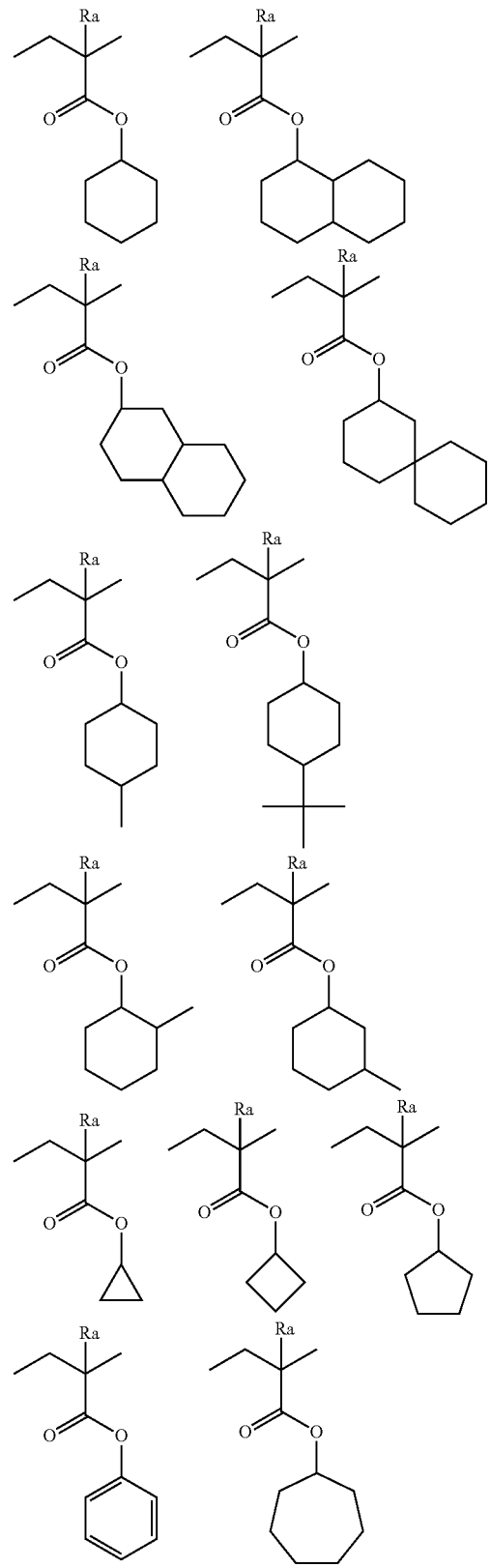

-continued

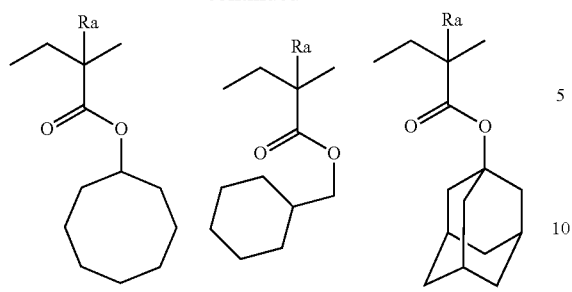

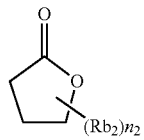
LC1-1

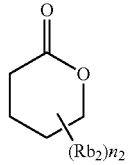
LC1-2

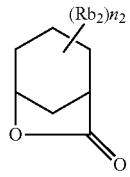
LC1-3

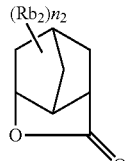
LC1-4

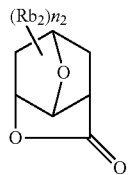
LC1-5

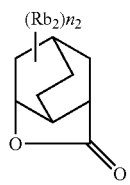
LC1-6

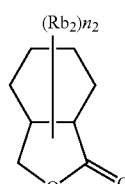
LC1-7

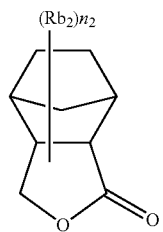
LC1-8

(a3) Repeating Unit Having Lactone Structure

The resin (A) may contain a repeating unit having a lactone structure.

The lactone structure may be any lactone structure but is preferably a 5- to 7-membered lactone structure, and a 5- to 7-membered lactone structure to which another ring structure is fused to form a bicyclo structure or a spiro structure is preferred. It is more preferred to contain a repeating unit having a lactone structure represented by any of the following formulae (LC1-1) to (LC1-17). The lactone structure may be bonded directly to the main chain. Among these lactone structures, preferred are (LC1-1), (LC1-4), (LC1-5), (LC1-6), (LC1-13), (LC1-14) and (LC1-17). By using a specific lactone structure, LWR and development defect are improved.

-continued

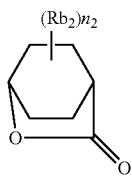

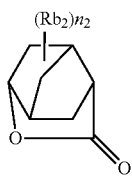

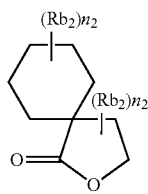

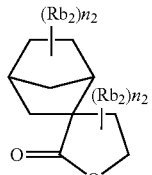

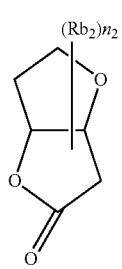

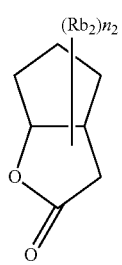

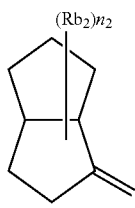

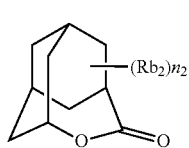

-continued

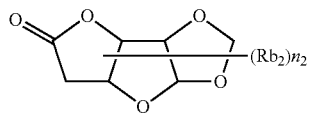

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other $Rb_2$, and also, the plurality of substituents ($Rb_2$) may combine with each other to form a ring.

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

As for the repeating unit having a lactone structure, a repeating unit represented by the following formula (AII') is preferred.

In formula (AII'), $Rb_0$ represents a hydrogen atom, a halogen atom or an alkyl group (preferably having a carbon number of 1 to 4). Preferred substituents which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

V represents a group having a structure indicated by any one of formulae (LC1-1) to (LC1-17).

Specific examples of the repeating unit having a lactone structure are illustrated below, but the present invention is not limited thereto.

(In the formulae, Rx represents H, $CH_3$, $CH_2OH$ or $CF_3$.)

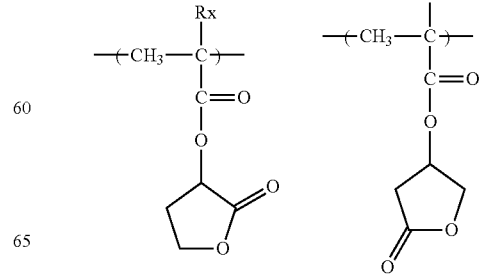

-continued
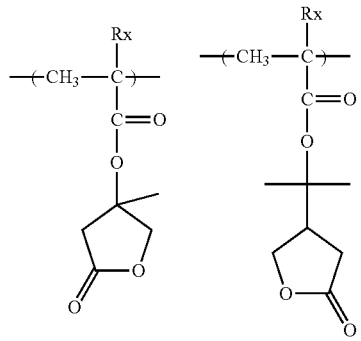
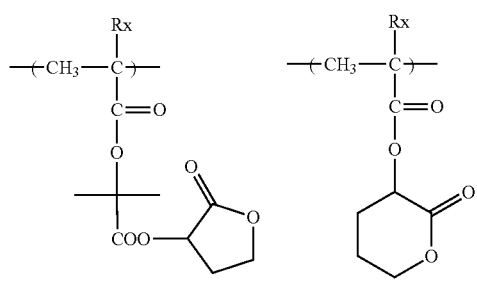
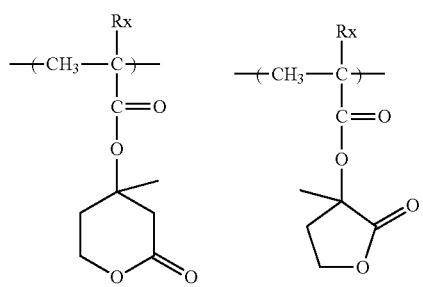
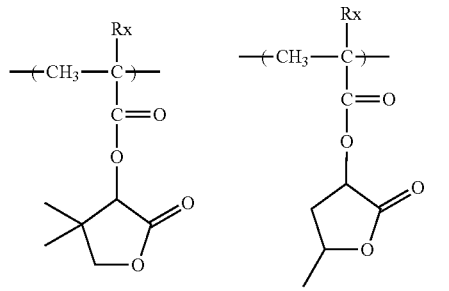
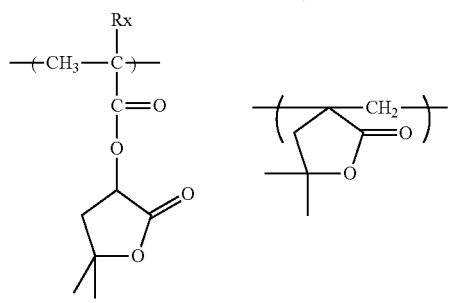
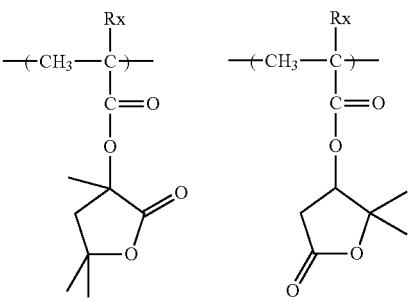
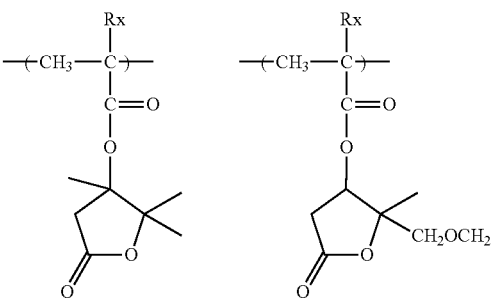
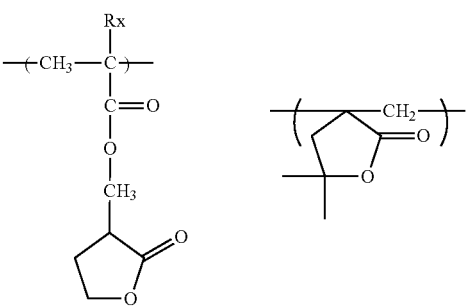
(In the formulae, Rx represents H, $CH_3$, $CH_2OH$ or $CF_3$.)
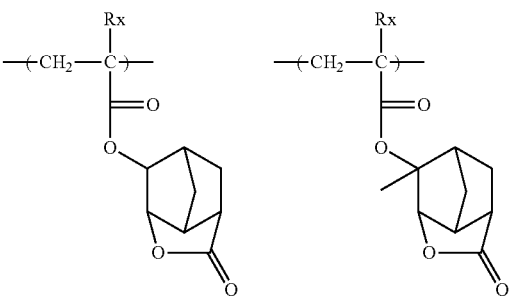
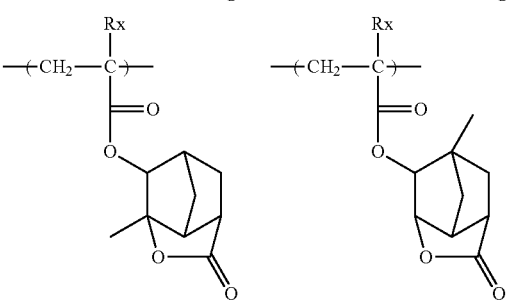

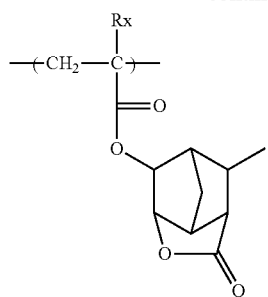
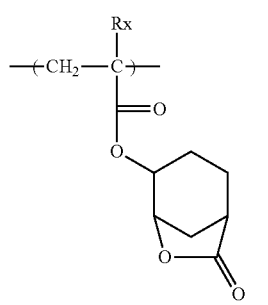
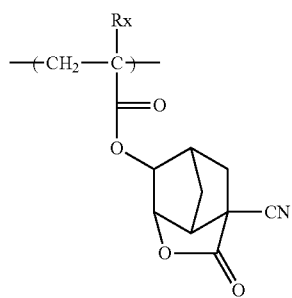
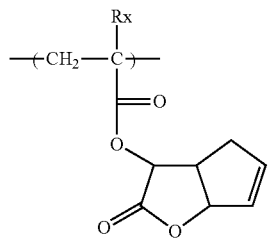
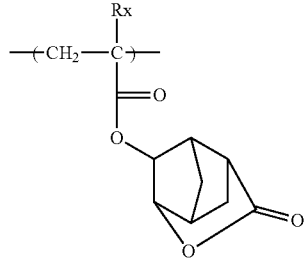
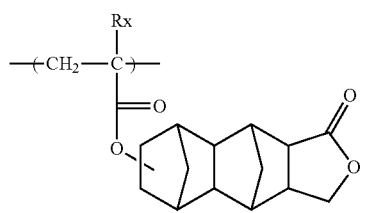
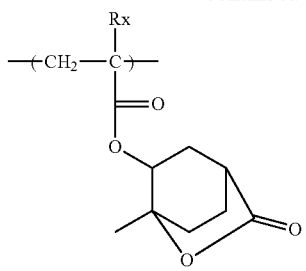
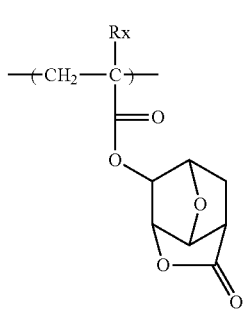
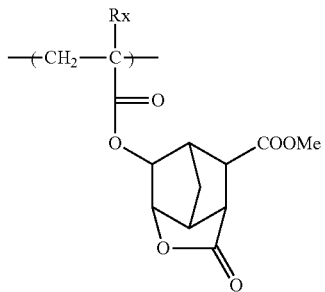
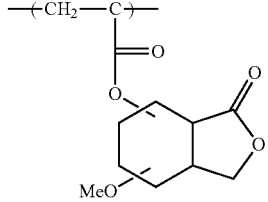
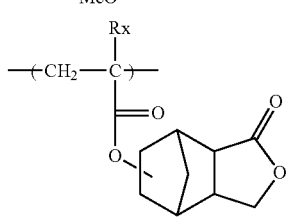
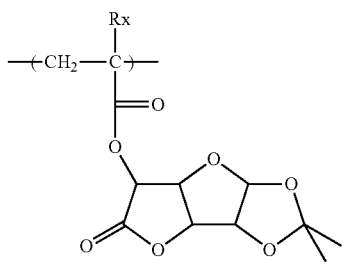

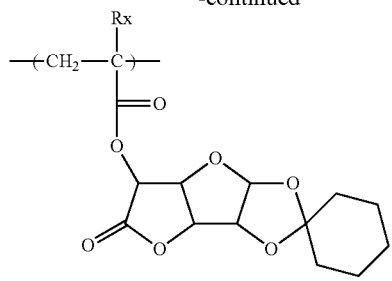
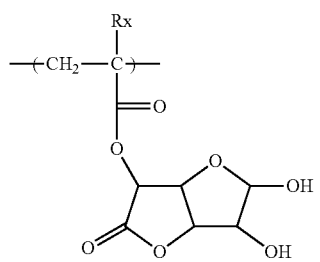
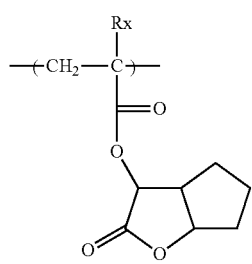
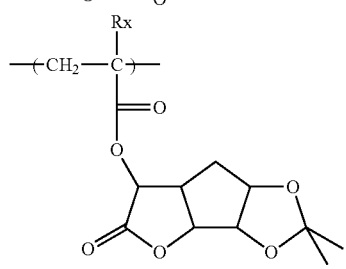
(In the formulae, Rx represents H, CH₃, CH₂OH or CF₃.)
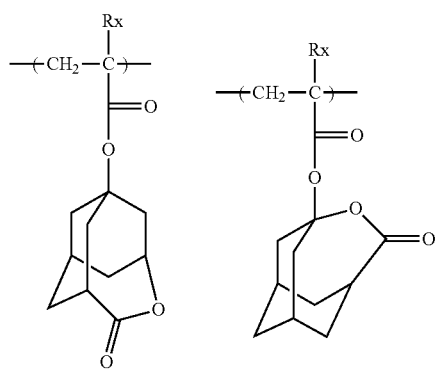
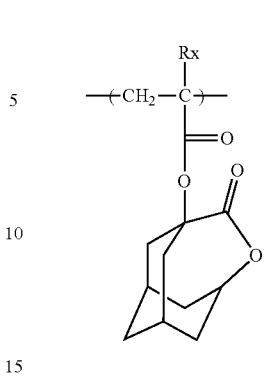
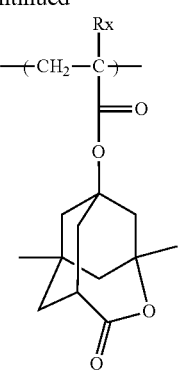
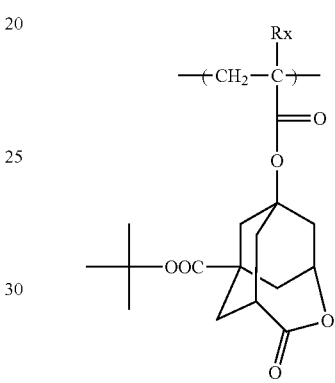
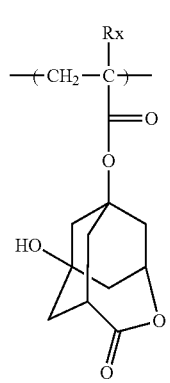
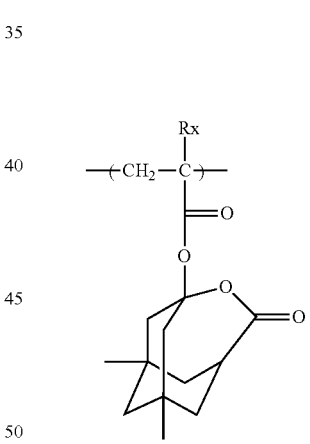
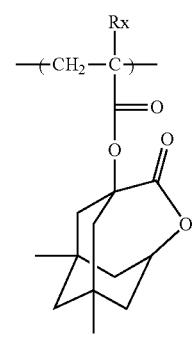
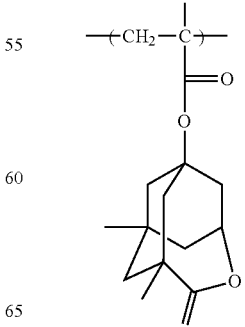
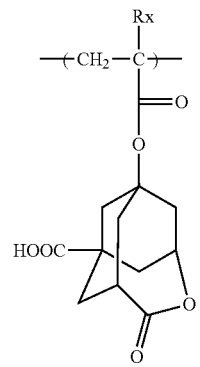

-continued

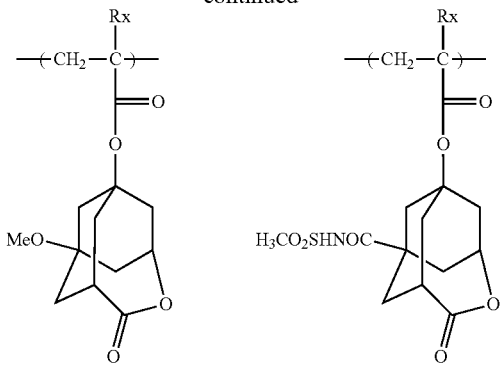
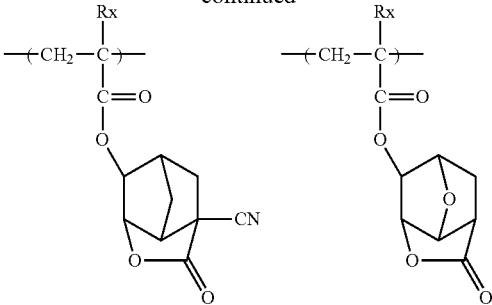

Particularly preferred repeating units having a lactone structure include the following repeating units. By selecting an optimal lactone structure, the pattern profile and the iso/dense bias are improved.

(In formulae, Rx represents H, CH$_3$, CH$_2$OH or CF$_3$.)

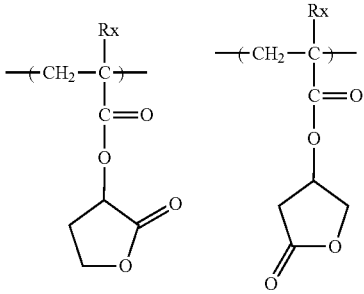
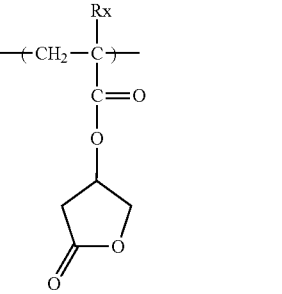
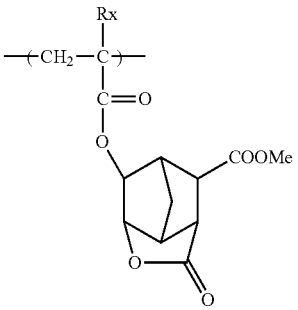
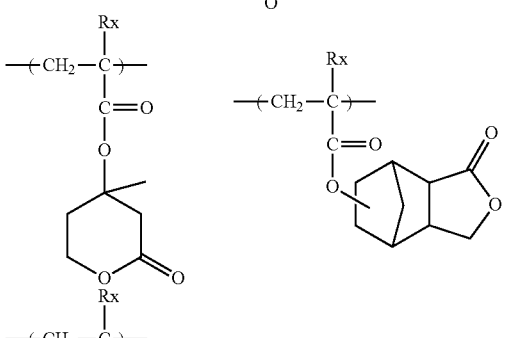
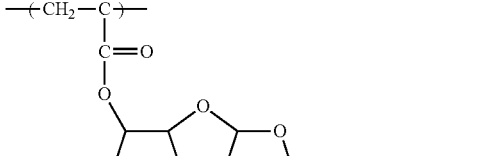

A repeating unit represented by the following formula (III) is preferably contained as a lactone structure-containing repeating unit.

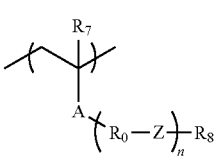

(III)

In formula (III), A represents an ester bond (a group represented by —COO—) or an amide bond (a group represented by —CONH—).

R$_0$ represents, when a plurality of R$_0$'s are present, each independently represents, an alkylene group, a cycloalkylene group or a combination thereof.

Z represents, when a plurality of Z's are present, each independently represents, an ether bond, an ester bond, an amide bond, a urethane bond (a group represented by

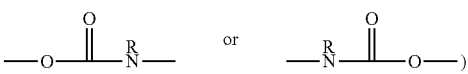
)

or a urea bond
(a group represented by

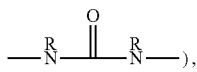

wherein R represents a hydrogen atom, an alkyl group, a cycloalkyl group or an aryl group.

$R_8$ represents a monovalent organic group having a lactone structure.

n is a repetition number of the structure represented by —$R_0$—Z— and represents an integer of 1 to 5, preferably 1.

$R_7$ represents a hydrogen atom, a halogen atom or an alkyl group.

The alkylene group and cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group.

The alkyl group in the alkylene group and cycloalkylene group of $R_0$ and in $R_7$ may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acyloxy group such as acetyloxy group and propionyloxy group.

$R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably a carbon number of 1 to 5, and examples thereof include a methylene group, an ethylene group and a propylene group. The cycloalkylene is preferably a cycloalkylene having a carbon number of 3 to 20, and examples thereof include a cyclohexylene group, a cyclopentylene group, a norbornylene group and an adamantylene group. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include lactone structures represented by formulae (LC1-1) to (LC1-17) and among these, a structure represented by (LC1-4) is preferred. Also, structures where $n_2$ in (LC1-1) to (LC1-17) is an integer of 2 or less are more preferred.

$R_8$ is preferably a monovalent organic group having an unsubstituted lactone structure or a monovalent organic group containing a lactone structure having a methyl group, a cyano group or an alkoxycarbonyl group as the substituent, more preferably a monovalent organic group containing a lactone structure having a cyano group as the substituent (cyanolactone).

Specific examples of the lactone structure-containing repeating unit represented by formula (III) are illustrated below, but the present invention is not limited thereto.

In specific examples, R represents a hydrogen atom, an alkyl group which may have a substituent, or a halogen atom, preferably a hydrogen atom, a methyl group, a hydroxymethyl group or an acetyloxymethyl group.

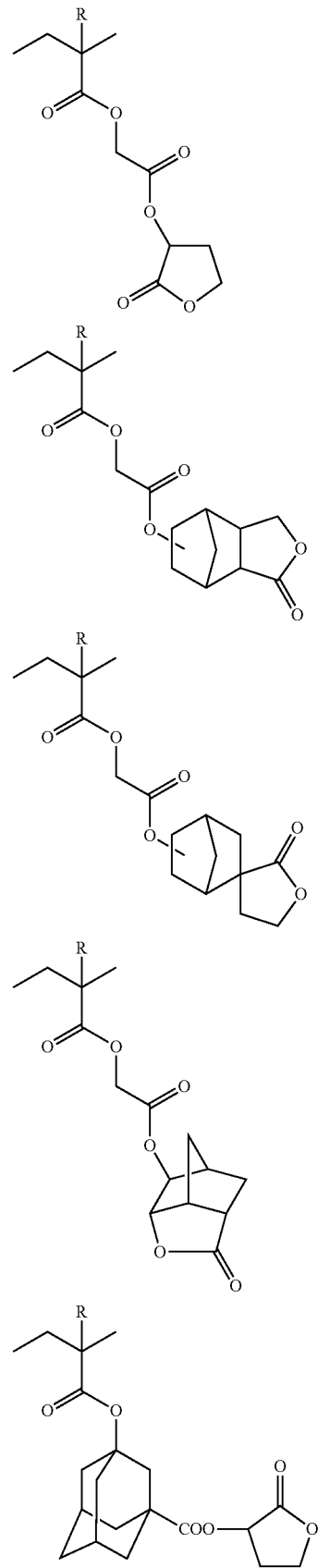

The lactone structure-containing repeating unit is more preferably a repeating unit represented by the following formula (III-1):

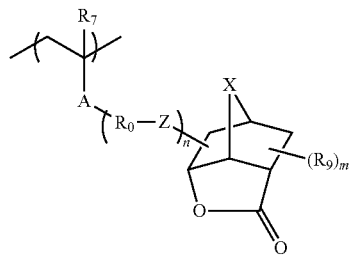

(III-1)

In formula (III-1), $R_7$, A, $R_0$, Z and n have the same meanings as in formula (III).

$R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. The cycloalkyl group includes a cyclopropyl group, a cyclobutyl group, a cyclopentyl group and a cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, a propoxy group, an isopropoxy group and a butoxy group. These groups may have a substituent, and the substituent includes a hydroxy group, an alkoxy group such as methoxy group and ethoxy group, a cyano group, and a halogen atom such as fluorine atom. $R_9$ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is an integer of 1 or more, at least one $R_9$ is preferably substituted at the α-position or β-position, more preferably at the α-position, of the carbonyl group of lactone.

Specific examples of the repeating unit having a lactone structure-containing group represented by formula (III-1) are illustrated below, but the present invention is not limited thereto. In specific examples, R represents a hydrogen atom, an alkyl group which may have a substituent, or a halogen atom, preferably a hydrogen atom, a methyl group, a hydroxymethyl group or an acetyloxymethyl group.

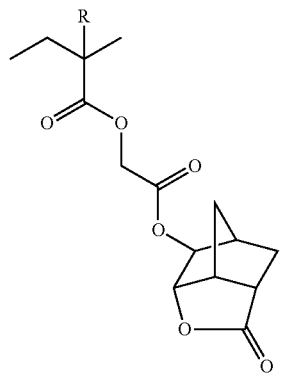

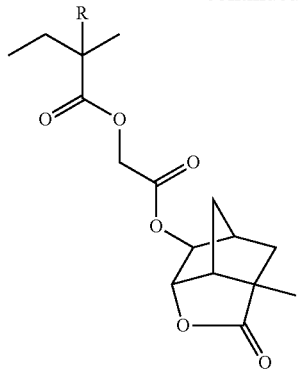

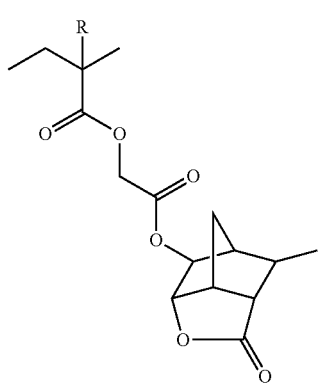

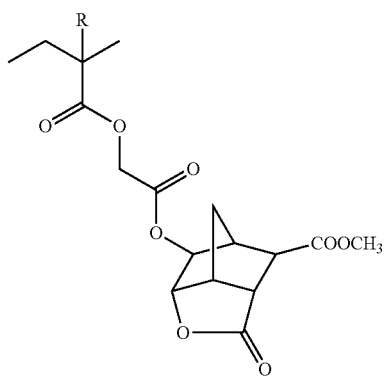

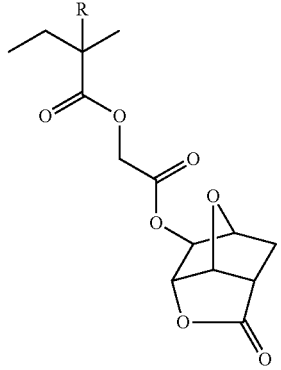

-continued
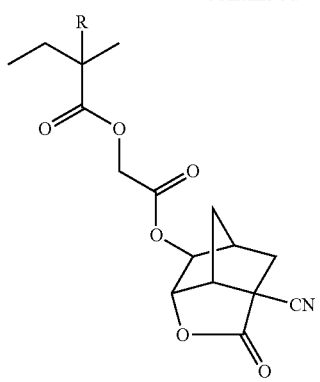
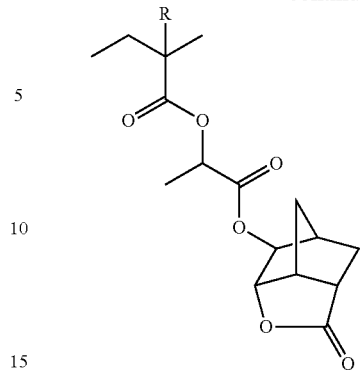
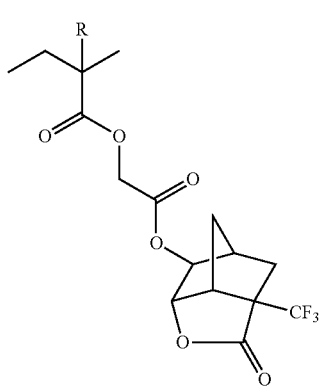
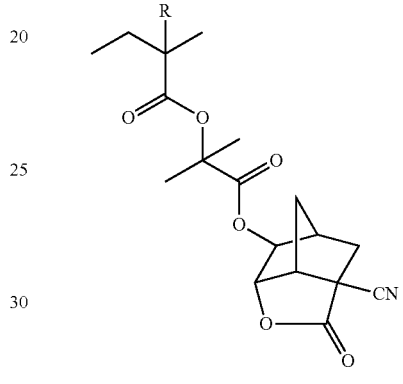
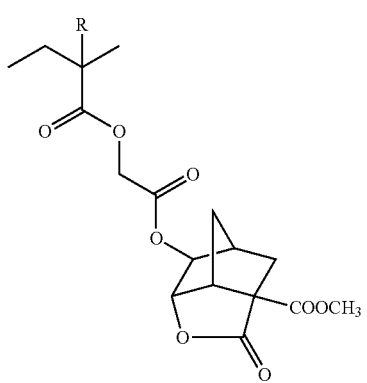
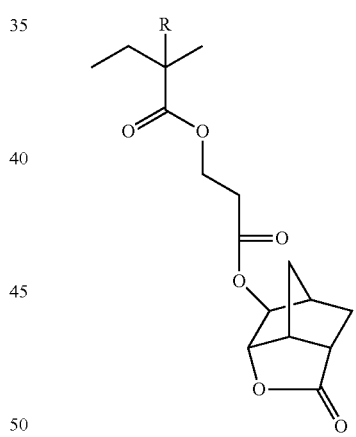
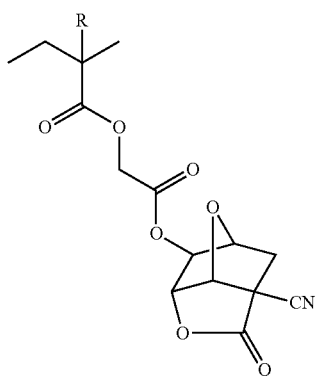
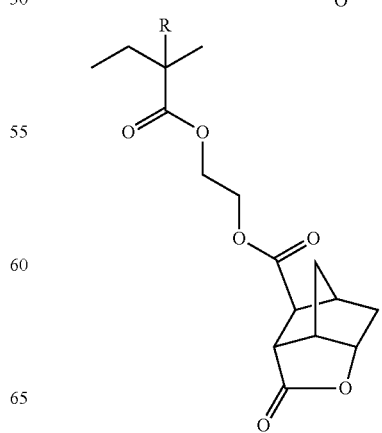

-continued
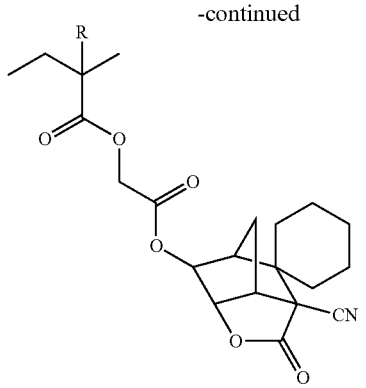
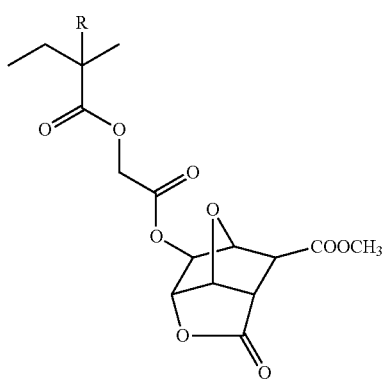
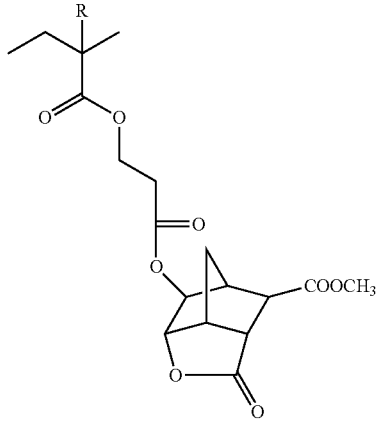
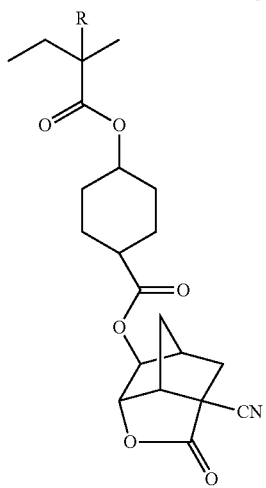
-continued
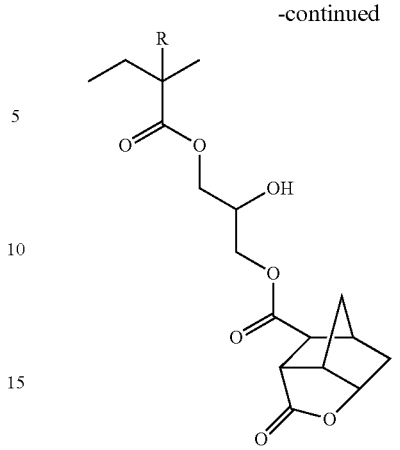
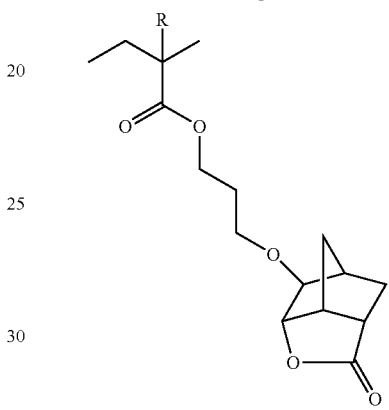
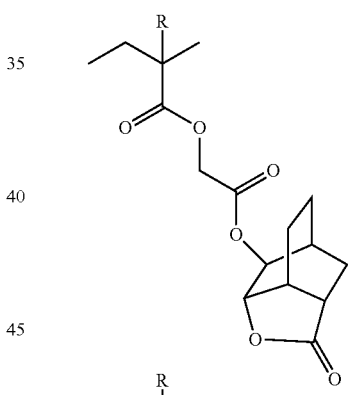
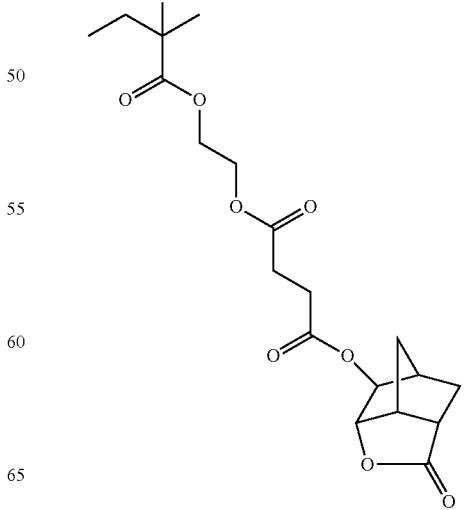

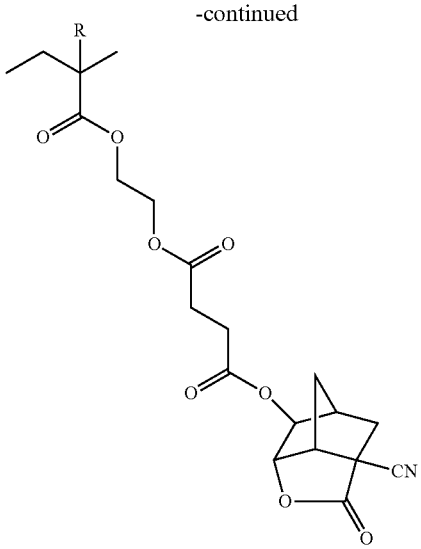
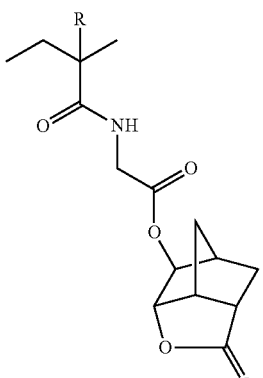
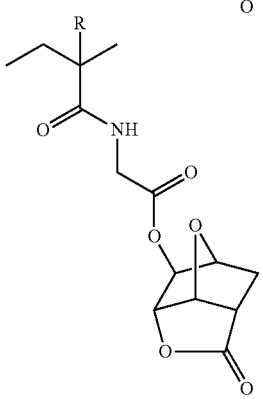
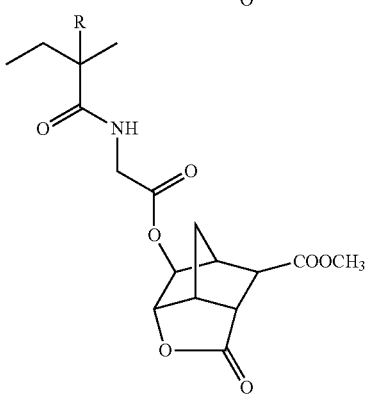

Two or more kinds of lactone repeating units may also be used in combination for raising the effects of the present invention. In the case of a combination use, it is also preferred that out of formula (III), two or more kinds of lactone repeating units where n is 1 are selected and used in combination.

(a4) Repeating Unit Having Acid-Decomposable Group

The resin (A) may further contain a repeating unit having a group capable of decomposing by the action of an acid to produce a polar group (hereinafter sometimes referred to as an "acid-decomposable group"), on either one or both of the main chain and the side chain of the resin. It is considered that when a polar group is produced from the resin (A), the affinity for the organic solvent-containing developer is reduced and insolubilization (negative conversion) is more accelerated. Also, by virtue of containing an acid-decomposable unit, resolution is more improved.

The acid-decomposable group preferably has a structure where the polar group is protected with a group capable of leaving by the action of an acid.

The polar group is not particularly limited as long as it is a group capable of being insolubilized in an organic solvent-containing developer, but an acidic group (a group capable of dissociating in an aqueous 2.38 mass % tetramethylammonium hydroxide solution which is conventionally used as the developer for resist) such as carboxyl group, fluorinated alcohol group (preferably hexafluoroisopropanol) and sulfonic acid group is preferred.

The group preferred as the acid-decomposable group is a group where a hydrogen atom of the group above is substituted for by a group capable of leaving by the action of an acid.

Examples of the group capable of leaving by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The acid-decomposable group-containing repeating unit which can be contained in the resin (A) is preferably a repeating unit represented by the following formula (AI):

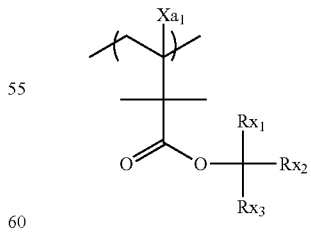

(AI)

In formula (AI), $Xa_1$ represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having a carbon number of 5 or less and an acyl group having a carbon number of 5 or less. Of these, an alkyl group having a carbon number of 3 or less is preferred, and a methyl group is more preferred. $Xa_1$ is preferably a hydrogen atom, a methyl group, a trifluoromethyl group or a hydroxymethyl group, more preferably a hydrogen atom, a methyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

$Rx_2$ and $Rx_3$ may combine to form a cycloalkyl group (monocyclic or polycyclic).

Examples of the divalent linking group of T include an alkylene group, a —COO-Rt- group and a —O-Rt- group. In the formulae, Rt represents an alkylene group or a cycloalkylene group.

T is preferably a single bond or a —COO-Rt- group. Rt is preferably an alkylene group having a carbon number of 1 to 5, more preferably a —CH$_2$— group, a —(CH$_2$)$_2$— group or a —(CH$_2$)$_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining $Rx_2$ and $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. Above all, a monocyclic cycloalkyl group having a carbon number of 5 to 6 is preferred.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a cycloalkyl group (having a carbon number of 3 to 15), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

Specific preferred examples of the repeating unit having an acid-decomposable group are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent containing a polar group, and when a plurality of Z's are present, each is independent from every others. p represents 0 or a positive integer. Specific examples and preferred examples of Z are the same as specific examples and preferred examples of $R_{10}$ in formula (2-1) described later.

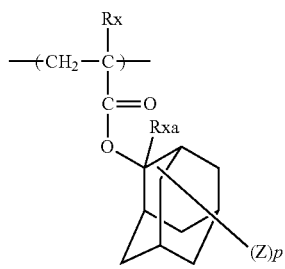

1

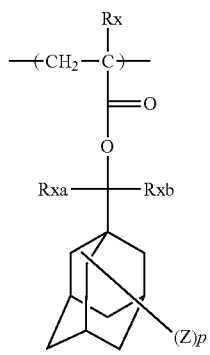

2

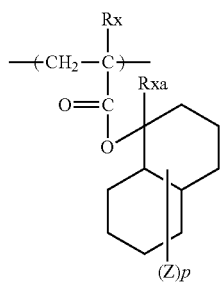

3

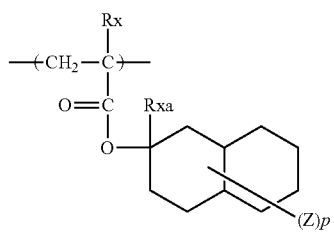

4

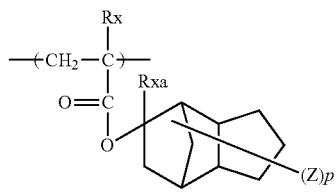

5

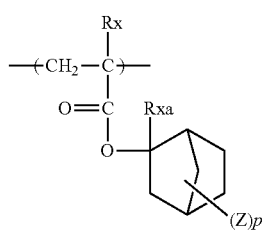

6

41
-continued
7
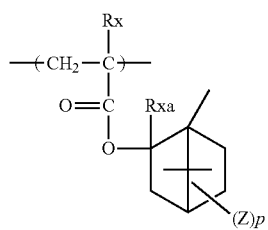
8
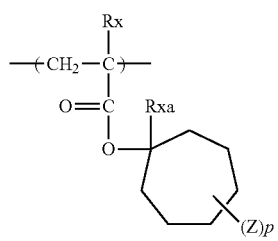
9
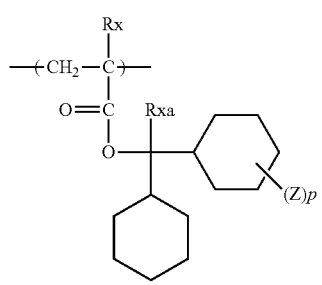
10
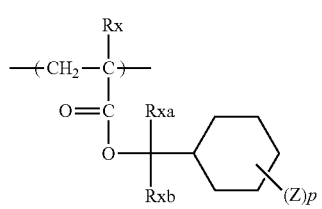
11
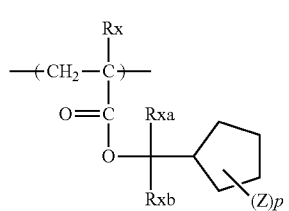
12
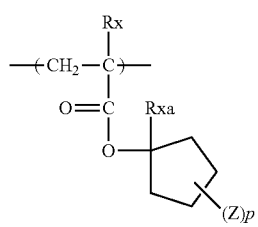
13
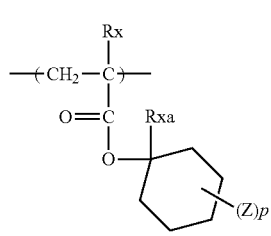
42
-continued
14
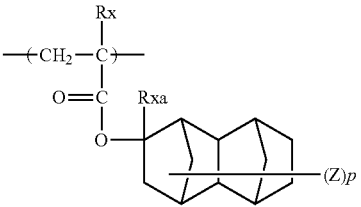
15
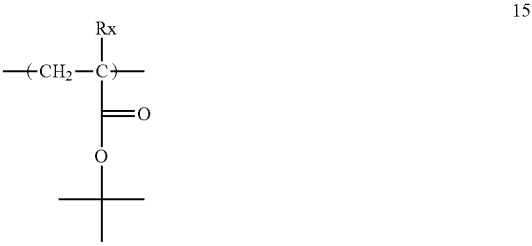
16
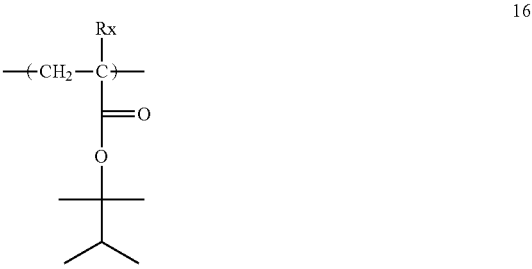
17
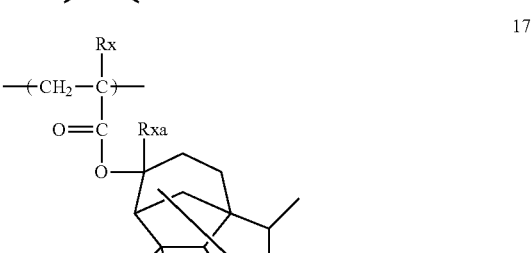
18
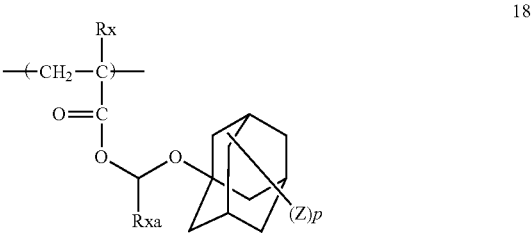
19
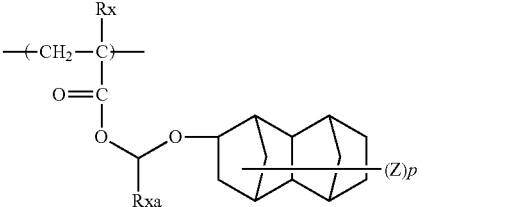

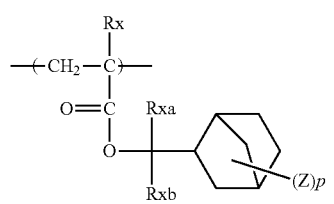
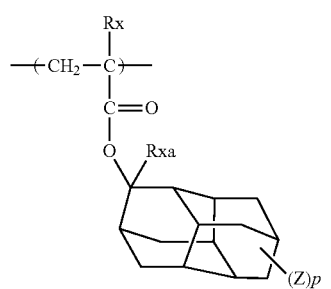
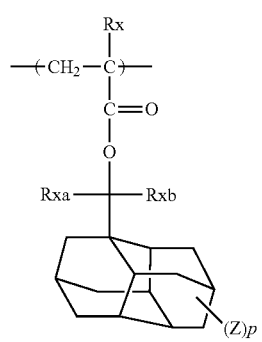
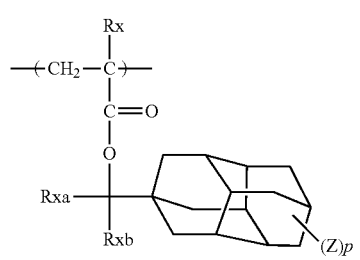
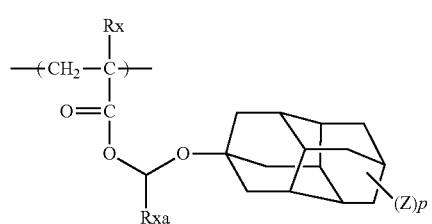
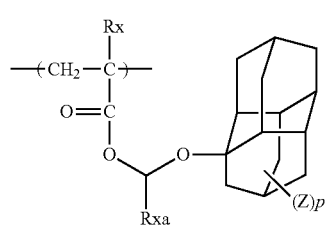
20
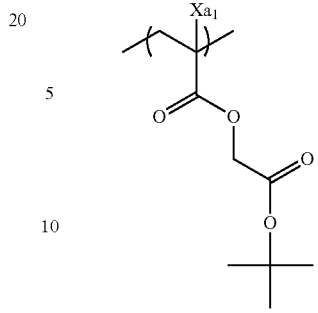
21
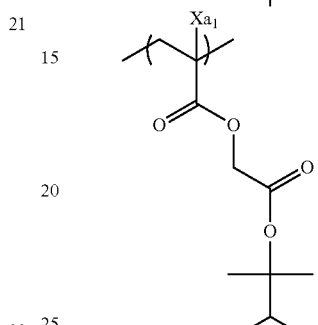
22
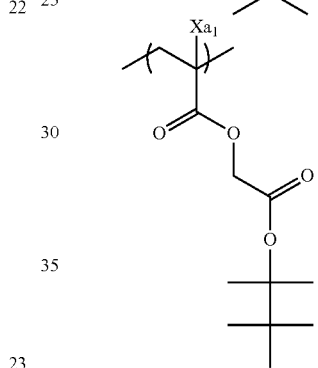
23
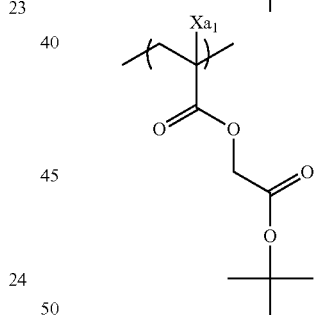
24
25
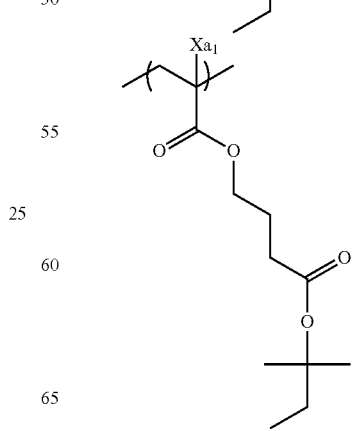

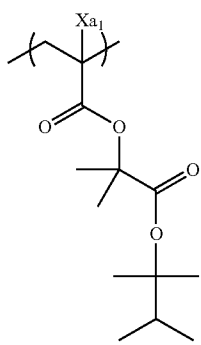
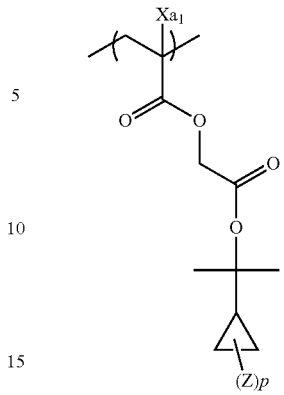
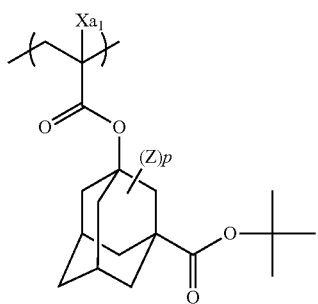
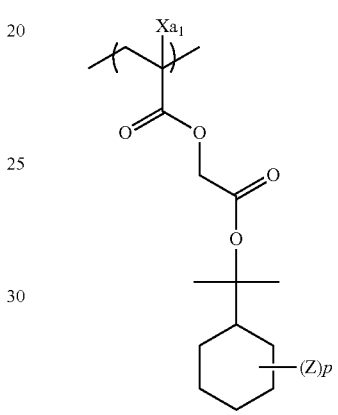
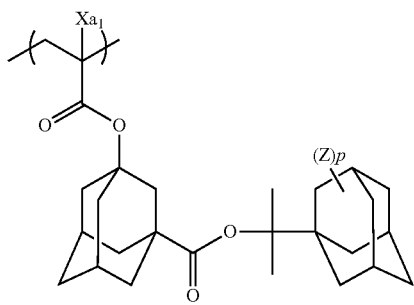
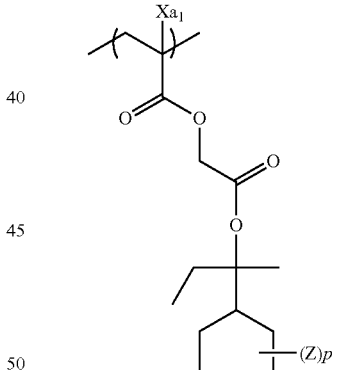
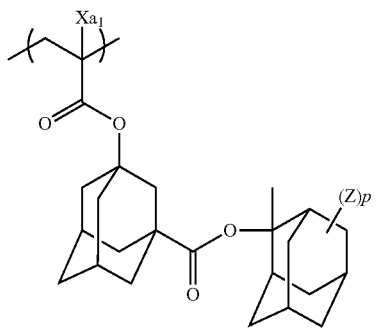
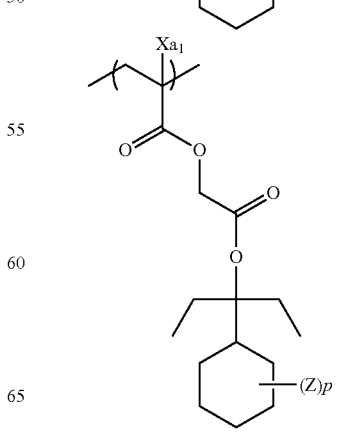
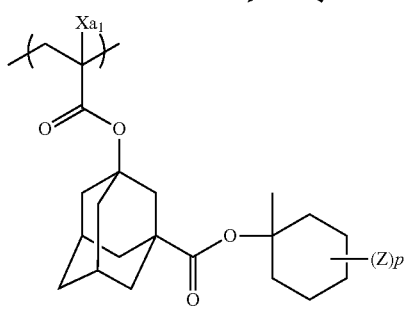

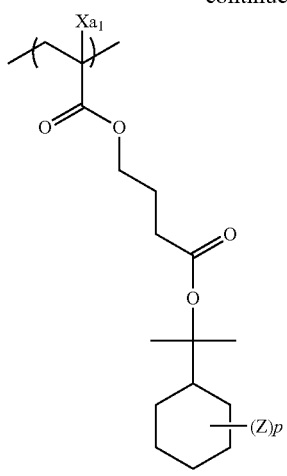
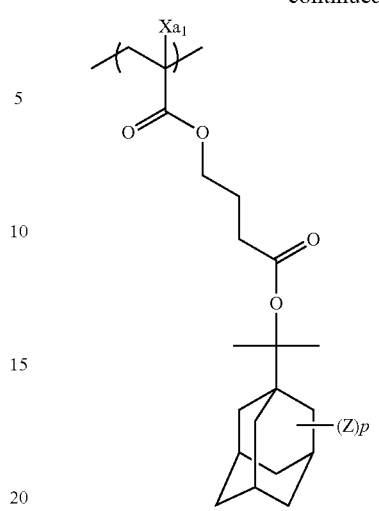
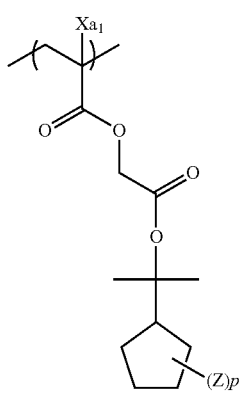
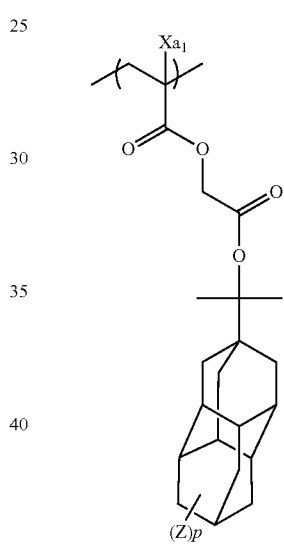
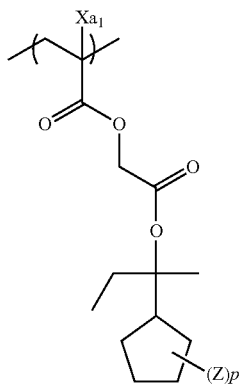
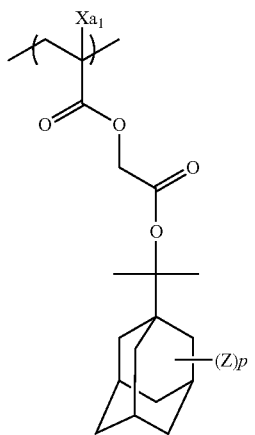
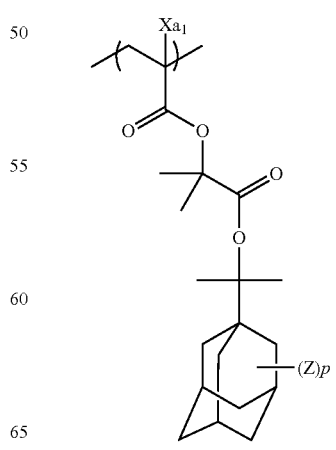

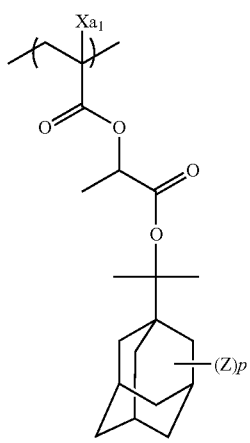
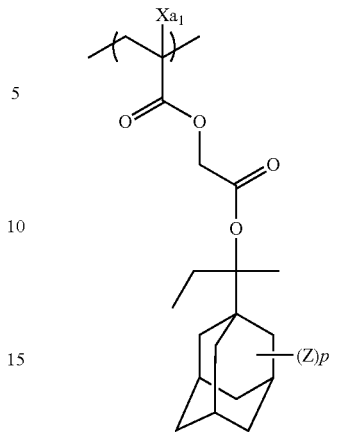
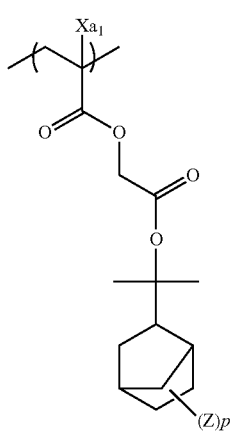
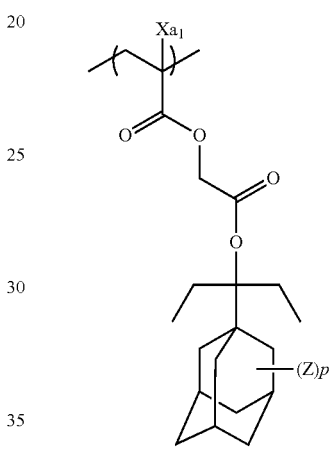
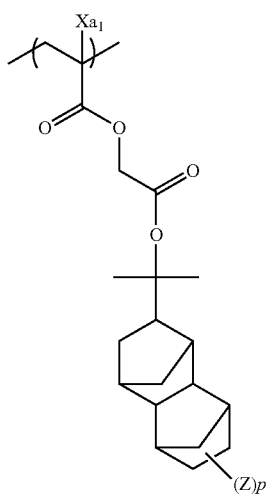
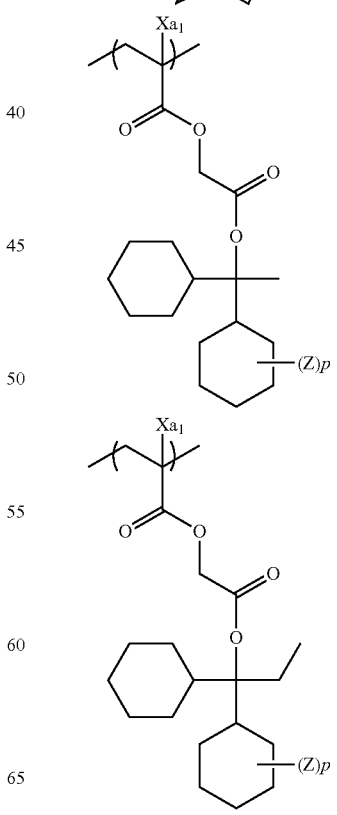

51
-continued
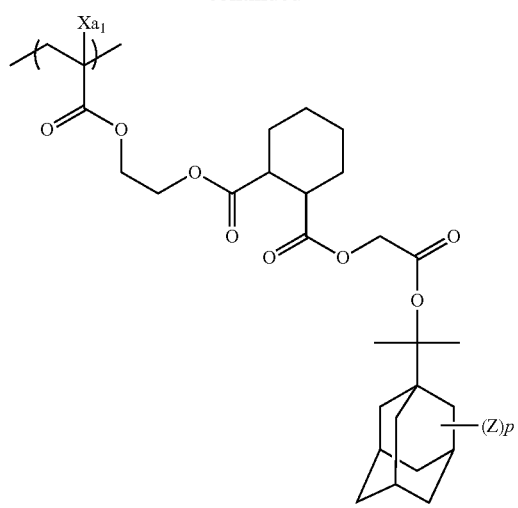
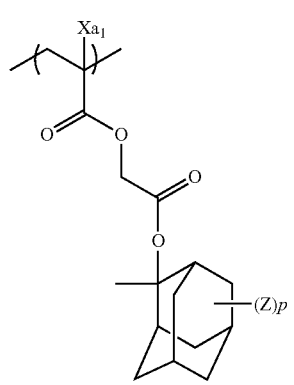
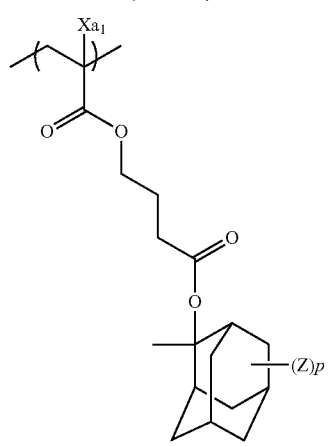
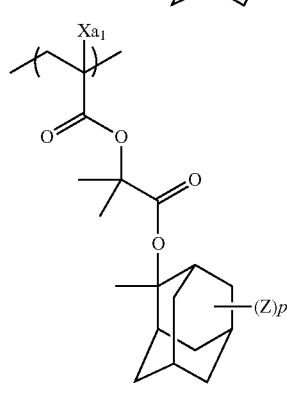
52
-continued
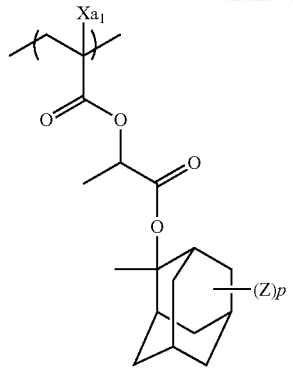
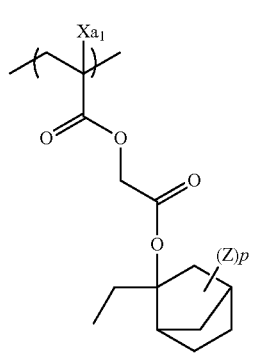
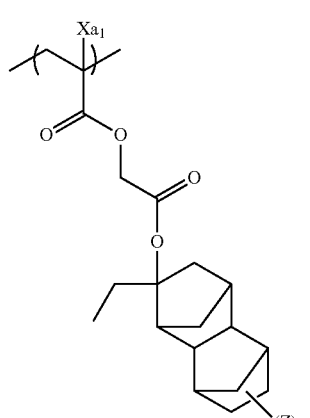
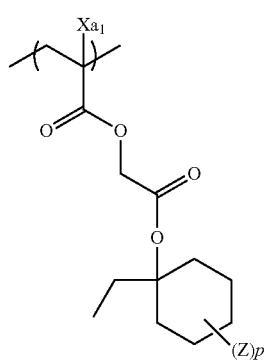

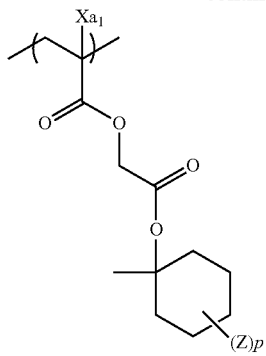

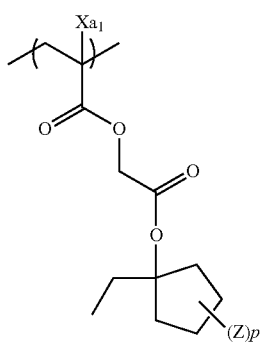

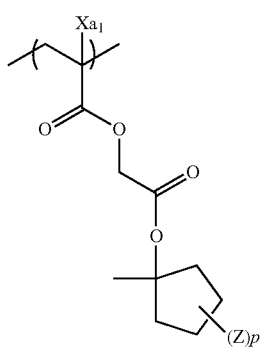

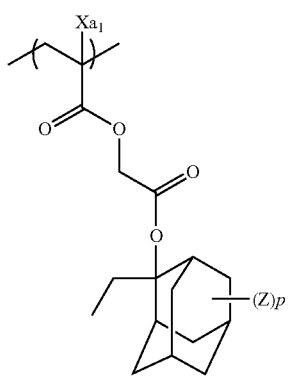

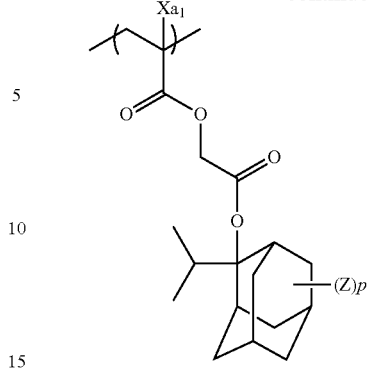

The resin (A) is more preferably a resin containing, as the repeating unit represented by formula (AI), at least either a repeating unit represented by formula (1) or a repeating unit represented by formula (2).

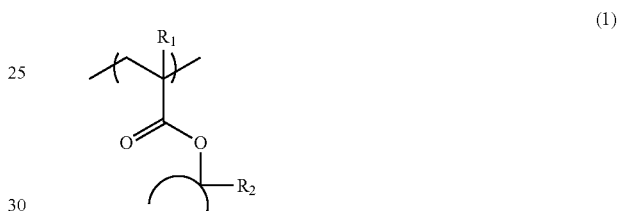

(1)

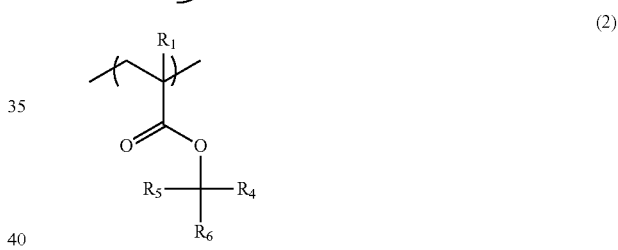

(2)

In formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

Each of $R_1$ and $R_3$ is preferably a hydrogen atom, a methyl group, a trifluoromethyl group or a hydroxymethyl group. Specific examples and preferred examples of the monovalent organic group in $R_9$ are the same as those described for $R_9$ in formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R together with the carbon atom is preferably a monocyclic alicyclic structure, and the carbon number thereof is preferably from 3 to 7, more preferably 5 or 6.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Examples of the repeating unit represented by formula (1) include a repeating unit represented by the following formula (1-a). In the formula, $R_1$ and $R_2$ have the same meanings as those in formula (1).

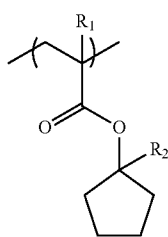
(1-a)

The repeating unit represented by formula (2) is preferably a repeating unit represented by the following formula (2-1):

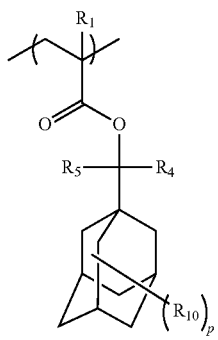
(2-1)

In formula (2-1), $R_3$ to $R_5$ have the same meanings as in formula (2).

$R_{10}$ represents a polar group-containing substituent. In the case where a plurality of $R_{10}$'s are present, each $R_{10}$ may be the same as or different from every other $R_{10}$. Examples of the polar group-containing substituent include a hydroxyl group, a cyano group, an amino group, an alkylamide group, a sulfonamide group itself, and a linear or branched alkyl group or cycloalkyl group having at least one of these groups. An alkyl group having a hydroxyl group is preferred, and a branched alkyl group having a hydroxyl group is more preferred. The branched alkyl group is preferably an isopropyl group.

p represents an integer of 0 to 15. p is preferably an integer of 0 to 2, more preferably 0 or 1.

The resin (A) may contain a plurality of repeating units having an acid-decomposable group.

The resin (A) is preferably a resin containing, as the repeating unit represented by formula (AI), a repeating unit represented by formula (1) and a repeating unit represented by formula (2). In another embodiment, the resin is preferably a resin containing, as the repeating unit represented by formula (AI), at least two kinds of repeating units represented by formula (1).

It is also possible that the resist composition of the present invention contains a plurality of kinds of resins (A) and the acid-decomposable group-containing repeating units in the plurality of resins (A) differ from each other. For example, a resin (A) containing a repeating unit represented by formula (1) and a resin (A) containing a repeating unit represented by formula (2) may be used in combination.

In the case where the resin (A) contains a plurality of acid-decomposable group-containing repeating units or where a plurality of resins (A) have different acid-decomposable group-containing repeating units, preferred examples of the combination are illustrated below. In the formulae below, each R independently represents a hydrogen atom or a methyl group.

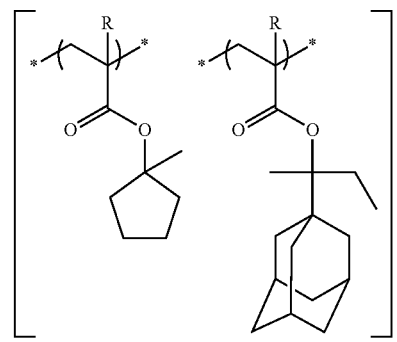

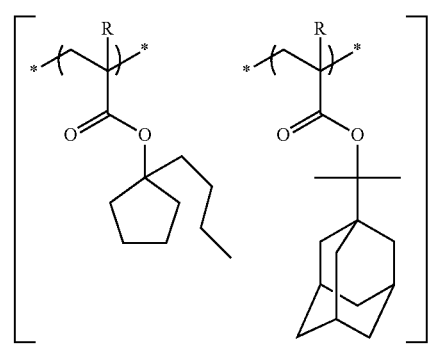

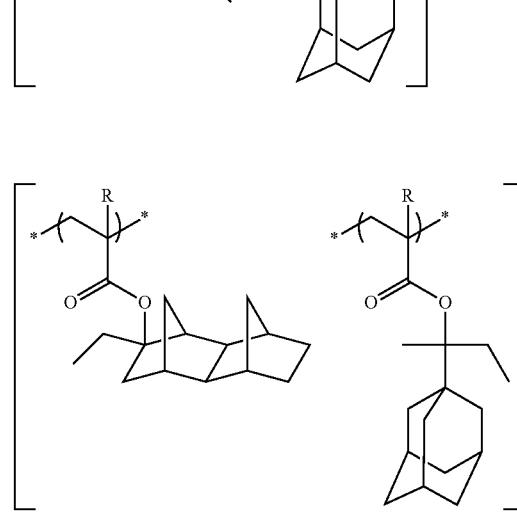

57
-continued
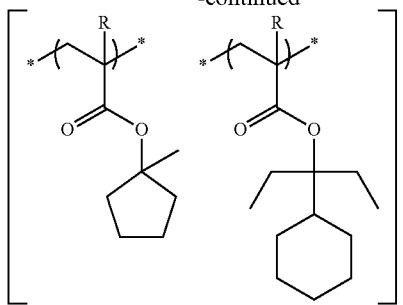
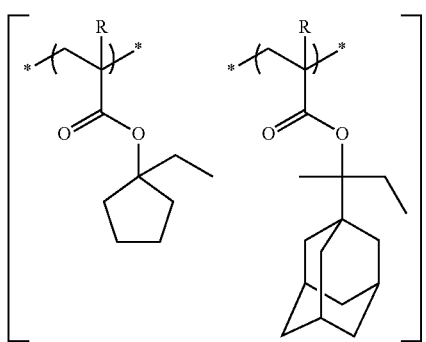
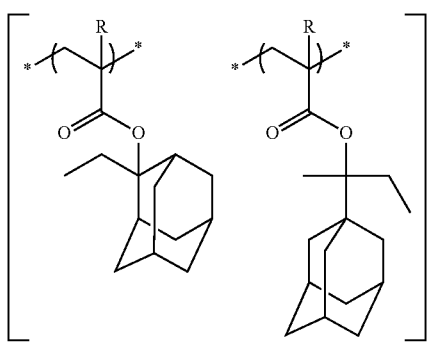
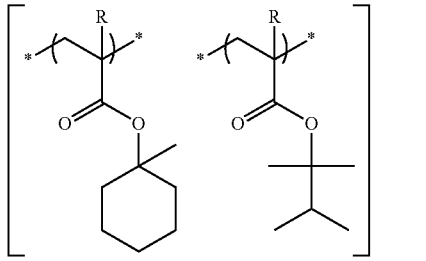
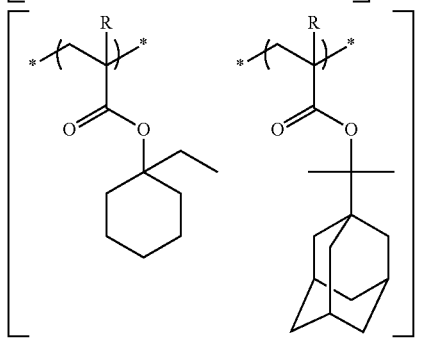
58
-continued
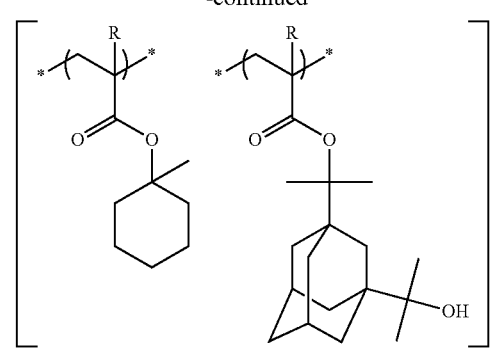
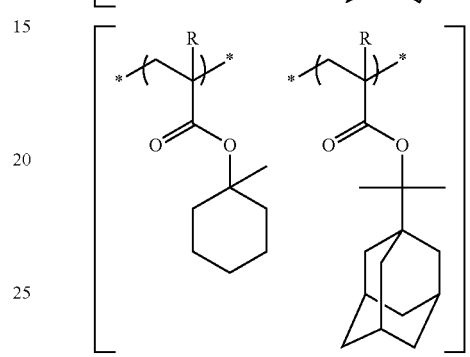
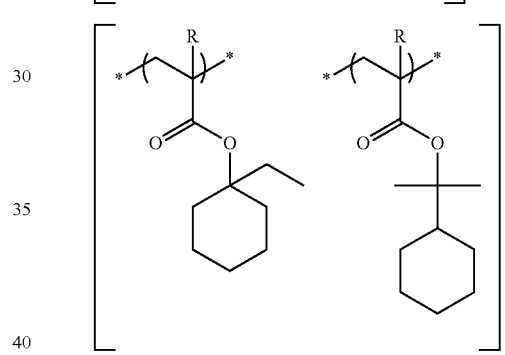
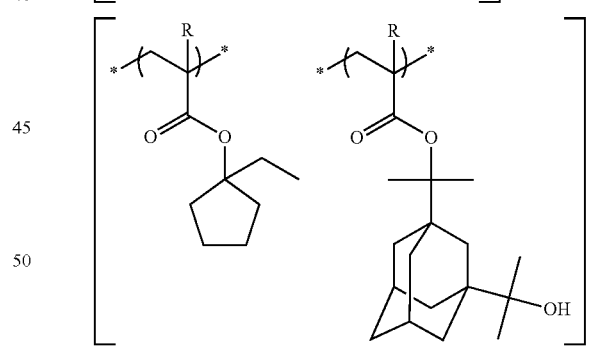
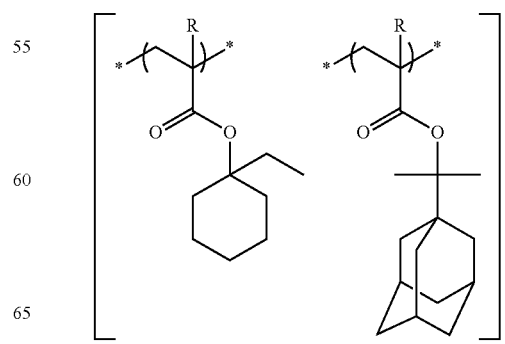

-continued

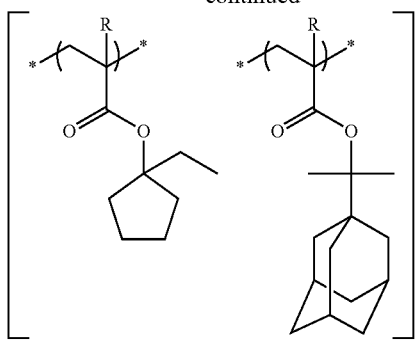
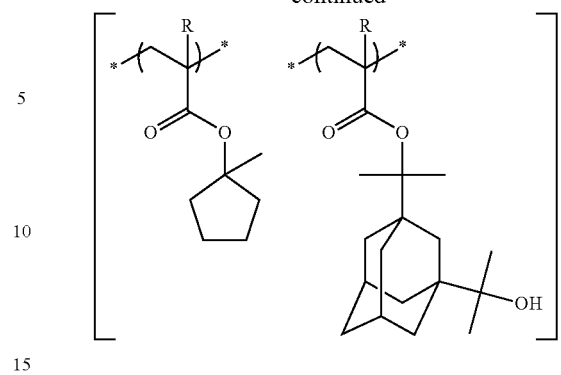
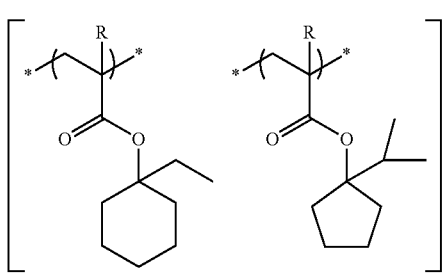
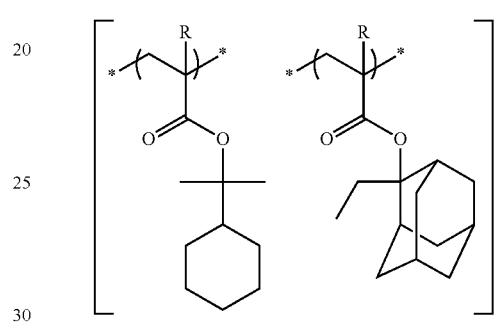
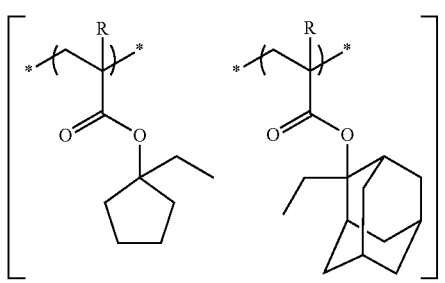
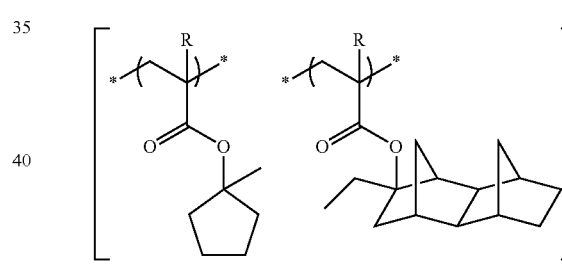
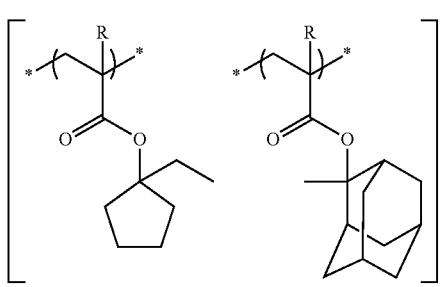
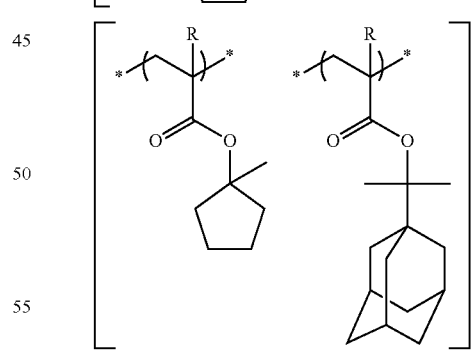
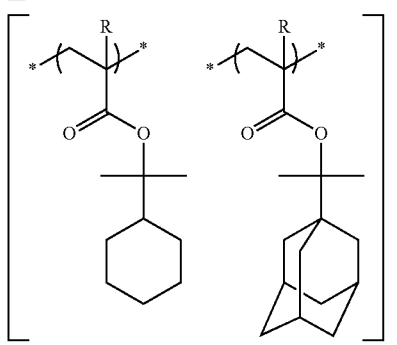

In view of the defocus latitude, it is also preferred that the resin (A) does not contain (a4) a repeating unit having an acid-decomposable group.

(a5) Repeating Unit Having Only One Hydroxyl Group

The resin (A) for use in the present invention may or may not further have (a5) a repeating unit having only one hydroxyl group. Here, it is preferred that the repeating unit (a5) does not come under the repeating units (a2) to (a4).

The (a5) repeating unit having only one hydroxyl group includes a repeating unit represented by formula (I'):

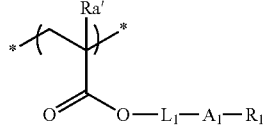

In formula (I'), Ra' represents a hydrogen atom, a halogen atom or an alkyl group.

$L_1$ represents a single bond or a divalent linking group.

$A_1$ represents a divalent hydrocarbon group.

$R_1$ represents a hydroxyl group or a hydroxyl group-containing organic group.

The halogen atom of Ra' includes a fluorine atom, a chlorine atom, a bromine atom and an iodine atom.

The carbon number of the alkyl group of Ra' is preferably from 1 to 4.

The alkyl group of Ra' may have a substituent other than a hydroxyl group, and examples thereof include a halogen atom.

Ra' is preferably a hydrogen atom, a methyl group or a trifluoromethyl group, more preferably a hydrogen atom or a methyl group.

Specific examples and preferred examples of the linking group or $L_1$ and the divalent hydrocarbon group of $A_1$ include divalent groups described as $L_1$ and $A_1$ of formula (I).

Specific examples and preferred examples of the hydroxyl group-containing organic group of $R_1$ are the same as those described for $R_1$ in formula (I).

Examples of the repeating unit (a5) are illustrated below, but the present invention is not limited thereto. In specific examples, $R^x$ represents a hydrogen atom or a methyl group.

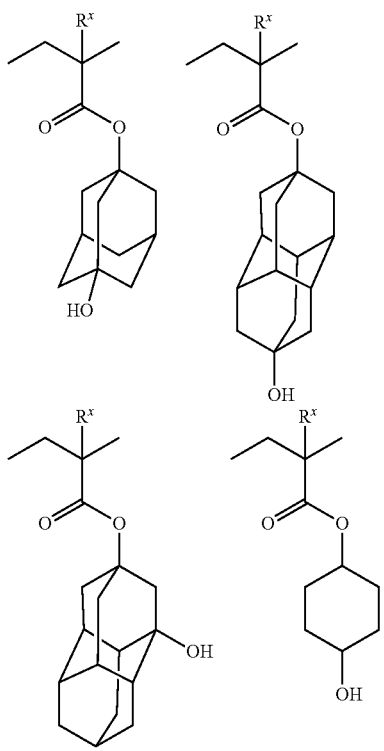

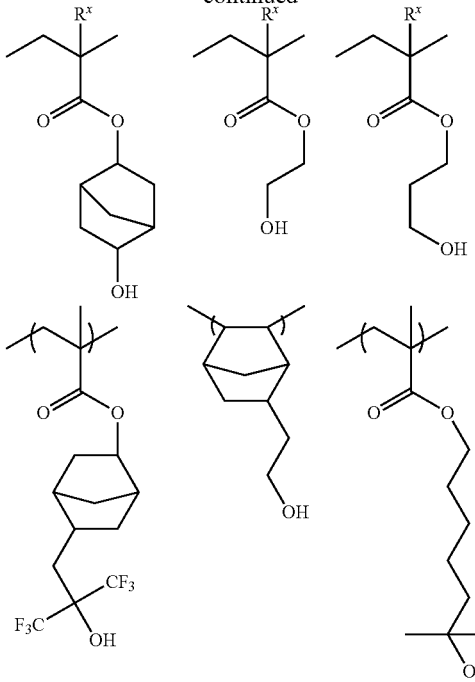

The resin (A) may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

The resin (A) may be a resin obtained by mixing two or more kinds of resins and, for example, a resin obtained by mixing a resin containing the repeating unit (a1) and a resin containing the repeating unit (a2) may be used for the purpose of controlling the dry etching resistance, suitability for standard developer, adherence to substrate, resist profile and properties generally required of a resist, such as resolution, heat resistance and sensitivity.

It is also preferred that a resin containing the repeating unit (a4) and a resin not containing the repeating unit (a4) are mixed and used.

In the case where the composition of the present invention is used for ArF exposure, in view of transparency to ArF light, the resin (A) for use in the composition of the present invention preferably has substantially no aromatic group (specifically, the ratio of an aromatic group-containing repeating unit in the resin is preferably 5 mol % or less, more preferably 3 mol % or less, and ideally 0 mol %, that is, the resin does not have an aromatic group), and the resin (A) preferably has a monocyclic or polycyclic alicyclic hydrocarbon structure.

Incidentally, the resin (A) preferably contains no fluorine atom and no silicon atom in view of compatibility with the later-described hydrophobic resin.

In the present invention, the content of each repeating unit is as follows. As for each repeating unit, a plurality of kinds of repeating units may be contained and in the case of containing a plurality of kinds of repeating units, the content is their total amount.

The content of the (a1) repeating unit having two or more hydroxyl groups is generally from 5 to 100 mol %, preferably from 10 to 80 mol %, more preferably from 10 to 60%, based on all repeating units constituting the resin (A).

In the case of containing (a2) a repeating unit having a nonpolar group, the content thereof is generally from 20 to 80 mol %, preferably from 30 to 60 mol %, based on all repeating units constituting the resin (A).

In the case of containing (a3) a lactone-containing repeating unit, the content thereof is preferably from 15 to 60 mol %, more preferably from 20 to 50 mol %, still more preferably from 30 to 50 mol %, based on all repeating units constituting the resin (A).

In the case of containing (a4) a repeating unit having an acid-decomposable group, the content thereof is preferably from 20 to 70 mol %, more preferably from 30 to 50 mol %, based on all repeating units constituting the resin (A).

In the case of containing (a5) a repeating unit having only one hydroxyl group, the content thereof is preferably 30 mol % or less, more preferably 20 mol % or less, based on all repeating units constituting the resin (A). In the case where the resin (A) contains the repeating unit (a5), the content thereof is usually 1 mol % or more.

The molar ratio (a1:a5) between the (a1) repeating unit having two or more hydroxyl groups and the (a5) repeating unit having only one hydroxyl group is preferably from 3:7 to 10:0, more preferably from 5:5 to 10:0, still more preferably from 7:3 to 10:0.

In the resin (A), the molar ratio of respective repeating structural units contained can be appropriately set to control the dry etching resistance of resist, suitability for standard developer, adherence to substrate, resist profile and performances generally required of a resist, such as resolution, heat resistance and sensitivity.

The resin (A) can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. For details of the synthesis method, purification method and the like, the methods described, for example, in "Kobunshi Gosei (Polymer Synthesis)" of *Dai 5-Han Jikken Kagaku Koza* 26, *Kobunshi Kagaku* (*Experimental Chemistry Course* 26, *Polymer Chemistry*, 5th Edition), Chapter 2, Maruzen can be used.

The weight average molecular weight of the resin (A) is preferably from 1,000 to 200,000, more preferably from 2,000 to 20,000, still more preferably from 3,000 to 15,000, yet still more preferably from 3,000 to 10,000, in terms of polystyrene as measured by the GPC method. When the weight average molecular weight is from 1,000 to 200,000, reduction in the heat resistance and dry etching resistance can be avoided and at the same time, the film-forming property can be prevented from deterioration due to impairment of developability or increase in the viscosity.

The polydispersity (molecular weight distribution) is usually from 1 to 3, preferably from 1 to 2.6, more preferably from 1 to 2, still more preferably from 1.4 to 1.7. As the molecular weight distribution is narrower, the resolution and resist profile are more excellent, the side wall of the resist pattern is smoother, and the roughness is more improved.

In the resist composition of the present invention, the blending amount of the resin (A) in the entire composition is preferably from 65 to 97 mass %, more preferably from 78 to 95 mass %, based on the entire solid content.

Also, in the present invention, as for the resin (A), one kind of a resin may be used or a plurality of kinds of resins may be used in combination. Alternatively, the resin (A) and other resins not coming under the resin (A) may be used in combination. In this case, the resin (A) is preferably present in a ratio of 50 mass % or more in all resins.

[2] (B) Compound Capable of Generating Acid Upon Irradiation with Actinic Ray or Radiation The resist composition of the present invention contains a compound capable of generating an acid upon irradiation with an actinic ray or radiation (hereinafter, sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a known compound that generates an acid upon irradiation with an actinic ray or radiation and is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Out of the acid generators, preferred compounds are compounds represented by the following formulae (ZI), (ZII) and (ZIII):

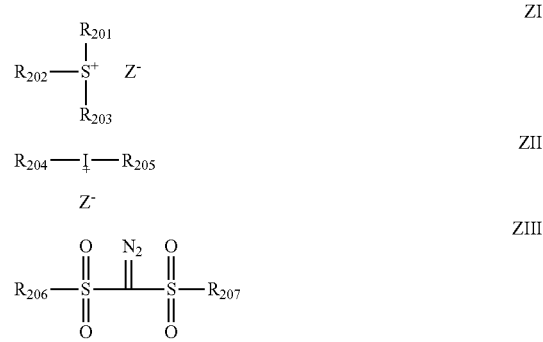

In formula (ZI), each of $R_{201}$, $R_{202}$ and $R_{203}$ independently represents an organic group. The carbon number of the organic group as $R_{201}$, $R_{202}$ and $R_{203}$ is generally from 1 to 30, preferably from 1 to 20. Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene). $Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methide anion.

The non-nucleophilic anion is an anion having an extremely low ability of causing a nucleophilic reaction, and this anion can suppress the decomposition with aging due to an intramolecular nucleophilic reaction. Thanks to this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group or ring structure in each group may be further substituted with an alkyl group (preferably having a carbon number of 1 to 15) or a cycloalkyl group (preferably having a carbon number of 3 to 15).

An anion capable of producing an arylsulfonic acid represented by the following formula (BI) is also preferred as the aromatic sulfonate anion.

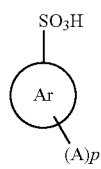

(BI)

In formula (BI), Ar represents an aromatic ring and may have a substituent in addition to the sulfonic acid group and the A group.

p represents an integer of 0 or more.

A represents a group containing a hydrocarbon group.

When p is 2 or more, each A group may be the same as or different from every other A groups.

Formula (BI) is described in detail below.

The aromatic ring represented by Ar is preferably an aromatic ring having a carbon number of 6 to 30.

Specific examples thereof include a benzene ring, a naphthalene ring, a pentalene ring, an indene ring, an azulene ring, a heptalene ring, an indecene ring, a perylene ring, a pentacene ring, an acenaphthalene ring, phenanthrene ring, an anthracene ring, a naphthacene ring, a pentacene ring, a chrysene ring, a triphenylene ring, an indene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring. Among these, a benzene ring, a naphthalene ring and an anthracene ring are preferred, and a benzene ring is more preferred.

Examples of the substituent which the aromatic ring may have in addition to the sulfonic acid group and the A group include a group containing a hydrocarbon group having a carbon number of 1 or more, a halogen atom (e.g., fluorine, chlorine, bromine, iodine), a hydroxyl group, a cyano group, a nitro group and a carboxyl group. Also, when the aromatic ring has two or more substituents, at least two substituents may combine with each other to form a ring.

Examples of the hydrocarbon group-containing group include an alkoxy group such as methoxy group, ethoxy group and tert-butoxy group, an aryloxy group such as phenoxy group and p-tolyloxy group, an alkylthioxy group such as methylthioxy group, ethylthioxy group and tert-butylthioxy group, an arylthioxy group such as phenylthioxy group and p-tolylthioxy group, an alkoxycarbonyl group such as methoxycarbonyl group, butoxycarbonyl group and phenoxycarbonyl group, an acetoxy group, a linear or branched alkyl group such as methyl group, ethyl group, propyl group, butyl group, heptyl group, hexyl group, dodecyl group and 2-ethylhexyl group, an alkenyl group such as vinyl group, propenyl group and hexenyl group, an acetylene group, an alkynyl group such as propynyl group and hexynyl group, an aryl group such as phenyl group and tolyl group, and an acyl group such as benzoyl group, acetyl group and tolyl group.

The hydrocarbon group in the hydrocarbon group-containing group represented by A includes an acyclic hydrocarbon group and a cyclic aliphatic group, and the carbon number of the hydrocarbon group is preferably 3 or more.

As for the A group, the carbon atom adjacent to Ar is preferably a tertiary or quaternary carbon atom.

Examples of the acyclic hydrocarbon group in the A group include an isopropyl group, a tert-butyl group, a tert-pentyl group, a neopentyl group, an s-butyl group, an isobutyl group, an isohexyl group, a 3,3-dimethylpentyl group and a 2-ethylhexyl group. The upper limit of the carbon number of the acyclic hydrocarbon group is preferably 12 or less, more preferably 10 or less.

Examples of the cyclic aliphatic group in the A group include a cycloalkyl group such as cyclobutyl group, cyclopentyl group, cyclohexyl group, cycloheptyl group and cyclooctyl group, an adamantyl group, a norbornyl group, a bornyl group, a camphenyl group, a decahydronaphthyl group, a tricyclodecanyl group, a tetracyclodecanyl group, a camphoroyl group, a dicyclohexyl group and a pinenyl group. These groups may have a substituent. The upper limit of the carbon number of the cyclic aliphatic group is preferably 15 or less, more preferably 12 or less.

In the case where the acyclic hydrocarbon group or cyclic aliphatic group has a substituent, examples of the substituent include a halogen atom such as fluorine atom, chlorine atom, bromine atom and iodine atom, an alkoxy group such as methoxy group, ethoxy group and tert-butoxy group, an aryloxy group such as phenoxy group and p-tolyloxy group, an alkylthioxy group such as methylthioxy group, ethylthioxy group and tert-butylthioxy group, an arylthioxy group such as phenylthioxy group and p-tolylthioxy group, an alkoxycarbonyl group such as methoxycarbonyl group, butoxycarbonyl group and phenoxycarbonyl group, an acetoxy group, a linear or branched alkyl group such as methyl group, ethyl group, propyl group, butyl group, heptyl group, hexyl group, dodecyl group and 2-ethylhexyl group, a cyclic alkyl group such as cyclohexyl group, an alkenyl group such as vinyl group, propenyl group and hexenyl group, an acetylene group, an alkynyl group such as propynyl group and hexynyl group, an aryl group such as phenyl group and tolyl group, a hydroxy group, a carboxy group, a sulfonic acid group, a carbonyl group and a cyano group.

Specific examples of the group containing the cyclic aliphatic group and acyclic hydrocarbon group as A are illustrated below.

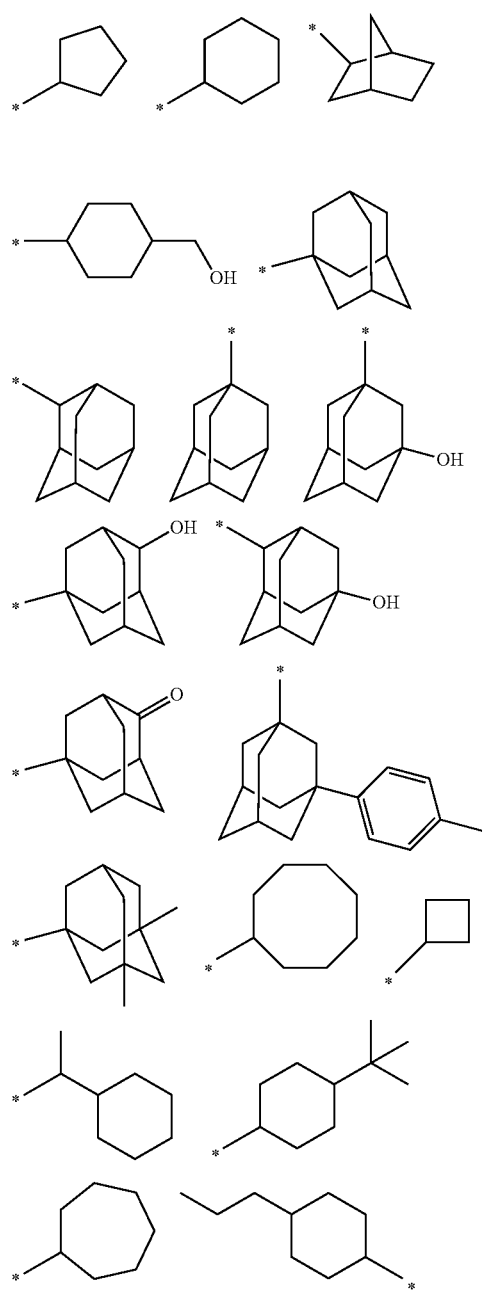
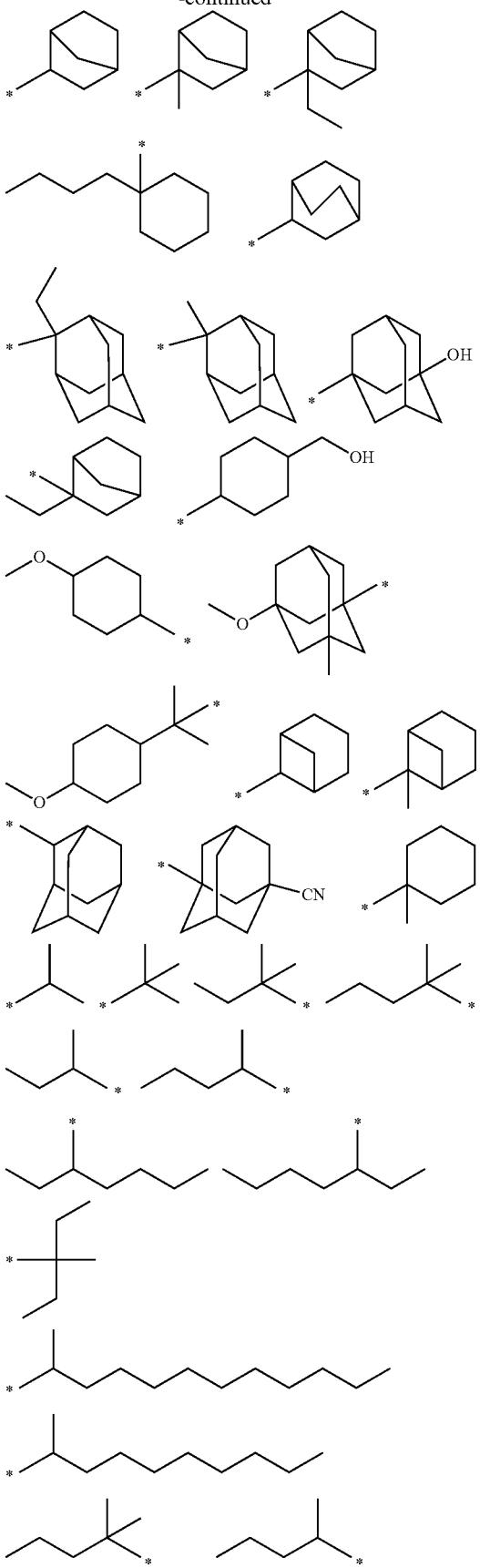

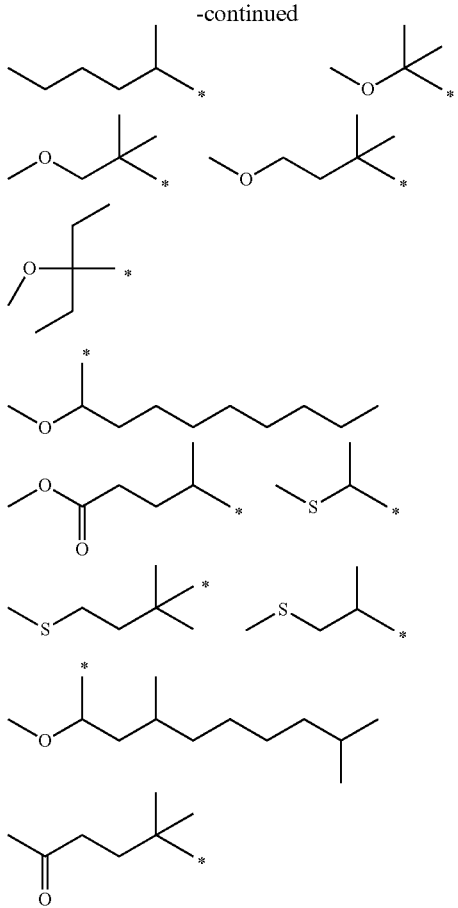

Among these, the following structures are more preferred in view of suppressing acid diffusion.

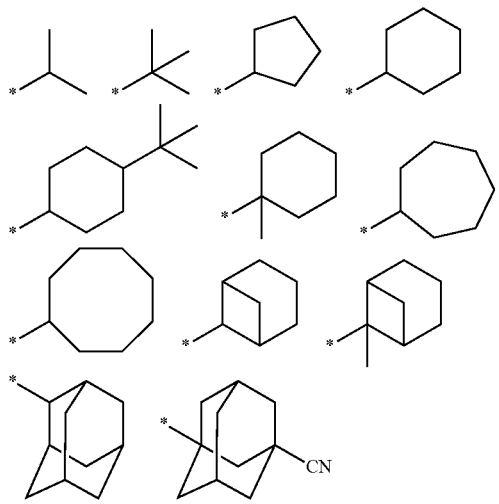

p represents an integer of 0 or more, and the upper limit thereof is not particularly limited as long as it is a chemically possible number. From the standpoint of suppressing the diffusion of acid, p is an integer of usually from 0 to 5, preferably from 1 to 4, more preferably 2 or 3, and most preferably 3.

In view of suppressing the diffusion of acid, the A group is preferably substituted on at least one o-position, more preferably two o-positions, of the sulfonic acid.

In one embodiment, the acid generator (B) for use in the present invention is a compound capable of generating an acid represented by the following formula (BII):

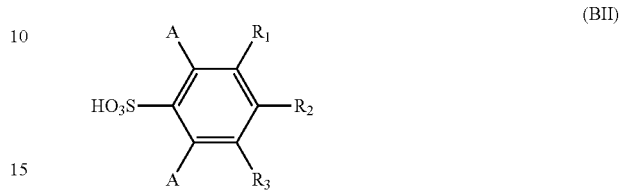

(BII)

In the formula, A is the same as A in formula (BI), and two A's may be the same or different. Each of $R_1$ to $R_3$ independently represents a hydrogen atom, a group containing a hydrocarbon group, a halogen atom, a hydroxyl group, a cyano group or a nitro group. Specific examples of the group containing a hydrocarbon group are the same as the groups exemplified above.

Furthermore, an anion capable of producing an acid represented by the following formula (I) is also preferred as the sulfonate anion.

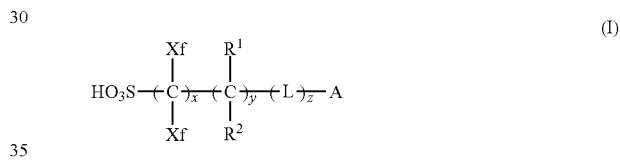

(I)

In the formula, each Xf independently represents a fluorine atom or an alkyl group substituted with at least one fluorine atom. Each of $R^1$ and $R^2$ independently represents a group selected from a hydrogen atom, a fluorine atom and an alkyl group, and when a plurality of $R^1$'s or $R^2$'s are present, each $R^1$ or $R^2$ may be the same as or different from every other $R^1$ or $R^2$. L represents a divalent linking group, and when a plurality of L's are present, each L may be the same as or different from every other L. A represents a cyclic organic group. x represents an integer of 1 to 20, y represents an integer of 0 to 10, and z represents an integer of 0 to 10.

Formula (I) is described in more detail below.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4.

Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xf's are a fluorine atom.

The alkyl group of $R^1$ and $R^2$ may have a substituent (preferably a fluorine atom) and is preferably an alkyl group having a carbon number of 1 to 4, more preferably a perfluoroalkyl group having a carbon number of 1 to 4. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R^1$ and $R^2$ is preferably a fluorine atom or $CF_3$.

y is preferably an integer of 0 to 4, more preferably 0, x is preferably an integer of 1 to 8, more preferably from 1 to 4, and z is preferably an integer of 0 to 8, more preferably from 0 to 4. The divalent linking group of L is not particularly limited, and examples thereof include —COO—, —OCO—, —CO—, —O—, —S—, —SO—, —$SO_2$—, an alkylene group, a cycloalkylene group and an alkenylene group, and a linking group formed by combining plural members of them, and a linking group having a total carbon number of 12 or less is preferred. Among these, —COO—, —OCO—, —CO—, —O— and —$SO_2$— are preferred, and —COO—, —OCO— and —$SO_2$— are more preferred.

The cyclic organic group of A is not particularly limited, and examples thereof include an alicyclic group, an aryl group and a heterocyclic group (including not only those having aromaticity but also those having no aromaticity).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film at the PEB (post-exposure baking) step can be suppressed and MEEF (mask error enhancement factor) can be improved.

Examples of the aryl group include a benzene ring, a naphthalene ring, a phenanthrene ring and an anthracene ring. Among these, naphthalene having low absorbance is preferred in view of absorbance for light at 193 nm.

Examples of the heterocyclic group include groups derived from a furan ring, a thiophene ring, a benzofuran ring, a benzothiophene ring, a dibenzofuran ring, a dibenzothiophene ring, a pyridine ring and a piperidine ring. Among these, groups derived from a furan ring, a thiophene ring, a pyridine ring and a piperidine ring are preferred.

The cyclic organic group also includes a lactone structure, and specific examples thereof include lactone structures represented by formulae (LC1-1) to (LC1-17) which the resin (A) may have.

The cyclic organic group may have a substituent, and examples of the substituent include an alkyl group (which may be linear or branched; preferably having a carbon number of 1 to 12), a cycloalkyl group (which may be monocyclic, polycyclic or spirocyclic; preferably having a carbon number of 3 to 20), an aryl group (preferably having a carbon number of 6 to 14), a hydroxy group, an alkoxy group, an ester group, an amido group, a urethane group, a ureido group, a thioether group, a sulfonamido group and a sulfonic acid ester group. Incidentally, the carbon constituting the cyclic organic group (the carbon contributing to ring formation) may be a carbonyl carbon.

The aliphatic moiety in the aliphatic carboxylate anion includes the same alkyl group and cycloalkyl group as in the aliphatic sulfonate anion.

The aromatic group in the aromatic carboxylate anion includes the same aryl group as in the aromatic sulfonate anion.

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as those, for example, in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Incidentally, two alkyl groups in the bis(alkylsulfonyl)imide anion may be the same or different. Similarly, a plurality of alkyl groups in the tris(alkylsulfonyl)methide anion may be the same or different.

In particular, the bis(alkylsulfonyl)imide anion and tris(alkylsulfonyl)methyl anion include an anion represented by the following formula (A3) or (A4):

(A3)

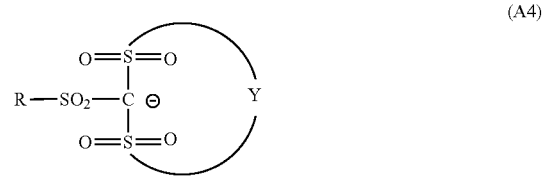

(A4)

In formulae (A3) and (A4), Y is an alkylene group substituted with at least one fluorine atom, preferably an alkylene group having a carbon number of 2 to 4. The alkylene chain may contain an oxygen atom. Y is more preferably a perfluoroalkylene group having a carbon number of 2 to 4, and most preferably a tetrafluoroethylene group, a hexafluoropropylene group or an octafluorobutylene group.

In formula (A4), R represents an alkyl group or a cycloalkyl group. The alkylene chain in the alkyl or cycloalkyl group may contain an oxygen atom.

Examples of the compound having an anion represented by formula (A3) or (A4) include those described as specific examples in JP-A-2005-221721.

Other examples of the non-nucleophilic anion include fluorinated phosphorus, fluorinated boron and fluorinated antimony.

The non-nucleophilic anion of $Z^-$ is preferably an aliphatic sulfonate anion substituted with a fluorine atom at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8, or a fluorine atom-containing benzenesulfonate anion, still more preferably nonafluorobutanesulfonate anion, perfluorooctanesulfonate anion, pentafluorobenzenesulfonate anion, or 3,5-bis(trifluoromethyl)benzenesulfonate anion.

Examples of the organic group as $R_{201}$, $R_{202}$ and $R_{203}$ in formula (ZI) include corresponding groups in the compounds (ZI-1) to (ZI-4) described later.

The compound may be a compound having a plurality of structures represented by formula (ZI). For example, the compound may be a compound having a structure where at least one of $R_{201}$ to $R_{203}$ in the compound represented by formula (ZI) is bonded to at least one of $R_{201}$ to $R_{203}$ in another compound represented by formula (ZI).

More preferred components (ZI) include compounds (ZI-1) to (ZI-4) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen, a nitrogen atom, a sulfur atom or the like. Examples of the heterocyclic structure include pyrrole, furan, thiophene, indole, benzofuran and benzothiophene. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10, and a cycloalkyl group having a carbon number of 3 to 10. The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having $>C=O$ at the 2-position of the above-described alkyl group.

The 2-oxocycloalkyl group is preferably a group having $>C=O$ at the 2-position of the above-described cycloalkyl group.

The alkoxy group in the alkoxycarbonylmethyl group is preferably an alkoxy group having a carbon number of 1 to 5.

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is a compound represented by the following formula (ZI-3), and this is a compound having a phenacylsulfonium salt structure.

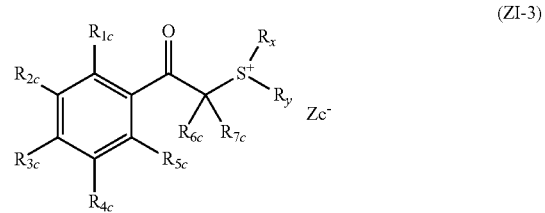

(ZI-3)

In formula (ZI-3), each of $R_{1c}$ to $R_{5c}$ independently represents a hydrogen atom, an alkyl group, a cycloalkyl group, an alkoxy group, a phenyl group, a phenylthio group or a halogen atom. Each of $R_{6c}$ and $R_{7c}$ independently represents a hydrogen atom, an alkyl group, a cycloalkyl group, a halogen atom, a cyano group or an aryl group. Each of $R_x$ and $R_y$ independently represents an alkyl group, a cycloalkyl group, an allyl group, a 2-oxoalkyl group, a 2-oxocycloalkyl group, an alkoxycarbonylalkyl group or a vinyl group.

Any two or more members out of $R_{1c}$ to $R_{5c}$, a pair of $R_{6c}$ and $R_{7c}$, or a pair of $R_x$ and $R_y$ may combine together to form a ring structure. This ring structure may contain an oxygen atom, a sulfur atom, an ester bond or an amide bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

The ring structure includes an aromatic or non-aromatic hydrocarbon ring, an aromatic or non-aromatic heterocyclic ring, and a polycyclic fused ring formed by combining two or more of these rings. The ring structure is a 3- to 10-membered ring, preferably a 4- to 8-membered ring, more preferably a 5- or 6-membered ring.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12. The cycloalkyl group is, for example, a cycloalkyl group having a carbon number of 3 to 8.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 or a cyclic alkoxy group having a carbon number of 3 to 8.

The aryl group as $R_{6c}$ and $R_{7c}$ is preferably an aryl group having a carbon number of 5 to 15, and examples thereof include a phenyl group and a naphthyl group.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylalkyl group are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (e.g., methyl group, ethyl group).

The allyl group is not particularly limited but is preferably an allyl group substituted with an unsubstituted, monocyclic or polycyclic cycloalkyl group.

The vinyl group is not particularly limited but is preferably a vinyl group substituted with an unsubstituted, monocyclic or polycyclic cycloalkyl group.

The ring structure which may be formed by combining $R_x$ and $R_y$ with each other includes a 5- or 6-membered ring formed by divalent $R_x$ and $R_y$ (for example, a methylene group, an ethylene group or a propylene group) together with the sulfur atom in formula (ZI-3), and a 5-membered ring (that is, a tetrahydrothiophene ring) is particularly preferred.

Each of $R_x$ and $R_y$ is preferably an alkyl or cycloalkyl group having a carbon number of 4 or more, more preferably 6 or more, still more preferably 8 or more.

The compound (ZI-4) is a compound represented by the following formula (ZI-4):

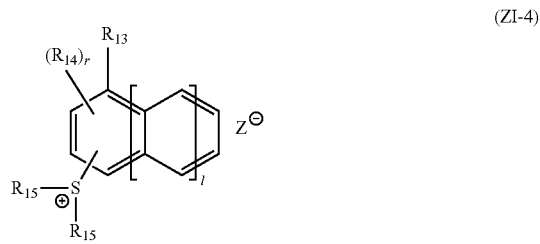

In formula (ZI-4), $R_{13}$ represents a hydrogen atom, a fluorine atom, a hydroxyl group, an alkyl group, a cycloalkyl group, an alkoxy group, an alkoxycarbonyl group, or a cycloalkyl group-containing group. These groups may have a substituent.

$R_{14}$ represents, when a plurality of $R_{14}$'s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group-containing group. These groups may have a substituent.

Each $R_{15}$ independently represents an alkyl group, a cycloalkyl group or a naphthyl group. Two $R_{15}$'s may combine with each other to form a ring.

l represents an integer of 0 to 2.

r represents an integer of 0 to 10.

$Z^-$ represents a non-nucleophilic anion, and examples thereof are the same as those of the non-nucleophilic anion of $Z^-$ in formula (ZI).

In formula (ZI-4), the alkyl group of $R_{13}$, $R_{14}$ and $R_{15}$ is preferably a linear or branched alkyl group having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

The cycloalkyl group of $R_{13}$, $R_{14}$ and $R_{15}$ includes a monocyclic or polycyclic cycloalkyl group (preferably a cycloalkyl group having a carbon number of 3 to 20), and examples thereof include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl and adamantyl. Above all, cyclopropyl, cyclopentyl, cyclohexyl, cycloheptyl and cyclooctyl are preferred.

The alkoxy group of $R_{13}$ and $R_{14}$ is preferably a linear or branched alkoxy group having a carbon number of 1 to 10, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are preferred.

The alkoxycarbonyl group of $R_{13}$ is preferably a linear or branched alkoxycarbonyl group having a carbon number of 2 to 11, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are preferred.

The cycloalkyl group-containing group of $R_{13}$ and $R_{14}$ includes a group having a monocyclic or polycyclic cycloalkyl group (preferably a cycloalkyl group having a carbon number of 3 to 20), and examples thereof include a monocyclic or polycyclic cycloalkyloxy group and an alkoxy group containing a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and it is preferred to contain a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cyclobutyloxy group, cyclooctyloxy group and cyclododecanyloxy group arbitrarily has a substituent such as alkyl group (e.g., methyl, ethyl, propyl, butyl, pentyl, hexyl, heptyl, octyl, dodecyl, 2-ethylhexyl, isopropyl, sec-butyl, tert-butyl, isoamyl), hydroxyl group, halogen atom (e.g., fluorine, chlorine, bromine, iodine), nitro group, cyano group, amido group, sulfonamido group, alkoxy group (e.g., methoxy, ethoxy, hydroxyethoxy, propoxy, hydroxypropoxy, butoxy), alkoxycarbonyl group (e.g., methoxycarbonyl, ethoxycarbonyl), acyl group (e.g., formyl, acetyl, benzoyl), acyloxy group (e.g., acetoxy, butyryloxy) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably alkoxy group having a monocyclic cycloalkyl group. The alkoxy group having a total carbon number of 7 or more and having a monocyclic cycloalkyl group indicates an alkoxy group where above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Preferred examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$ above.

The alkylsulfonyl or cycloalkylsulfonyl group of $R_{14}$ is preferably a linear, branched or cyclic alkylsulfonyl group having a carbon number of 1 to 10, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

l is preferably 0 or 1, more preferably 1.

r is preferably an integer of 0 to 2.

Examples of the substituent which each of the groups of $R_{13}$, $R_{14}$ and $R_{15}$ may have include a halogen atom (e.g., fluorine), a hydroxyl group, a carboxyl group, a cyano group, a nitro group, an alkoxy group, an alkoxyalkyl group, an alkoxycarbonyl group and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

As for the ring structure which may be formed by combining two $R_{15}$'s with each other, a group capable of forming a 5- or 6-membered ring together with the sulfur atom in formula (ZI-4) is preferred, and a group capable of forming a 5-membered ring (that is, a tetrahydrothiophene ring) is more preferred. Examples of the substituent on the divalent group include a hydroxyl group, a carboxyl group, a cyano group, a nitro group, an alkyl group, a cycloalkyl group, an alkoxy group, an alkoxyalkyl group, an alkoxycarbonyl group and an alkoxycarbonyloxy group. On the ring structure, a plurality of substituents may be present, and the substituents may combine to form a ring (for example, an aromatic or non-aromatic hydrocarbon ring, an aromatic or non-aromatic heterocyclic ring, or a polycyclic condensed ring formed by combining two or more of these groups).

In formula (ZI-4), $R_{15}$ is preferably, for example, a methyl group, an ethyl group, or a divalent group of combining two $R_{15}$'s to form a tetrahydrothiophene ring structure together with the sulfur atom.

Each of the alkyl group, cycloalkyl group, alkoxy group and alkoxycarbonyl group of $R_{13}$ and the alkyl group, cycloalkyl group, alkoxy group, alkylsulfonyl group and cycloalkylsulfonyl group of $R_{14}$ may be substituted as described above, and the substituent is preferably a hydroxyl group, an alkoxy group, an alkoxycarbonyl group or a halogen atom (particularly a fluorine atom).

Specific preferred examples of the cation in the compound represented by formula (ZI-4) are illustrated below.

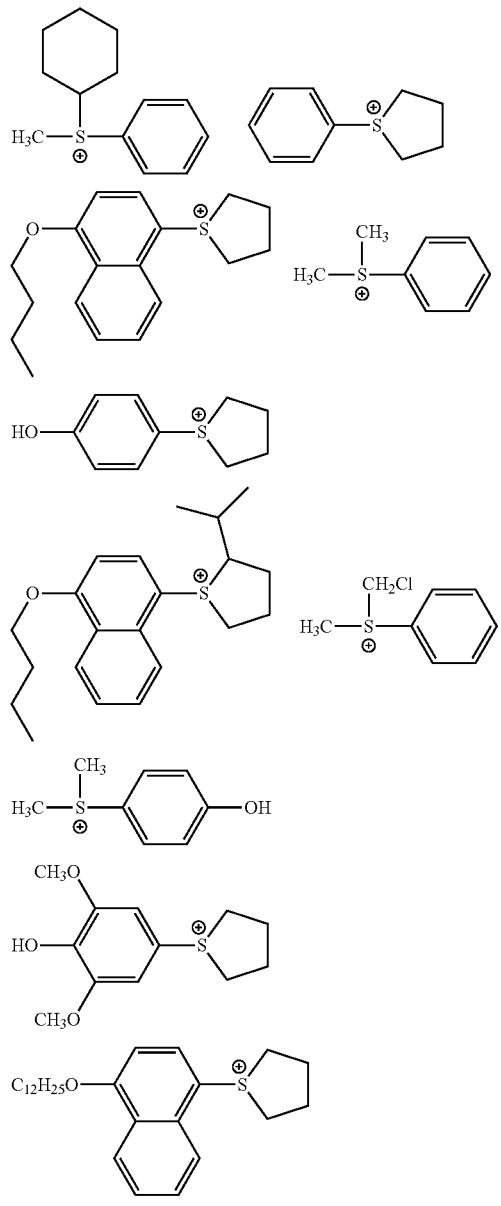

-continued

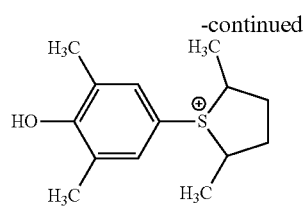

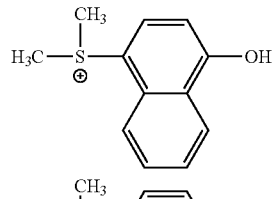

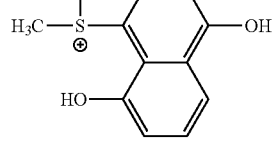

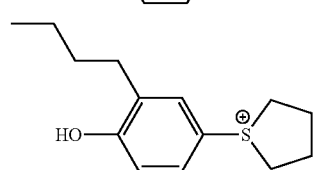

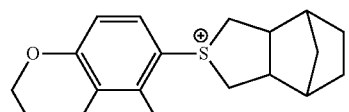

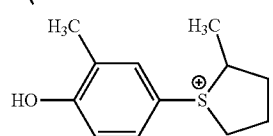

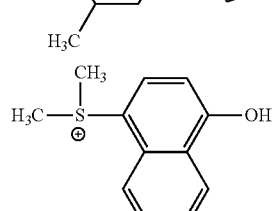

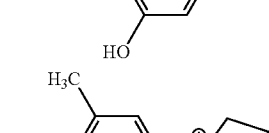

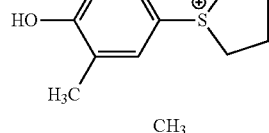

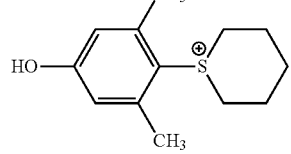

81
-continued
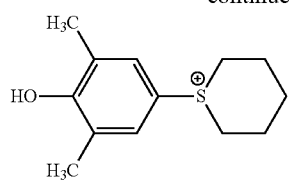
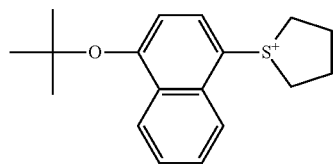
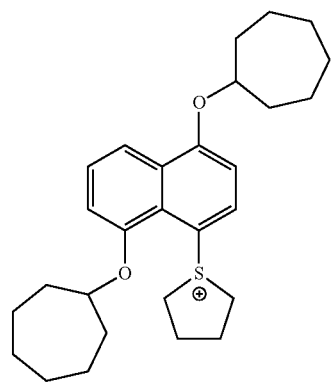
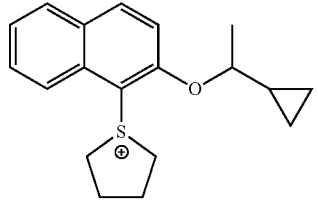
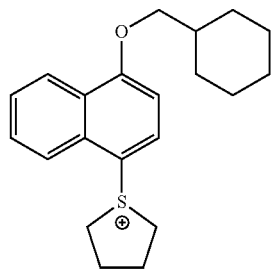
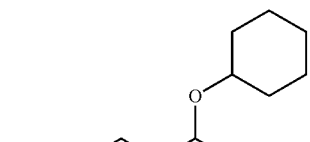
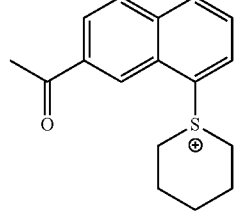
82
-continued
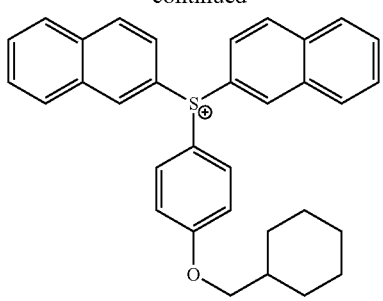
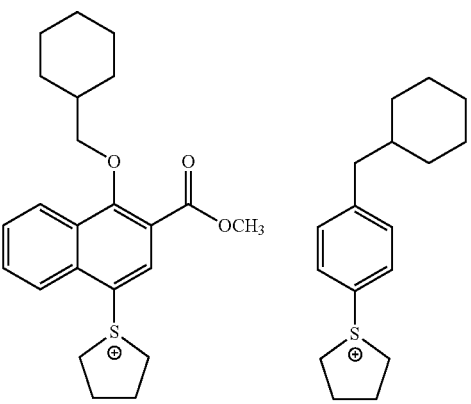
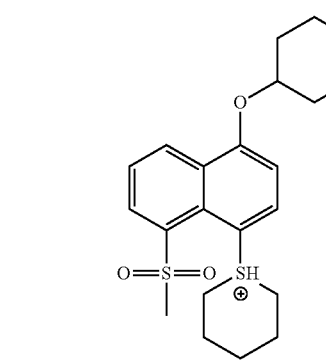
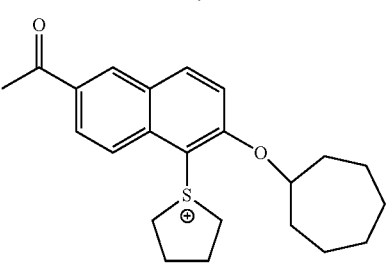
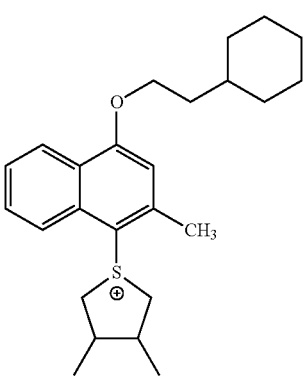

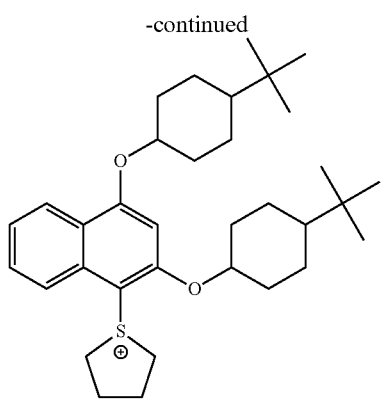
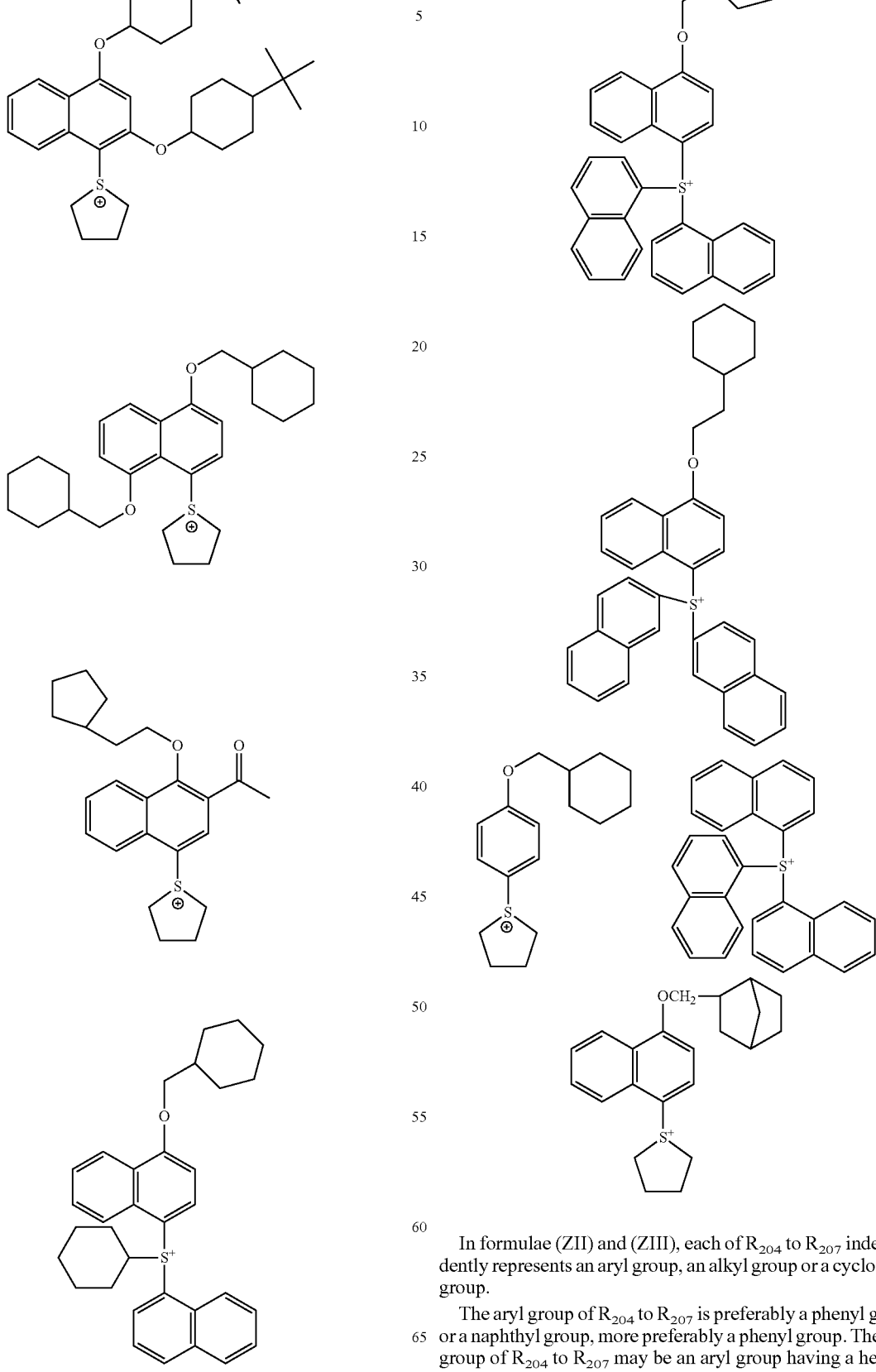
In formulae (ZII) and (ZIII), each of $R_{204}$ to $R_{207}$ independently represents an aryl group, an alkyl group or a cycloalkyl group.
The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene.

The alkyl or cycloalkyl group in $R_{204}$ to $R_{207}$ is preferably a linear or branched alkyl group having a carbon number of 1 to 10 or a cycloalkyl group having a carbon number of 3 to 10.

The aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

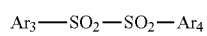
(ZIV)

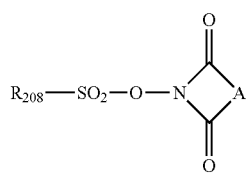
(ZV)

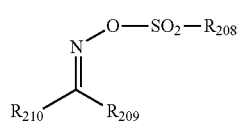
(ZVI)

In formulae (ZIV) to (ZVI), each of $Ar_3$ and $Ar_4$ independently represents an aryl group. Each of $R_{208}$, $R_{209}$ and $R_{210}$ independently represents an alkyl group, a cycloalkyl group or an aryl group. A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group as $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group as $R_{201}$, $R_{202}$ and $R_{203}$ in formula (ZI-2).

The alkylene group of A includes an alkylene group having a carbon number of 1 to 12 (e.g., methylene group, ethylene group, propylene group, isopropylene group, butylenes group, isobutylene group), the alkenylene of A includes an alkenylene group having a carbon number of 2 to 12 (e.g., ethynylene group, propenylene group, butenylene group), and the arylene group of A includes an arylene group having a carbon number of 6 to 10 (e.g., phenylene group, tolylene group, naphthylene group).

Among the acid generators, more preferred are the compounds represented by formulae (ZI) to (ZIII). The acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Out of the acid generators, particularly preferred examples are illustrated below.

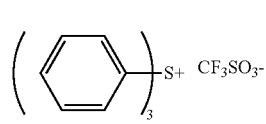
(z1)

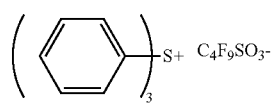
(z2)

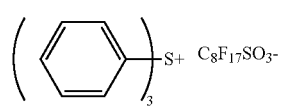
(z3)

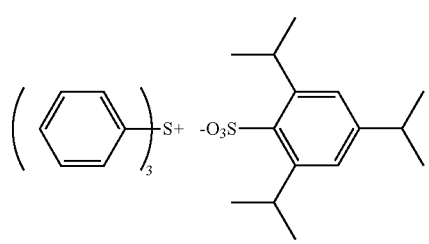
(z4)

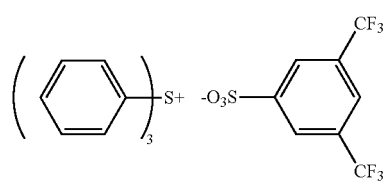
(z5)

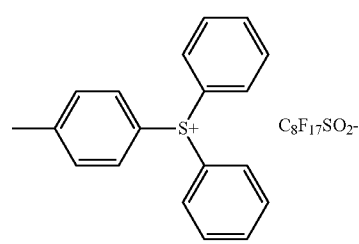
(z6)

-continued
(z7) 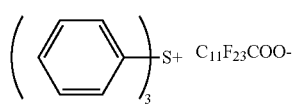
(z8) 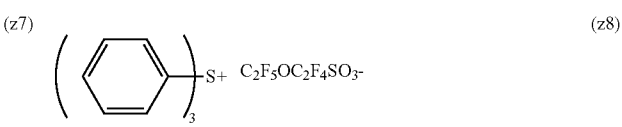
(z9) 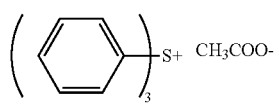
(z10) 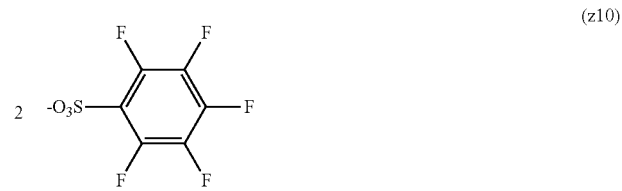
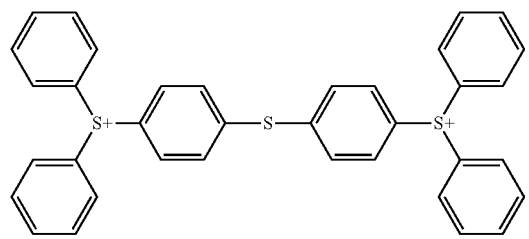
(z11) 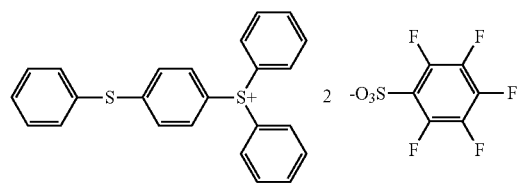
(z12) 
(z13) 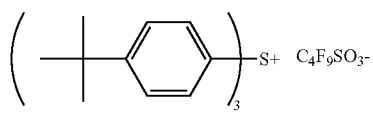
(z14) 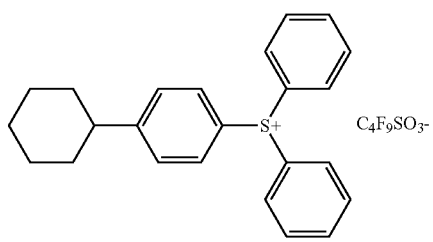
(z15) 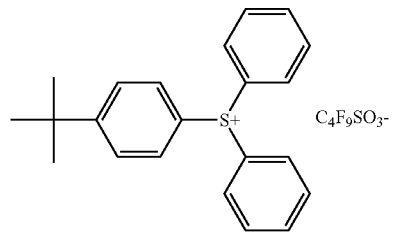
(z16) 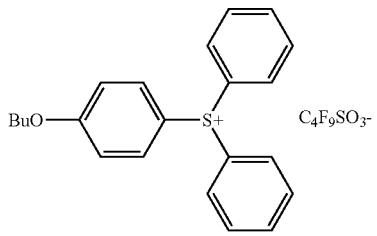
(z17) 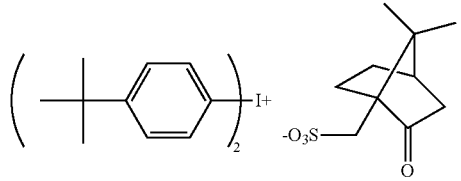
(z18) 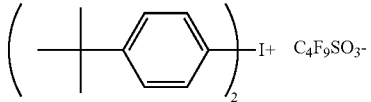
(z19) 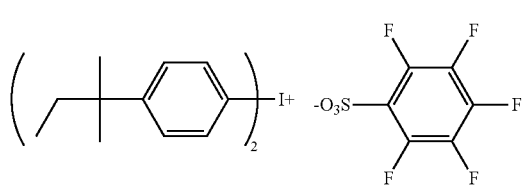
(z20) 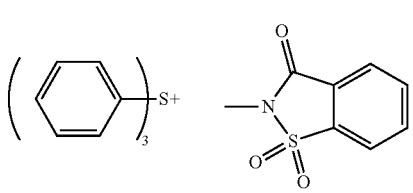

-continued
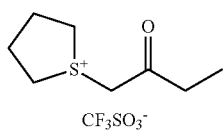 (z21)
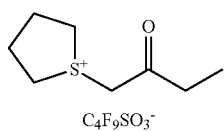 (z22)
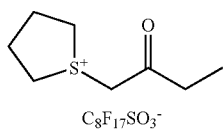 (z23)
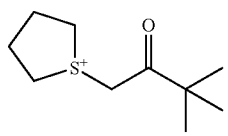 (z24)
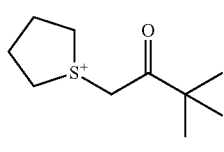 (z25)
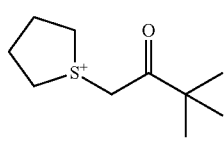 (z26)
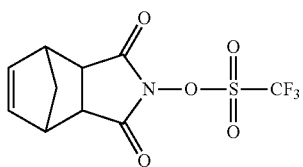 (z27)
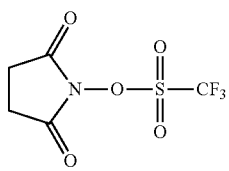 (z28)
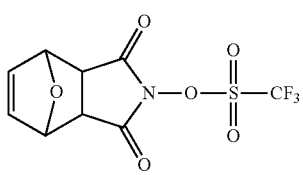 (z29)
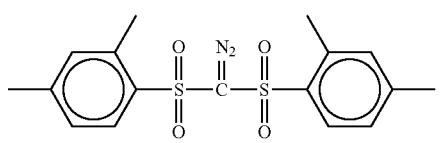 (z30)
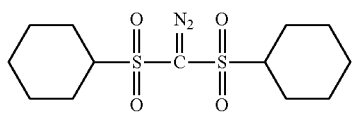 (Z31)
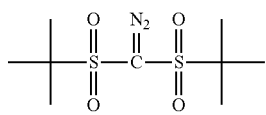 (z32)
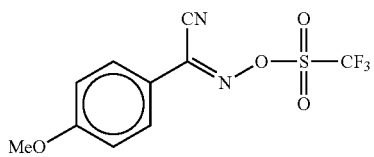 (z33)
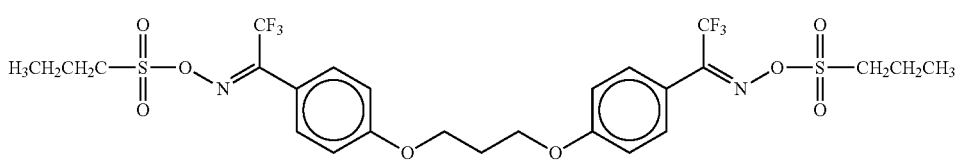 (z34)
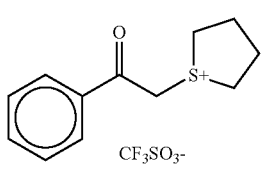 (z35)
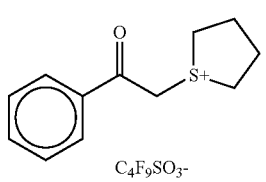 (z36)

-continued
| | |
|---|---|
| (z37) 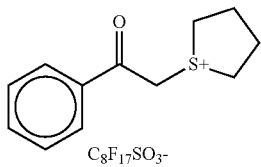 | (z38) 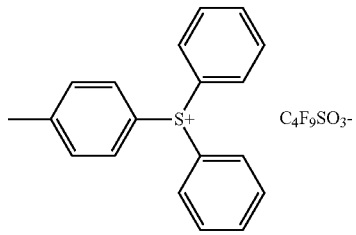 |
| (z39) 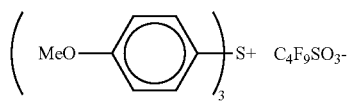 | (z40) 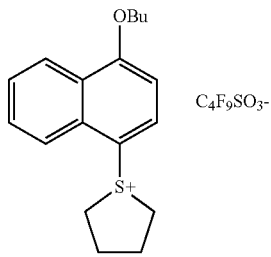 |
| (z41)  | (z42) 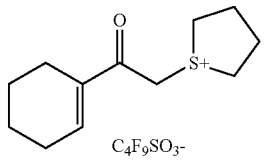 |
| (z43) 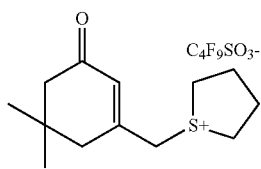 | (z44) 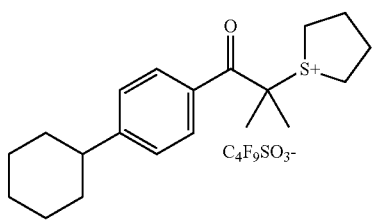 |
| (z45) 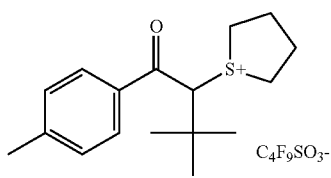 | (z46) 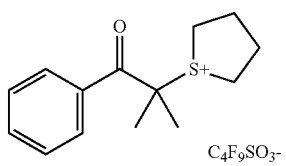 |
| (z47) 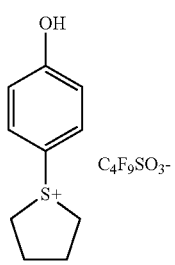 | (z48) 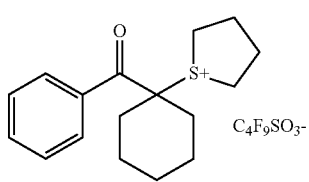 |
| (z49) 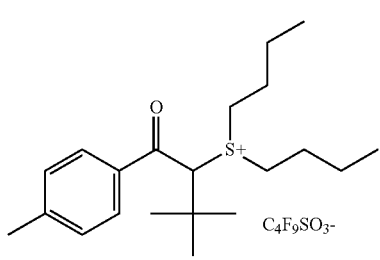 | (z50) 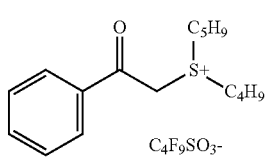 |

-continued
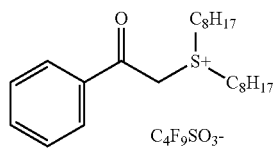
(z51)
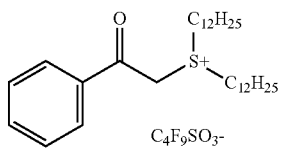
(z52)
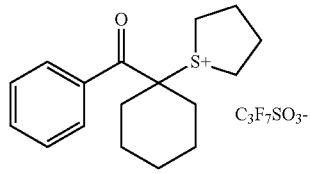
(z53)
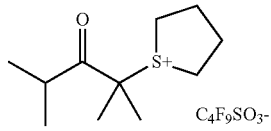
(z54)
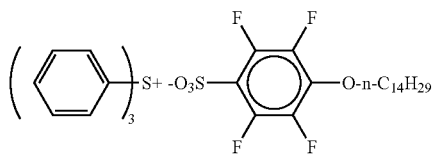
(z55)
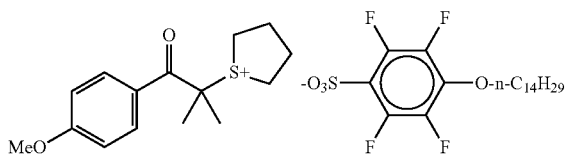
(z56)
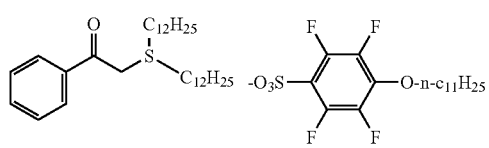
(z57)
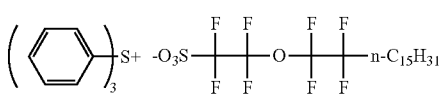
(z58)
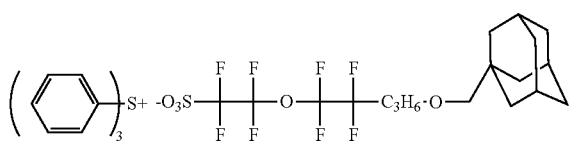
(z59)
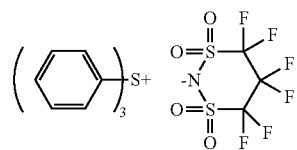
(z61)
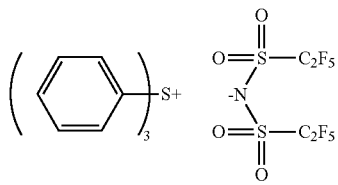
(z62)
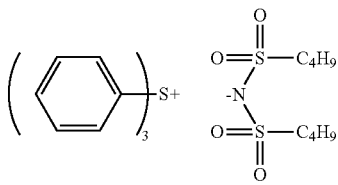
(z63)
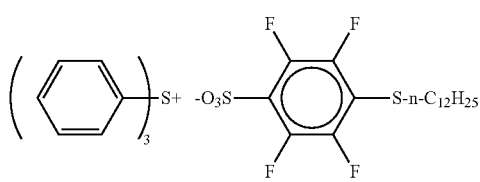
(z64)
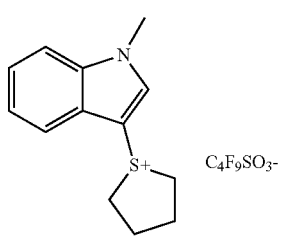
(z65)
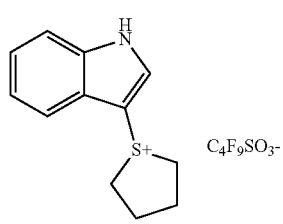
(z66)
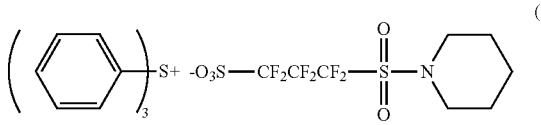
(z67)
(z68)
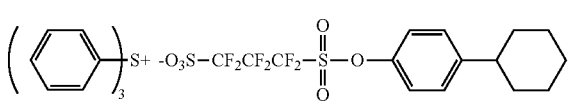

-continued
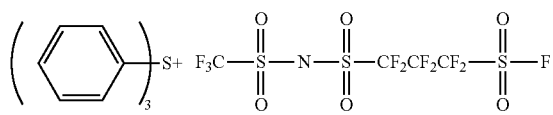
(z69)
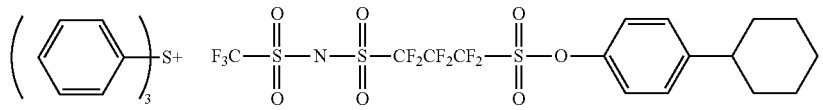
(z70)
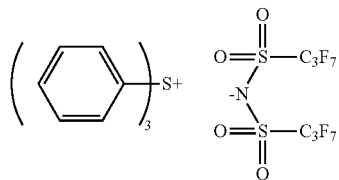
(z71)
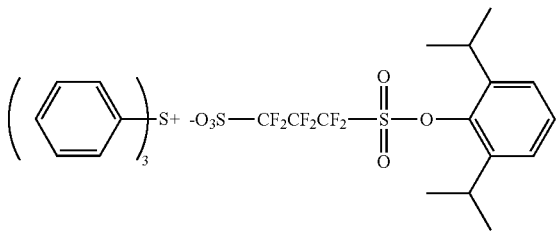
(z72)
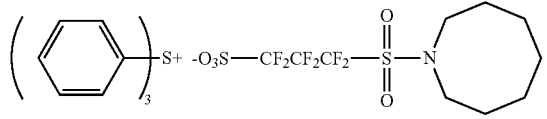
(z73)
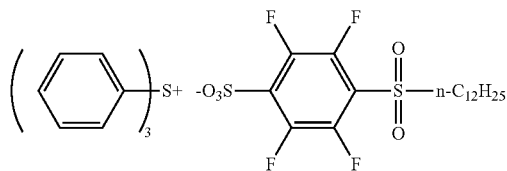
(z74)
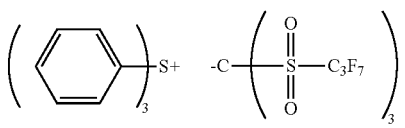
(z75)
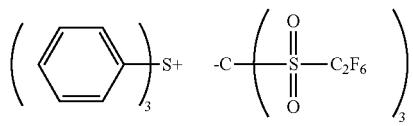
(z76)
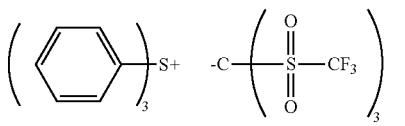
(z77)
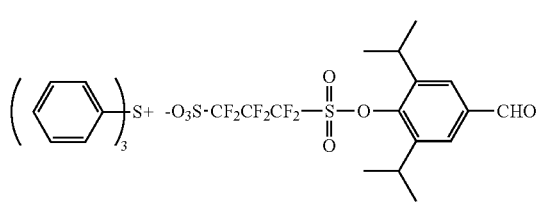
(z78)
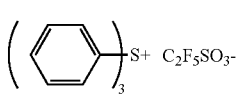
(z79)
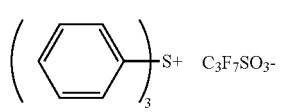
(z80)
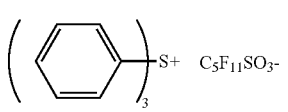
(z81)
(82)
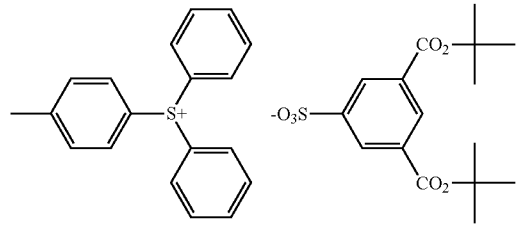
(z83)
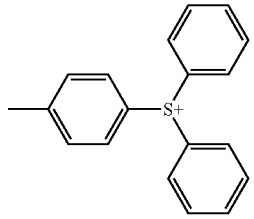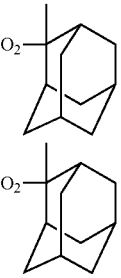

-continued
(z84)
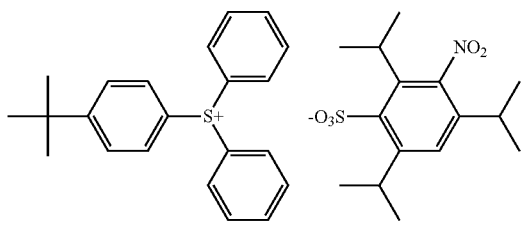
(z85)
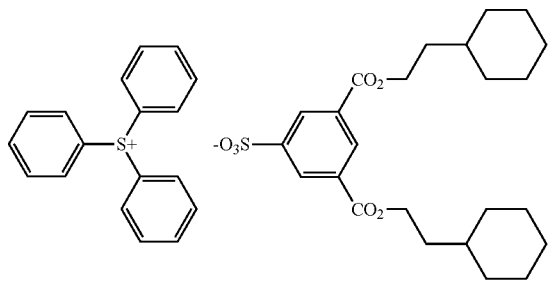
(z86)
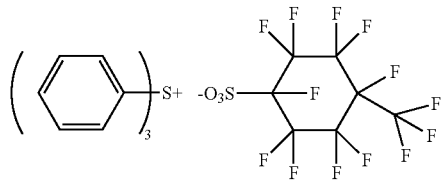
(z87)
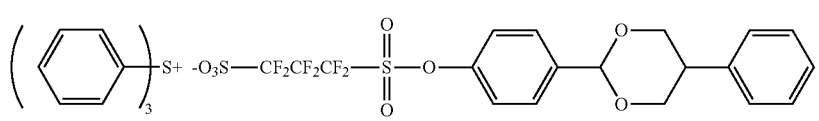
(z88)
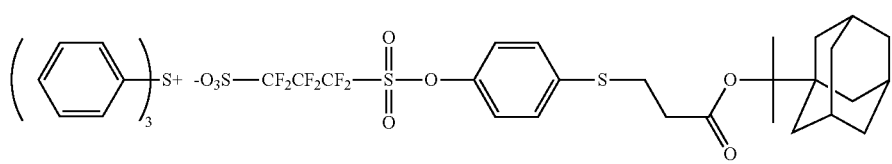
(z89)
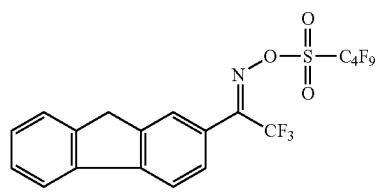
(z90)
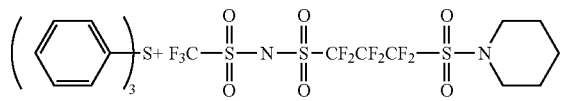
(z91)
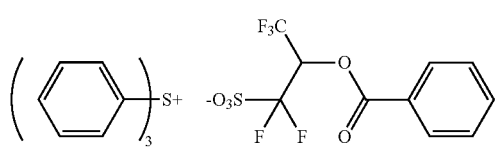
(z92)
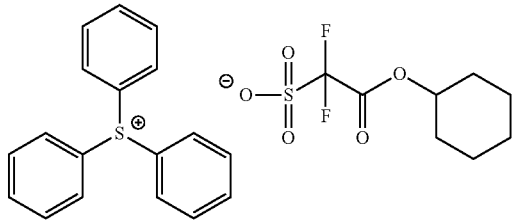
(z93)
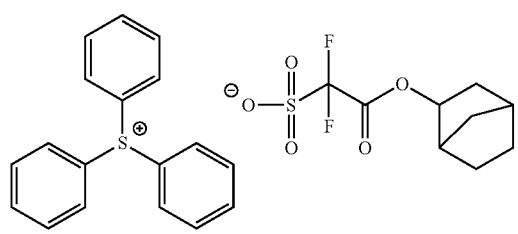
(z94)
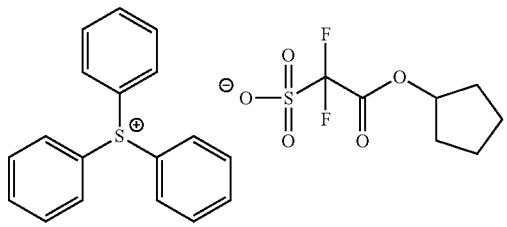

-continued
(z95)
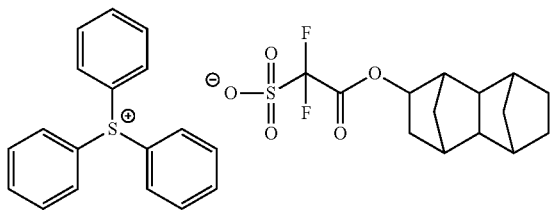
(z96)
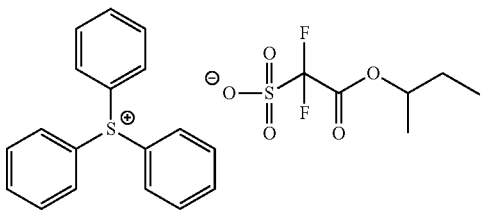
(z97)
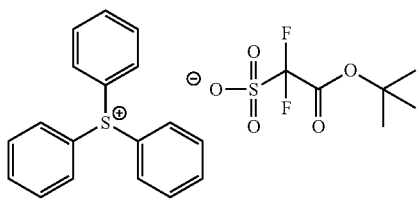
(z98)
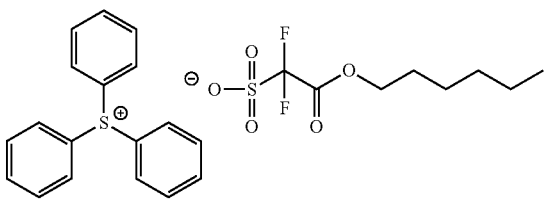
(z99)
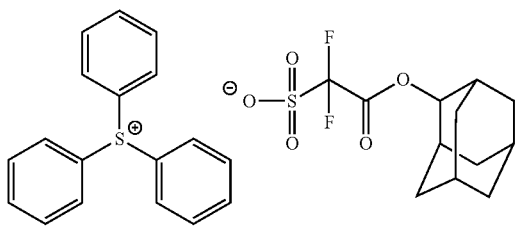
(z100)
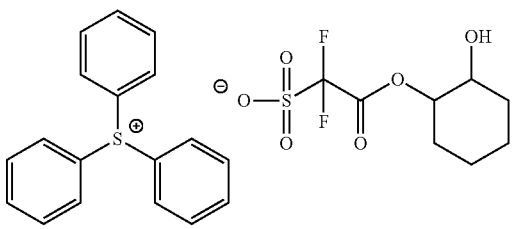
(z101)
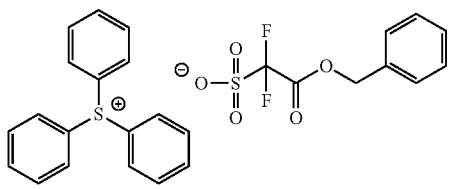
(z102)
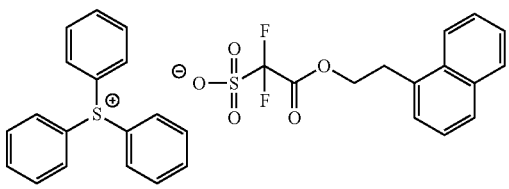
(z103)
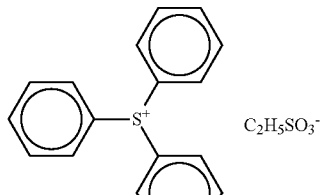 $C_2H_5SO_3^-$
(z104)
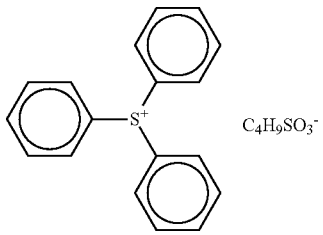 $C_4H_9SO_3^-$
(z105)
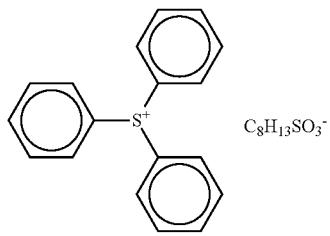 $C_8H_{13}SO_3^-$
(z106)
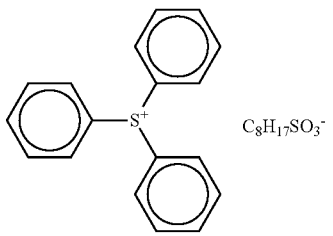 $C_8H_{17}SO_3^-$ -continued
(z107)
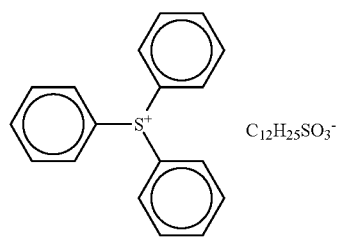
(z108)
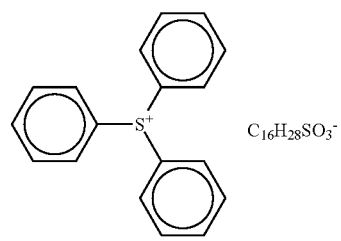
(z109)
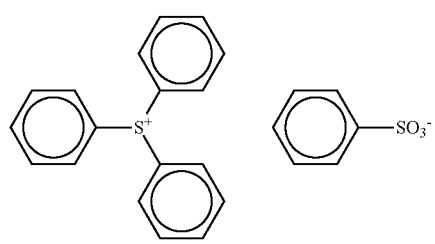
(z110)
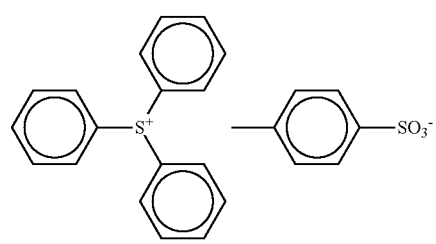
(z111)
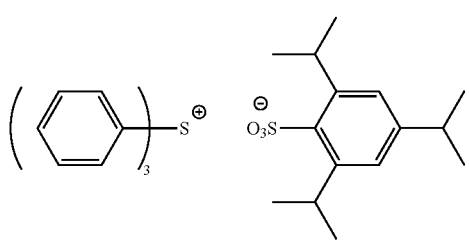
(z112)
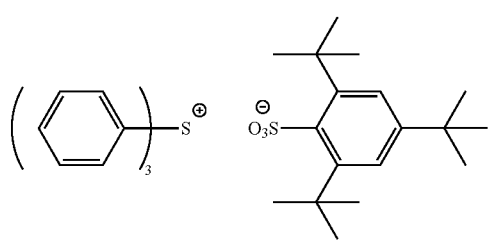
(z113)
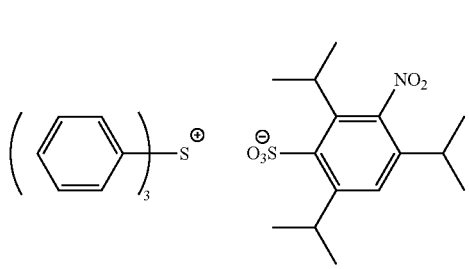
(z114)
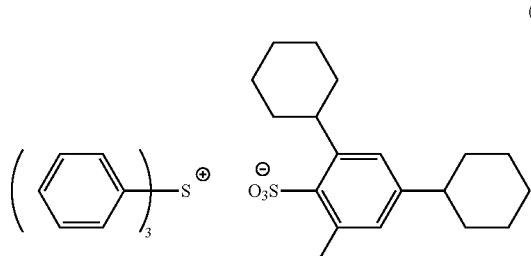
(z115)
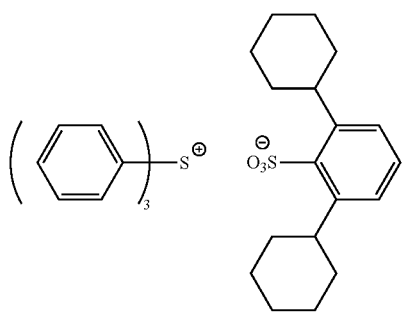
(z116)
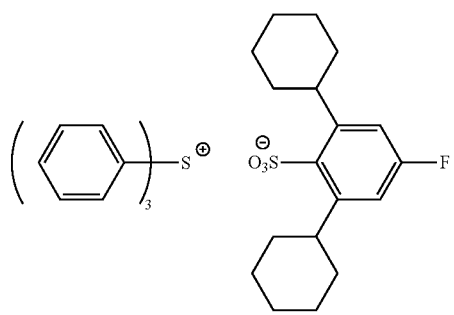

-continued
(z117)
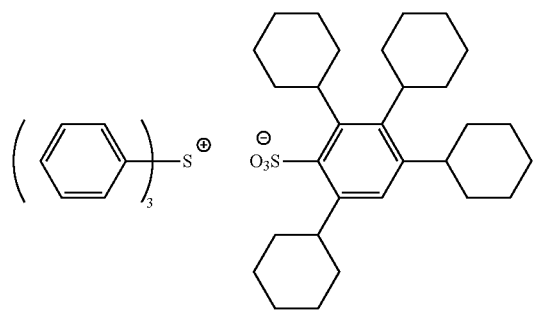
(z118)
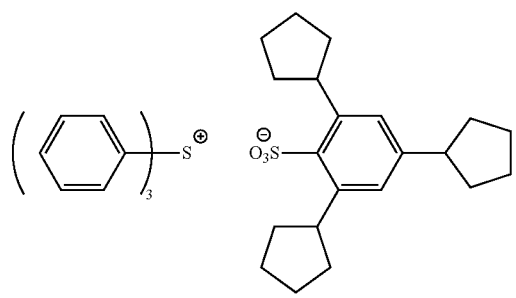
(z119)
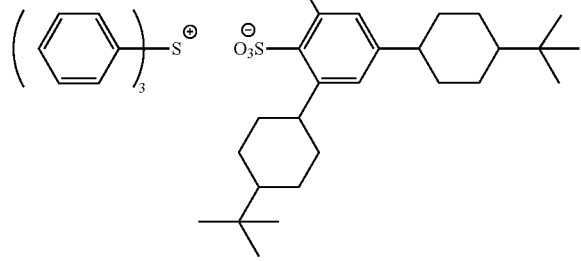
(z120)
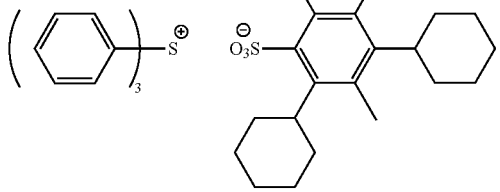
(z121)
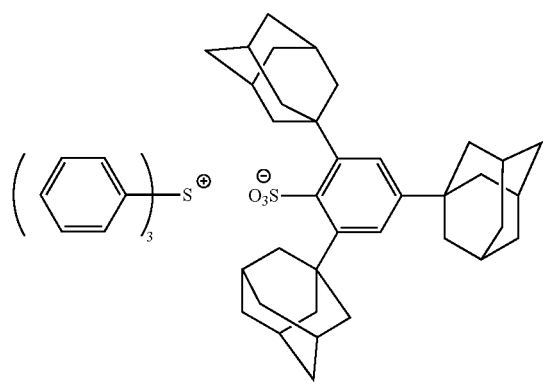
(z122)
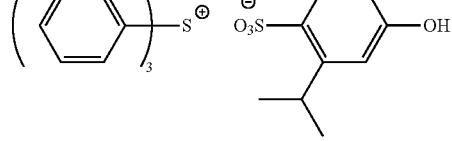
(z123)
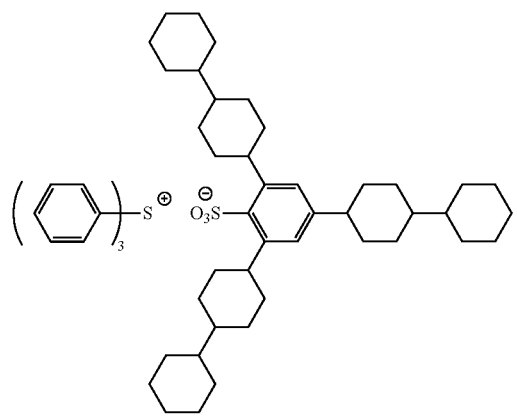
(z124)
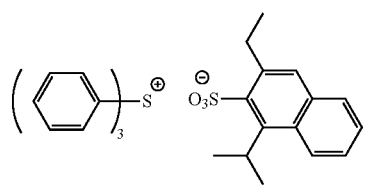

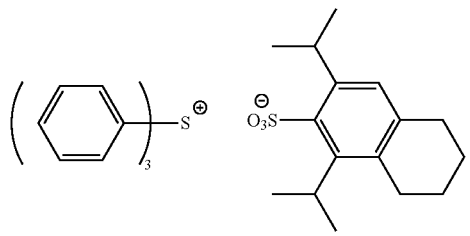 (z125)

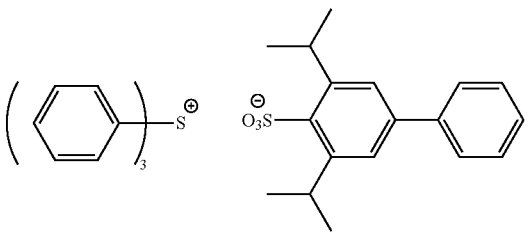 (z126)

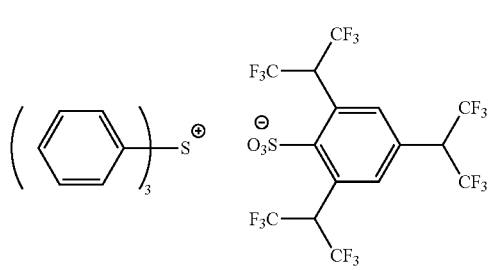 (z127)

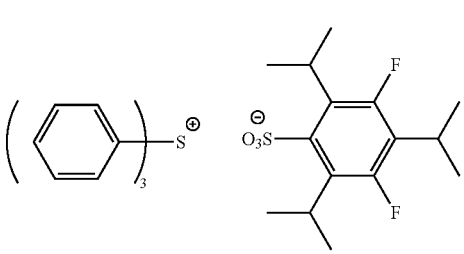 (z128)

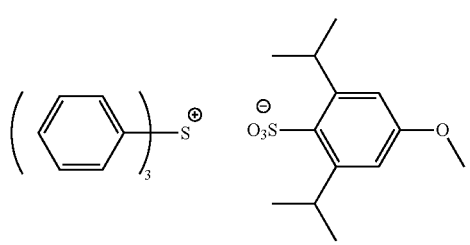 (z129)

As for the acid generator, one kind of an acid generator may be used alone, or two or more kinds of acid generators may be used in combination. The content of the acid generator in the resist composition is preferably from 0.1 to 20 mass %, more preferably from 0.5 to 10 mass %, still more preferably from 1 to 7 mass %, based on the entire solid content of the resist composition.

[3] (C) Crosslinking Agent

In the present invention, a compound capable of crosslinking the resin (A) by the action of an acid (hereinafter referred to as a "crosslinking agent") is used together with the resin (A). Here, a known crosslinking agent can be effectively used.

The crosslinking agent (C) is a compound having a crosslinking group capable of crosslinking the resin (A), and the crosslinking agent (C) is preferably a crosslinking agent of melamine-based compound, urea-based compound, alkylene urea-based compound or glycoluril-based compound.

Preferred examples of the crosslinking agent include a compound having an N-hydroxymethyl group, an N-alkoxymethyl group or an N-acyloxymethyl group.

The compound having an N-hydroxymethyl group, an N-alkoxymethyl group or an N-acyloxymethyl group is preferably a compound having two or more (more preferably from two to eight) partial structures represented by the following formula (CLNM-1).

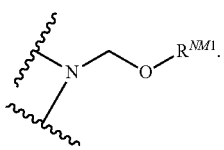 (CLNM-1)

In formula (CLNM-1), $R^{NM1}$ represents a hydrogen atom, an alkyl group, a cycloalkyl group or an oxoalkyl group. The alkyl group of $R^{NM1}$ in formula (CLNM-1) is preferably a linear or branched alkyl group having a carbon number of 1 to 6, and the cycloalkyl group of $R^{NM1}$ is preferably a cycloalkyl group having a carbon number of 5 to 6. The oxoalkyl group of $R^{NM1}$ is preferably an oxoalkyl group having a carbon number of 3 to 6, and examples thereof include a β-oxopropyl group, a β-oxobutyl group, a β-oxopentyl group and a β-oxohexyl group.

More preferred embodiments of the compound having two or more partial structures represented by formula (CLNM-1) include a urea-based crosslinking agent represented by the following formula (CLNM-2), an alkylene urea-based crosslinking agent represented by the following formula (CLNM-3), a glycoluril-based crosslinking agent represented by the following formula (CLNM-4) and a melamine-based crosslinking agent represented by the following formula (CLNM-5).

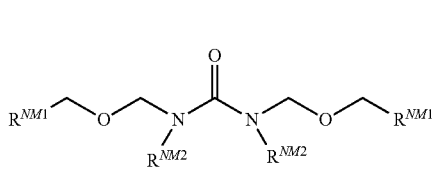

(CLNM-2)

In formula (CLNM-2), each $R^{NM1}$ independently has the same meaning as $R^{NM1}$ in formula (CLNM-1). Each $R^{NM2}$ independently represents a hydrogen atom, an alkyl group (preferably having a carbon number of 1 to 6) or a cycloalkyl group (preferably having a carbon number of 5 to 6).

Specific examples of the urea-based crosslinking agent represented by formula (CLNM-2) include N,N-di(methoxymethyl)urea, N,N-di(ethoxymethyl)urea, N,N-di(propoxymethyl)urea, N,N-di(isopropoxymethyl)urea, N,N-di(butoxymethyl)urea, N,N-di(tert-butoxymethyl)urea, N,N-di(cyclohexyloxymethyl)urea, N,N-di(cyclopentyloxymethyl)urea, N,N-di(adamantyloxymethyl)urea and N,N-di(norbornyloxymethyl)urea.

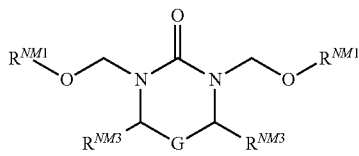

(CLNM-3)

In formula (CLNM-3), each $R^{NM1}$ independently has the same meaning as $R^{NM1}$ in formula (CLNM-1).

Each $R^{NM3}$ independently represents a hydrogen atom, a hydroxyl group, a linear or branched alkyl group (preferably having a carbon number of 1 to 6), a cycloalkyl group (preferably having a carbon number of 5 to 6), an oxoalkyl group (preferably having a carbon number of 3 to 6), an alkoxy group (preferably having a carbon number of 1 to 6) or an oxoalkoxy group (preferably having a carbon number of 1 to 6).

G represents a single bond, an oxygen atom, a sulfur atom, an alkylene group (preferably having a carbon number of 1 to 3) or a carbonyl group. Specific examples thereof include a methylene group, an ethylene group, a propylene group, a 1-methylethylene group, a hydroxymethylene group and a cyanomethylene group.

Specific examples of the alkylene urea-based crosslinking agent represented by formula (CLNM-3) include N,N-di(methoxymethyl)-4,5-di(methoxymethyl)ethylene urea, N,N-di(ethoxymethyl)-4,5-di(ethoxymethyl)ethylene urea, N,N-di(propoxymethyl)-4,5-di(propoxymethyl)ethylene urea, N,N-di(isopropoxymethyl)-4,5-di(isopropoxymethyl)ethylene urea, N,N-di(butoxymethyl)-4,5-di(butoxymethyl)ethylene urea, N,N-di(tert-butoxymethyl)-4,5-di(tert-butoxymethyl)ethylene urea, N,N-di(cyclohexyloxymethyl)-4,5-di(cyclohexyloxymethyl)ethylene urea, N,N-di(cyclopentyloxymethyl)-4,5-di(cyclopentyloxymethyl)ethylene urea, N,N-di(adamantyloxymethyl)-4,5-di(adamantyloxymethyl)ethylene urea and N,N-di(norbornyloxymethyl)-4,5-di(norbornyloxymethyl)ethylene urea.

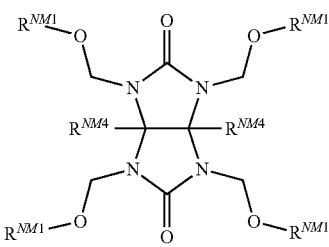

(CLNM-4)

In formula (CLNM-4), each $R^{NM1}$ independently has the same meaning as $R^{NM1}$ in formula (CLNM-1).

Each $R^{NM4}$ independently represents a hydrogen atom, a hydroxyl group, an alkyl group, a cycloalkyl group or an alkoxy group.

Specific examples of the alkyl group (preferably having a carbon number of 1 to 6), cycloalkyl group (preferably having a carbon number of 5 to 6) and alkoxy group (preferably having a carbon number of 1 to 6) of $R^{NM4}$ include a methyl group, an ethyl group, a butyl group, a cyclopentyl group, a cyclohexyl group, a methoxy group, an ethoxy group and a butoxy group.

Specific examples of the glycoluril-based crosslinking agent represented by formula (CLNM-4) include N,N,N,N-tetra(methoxymethyl)glycoluril, N,N,N,N-tetra(ethoxymethyl)glycoluril, N,N,N,N-tetra(propoxymethyl)glycoluril, N,N,N,N-tetra(isopropoxymethyl)glycoluril, N,N,N,N-tetra(butoxymethyl)glycoluril, N,N,N,N-tetra(tert-butoxymethyl)glycoluril, N,N,N,N-tetra(cyclohexyloxymethyl)glycoluril, N,N,N,N-tetra(cyclopentyloxymethyl)glycoluril, N,N,N,N-tetra(adamantyloxymethyl)glycoluril and N,N,N,N-tetra(norbornyloxymethyl)glycoluril.

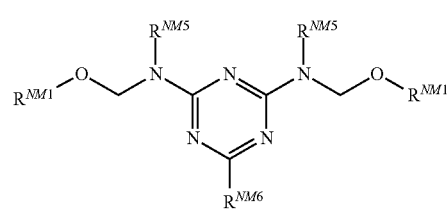

(CLNM-5)

In formula (CLNM-5), each $R^{NM1}$ independently has the same meaning as $R^{NM1}$ in formula (CLNM-1).

Each $R^{NM5}$ independently represents a hydrogen atom, an alkyl group, a cycloalkyl group, an aryl group or an atomic group represented by the following formula (CLNM-5').

$R^{NM6}$ represents a hydrogen atom, an alkyl group, a cycloalkyl group, an aryl group or an atomic group represented by the following formula (CLNM-5").

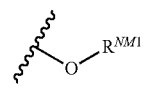

(CLNM-5')

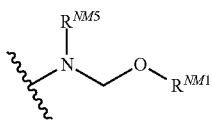
(CLNM-5″)

In formula (CLNM-5'), $R^{NM1}$ has the same meaning as $R^{NM1}$ in formula (CLNM-1).

In formula (CLNM-5″), $R^{NM1}$ has the same meaning as $R^{NM1}$ in formula (CLNM-1), and $R^{NM5}$ has the same meaning as $R^{NM5}$ in formula (CLNM-5).

More specific examples of the alkyl group (preferably having a carbon number of 1 to 6), cycloalkyl group (preferably having a carbon number of 5 to 6) and aryl group (preferably having a carbon number of 6 to 10) of $R^{NM5}$ and $R^{NM6}$ include a methyl group, an ethyl group, a propyl group, an isopropyl group, a butyl group, an isobutyl group, a tert-butyl group, a pentyl group, a cyclopentyl group, a hexyl group, a cyclohexyl group, a phenyl group and a naphthyl group.

Examples of the melamine-based crosslinking agent represented by formula (CLNM-5) include N,N,N,N,N,N-hexa(methoxymethyl)melamine, N,N,N,N,N,N-hexa(ethoxymethyl)melamine, N,N,N,N,N,N-hexa(propoxymethyl)melamine, N,N,N,N,N,N-hexa(isopropoxymethyl)melamine, hexa(butoxymethyl)melamine, N,N,N,N,N,N-hexa(tert-butoxymethyl)melamine, N,N,N,N,N,N-hexa(cyclohexyloxymethyl)melamine, N,N,N,N,N,N-hexa(cyclopentyl oxymethyl)melamine, N,N,N,N,N,N-hexa(adamantyloxymethyl)melamine, N,N,N,N,N,N-hexa(norbornyloxymethyl)melamine, N,N,N,N,N,N-hexa(methoxymethyl)acetoguanamine, N,N,N,N,N,N-hexa(ethoxymethyl)acetoguanamine, N,N,N,N,N,N-hexa(propoxymethyl)acetoguanamine, N,N,N,N,N,N-hexa(isopropoxymethyl)acetoguanamine, N,N,N,N,N,N-hexa(butoxymethyl)acetoguanamine, N,N,N,N,N,N-hexa(tert-butoxymethyl)acetoguanamine, N,N,N,N,N,N-hexa(methoxymethyl)benzoguanamine, N,N,N,N,N,N-hexa(ethoxymethyl)benzoguanamine, N,N,N,N,N,N-hexa(propoxymethyl)benzoguanamine, N,N,N,N,N,N-hexa(isopropoxymethyl)benzoguanamine, N,N,N,N,N,N-hexa(butoxymethyl)benzoguanamine and N,N,N,N,N,N-hexa(tert-butoxymethyl)benzoguanamine.

The groups represented by $R^{NM1}$ to $R^{NM6}$ in formulae (CLNM-1) to (CLNM-5) may further have a substituent. Examples of the substituent which $R^{NM1}$ to $R^{NM6}$ may have include a halogen atom, a hydroxyl group, a nitro group, a cyano group, a carboxyl group, a cycloalkyl group (preferably having a carbon number of 3 to 20), an aryl group (preferably having a carbon number of 6 to 14), an alkoxy group (preferably having a carbon number of 1 to 20), a cycloalkoxy group (preferably having a carbon number of 4 to 20), an acyl group (preferably having a carbon number of 2 to 20) and an acyloxy group (preferably having a carbon number of 2 to 20).

The crosslinking agent (C) may be a phenol compound having a benzene ring in a molecule.

The phenol compound is preferably a phenol derivative having a molecular weight of 1,200 or less, containing from three to five benzene rings in the molecule and further having two or more hydroxymethyl groups or alkoxymethyl groups in total, where the hydroxymethyl groups or alkoxymethyl groups are bonded in a concentrated manner to at least any one benzene ring or distributed among the benzene rings. By virtue of using such a phenol derivative, the effects of the present invention are more remarkably brought out. The alkoxymethyl group bonded to the benzene ring is preferably an alkoxymethyl group having a carbon number of 6 or less. Specifically, a methoxymethyl group, an ethoxymethyl group, an n-propoxymethyl group, an i-propoxymethyl group, an n-butoxymethyl group, an i-butoxymethyl group, a sec-butoxymethyl group, or a tert-butoxymethyl group is preferred. An alkoxy-substituted alkoxy group such as 2-methoxyethoxy group and 2-methoxy-1-propyl group is also preferred.

The phenol compound is preferably a phenol compound containing two or more benzene rings in the molecule and is preferably a phenol compound containing no nitrogen atom.

Specifically, a phenol compound having from two to eight crosslinking groups capable of crosslinking the resin (A) per molecule is preferred, and it is more preferred to have from three to six crosslinking groups.

Out of these phenol derivatives, particularly preferred compounds are illustrated below. In the formulae, each of $L^1$ to $L^8$, which may be the same or different, represents a crosslinking group, and the crosslinking group is preferably a hydroxymethyl group, a methoxymethyl group or an ethoxymethyl group.

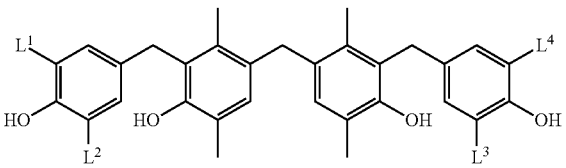

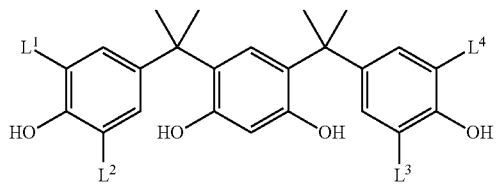

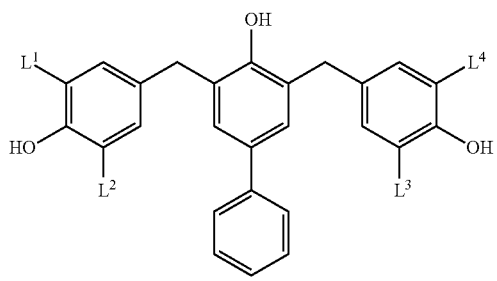

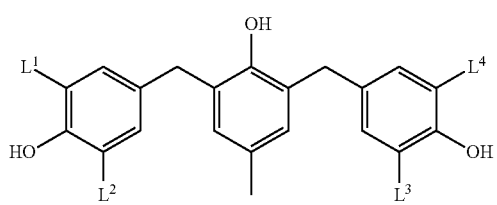

111
-continued
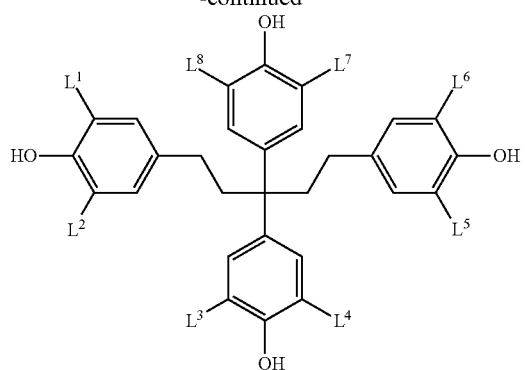
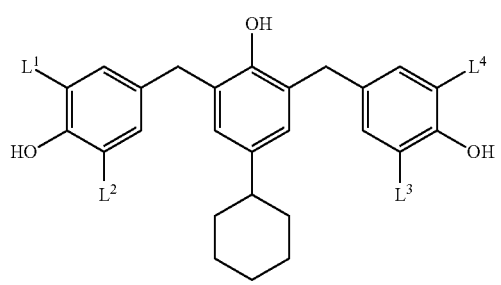
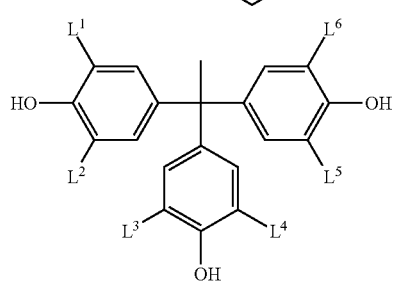
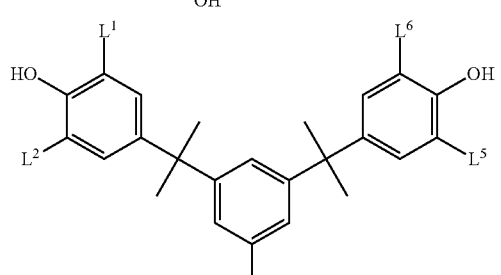
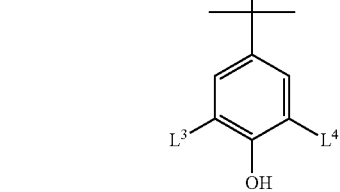
112
-continued
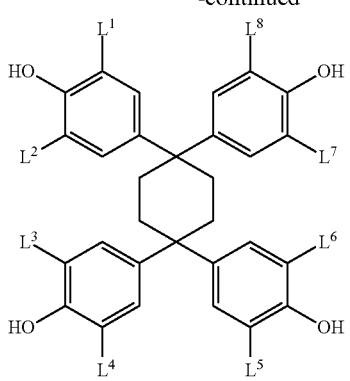
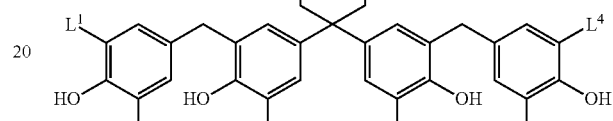
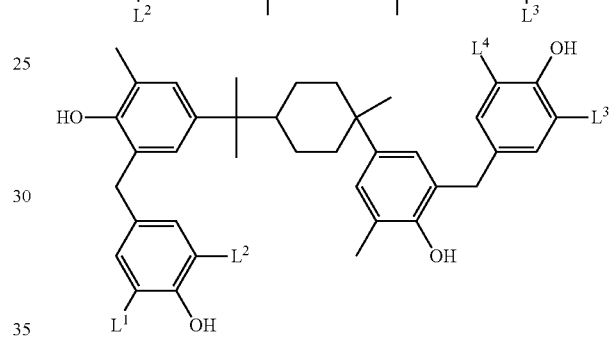
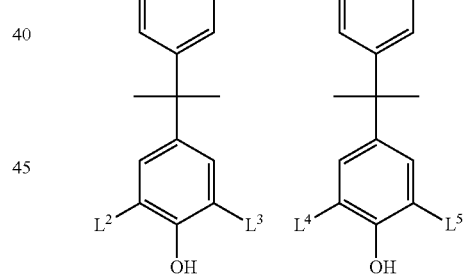
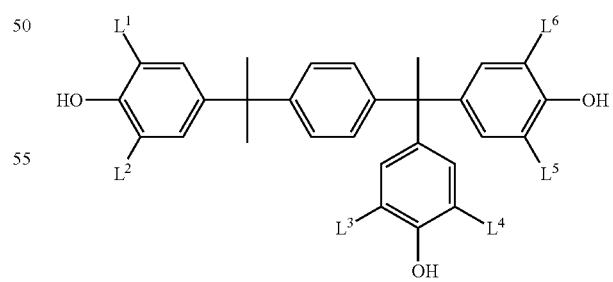
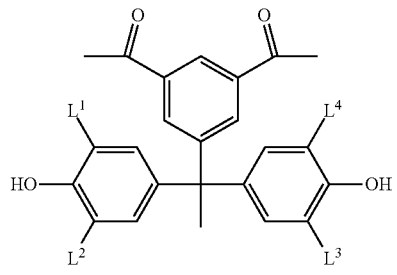
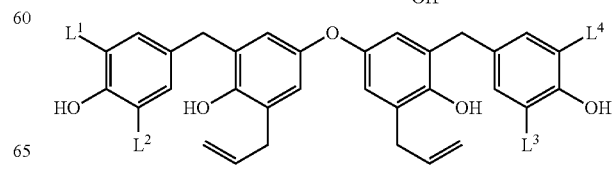

-continued

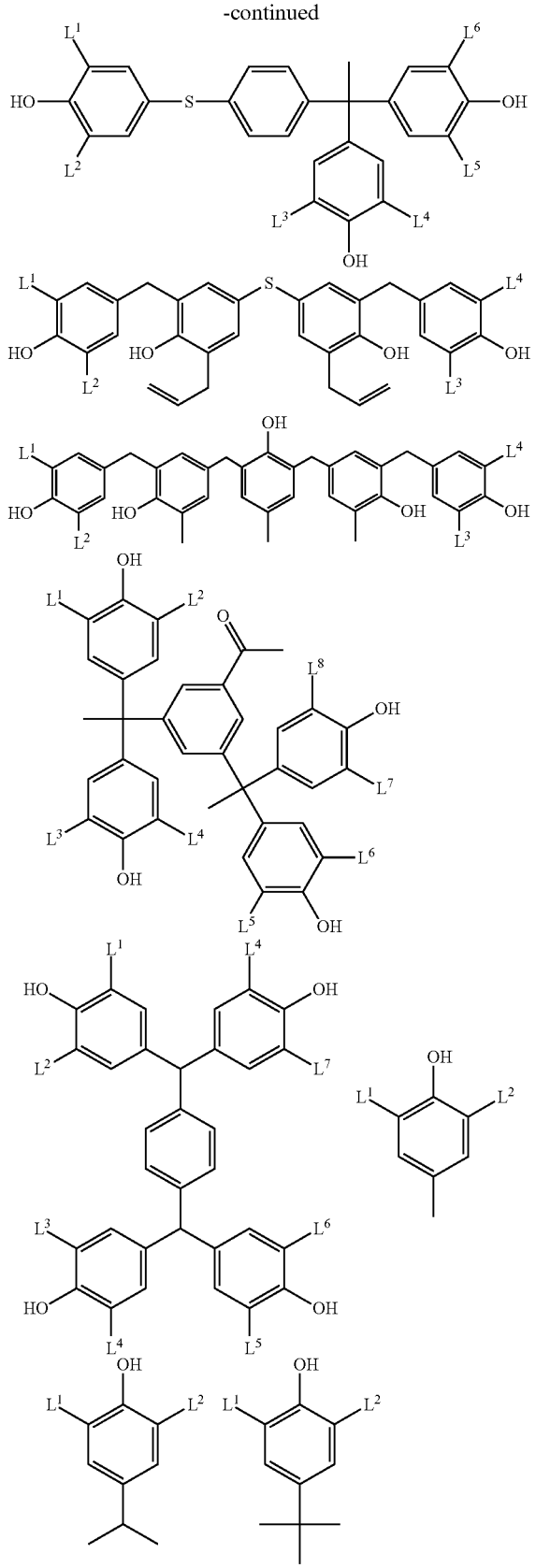

As for the phenol compound, a commercially available product may be used, or the compound may be synthesized by a known method. For example, a phenol derivative having a hydroxymethyl group can be obtained by reacting a phenol compound having no corresponding hydroxymethyl group (a compound where in the formulae above, each of $L^1$ to $L^8$ is a hydrogen atom) with formaldehyde in the presence of a base catalyst. At this time, in order to prevent resinification or gelling, the reaction is preferably performed at a temperature of 60° C. or less. Specifically, the compound can be synthesized by the method described, for example, in JP-A-6-282067 and JP-A-7-64285.

A phenol derivative having an alkoxymethyl group can be obtained by reacting a phenol derivative having a corresponding hydroxymethyl group with an alcohol in the presence of an acid catalyst. At this time, in order to prevent resinification or gelling, the reaction is preferably performed at a temperature of 100° C. or less. Specifically, the compound can be synthesized by the method described, for example, in EP632003A1. The thus-synthesized phenol derivative having a hydroxymethyl group or an alkoxymethyl group is preferred in view of stability during storage, and a phenol derivative having an alkoxymethyl group is particularly preferred in view of stability during storage. One of these phenol derivatives having two or more hydroxymethyl groups or alkoxymethyl groups in total that are bonded in a concentrated manner to any one benzene ring or distributed among the benzene rings, may be used alone, or two or more thereof may be used in combination.

The crosslinking agent (C) may be an epoxy compound having an epoxy group in the molecule.

The epoxy compound includes a compound represented by the following formula (EP2).

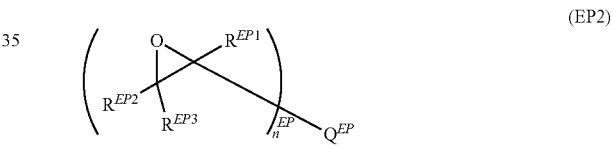

(EP2)

In formula (EP2), each of $R^{EP1}$ to $R^{EP3}$ independently represents a hydrogen atom, a halogen atom, an alkyl group or a cycloalkyl group, and these alkyl group and cycloalkyl group may have a substituent. Also, $R^{EP1}$ and $R^{EP2}$, or $R^{EP2}$ and $R^{EP3}$ may combine with each other to form a ring structure.

Examples of the substituent which the alkyl group and cycloalkyl group may have include a hydroxyl group, a cyano group, an alkoxy group, an alkylcarbonyl group, an alkoxycarbonyl group, an alkylcarbonyloxy group, an alkylthio group, an alkylsulfone group, an alkylsulfonyl group, an alkylamino group and an alkylamide group.

$Q^{EP}$ represents a single bond or an $n^{EP}$-valent organic group. $R^{EP1}$ to $R^{EP3}$ may combine not only with each other but also with $Q^{EP}$ to form a ring structure.

$n^{EP}$ represents an integer of 2 or more and is preferably an integer of 2 to 10, more preferably from 2 to 6. However, when $Q^{EP}$ is a single bond, $n^{EP}$ is 2.

In the case where $Q^{EP}$ is an $n^{EP}$-valent organic group, for example, a chain or cyclic saturated hydrocarbon structure (preferably having a carbon number of 2 to 20), an aromatic ring structure (preferably having a carbon number of 6 to 30), or a structure where these structures are linked by a structure such as ether, ester, amide and sulfonamide, is preferred.

Specific examples of the (B) compound having an epoxy structure are illustrated below, but the present invention is not limited thereto.

115 116
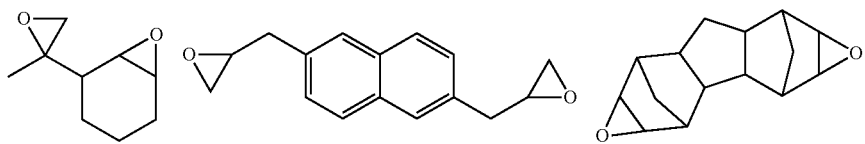
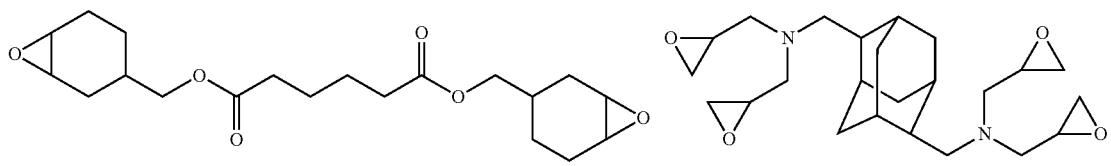
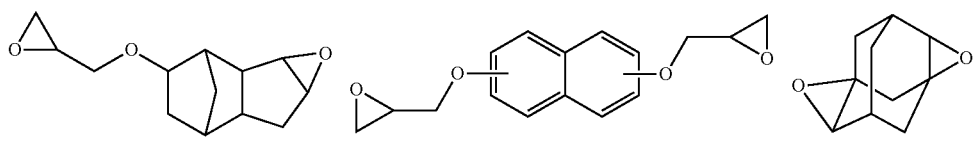
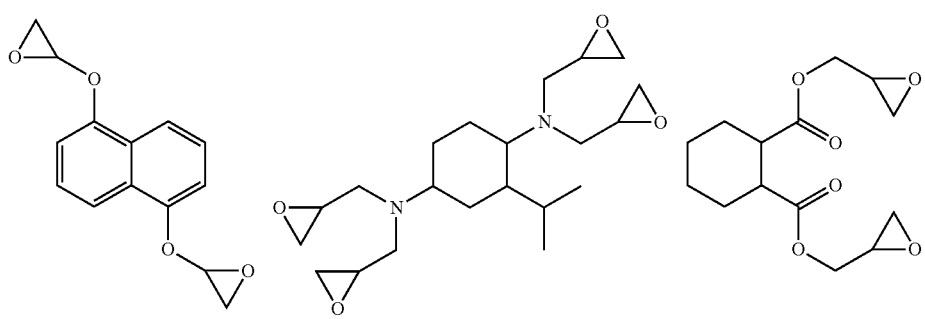
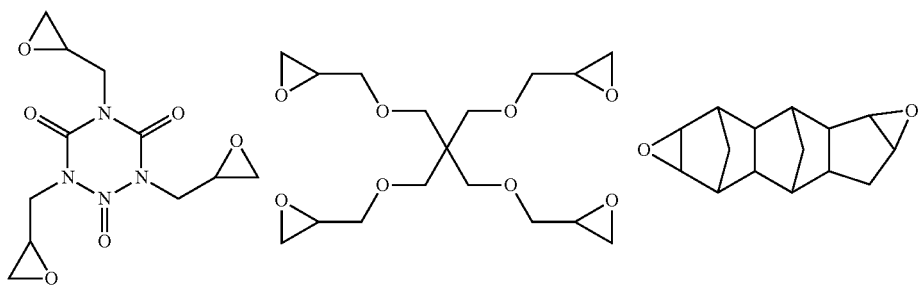
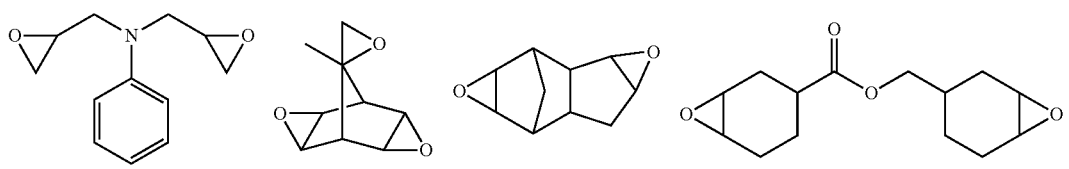
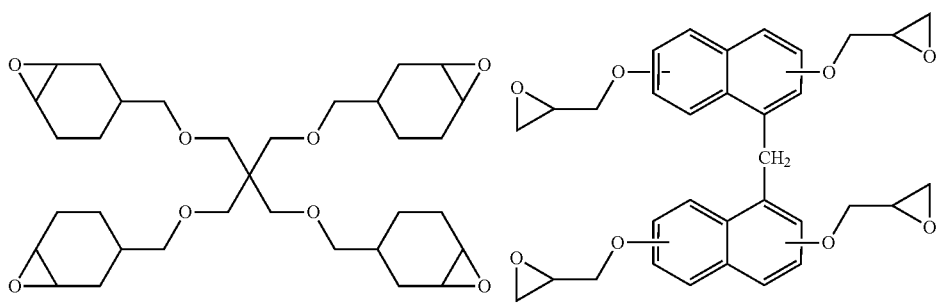

-continued
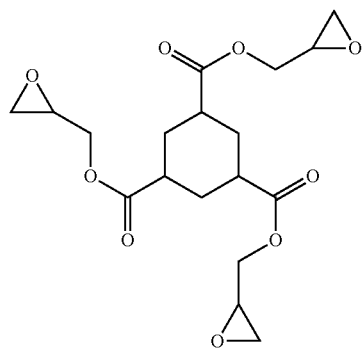
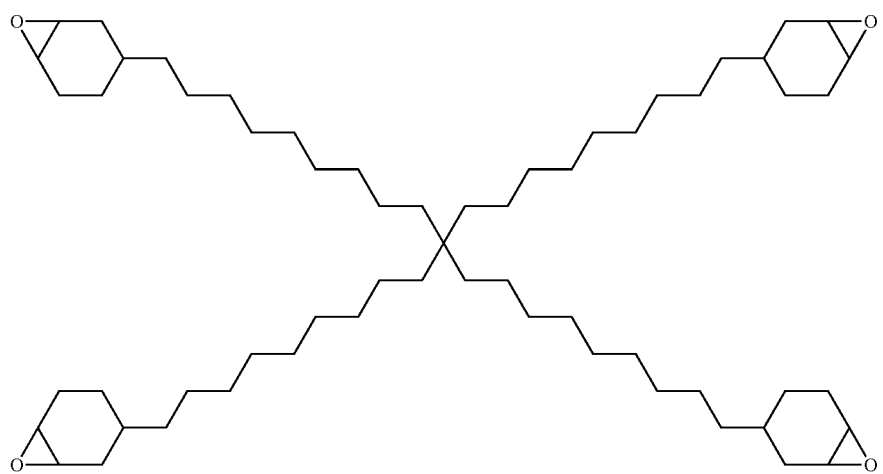
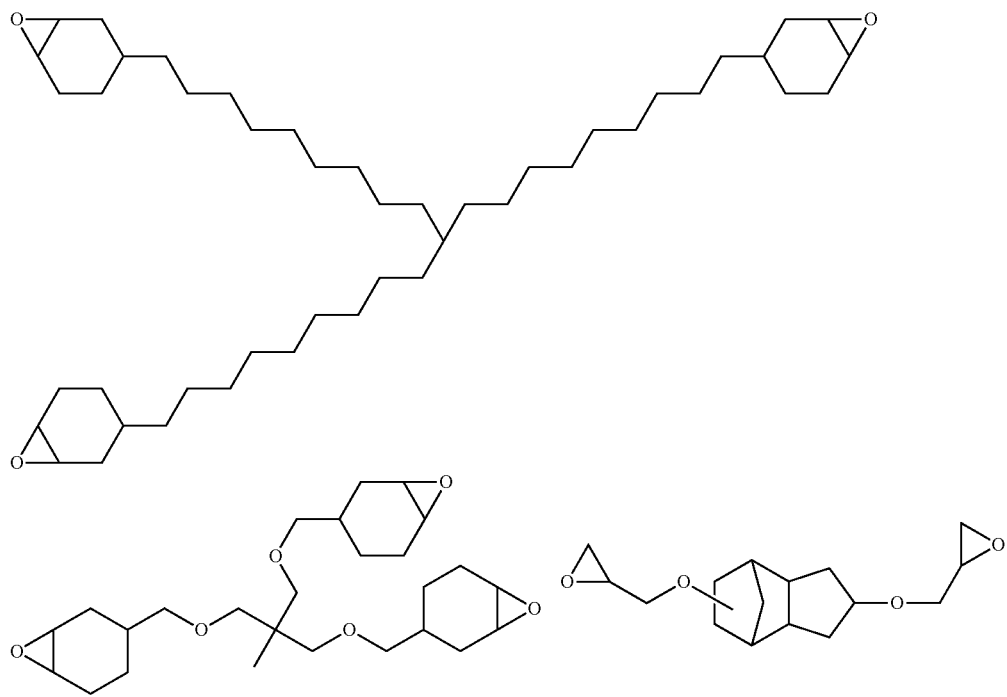

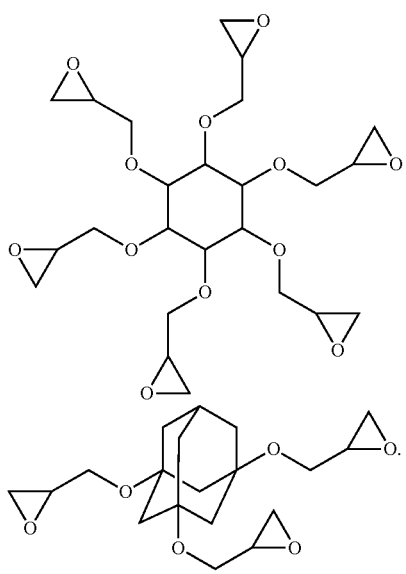
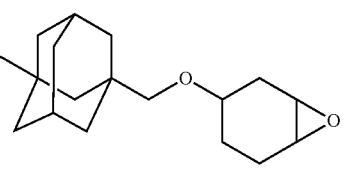

-continued

In the present invention, one crosslinking agent may be used alone, or two or more crosslinking agents may be used in combination.

The content of the crosslinking agent in the resist composition is preferably from 3 to 15 mass %, more preferably from 4 to 12 mass %, still more preferably form 5 to 10 mass %, based on the entire solid content of the resist composition.

[4] (D) Solvent

The resist composition for use in the present invention contains a solvent.

Examples of the solvent which can be used at the time of preparing the resist composition for use in the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Specific examples and preferred examples of these solvents are the same as those described in paragraphs [0244] to [0248] of JP-A-2008-292975.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent not containing a hydroxyl group is preferably an alkylene glycol monoalkyl ether acetate, an alkyl alkoxypropionate, a monoketone compound which may contain a ring, a cyclic lactone, an alkyl acetate or the like, more preferably propylene glycol monomethyl ether acetate (PGMEA, another name: 1-methoxy-2-acetoxypropane), ethyl ethoxy propionate, 2-heptanone, γ-butyrolactone, cyclohexanone or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group accounts for 50 mass % or more is particularly preferred in view of coating uniformity.

The solvent is preferably a mixed solvent of two or more kinds of solvents containing propylene glycol monomethyl ether acetate.

[5] Hydrophobic Resin (HR)

The resist composition for use in the present invention may contain a hydrophobic resin having at least either a fluorine atom or a silicon atom particularly when the resist composition is applied to immersion exposure. The hydrophobic resin (HR) is unevenly distributed to the film surface layer and when the immersion medium is water, the static/dynamic contact angle on the resist film surface for water as well as the followability of immersion liquid can be enhanced.

The hydrophobic resin (HR) is, as described above, unevenly distributed to the interface but unlike a surfactant, need not have necessarily a hydrophilic group in the molecule and may not contribute to uniform mixing of polar/nonpolar substances.

The hydrophobic resin typically contains a fluorine atom and/or a silicon atom. Such a fluorine atom and/or silicon atom may be contained in the main chain of resin or contained in the side chain.

In the case where the hydrophobic resin contains a fluorine atom, the resin preferably contains, as the fluorine atom-containing partial structure, a fluorine atom-containing alkyl group, a fluorine atom-containing cycloalkyl group or a fluorine atom-containing aryl group.

The fluorine atom-containing alkyl group is a linear or branched alkyl group with at least one hydrogen atom being replaced by a fluorine atom. This alkyl group preferably has a carbon number of 1 to 10, more preferably from 1 to 4. The fluorine atom-containing alkyl group may further have a substituent other than fluorine atom.

The fluorine atom-containing cycloalkyl group is a monocyclic or polycyclic cycloalkyl group with at least one hydrogen atom being replaced by a fluorine atom. This fluorine atom-containing cycloalkyl group may further have a substituent other than fluorine atom.

The fluorine atom-containing aryl group is an aryl group with at least one hydrogen atom being replaced by a fluorine atom. Examples of this aryl group include a phenyl group and a naphthyl group. The fluorine atom-containing aryl group may further have a substituent other than fluorine atom.

Preferred examples of the fluorine atom-containing alkyl group, fluorine atom-containing cycloalkyl group and fluorine atom-containing aryl group include the groups represented by the following formulae (F2) to (F4).

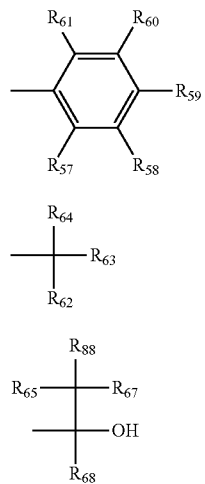

In formulae (F2) to (F4), each of $R_{57}$ to $R_{68}$ independently represents a hydrogen atom, a fluorine atom or an alkyl group. However, at least one of $R_{57}$ to $R_{61}$ represents a fluorine atom or an alkyl group with at least one hydrogen atom being replaced by a fluorine atom, at least one of $R_{62}$ to $R_{64}$ represents a fluorine atom or an alkyl group with at least one hydrogen atom being replaced by a fluorine atom, and at least one of $R_{65}$ to $R_{68}$ represents a fluorine atom or an alkyl group with at least one hydrogen atom being replaced by a fluorine atom. The alkyl group preferably has a carbon number of 1 to 4.

It is preferred that all of $R_{57}$ to $R_{61}$ and $R_{65}$ to $R_{67}$ are a fluorine atom.

Each of $R_{62}$, $R_{63}$ and $R_{68}$ is preferably an alkyl group with at least one hydrogen atom being replaced by a fluorine atom, more preferably a perfluoroalkyl group having a carbon number of 1 to 4. $R_{62}$ and $R_{63}$ may combine with each other to form a ring.

Examples of the group represented by formula (F2) include p-fluorophenyl group, pentafluorophenyl group and 3,5-di(trifluoromethyl)phenyl group.

Examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Examples of the group represented by formula (F4) include $-C(CF_3)_2OH$, $-C(C_2F_5)_2OH$, $-C(CF_3)(CH_3)OH$ and $-CH(CF_3)OH$, with $-C(CF_3)_2OH$ being preferred.

Specific examples of the repeating unit containing a fluorine atom are illustrated below.

In specific examples, $X_1$ represents a hydrogen atom, $-CH_3$, $-F$ or $-CF_3$, and $X_2$ represents $-F$ or $-CF_3$.

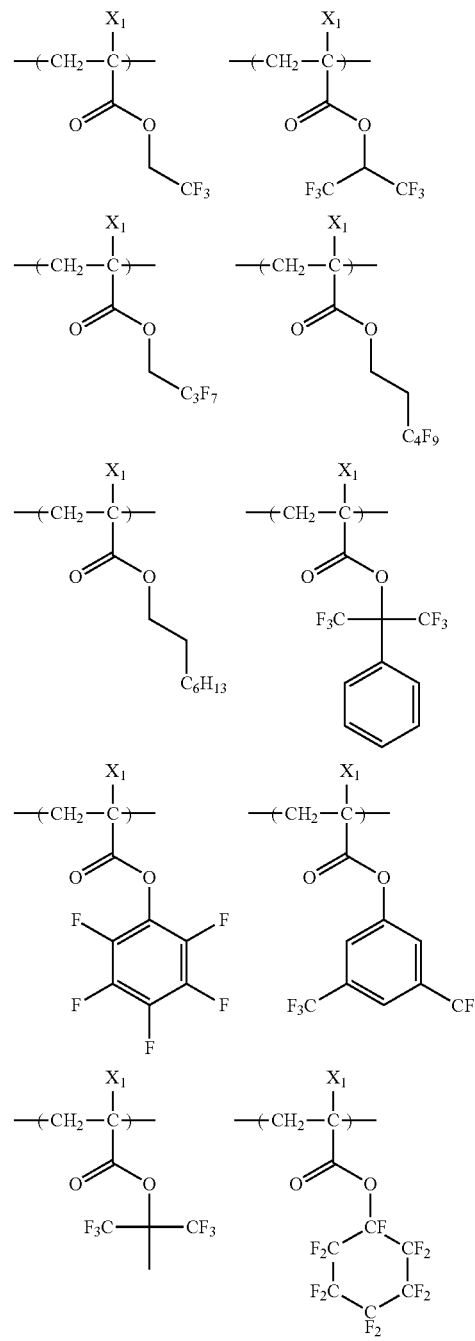

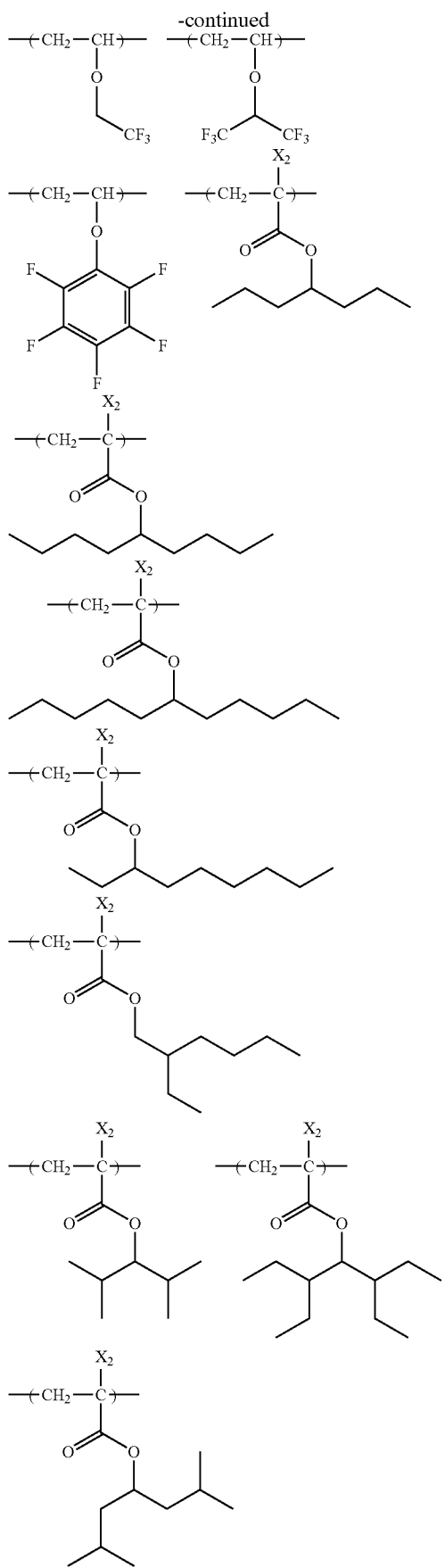

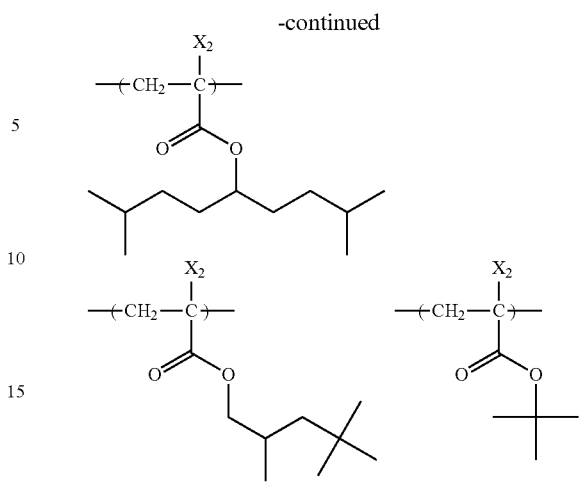

In the case where the hydrophobic resin contains a silicon atom, the resin preferably contains an alkylsilyl structure or a cyclic siloxane structure, as the silicon atom-containing partial structure. The alkylsilyl structure is preferably a trialkylsilyl group-containing structure.

Preferred examples of the alkylsilyl structure and cyclic siloxane structure include the groups represented by the following formulae (CS-1) to (CS-3).

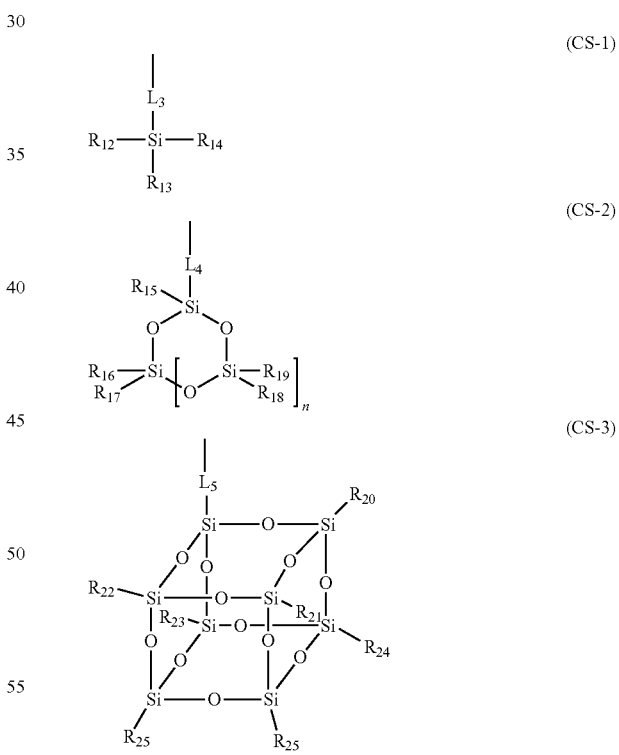

In formulae (CS-1) to (CS-3), each of $R_{12}$ to $R_{26}$ independently represents a linear or branched alkyl group or a cycloalkyl group. The alkyl group preferably has a carbon number of 1 to 20. The cycloalkyl group preferably has a carbon number of 3 to 20.

Each of $L_3$ to $L_5$ represents a single bond or a divalent linking group. Examples of the divalent linking group include an alkylene group, a phenylene group, an ether bond, a thioether bond, a carbonyl group, an ester bond, an amide bond, a urethane bond, a ureylene bond, and a combination of two or more of these groups and bonds, and a linking group having a total carbon number of 12 or less is preferred.

n represents an integer of 1 to 5. n is preferably an integer of 2 to 4.

Specific examples of the repeating unit having a group represented by formulae (CS-1) to (CS-3) are illustrated below. In specific examples, $X_1$ represents a hydrogen atom, —$CH_3$, —F or —$CF_3$.

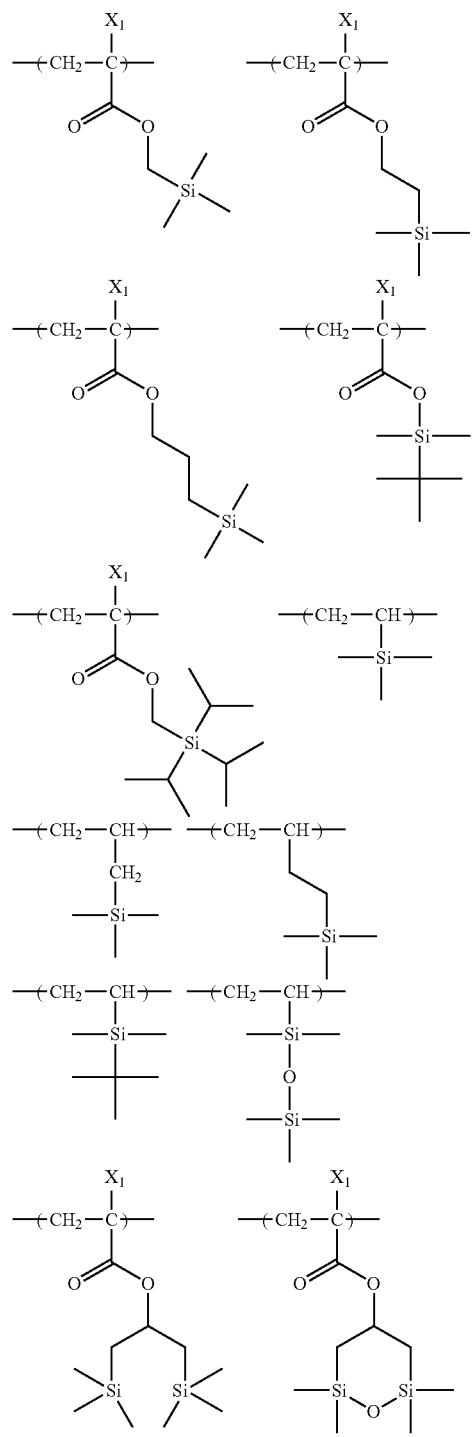

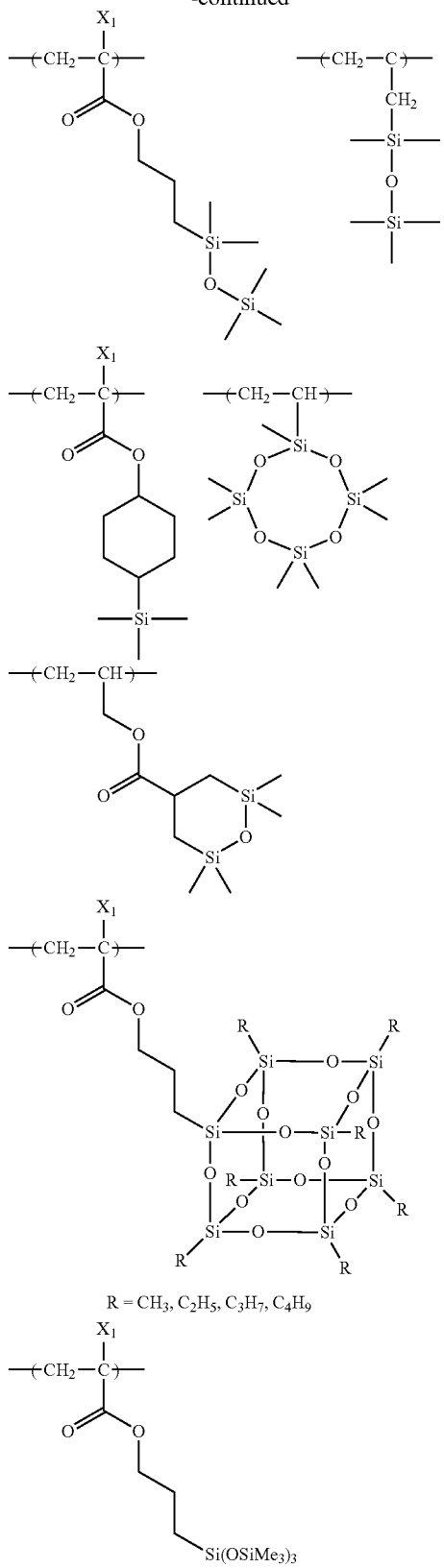

The hydrophobic resin may further contain at least one group selected from the group consisting of the following (x) to (z):

(x) an acid group, (y) a lactone structure-containing group, an acid anhydride, or an acid imide group, and (z) an acid-decomposable group.

Examples of the (x) acid group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group. Preferred acid groups include a fluorinated alcohol group, a sulfonimide group and a bis(carbonyl)methylene group. Preferred fluorinated alcohol groups include hexafluoroisopropanol.

The repeating unit having an acid group is, for example, a repeating unit where an acid group is directly bonded to the main chain of the resin, such as repeating unit by an acrylic acid or a methacrylic acid. This repeating unit may be a repeating unit where an acid group is bonded to the main chain of the resin through a linking group. Alternatively, in this repeating unit, an acid group may be introduced into the terminal of the resin by using an acid group-containing polymerization initiator or chain transfer agent at the polymerization.

The content of the repeating unit having an acid group is preferably from 1 to 50 mol %, more preferably from 3 to 35 mol %, still more preferably from 5 to 20 mol %, based on all repeating units in the hydrophobic resin.

Specific examples of the repeating unit having an acid group are illustrated below. In the formulae, Rx represents a hydrogen atom, $CH_3$, $CF_3$ or $CH_2OH$.

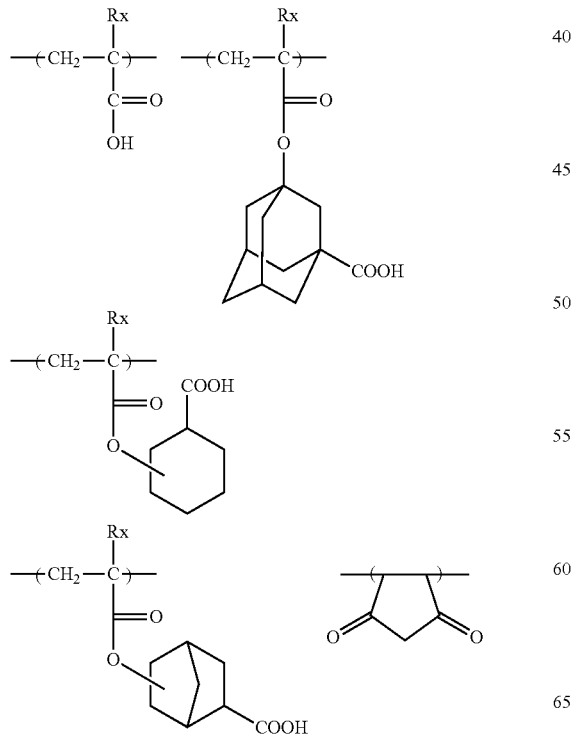

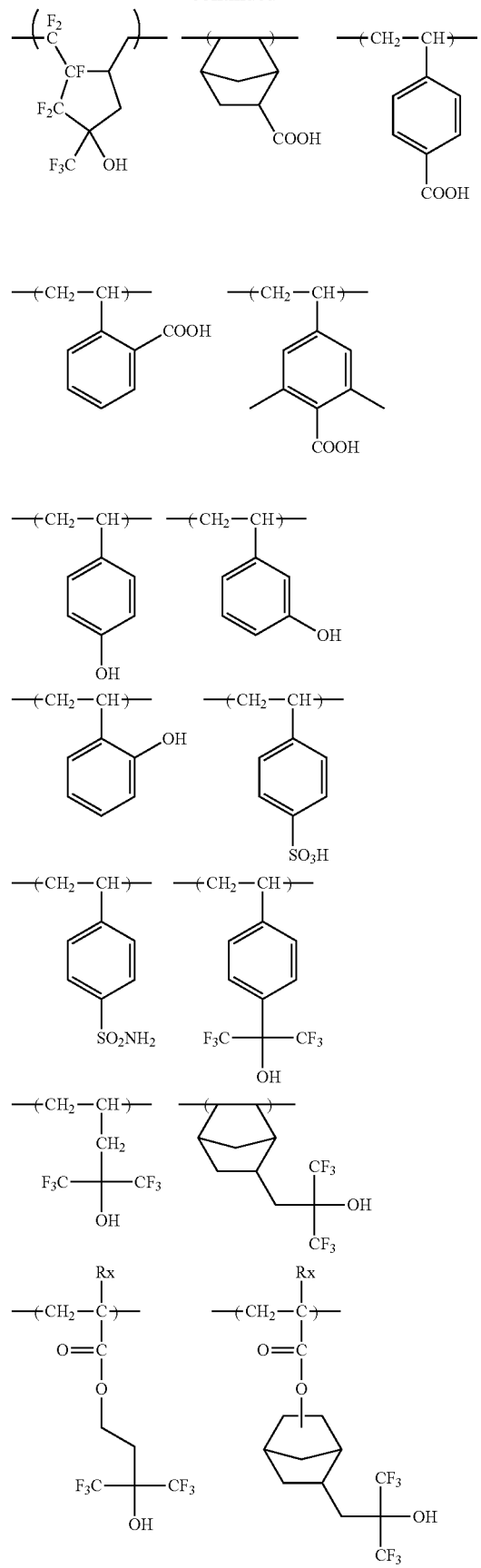

-continued

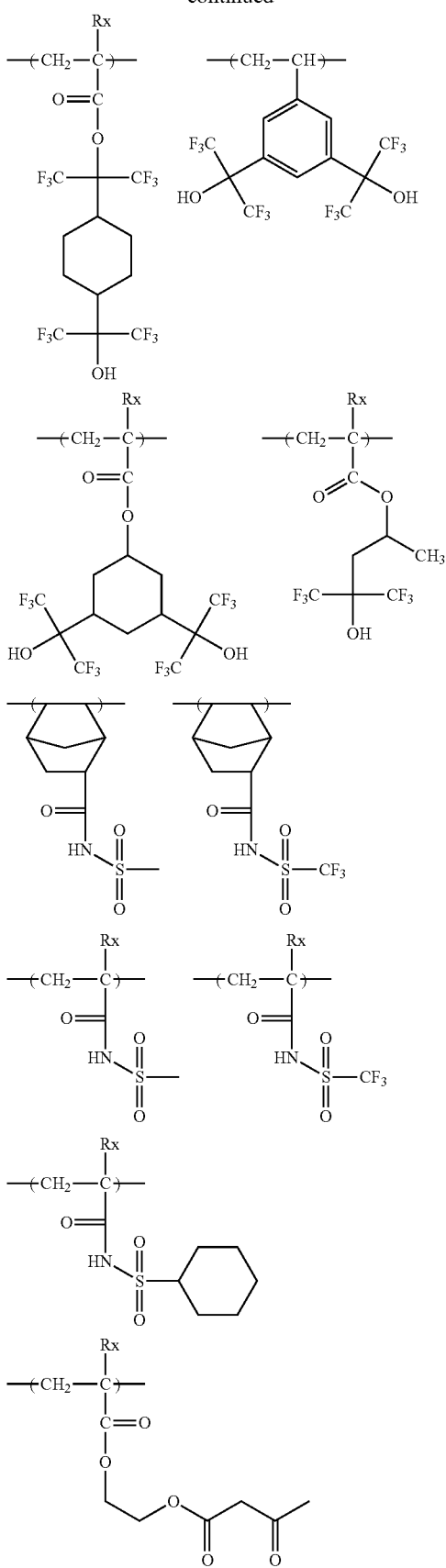

The (y) lactone structure-containing group, acid anhydride group or acid imide group is preferably a lactone structure-containing group.

The repeating unit having such a group is a repeating unit where the group is directly bonded to the main chain of the resin, such as repeating unit by an acrylic acid ester or a methacrylic acid ester. This repeating unit may also be a repeating unit where the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a lactone structure-containing group are the same as those of the repeating unit having a lactone structure described above in the paragraph of the (A) acid-decomposable resin.

The lactone structure-containing group is preferably a group having a partial structure represented by the following formula (KA-1). By virtue of having this structure, it is expected that, for example, the receding contact angle of the immersion liquid is improved.

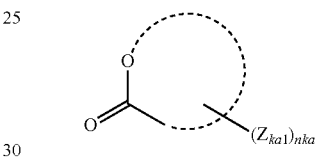

(KA-1)

In formula (KA-1), $Z_{ka1}$ represents, when nka is 2 or more, each independently represents, an alkyl group, a cycloalkyl group, an ether group, a hydroxyl group, an amide group, an aryl group, a lactone ring group or an electron-withdrawing group. In the case where nka is 2 or more, the plurality of $Z_{ka1}$'s may combine with each other to form a ring. Examples of the ring include a cycloalkyl ring and a heterocyclic ring such as cyclic ether ring and lactone ring.

nka represents an integer of 0 to 10. nka is preferably an integer of 0 to 8, more preferably an integer of 0 to 5, still more preferably an integer of 1 to 4, and yet still more preferably an integer of 1 to 3.

Incidentally, the structure represented by formula (KA-1) is a partial structure present in the main chain, side chain, terminal or the like of the resin and is present as a monovalent or higher valent substituent resulting from removal of at least one hydrogen atom contained in the structure.

$Z_{ka1}$ is preferably an alkyl group, a cycloalkyl group, an ether group, a hydroxyl group or an electron-withdrawing group, more preferably an alkyl group, a cycloalkyl group or an electron-withdrawing group. The ether group is preferably an alkyl ether group or a cycloalkyl ether group.

The alkyl group of $Z_{ka1}$ may be either linear or branched, and the alkyl group may further have a substituent.

The alkyl group of $Z_{ka1}$ is preferably an alkyl group having a carbon number of 1 to 4, such as methyl group, ethyl group, n-propyl group, i-propyl group, n-butyl group, i-butyl group and tert-butyl group.

The cycloalkyl group of $Z_{ka1}$ may be monocyclic or polycyclic. In the latter case, the cycloalkyl group may be crosslinked. That is, in this case, the cycloalkyl group may have a bridged structure. Incidentally, a part of carbon atoms in the cycloalkyl group may be substituted with a heteroatom such as oxygen atom.

The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group.

Examples of the polycyclic cycloalkyl group include a group having a bicyclo, tricyclo or tetracyclo structure and having a carbon number of 5 or more. The polycyclic cycloalkyl group preferably has a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group.

These structures may further have a substituent. Examples of the substituent include an alkyl group, a halogen atom, a hydroxyl group, an alkoxy group, a carboxyl group and an alkoxycarbonyl group.

The alkyl group as the substituent is preferably a lower alkyl group such as methyl group, ethyl group, propyl group, isopropyl group and butyl group, more preferably a methyl group, an ethyl group, a propyl group or an isopropyl group.

The alkoxy group as the substituent is preferably an alkoxy group having a carbon number of 1 to 4, such as methoxy group, ethoxy group, propoxy group and butoxy group.

The alkyl group and alkoxy group as the substituent may have a further substituent, and examples of the further substituent include a hydroxyl group, a halogen atom and an alkoxy group (preferably having a carbon number of 1 to 4).

Examples of the aryl group of $Z_{ka1}$ include a phenyl group and a naphthyl group.

Examples of the substituent which the alkyl group, cycloalkyl group and aryl group of $Z_{ka1}$ may further have include a hydroxyl group; a halogen atom; a nitro group; a cyano group; the above-described alkyl group; an alkoxy group such as methoxy group, ethoxy group, hydroxyethoxy group, propoxy group, hydroxypropoxy group, n-butoxy group, isobutoxy group, sec-butoxy group and tert-butoxy group; an alkoxycarbonyl group such as methoxycarbonyl group and ethoxycarbonyl group; an aralkyl group such as benzyl group, phenethyl group and cumyl group; an aralkyloxy group; an acyl group such as formyl group, acetyl group, butyryl group, benzoyl group, cinnamyl group and valeryl group; an acyloxy group such as butyryloxy group; an alkenyl group; an alkenyloxy group such as vinyloxy group, propenyloxy group, allyloxy group and butenyloxy group; the above-described aryl group; an aryloxy group such as phenoxy group; and an aryloxycarbonyl group such as benzoyloxy group.

Examples of the electron-withdrawing group of $Z_{ka1}$ include a halogen atom, a cyano group, an oxy group, a carbonyl group, a carbonyloxy group, an oxycarbonyl group, a nitrile group, a nitro group, a sulfonyl group, a sulfinyl group, a halo(cyclo)alkyl represented by —C($R_{f1}$)($R_{f2}$)—$R_{f3}$, a haloaryl group, and a combination of two or more of these groups. The term "halo(cyclo)alkyl group" indicates a (cyclo)alkyl in which at least one hydrogen atom is replaced by a halogen atom.

The halogen atom of $Z_{ka1}$ includes a fluorine atom, a chlorine atom, a bromine atom and an iodine atom. Among these, a fluorine atom is preferred.

In the halo(cyclo)alkyl group represented by —C($R_{f1}$)($R_{f2}$)—$R_{f3}$, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

In the halo(cyclo)alkyl group represented by —C($R_{f1}$)($R_{f2}$)—$R_e$, each of $R_{f2}$ and $R_{f3}$ independently represents a hydrogen atom, a halogen atom or an organic group.

Examples of the organic group include an alkyl group, a cycloalkyl group and an alkoxy group. These group may further have a substituent such as halogen atom.

At least two members out of $R_{f1}$ to $R_{f3}$ may combine with each other to form a ring. Examples of the ring include a cycloalkyl ring, a halocycloalkyl ring, an aryl ring and a haloaryl ring.

Examples of the alkyl group and haloalkyl group of $R_{f1}$ to $R_{f3}$ include the alkyl groups described above for $Z_{ka1}$ and groups where at least a part of hydrogen atoms of the alkyl group is replaced by a halogen atom.

Examples of the halocycloalkyl group and haloaryl group include groups where at least a part of hydrogen atoms in the cycloalkyl group or aryl group described above for $Z_{ka1}$ is replaced by a halogen atom. More preferred halocycloalkyl groups and haloaryl groups include, for example, a fluorocycloalkyl group represented by —$C_{(n)}F_{(2n-2)}H$ and a perfluoroaryl group. Here, the range of carbon number n is not particularly limited, but n is preferably an integer of 5 to 13, and n is more preferably 6.

$R_{f2}$ is preferably the same group as $R_{f1}$ or combines with $R_{f3}$ to form a ring.

The electron-withdrawing group is preferably a halogen atom, a halo(cyclo)alkyl group or a haloaryl group.

In the electron-withdrawing group, a part of fluorine atoms may be substituted with an electron-withdrawing group except for fluorine atom.

Incidentally, when the electron-withdrawing group is a divalent or higher valent group, the remaining bond is used for bonding to an arbitrary atom or substituent. In this case, the partial structure above may be bonded to the main chain of the hydrophobic resin through a further substituent.

Out of the structures represented by formula (KA-1), a structure represented by the following formula (KY-1) is preferred.

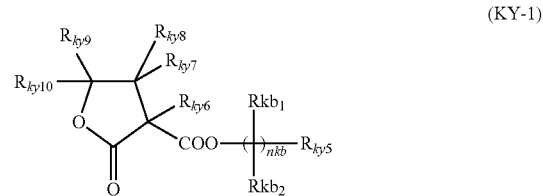

(KY-1)

In formula (KY-1), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group. At least two members out of $R_{ky6}$ to $R_{ky10}$ may combine with each other to form a ring.

$R_{ky5}$ represents an electron-withdrawing group. Examples of the electron-withdrawing group are the same as those for $Z_{ka1}$ in formula (KA-1). The electron-withdrawing group is preferably a halogen atom, a halo(cyclo)alkyl group represented by —C($R_{f1}$)($R_{f2}$)—$R_n$, or a haloaryl group. Specific examples of these groups are the same as those in formula (KA-1).

nkb represents 0 or 1.

Each of $R_{kb1}$ and $R_{kb2}$ independently represents a hydrogen atom, an alkyl group, a cycloalkyl group, an aryl group or an electron-withdrawing group. Specific examples of these atomic groups are the same as those for $Z_{ka1}$ in formula (KA-1).

The structure represented by formula (KY-1) is preferably a structure represented by the following formula (KY-1-1).

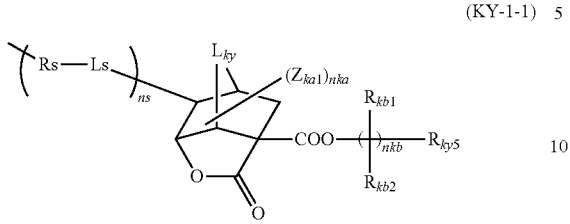

(KY-1-1)

In formula (KY-1-1), $Z_{ka1}$ and nka have the same meanings as those in formula (KA-1). $R_{ky5}$, $R_{kb1}$, $R_{kb2}$ and nkb have the same meaning as those in formula (KY-1).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, more preferably a methylene group.

Ls represents a single bond, an ether bond, an ester bond, an amide bond, a urethane bond or a urea bond, and when a plurality of Ls's are present, they may be the same or different.

Rs represents, when ns is 2 or more, each independently represents, an alkylene group or a cycloalkylene group. In the case where ns is 2 or more, each Rs may be the same as or different from every other Rs.

ns is the repetition number of the linking group represented by —(Rs-Ls)- and represents an integer of 0 to 5.

Specific preferred examples of the repeating unit having a structure represented by formula (KA-1) are illustrated below, but the present invention is not limited thereto. Ra represents a hydrogen atom, a fluorine atom, a methyl group or a trifluoromethyl group.

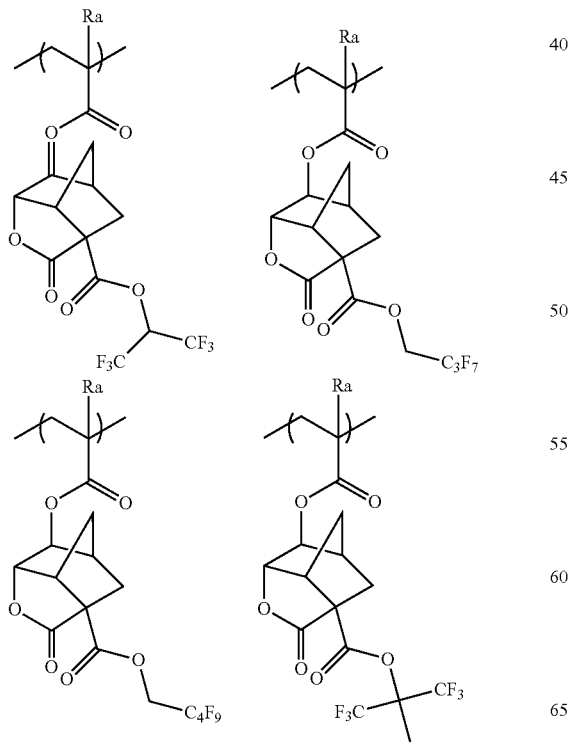

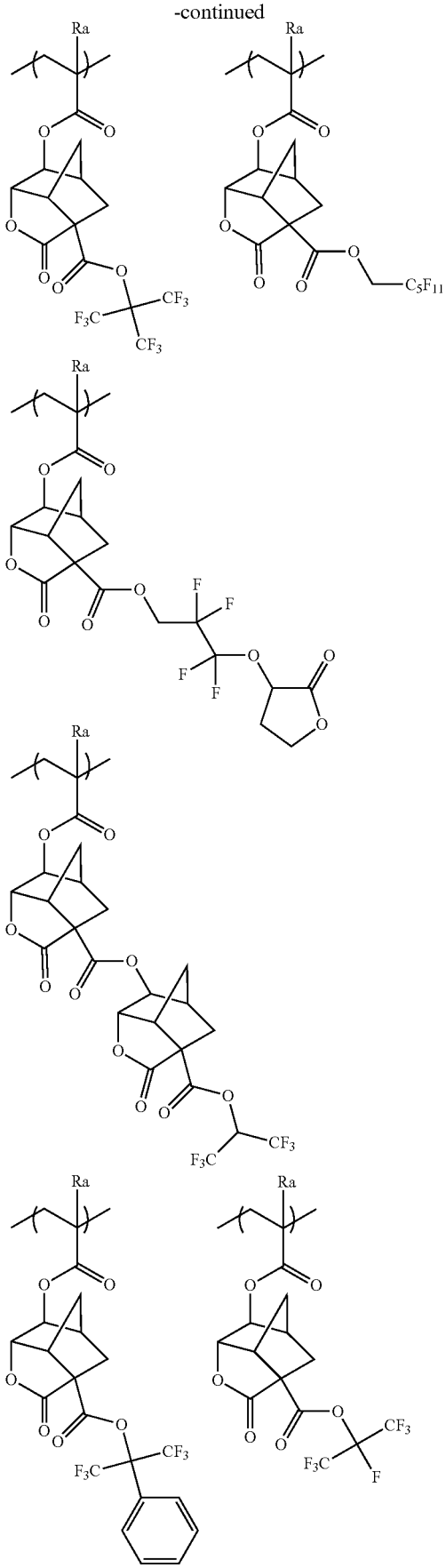

-continued

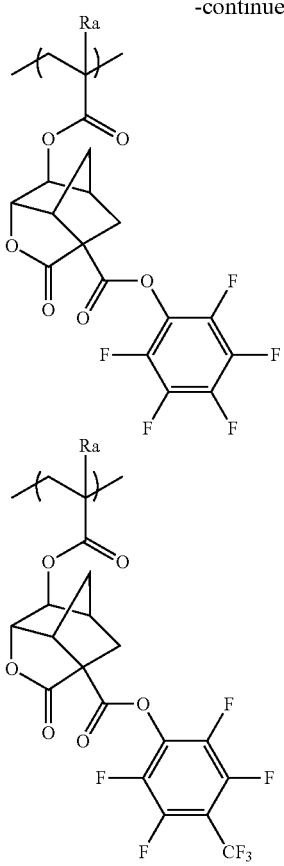

The content of the repeating unit having a lactone structure-containing group, an acid anhydride group or an acid imide group is preferably from 1 to 40 mol %, more preferably from 3 to 30 mol %, still more preferably from 5 to 15 mol %, based on all repeating units in the hydrophobic resin.

Examples of the (z) acid-decomposable group are the same as those described above in the paragraph of the (A) acid-decomposable resin.

The content of the repeating unit having an acid-decomposable group is preferably from 1 to 80 mol %, more preferably from 10 to 80 mol %, still more preferably from 20 to 60 mol %, based on all repeating units in the hydrophobic resin.

The hydrophobic resin may further contain a repeating unit represented by the following formula (III):

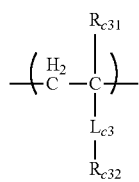

(III)

$R_{c31}$ represents a hydrogen atom, an alkyl group (which may be substituted with a fluorine atom or the like), a cyano group or a —CH$_2$—O-Rac$_2$ group, wherein Rac$_2$ represents a hydrogen atom, an alkyl group or an acyl group.

$R_{c31}$ is preferably a hydrogen atom, a methyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a silicon atom-containing group, a fluorine atom or the like.

$L_{c3}$ represents a single bond or a divalent linking group.

The alkyl group of $R_{c32}$ is preferably a linear or branched alkyl group having a carbon number of 3 to 20.

The cycloalkyl group preferably has a carbon number of 3 to 20.

The alkenyl group preferably has a carbon number of 3 to 20.

The cycloalkenyl group is preferably a cycloalkenyl group having a carbon number of 3 to 20.

$R_{c32}$ is preferably an unsubstituted alkyl group or an alkyl group with at least one hydrogen atom being replaced by a fluorine atom.

$L_{c3}$ represents a single bond or a divalent linking group. Examples of the divalent linking group include an alkylene group (preferably having a carbon number of 1 to 5), an ether bond, a phenylene group, an ester bond (a group represented by —COO—), and a combination of two or more of these groups and bonds, and a linking group having a total carbon number of 12 or less is preferred.

The content of the repeating unit represented by formula (III) is preferably from 1 to 100 mol %, more preferably from 10 to 90 mol %, still more preferably from 30 to 70 mol %, based on all repeating units in the hydrophobic resin.

the hydrophobic resin may further contain a repeating unit represented by the following formula (CII-AB):

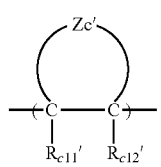

(CII-AB)

In formula (CII-AB), each of $R_{c11}'$ and $R_{c12}'$ independently represents a hydrogen atom, a cyano group, a halogen atom or an alkyl group. $Z_c'$ represents an atomic group necessary for forming an alicyclic structure together with two carbon atoms (C—C) to which $R_{c11}'$ and $R_{c12}'$ are bonded.

The content of the repeating unit represented by formula (CII-AB) is preferably from 1 to 100 mol %, more preferably from 10 to 90 mol %, still more preferably from 30 to 70 mol %, based on all repeating units in the hydrophobic resin.

Specific examples of the repeating units represented by formulae (III) and (CII-AB) are illustrated below. In specific examples, Ra represents H, CH$_3$, CH$_2$OH, CF$_3$ or CN.

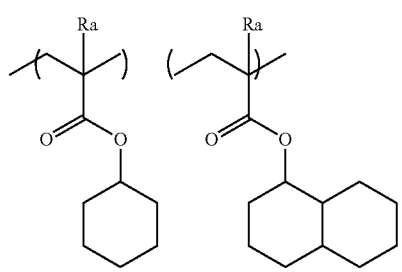

137
-continued
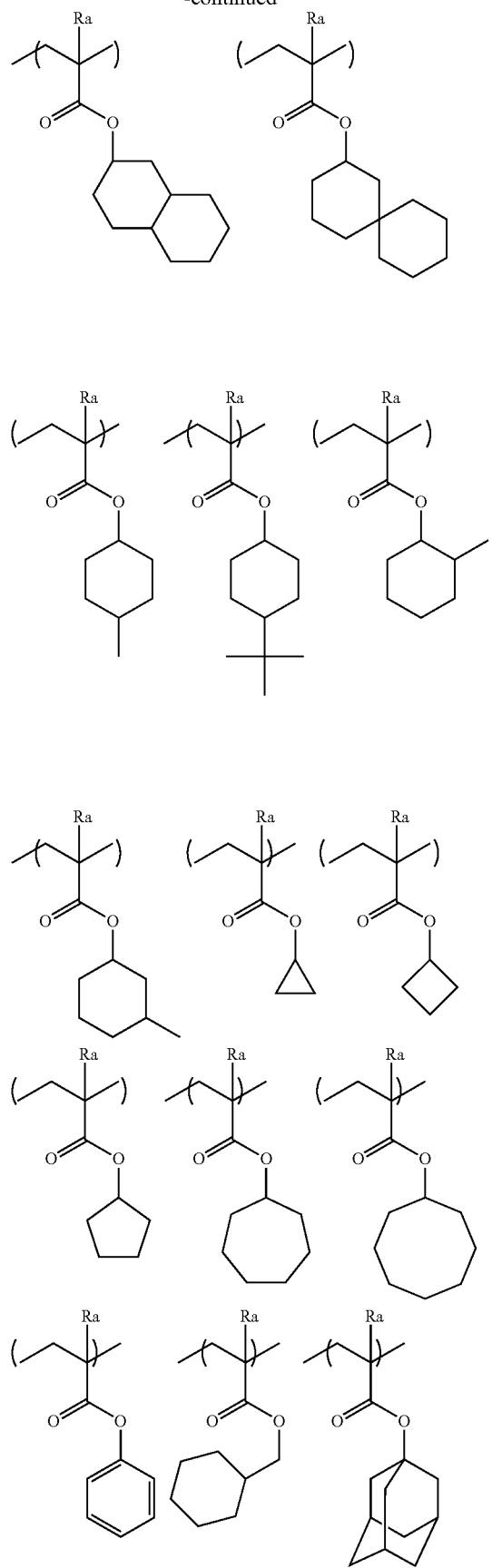
138
-continued
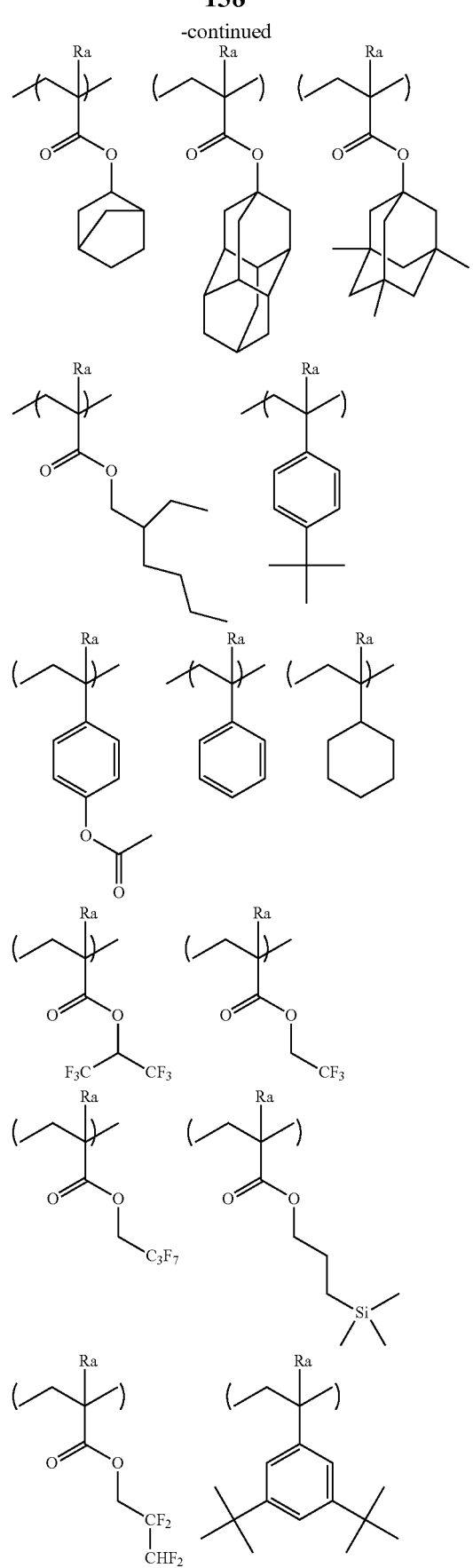

-continued
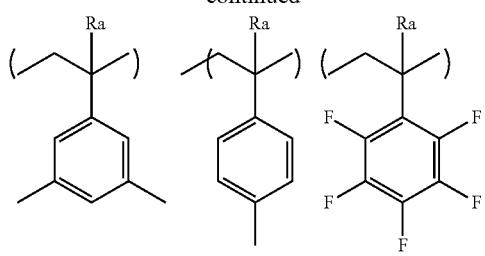
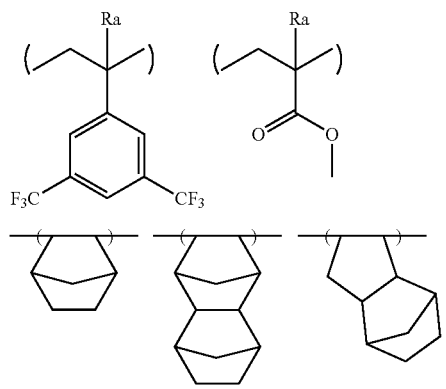
Specific examples of the hydrophobic resin are illustrated below. Also, the molar ratio of repeating units (corresponding to repeating units starting from the left), weight average molecular weight and polydispersity (Mw/Mn) of each resin are shown in Table 1.
(HR-1)
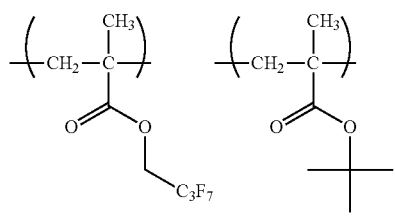
(HR-2)
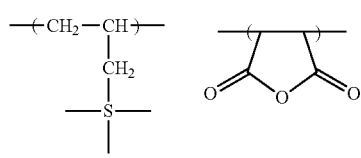
(HR-3)
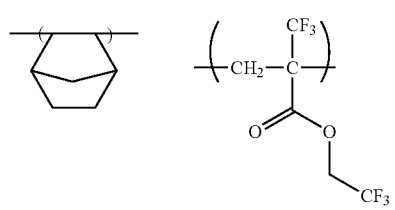
(HR-4)
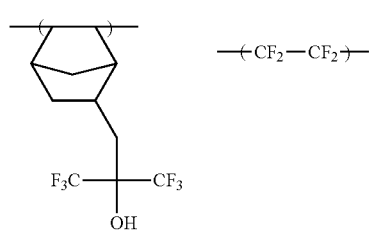
-continued
(HR-5)
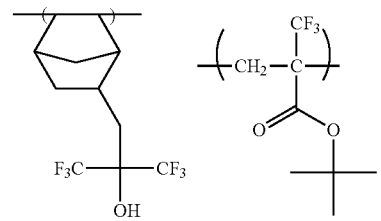
(HR-6)
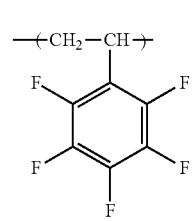
(HR-7)
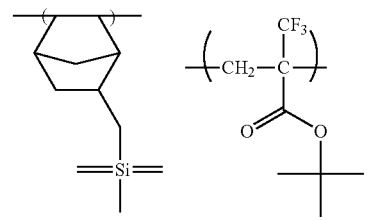
(HR-8)
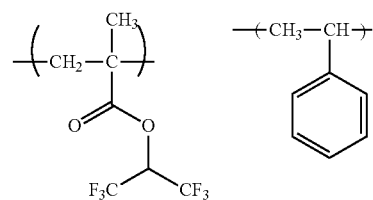
(HR-9)
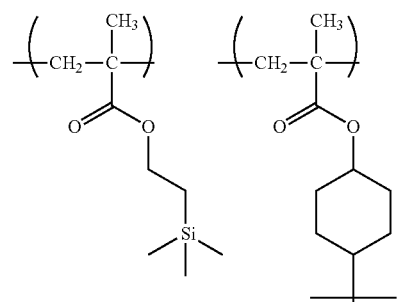
(HR-10)
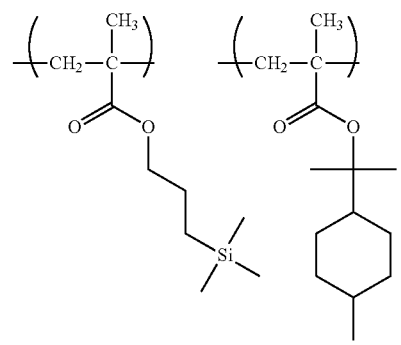

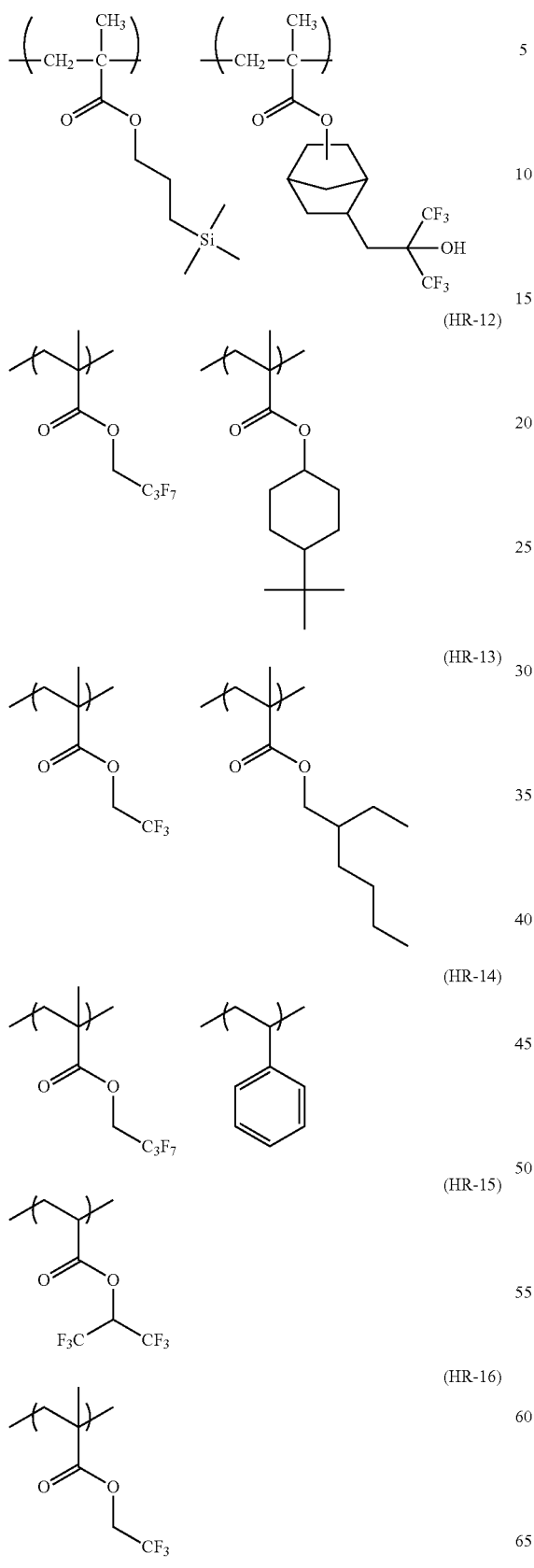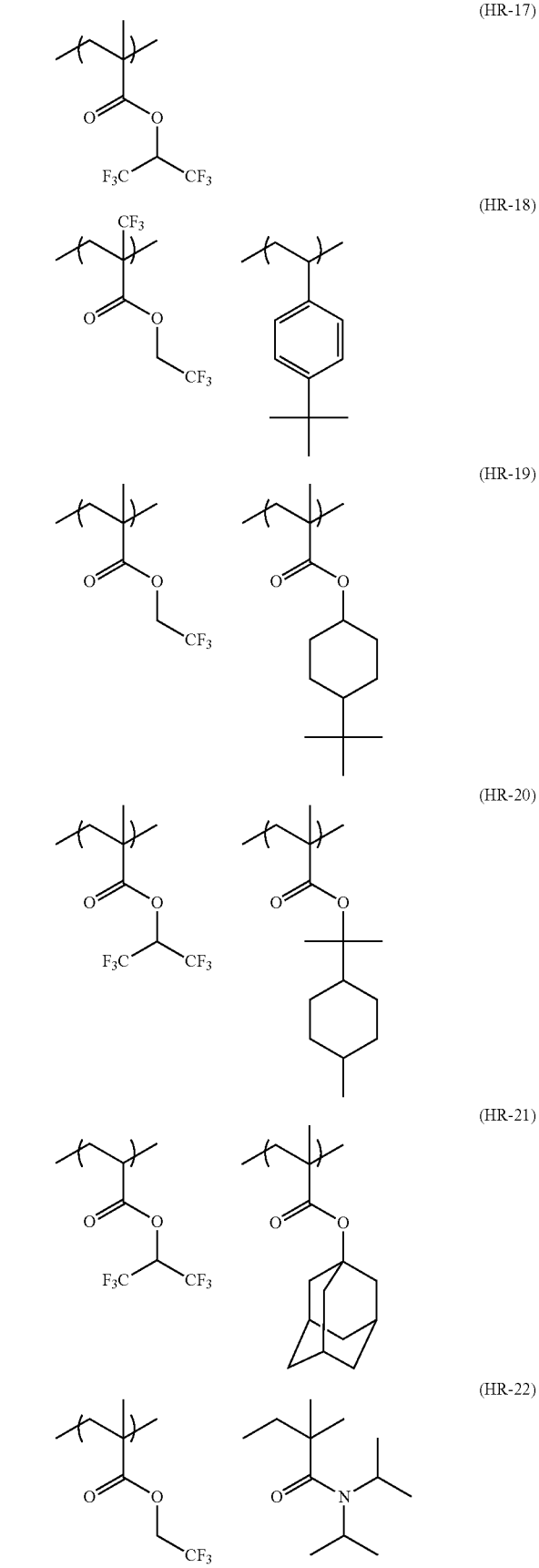

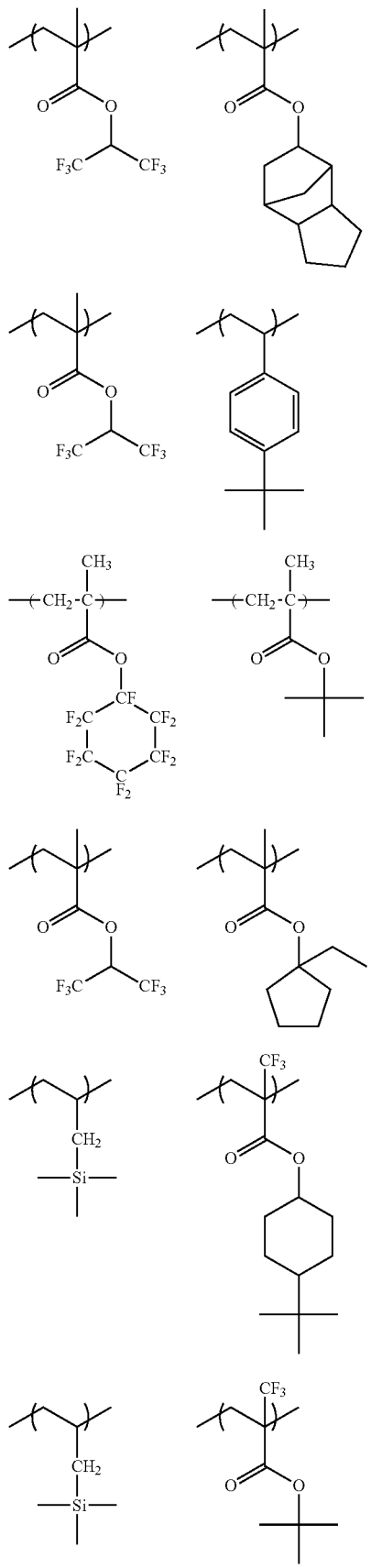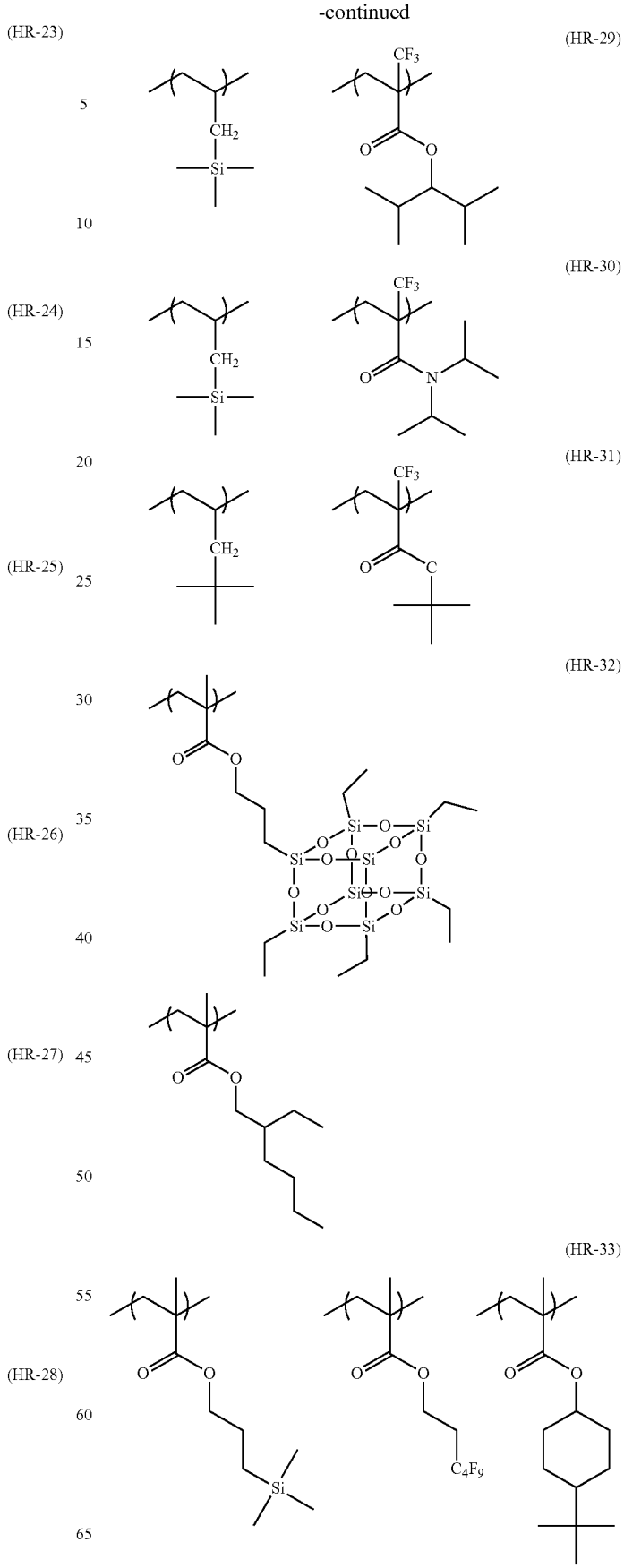

(HR-34) 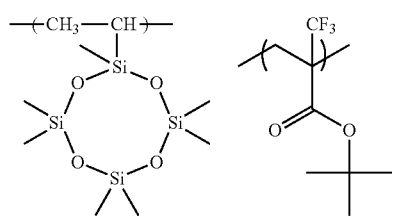
(HR-35) 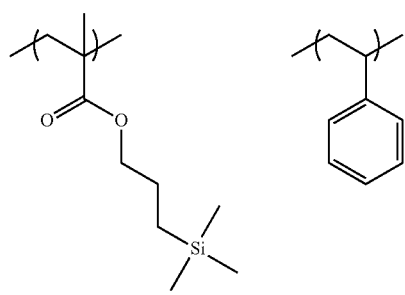
(HR-36) 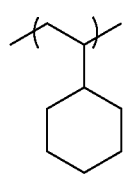
(HR-37) 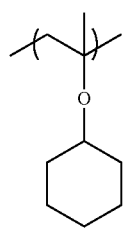
(HR-38) 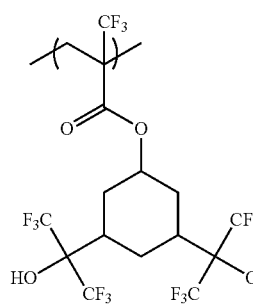
(HR-39) 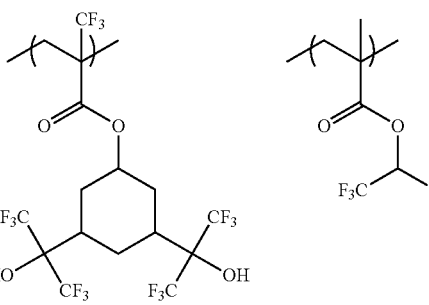
(HR-40) 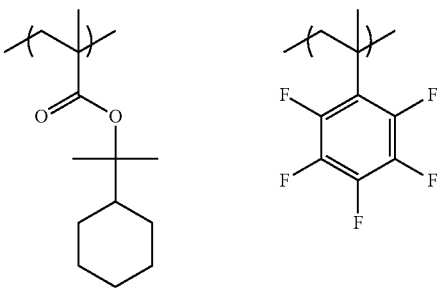
(HR-41) 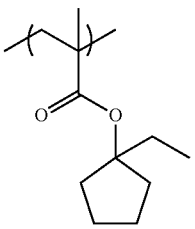 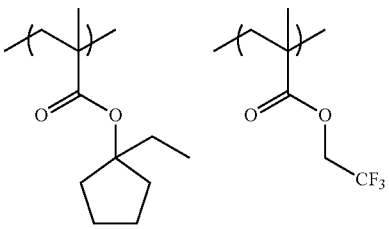
(HR-42) 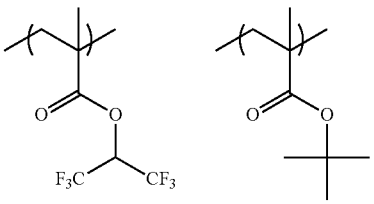
(HR-43) 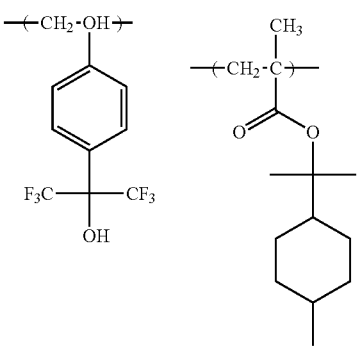

-continued
(HR-44)
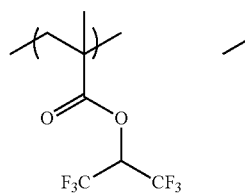 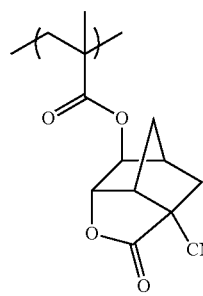
(HR-45)
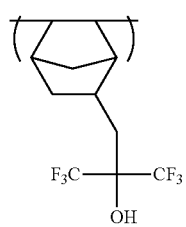 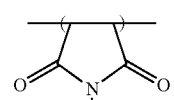 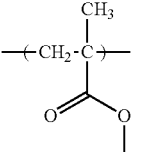
(HR-46)
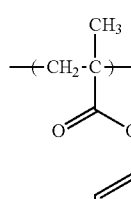 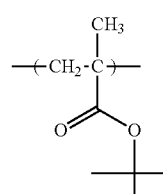
(HR-47)
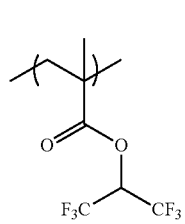 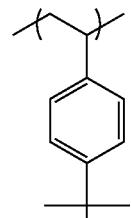 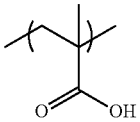
(HR-48)
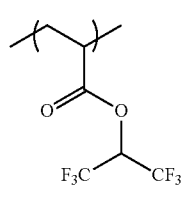 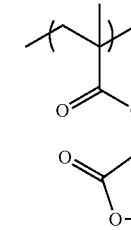 
(HR-49)
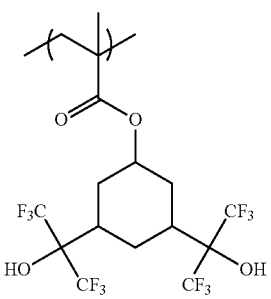
(HR-50)
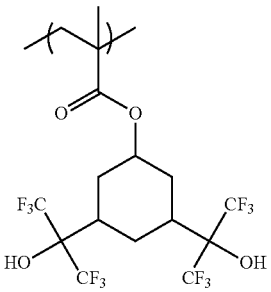 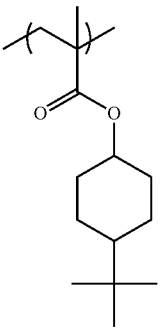
(HR-51)
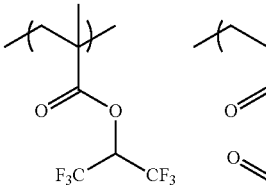 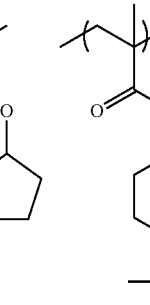
(HR-52)
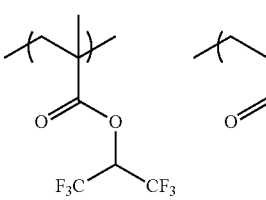 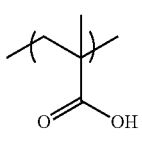
(HR-53)
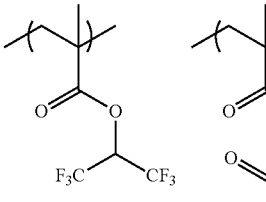 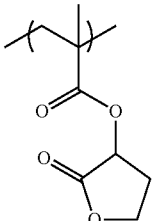 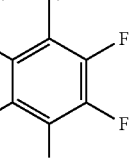

(HR-54)
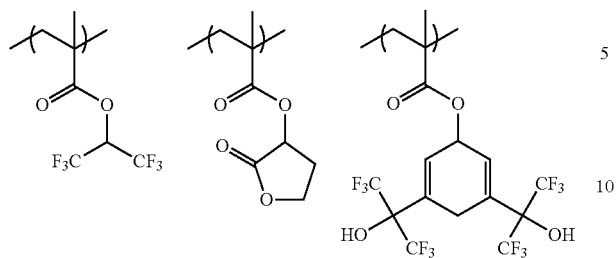
(HR-55)
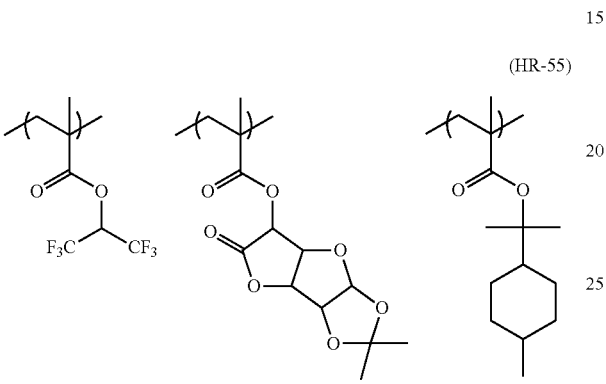
(HR-56)
(HR-57)
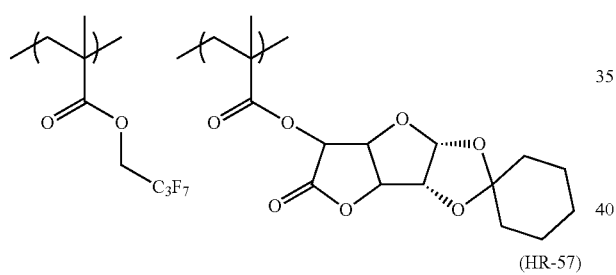
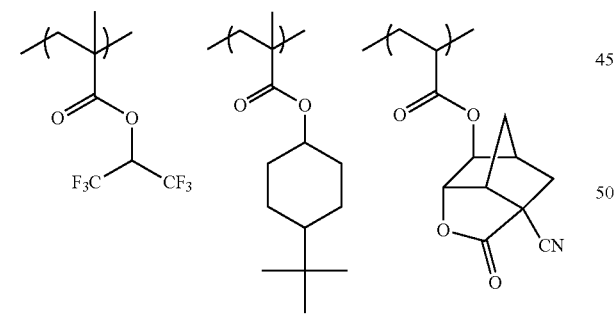
(HR-58)
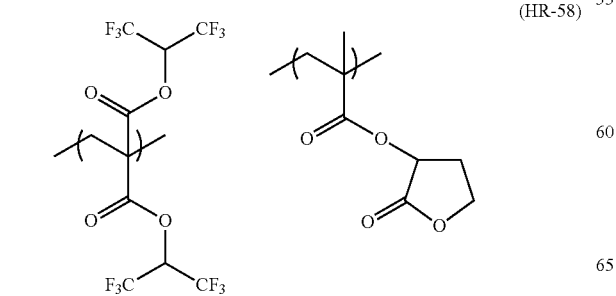
(HR-59)
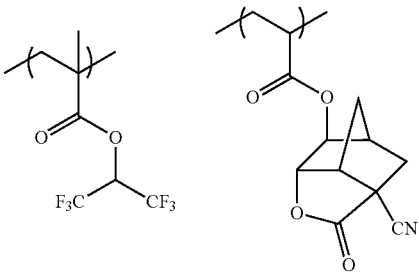
(HR-60)
(HR-61)
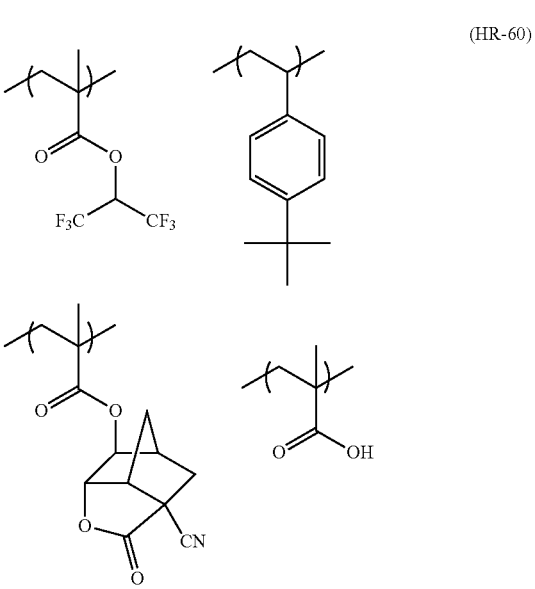
(HR-62)
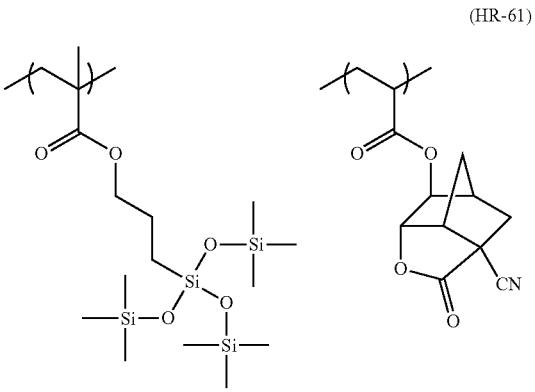
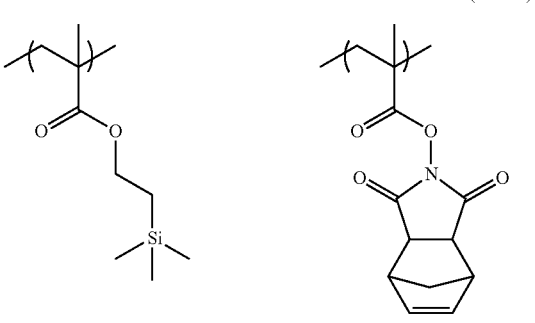

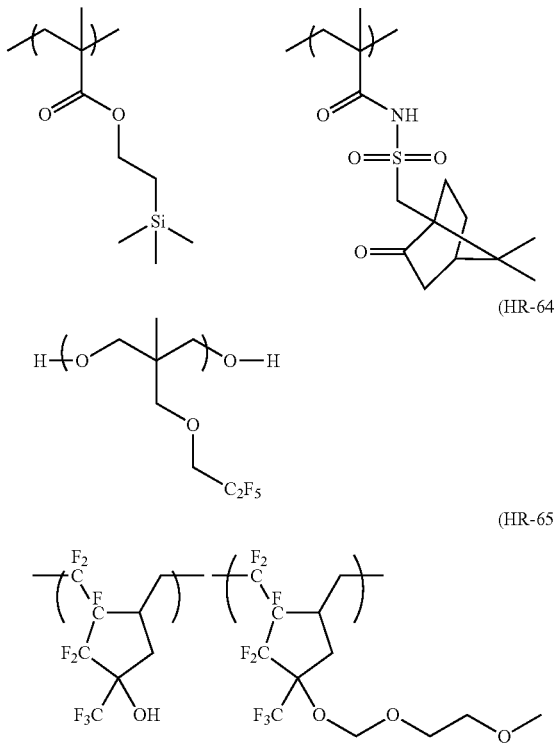

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

In the case where the hydrophobic resin contains a fluorine atom, the fluorine atom content is preferably from 5 to 80 mass %, more preferably from 10 to 80 mass %, based on the molecular weight of the hydrophobic resin. Also, the content of the fluorine atom-containing repeating unit is preferably from 10 to 100 mol %, more preferably from 30 to 100 mol %, based on all repeating units in the hydrophobic resin.

In the case where the hydrophobic resin contains a silicon atom, the silicon atom content is preferably from 2 to 50 mass %, more preferably from 2 to 30 mass %, based on the molecular weight of the hydrophobic resin. Also, the content of the silicon atom-containing repeating unit is preferably from 10 to 100 mol %, more preferably from 20 to 100 mol %, based on all repeating units in the hydrophobic resin.

The weight average molecular weight of the hydrophobic resin is preferably from 1,000 to 100,000, more preferably from 1,000 to 50,000, still more preferably from 2,000 to 15,000.

The polydispersity of the hydrophobic resin is preferably from 1 to 5, more preferably from 1 to 3, still more preferably from 1 to 2. Within this range, more excellent resolution, resist profile and roughness property can be achieved.

One kind of a hydrophobic resin may be used alone, or two or more kinds of hydrophobic resins may be used in combination.

The content of the hydrophobic resin is preferably from 0.01 to 10 mass %, more preferably from 0.05 to 8 mass %, still more preferably from 0.1 to 5 mass %, based on the entire solid content of the composition.

As for the hydrophobic resin, a commercially available product may be used or a resin synthesized by a conventional method may be used. Examples of the general synthesis method of this resin include the same methods described above for the resin (A).

In the hydrophobic resin, it is of course preferred that the content of impurities such as metal is small, and in addition, the amount of residual monomers or oligomer components is also preferably from 0 to 10 mass %, more preferably from 0 to 5 mass %, still more preferably from 0 to 1 mass %. When these conditions are satisfied, the amount of extraneous substances in liquid and the change with aging of sensitivity or the like can be reduced.

[6] (F) Surfactant

The resist composition for use in the present invention may or may not further contain a surfactant and in the case of containing a surfactant, it is preferred to contain any one fluorine-containing and/or silicon-containing surfactant (a fluorine-containing surfactant, a silicon-containing surfactant or a surfactant containing both a fluorine atom and a silicon atom) or two or more kinds thereof.

When the composition for use in the present invention contains the surfactant above, a resist pattern with good sensitivity, resolution and adherence as well as little development defect can be obtained in using an exposure light source of 250 nm or less, particularly 220 nm or less.

Examples of the fluorine-containing and/or silicon-containing surfactant include the surfactants described in paragraph [0276] of U.S. Patent Application Publication 2008/0248425, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the above-described type of surfactant include Megaface F178, F-470, F-473, F-475, F-476 and F-472 (produced by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant, described in paragraph [0280] of U.S. Patent Application Publication 2008/0248425, may also be used.

One of these surfactants may be used alone, or some of them may be used in combination.

In the case where the resist composition contains a surfactant, the amount of the surfactant used is preferably from 0.0001 to 2 mass %, more preferably from 0.0005 to 1 mass %, based on the entire amount of the resist composition (excluding the solvent).

On the other hand, by setting the amount added of the surfactant to 10 ppm or less based on the entire amount of the resist composition (excluding the solvent), the hydrophobic resin is more unevenly distributed to the surface, so that the resist film surface can be made more hydrophobic and the followability of water at the immersion exposure can be enhanced.

[7] Basic Compound

The resist composition for use in the present invention may contain a basic compound so as to reduce the change in performance with aging from exposure to heating.

Specific examples of the basic compound include a basic compound having a structure represented by the following formulae (A) to (E):

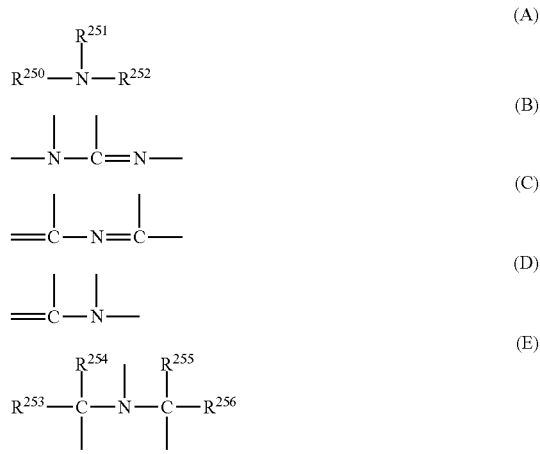

In the formulae, each of $R^{250}$, $R^{251}$ and $R^{252}$ independently represents a hydrogen atom, an alkyl group (preferably having a carbon number of 1 to 20), a cycloalkyl group (preferably having a carbon number of 3 to 20) or an aryl group (preferably having a carbon number of 6 to 20), and $R^{250}$ and $R^{251}$ may combine with each other to form a ring ($R^{250}$ and $R^{251}$ may form a ring by combining with each other through a heteroatom such as oxygen atom).

These groups may have a substituent. Examples of the substituent include an alkyl group, a cycloalkyl group, an alkoxy group, an aryloxy group, an alkylcarbonyloxy group, an alkoxyalkyl group and an aryloxyalkyl group, and the alkyl chain thereof may contain one or more atoms selected from an oxygen atom, a sulfur atom, a nitrogen atom and the like.

The alkyl group having a substituent or the cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

The aryl group having a substituent is preferably an aryl group having one or more alkyl groups as the substituent.

In the formulae, each of $R^{253}$, $R^{254}$, $R^{255}$ and $R^{256}$ independently represents an alkyl group (preferably having a carbon number of 1 to 6) or a cycloalkyl group (preferably having a carbon number of 3 to 6).

Preferred examples of the compound include guanidine, aminopyrrolidine, pyrazole, pyrazoline, piperazine, aminomorpholine, aminoalkylmorpholine and piperidine, and these may have a substituent. More preferred examples of the compound include a compound having an imidazole structure, a diazabicyclo structure, an onium hydroxide structure (particularly preferably a tetraalkylammonium hydroxide such as tetrabutylammonium hydroxide), an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Furthermore, the compound may be at least one kind of a nitrogen-containing compound selected from the group consisting of a phenoxy group-containing amine compound, a phenoxy group-containing ammonium salt compound, a sulfonic acid ester group-containing amine compound and a sulfonic acid ester group-containing ammonium salt compound. Examples of these compounds include, but are not limited to, Compounds (C1-1) to (C3-3) illustrated in paragraph [0066] of U.S. Patent Application Publication 2007/0224539.

In addition, a nitrogen-containing organic compound having a group capable of leaving by the action of an acid, which is a kind of a basic compound, can also be used. Examples of this compound include a compound represented by the following formula (F). Incidentally, the compound represented by the following formula (F) exhibits an effective basicity in the system as a result of elimination of the group capable of leaving by the action of an acid.

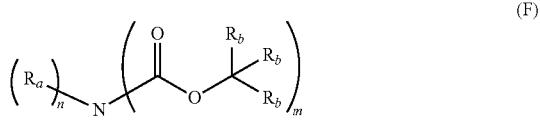

(F)

In formula (F), each Ra independently represents a hydrogen atom, an alkyl group, a cycloalkyl group, an aryl group or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group.

At least two Rb's may combine to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (F), each of the alkyl group, cycloalkyl group, aryl group and aralkyl group represented by Ra and Rb may be substitute with a functional group such as hydroxyl group, cyano group, amino group, pyrrolidino group, piperidino group, morpholino group and oxo group, an alkoxy group or a halogen atom.

Examples of the alkyl group, cycloalkyl group, aryl group and aralkyl group (each of these alkyl, cycloalkyl, aryl and aralkyl groups may be substituted with the above-described functional group, an alkoxy group or a halogen atom) of R include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl groups such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl groups or aromatic compound-derived groups; a group where the group derived from a linear or branched alkane or the group derived from a cycloalkane is substituted with one or more kinds of or one or more groups of aromatic compound-derived groups such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived groups, cycloalkane-derived groups, aromatic compound-derived groups, heterocyclic compound-derived groups and functional groups such as hydroxyl group, cyano group, amino group, pyrrolidino group, piperidino group, morpholino group and oxo group.

Specific examples particularly preferred in the present invention include N-tert-butoxycarbonyldi-n-octylamine, N-tert-butoxycarbonyldi-n-nonyl amine, N-tert-butoxycarbonyldi-n-decylamine, N-tert-butoxycarbonyldicyclohexylamine, N-tert-butoxycarbonyl-1-adamantylamine, N-tert-butoxycarbonyl-2-adamantyl amine, N-tert-butoxycarbonyl-N-methyl-1-adamantylamine, (S)-(−)-1-(tert-butoxycarbonyl)-2-pyrrolidinemethanol, (R)-(+)-1-(tert-butoxycarbonyl)-2-pyrrolidinemethanol, N-tert-butoxycarbonyl-4-hydroxypiperidine, N-tert-butoxycarbonylpyrrolidine, N-tert-butoxycarbonylmorpholine, N-tert-butoxycarbonylpiperazine, N,N-di-tert-butoxycarbonyl-1-adamantylamine, N,N-di-tert-butoxycarbonyl-N-methyl-1-adamantylamine, N-tert-butoxycarbonyl-4,4'-diaminodiphenylmethane, N,N'-di-tert-butoxycarbonylhexamethylenediamine, N,N,N',N'-tetra-tert-butoxycarbonylhexamethylenediamine, N,N'-di-tert-butoxycarbonyl-1,7-diaminoheptane, N,N'-di-tert-butoxycarbonyl-1,8-diaminooctane, N,N'-di-tert-butoxycarbonyl-1,9-diaminononane, N,N'-di-tertbutoxycarbonyl-1,10-diaminodecane, N,N'-di-tert-butoxycarbonyl-1,12-diaminododecane, N,N'-di-tert-butoxycarbonyl-4,4'-diaminodiphenylmethane, N-tert-butoxycarbonylbenzimidazole, N-tert-butoxycarbonyl-2-methylbenzimidazole and N-tert-butoxycarbonyl-2-phenylbenzimidazole.

As for the compound represented by formula (F), a commercial product may be used, or the compound may be synthesized from a commercially available amine by the method described, for example, in Protective Groups in Organic Synthesis, 4th edition. A most general method is a method of causing a dicarbonic acid ester or a haloformic acid ester to act on a commercially available amine to obtain the compound. In the formulae, X represents a halogen atom, and Ra and Rb have the same meanings as in formula (F).

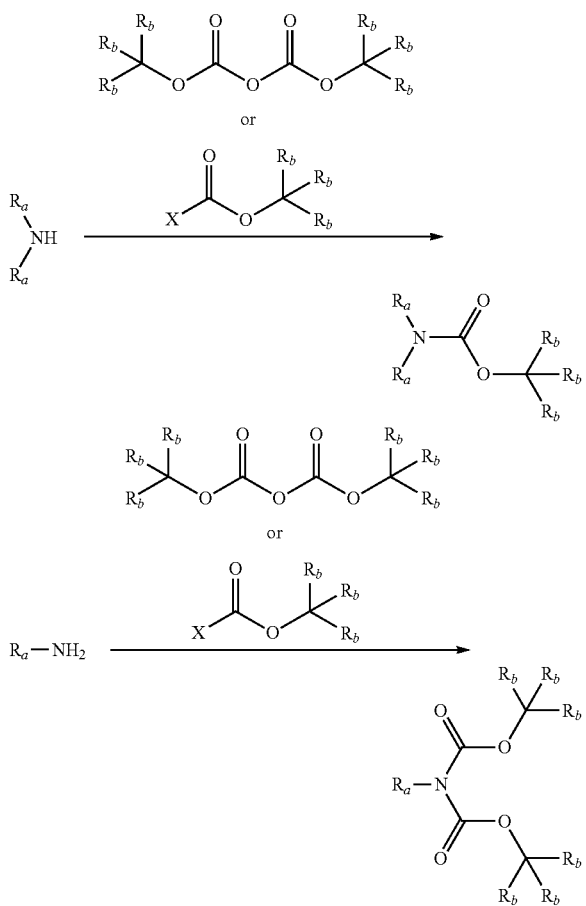

The molecular weight of the basic compound is preferably from 250 to 2,000, more preferably from 400 to 1,000. From the standpoint of more reducing LWR, the molecular weight of the basic compound is preferably 400 or more, more preferably 500 or more, more preferably 600 or more.

One of these basic compounds is used alone, or two or more thereof are used.

In the case of containing a basic compound, the content thereof is preferably from 0.05 to 8.0 mass %, more preferably from 0.05 to 5.0 mass %, still more preferably from 0.05 to 4.0 mass %, based on the entire solid content of the resist composition.

[8] Basic Compound or Ammonium Salt Compound Whose Basicity Decreases Upon Irradiation with Actinic Ray or Radiation The resist composition for use in the present invention may contain a basic compound or ammonium salt compound whose basicity decreases upon irradiation with an actinic ray or radiation (hereinafter sometimes referred to as a "compound (PA)").

The compound (PA) is preferably (PA') a compound having a basic functional group or an ammonium group and a group capable of generating an acidic functional group upon irradiation with an actinic ray or radiation. That is, the compound (PA) is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

The compound which is generated due to decomposition of the compound (PA) or (PA') upon irradiation with an actinic ray or radiation and whose basicity is decreased includes compounds represented by the following formulae (PA-I), (PA-II) and (PA-III), and from the standpoint that excellent effects can be attained in a high level in terms of both LWR and DOF, compounds represented by formulae (PA-II) and (PA-III) are preferred.

The compound represented by formula (PA-I) is described below.

Q-A$_1$-(X)$_n$—B—R (PA-I)

In formula (PA-I), A$_1$ represents a single bond or a divalent linking group.

Q represents —SO$_3$H or —CO$_2$H. Q corresponds to an acidic functional group that is generated upon irradiation with an actinic ray or radiation.

X represents —SO$_2$— or —CO—.

n represents 0 or 1.

B represents a single bond, an oxygen atom or —N(Rx)-.

Rx represents a hydrogen atom or a monovalent organic group.

R represents a monovalent organic group having a basic functional group, or a monovalent organic group having an ammonium group.

The divalent linking group of A$_1$ is preferably a divalent linking group having a carbon number of 2 to 12, and examples thereof include an alkylene group and a phenylene group. An alkylene group having at least one fluorine atom is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably an alkylene group where the carbon atom bonded to the Q site has a fluorine atom, still more preferably a perfluoroalkylene group, yet still more preferably a perfluoroethylene group, a perfluoropropylene group or a perfluorobutylene group.

The monovalent organic group in Rx is preferably a monovalent organic group having a carbon number of 4 to 30, and examples thereof include an alkyl group, a cycloalkyl group, an aryl group, an aralkyl group and an alkenyl group.

The alkyl group in Rx may have a substituent and is preferably a linear or branched alkyl group having a carbon number of 1 to 20, and the alkyl chain may contain an oxygen atom, a sulfur atom or a nitrogen atom.

Here, the alkyl group having a substituent includes particularly a group where a cycloalkyl group is substituted on a linear or branched alkyl group (for example, an adamantylmethyl group, an adamantylethyl group, a cyclohexylethyl group and a camphor residue).

The cycloalkyl group in Rx may have a substituent and is preferably a cycloalkyl group having a carbon number of 3 to 20, and the cycloalkyl group may contain an oxygen atom in the ring.

The aryl group in Rx may have a substituent and is preferably an aryl group having a carbon number of 6 to 14.

The aralkyl group in Rx may have a substituent and is preferably an aralkyl group having a carbon number of 7 to 20.

The alkenyl group in Rx may have a substituent and include, for example, a group having a double bond at an arbitrary position of the alkyl group described as Rx.

Preferred examples of the partial structure of the basic functional group include a crown ether structure, a primary to tertiary amine structure, and a nitrogen-containing heterocyclic structure (e.g., pyridine, imidazole, pyrazine).

Preferred examples of the partial structure of the ammonium group include a primary to tertiary ammonium structure, a pyridinium structure, an imidazolinium structure and a pyrazinium structure.

The basic functional group is preferably a functional group having a nitrogen atom, more preferably a structure having a primary to tertiary amino group or a nitrogen-containing heterocyclic structure. From the standpoint of enhancing the basicity, it is preferred that all atoms adjacent to nitrogen atom contained in the structure are a carbon atom or a hydrogen atom. Also, in view of enhancing the basicity, an electron-withdrawing functional group (e.g., carbonyl group, sulfonyl group, cyano group, halogen atom) is preferably not bonded directly to nitrogen atom.

The monovalent organic group in the monovalent organic group (group R) containing such a structure is preferably an organic group having a carbon number of 4 to 30, and examples thereof include an alkyl group, a cycloalkyl group, an aryl group, an aralkyl group and an alkenyl group. These groups each may have a substituent.

The alkyl group, cycloalkyl group, aryl group, aralkyl group and alkenyl group in the basic functional group- or ammonium group-containing alkyl, cycloalkyl, aryl, aralkyl and alkenyl groups of R are the same as the alkyl group, cycloalkyl group, aryl group, aralkyl group and alkenyl group described for Rx.

Examples of the substituent which the groups above each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). The cyclic structure in the aryl group, cycloalkyl group and the like may be further substituted with an alkyl group (preferably having a carbon number of 1 to 20, more preferably a carbon number of 1 to 10). The aminoacyl group may be further substituted with one or two alkyl groups (preferably having a carbon number of 1 to 20, more preferably a carbon number of 1 to 10). Examples of the alkyl group having a substituent include a perfluoroalkyl group such as perfluoromethyl group, perfluoroethyl group, perfluoropropyl group and perfluorobutyl group.

In the case where B is —N(Rx)-, R and Rx preferably combine together to form a ring. By virtue of forming a ring structure, the stability is enhanced and the composition using this compound is also enhanced in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4- to 8-membered ring containing a nitrogen atom. Examples of the polycyclic structure include a structure composed of a combination of two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). The cyclic structure in the aryl group, cycloalkyl group and the like may be further substituted with an alkyl group (preferably having a carbon number of 1 to 15). The aminoacyl group may be substituted with one or two alkyl groups (preferably having a carbon number of 1 to 15).

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

The compound represented by formula (PA-II) is described below.

$$Q_1\text{-}X_1\text{—}NH\text{—}X_2\text{-}Q_2 \qquad \text{(PA-II)}$$

In formula (PA-II), each of $Q_1$ and $Q_2$ independently represents a monovalent organic group, provided that either one of $Q_1$ and $Q_2$ has a basic functional group. It is also possible that $Q_1$ and $Q_2$ combine together to form a ring and the ring formed has a basic functional group.

Each of $X_1$ and $X_2$ independently represents —CO— or —$SO_2$—.

Here, —NH— corresponds to an acidic functional group generated upon irradiation with an actinic ray or radiation.

The monovalent organic group as $Q_1$ and $Q_2$ in formula (PA-II) is preferably a monovalent organic group having a carbon number of 1 to 40, and examples thereof include an alkyl group, a cycloalkyl group, an aryl group, an aralkyl group, and an alkenyl group.

The alkyl group in $Q_1$ and $Q_2$ may have a substituent and is preferably a linear or branched alkyl group having a carbon number of 1 to 30, and the alkyl chain may contain an oxygen atom, a sulfur atom or a nitrogen atom.

The cycloalkyl group in $Q_1$ and $Q_2$ may have a substituent and is preferably a cycloalkyl group having a carbon number of 3 to 20, and the ring may contain an oxygen atom or a nitrogen atom.

The aryl group in $Q_1$ and $Q_2$ may have a substituent and is preferably an aryl group having a carbon number of 6 to 14.

The aralkyl group in $Q_1$ and $Q_2$ may have a substituent and is preferably an aralkyl group having a carbon number of 7 to 20.

The alkenyl group in $Q_1$ and $Q_2$ may have a substituent and includes a group having a double bond at an arbitrary position of the alkyl group above.

Examples of the substituent which each of the groups above may have include those described as examples of the substituent which each of the groups in formula (PA-1) may have.

Preferred partial structures of the basic functional group which at least either $Q_1$ or $Q_2$ has are the same as those of the basic functional group in R of formula (PA-I).

In the case where $Q_1$ and $Q_2$ combine together to form a ring and the ring formed has a basic functional group, examples of the structure thereof include a structure where the organic group of $Q_1$ or $Q_2$ is further bonded with an alkylene group, an oxy group, an imino group or the like.

In formula (PA-II), at least either one of $X_1$ and $X_2$ is preferably —$SO_2$—.

The compound represented by formula (PA-III) is described below.

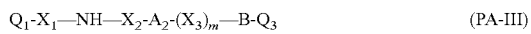

In formula (PA-III), each of $Q_1$ and $Q_3$ independently represents a monovalent organic group, provided that either one of $Q_1$ and $Q_3$ has a basic functional group. It is also possible that $Q_1$ and $Q_3$ combine together to form a ring and the ring formed has a basic functional group.

Each of $X_1$, $X_2$ and $X_3$ independently represents —CO— or —$SO_2$—.

$A_2$ represents a divalent linking group.

B represents a single bond, an oxygen atom or —N(Qx)-.

Qx represents a hydrogen atom or a monovalent organic group.

In the case where B is —N(Qx)-, $Q_3$ and Qx may combine together to form a ring.

m represents 0 or 1.

Here, —NH— corresponds to an acidic functional group generated upon irradiation with an actinic ray or radiation.

$Q_1$ has the same meaning as $Q_1$ in formula (PA-II).

Examples of the organic group of $Q_3$ are the same as those of the organic group of $Q_1$ and $Q_2$ in formula (PA-II).

The divalent linking group in $A_2$ is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably a perfluoroalkylene group, still more preferably a perfluoroalkylene group having a carbon number of 2 to 4.

The monovalent organic group in Qx is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those for Rx in formula (PA-I).

In formula (PA-III), each of $X_1$, $X_2$ and $X_3$ is preferably —$SO_2$—.

The compound (PA) is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

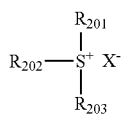

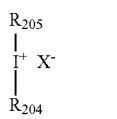

In formula (PA1), each of $R_{201}$, $R_{202}$ and $R_{203}$ independently represents an organic group, and specific examples thereof are the same as those for $R_{201}$, $R_{202}$ and $R_{203}$ of formula (ZI) in the acid generator.

$X^-$ represents a sulfonate or carboxylate anion resulting from elimination of a hydrogen atom in the —$SO_3H$ moiety or —COOH moiety of the compound represented by formula (PA-I), or an anion resulting from elimination of a hydrogen atom in the —NH— moiety of the compound represented by formula (PA-II) or (PA-III).

In formula (PA2), each of $R_{204}$ and $R_{205}$ independently represents an aryl group, an alkyl group or a cycloalkyl group. Specific examples thereof are the same as those for $R_{204}$ and $R_{205}$ of formula (ZII) in the acid generator.

$X^-$ represents a sulfonate or carboxylate anion resulting from elimination of a hydrogen atom in the —$SO_3H$ moiety or —COOH moiety of the compound represented by formula (PA-I), or an anion resulting from elimination of a hydrogen atom in the —NH— moiety of the compound represented by formula (PA-II) or (PA-III).

The compound (PA) decomposes upon irradiation with an actinic ray or radiation to generate, for example, a compound represented by formula (PA-I), (PA-II) or (PA-III).

The compound represented by formula (PA-I) is a compound having a sulfonic or carboxylic acid group together with a basic functional group or an ammonium group and thereby being reduced in or deprived of the basicity or changed from basic to acidic as compared with the compound (PA).

The compound represented by formula (PA-II) or (PA-III) is a compound having an organic sulfonylimino or organic carbonylimino group together with a basic functional group and thereby being reduced in or deprived of the basicity or changed from basic to acidic as compared with the compound (PA).

In the present invention, the expression "reduced in the basicity upon irradiation with an actinic ray or radiation" means that the acceptor property for a proton (an acid generated upon irradiation with an actinic ray or radiation) of the compound (PA) is decreased by the irradiation with an actinic ray or radiation. The expression "reduced in the acceptor property" means that when an equilibrium reaction of producing a noncovalent bond complex as a proton adduct from a basic functional group-containing compound and a proton takes place or when an equilibrium reaction of causing the counter cation of the ammonium group-containing compound to be exchanged with a proton takes place, the equilibrium constant in the chemical equilibrium decreases.

A compound (PA) whose basicity decreases in this way upon irradiation with an actinic ray or radiation is contained in the resist film, so that in the unexposed area, the acceptor property of the compound (PA) is sufficiently brought out and an unintended reaction between an acid diffused from the exposed area or the like and the resin (A) can be inhibited, whereas in the exposed area, the acceptor property of the compound (PA) decreases and the intended reaction of an acid with the resin (A) unfailingly occurs. Such an operation mechanism is considered to contribute to obtaining a pattern excellent in terms of line width variation (LWR), focus latitude (DOF) and pattern profile.

Incidentally, the basicity can be confirmed by measuring the pH, or a calculated value can be computed using a commercially available software.

Specific examples of the compound (PA) whose basicity decreases upon irradiation with an actinic ray or radiation include those described in JP-A-2006-208781 and JP-A-2006-330098.

Specific examples of the compound (PA) capable of generating a compound represented by formula (PA-I) upon irradiation with an actinic ray or radiation are illustrated below, but the present invention is not limited thereto.

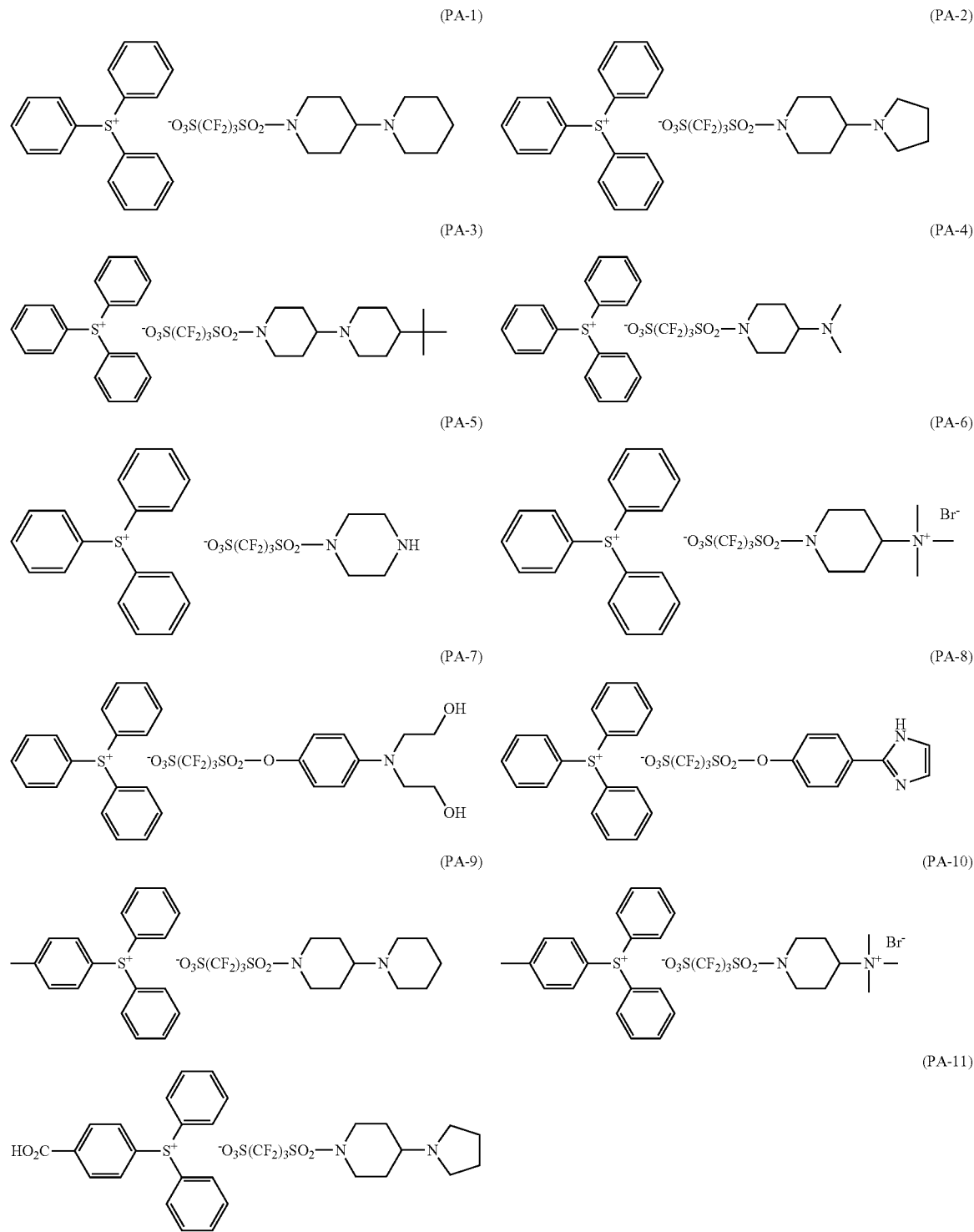

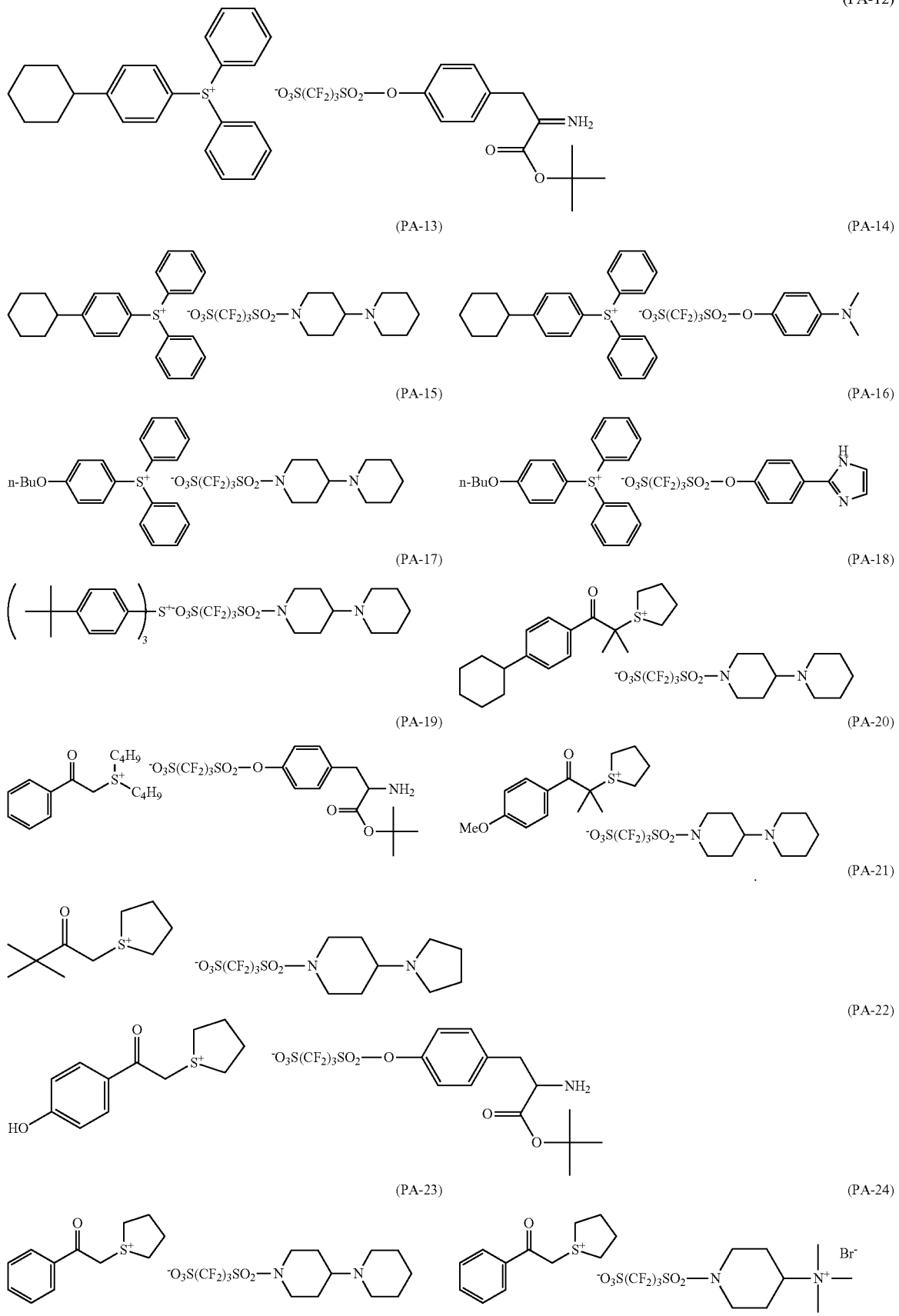

-continued
(PA-25)
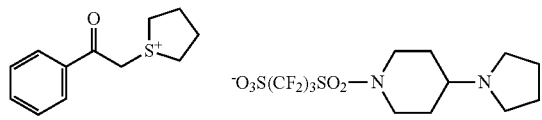
(PA-26)
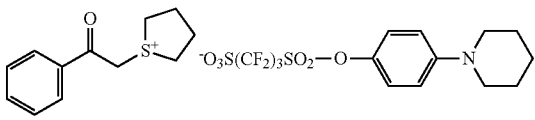
(PA-27)
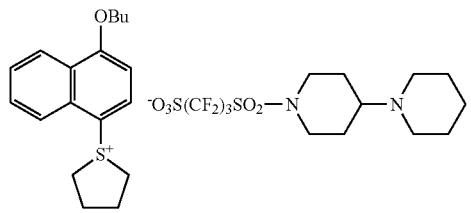
(PA-28)
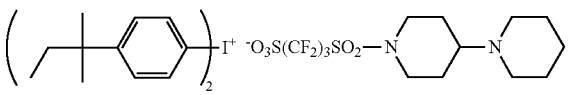
(PA-29)
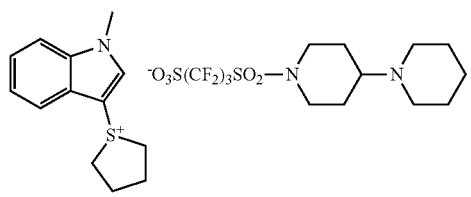
(PA-30)
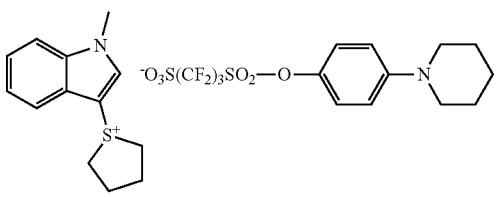
(PA-31)
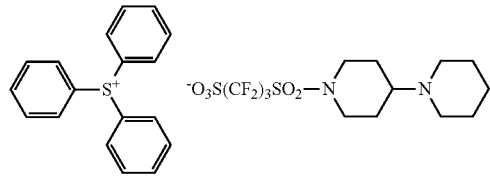
(PA-32)
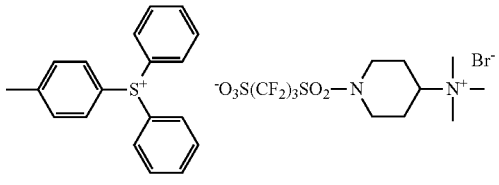
(PA-33)
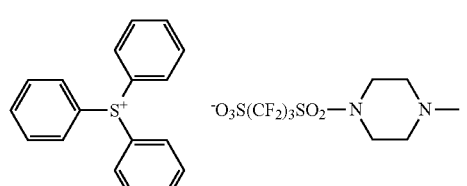
(PA-34)
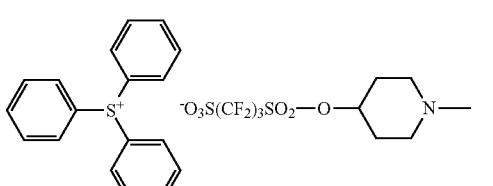
(PA-35)
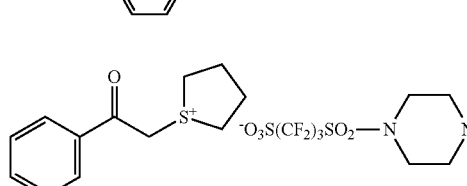
(PA-36)
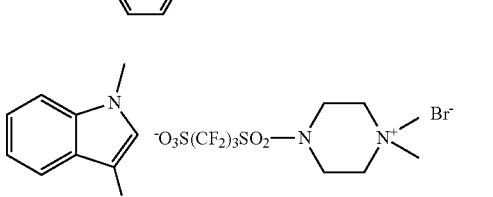
(PA-37)
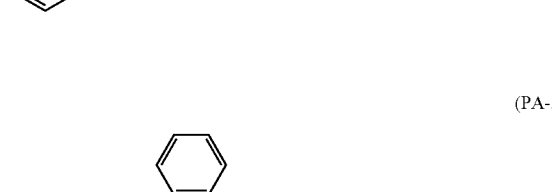
(PA-38)
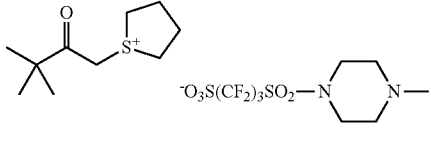

-continued
(PA-39)
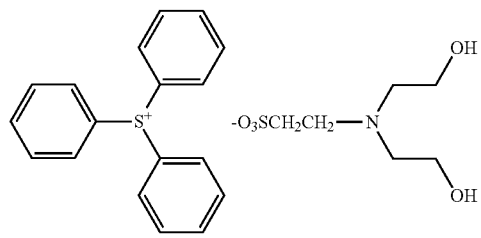
(PA-40)
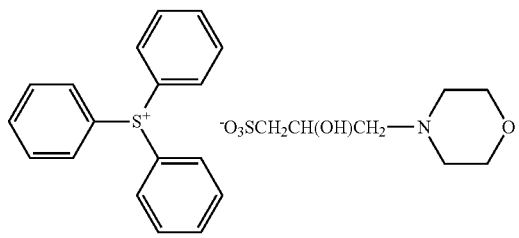
(PA-41)
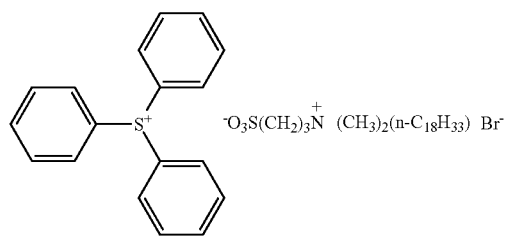
(PA-42)
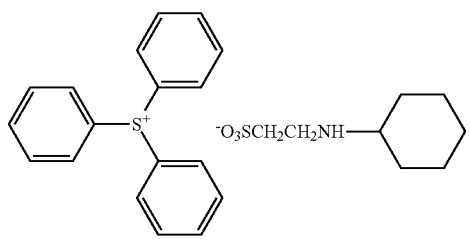
(PA-43)
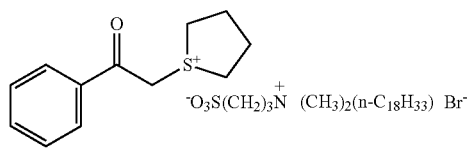
(PA-44)
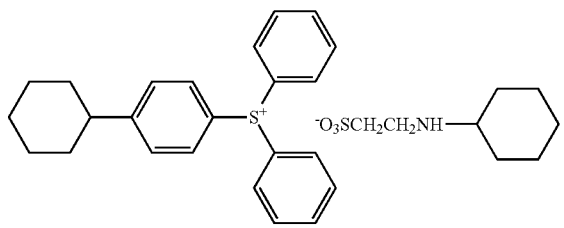
(PA-45)
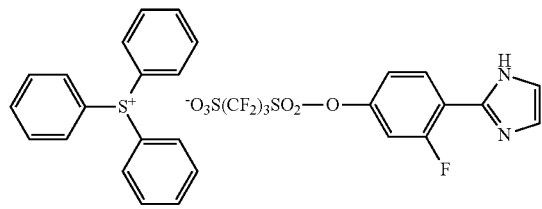
(PA-46)
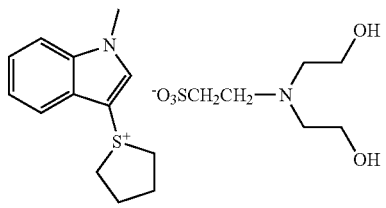
(PA-47)
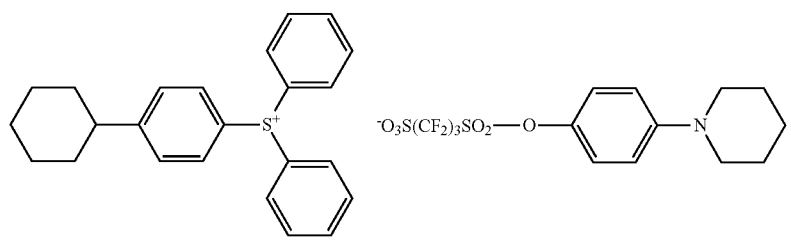
(PA-48)
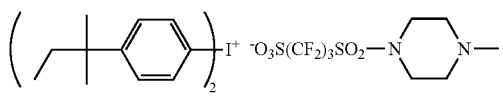
(PA-49)
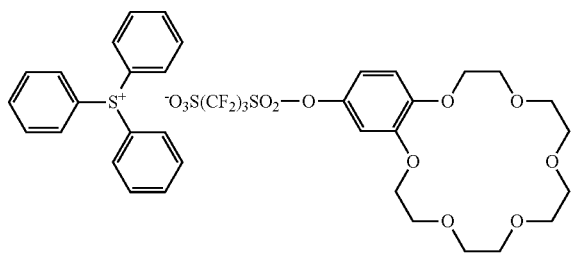

-continued
(PA-50) 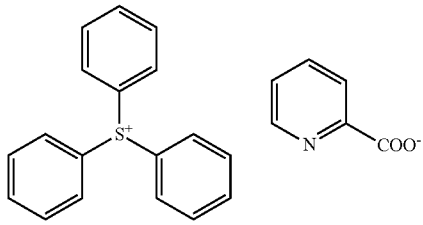
(PA-51) 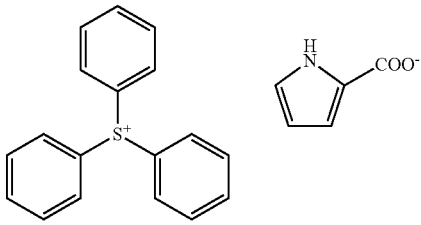
(PA-52) 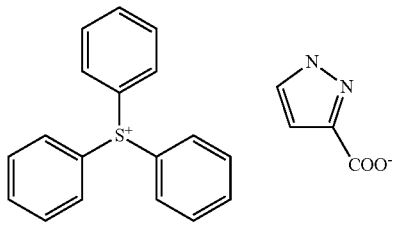
(PA-53) 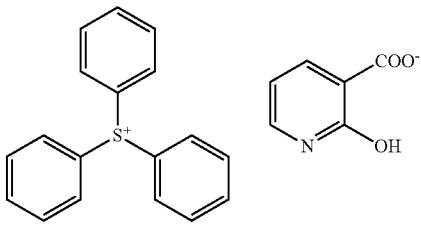
(PA-54) 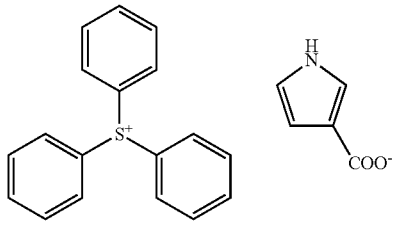
(PA-55) 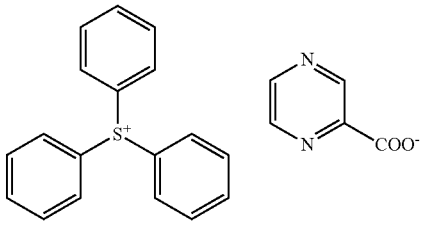
(PA-56) 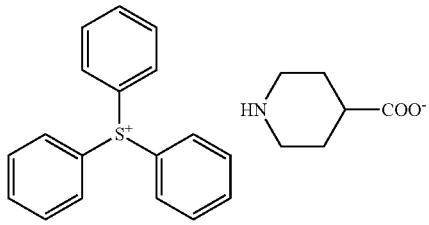
(PA-57) 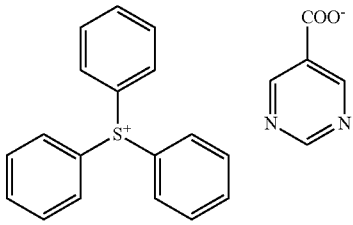
(PA-58) 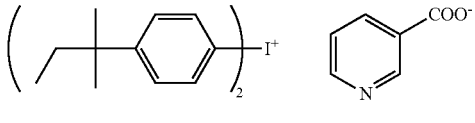
(PA-59) 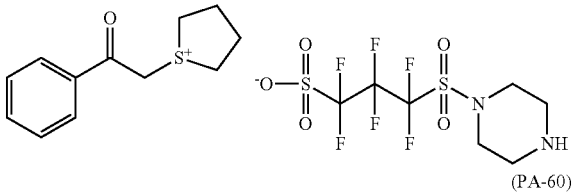
(PA-60) 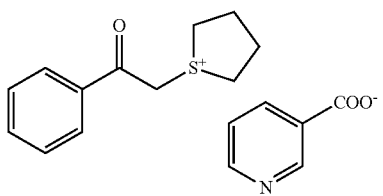

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786. The synthesis may also be performed in accordance with the synthesis method described in JP-A-7-333851.

Specific examples of the compound (PA) capable of generating a compound represented by formula (PA-II) or (PA-III) upon irradiation with an actinic ray or radiation are illustrated below, but the present invention is not limited thereto.

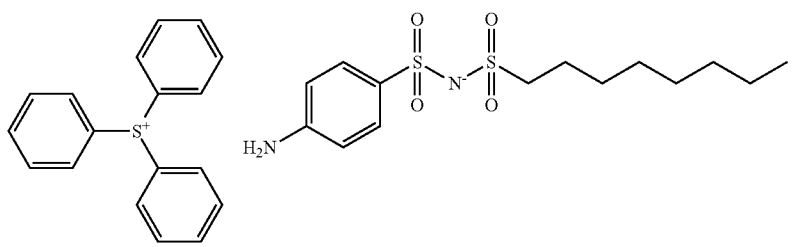

(PA-61)

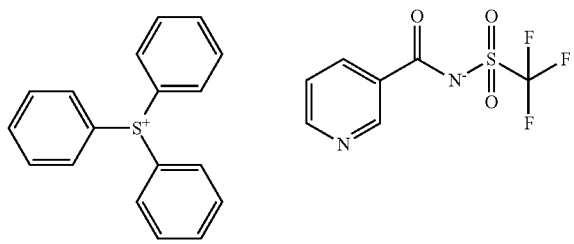

(PA-62)

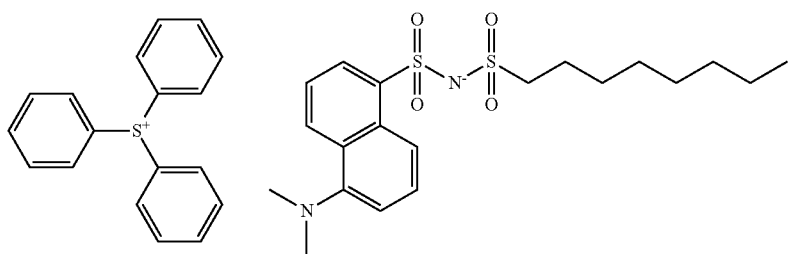

(PA-63)

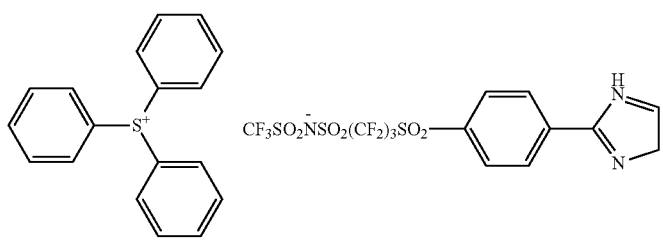

(PA-64)

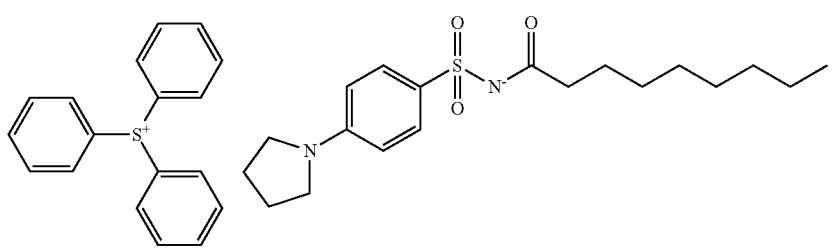

(PA-65)

(PA-66)
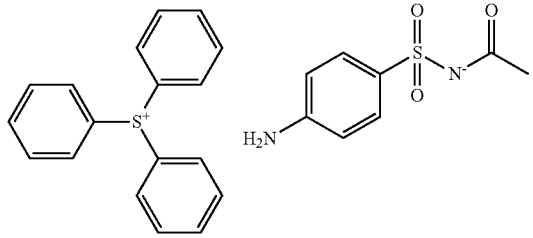
(PA-67)
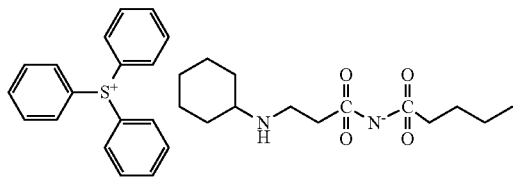
(PA-68)
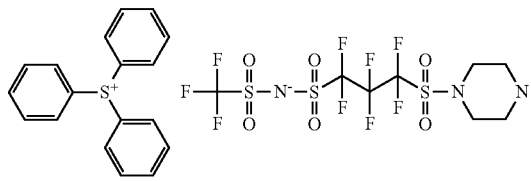
(PA-69)
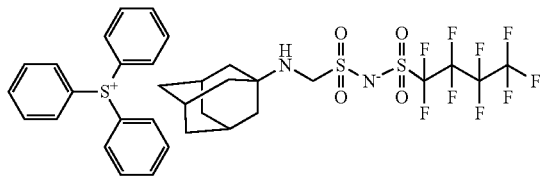
(PA-70)
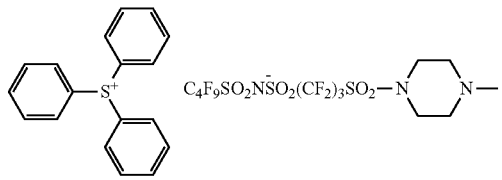
(PA-71)
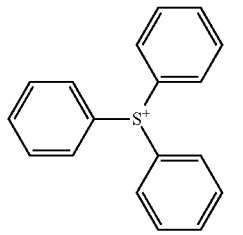 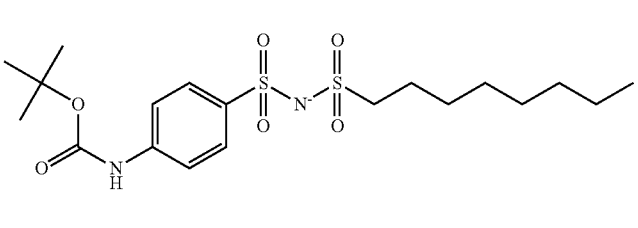
(PA-72)
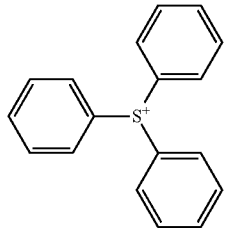 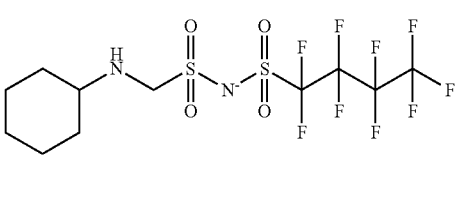
(PA-73)
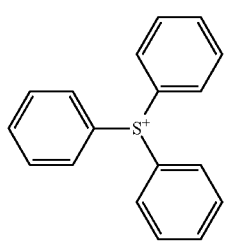 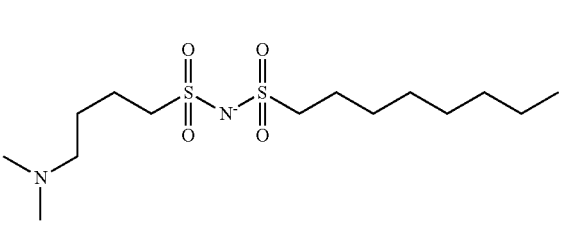
(PA-74)
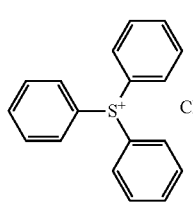
(PA-75)
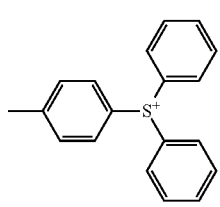

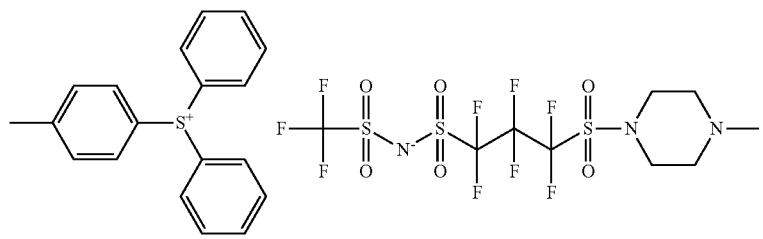
(PA-76)
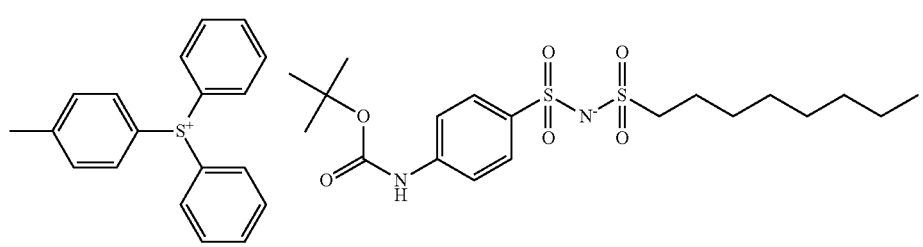
(PA-77)
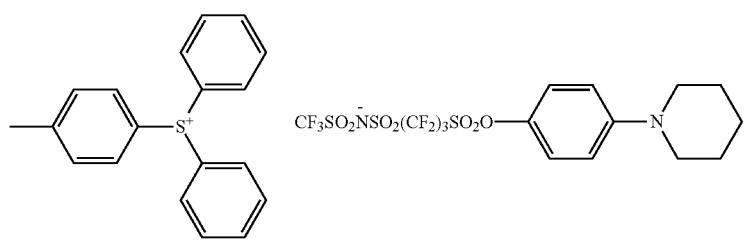
(PA-78)
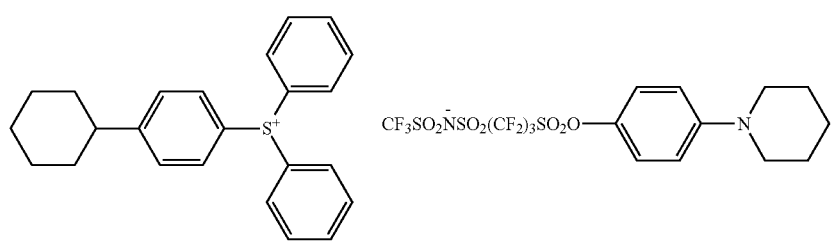
(PA-79)
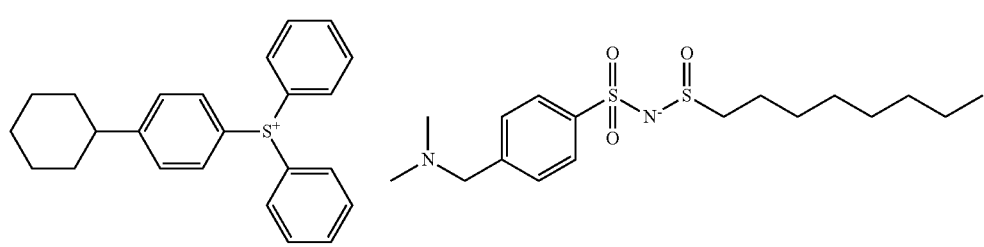
(PA-80)
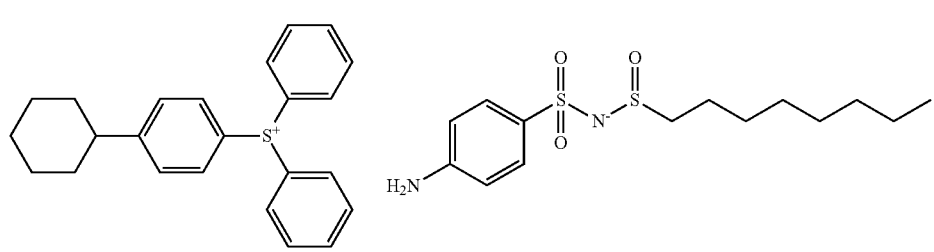
(PA-81)

(PA-82)
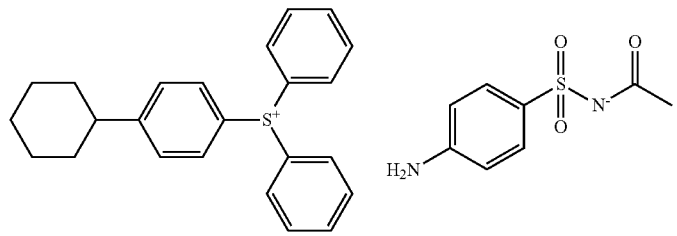
(PA-83)
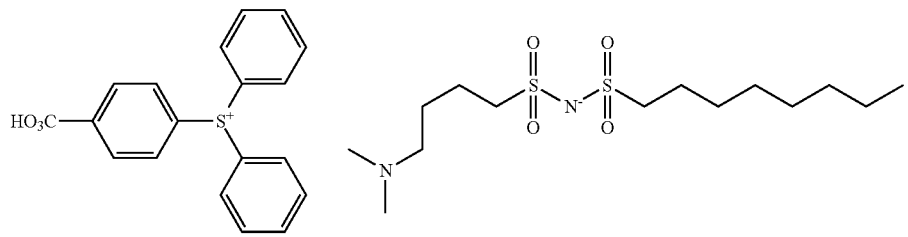
(PA-84)
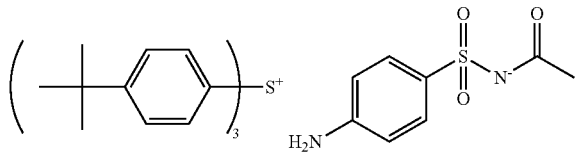
(PA-85)
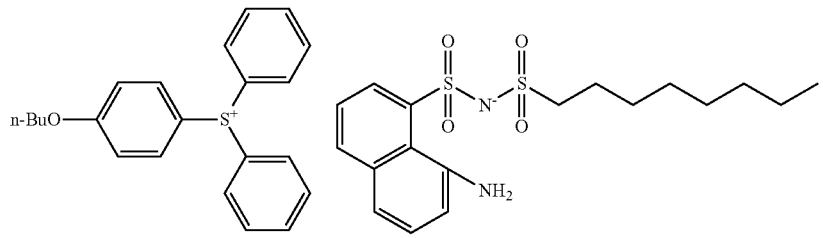
(PA-86)
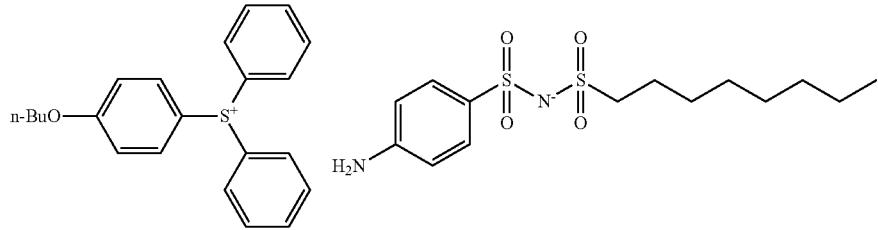
(PA-87)
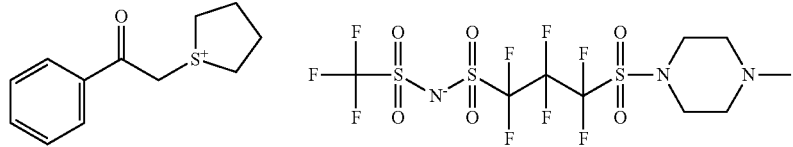
(PA-88)
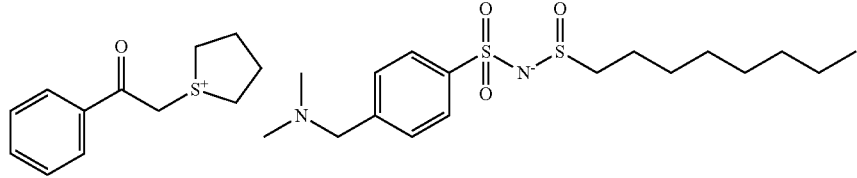

-continued
(PA-89)
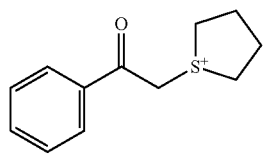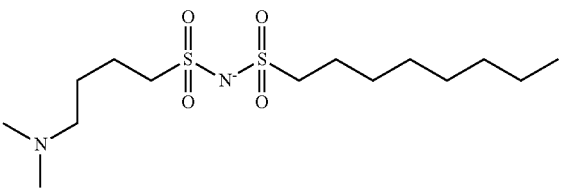
(PA-90)
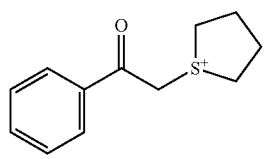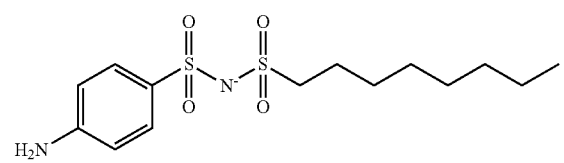
(PA-91)
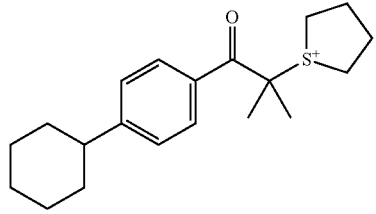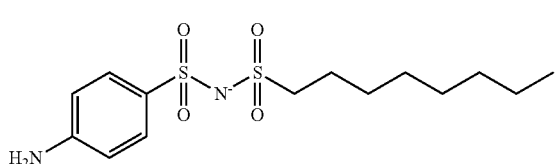
(PA-92)
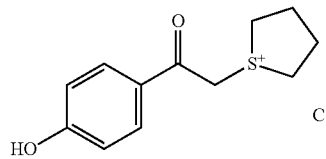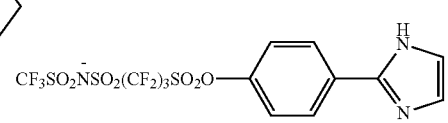
(PA-93)
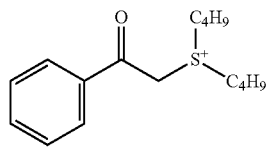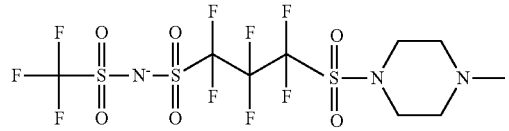
(PA-94)
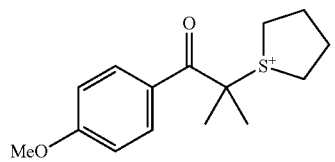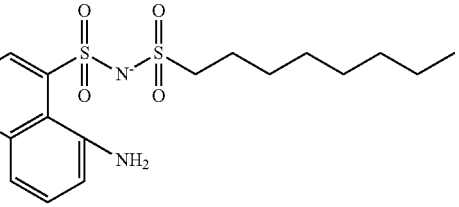
(PA-95)
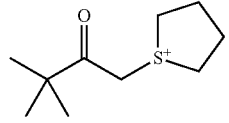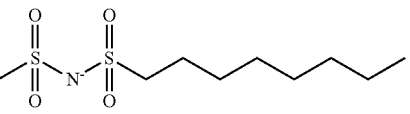
(PA-96)
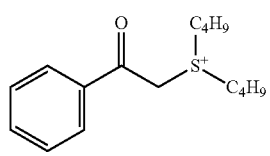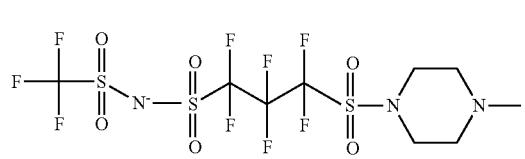

-continued
(PA-97)
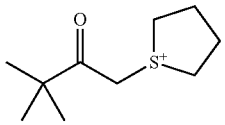 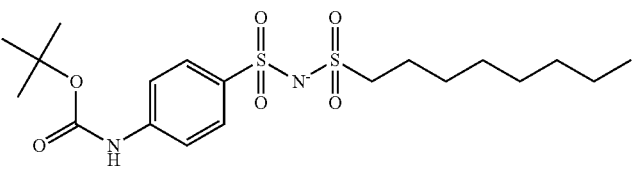
(PA-98)
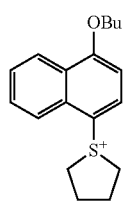 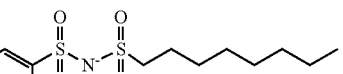
(PA-99)
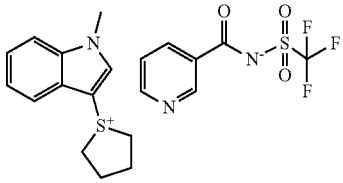
(PA-100)
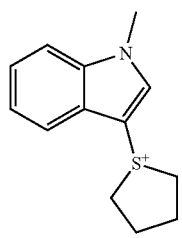 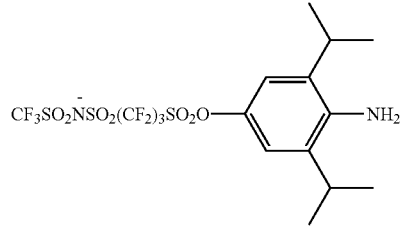
(PA-101)
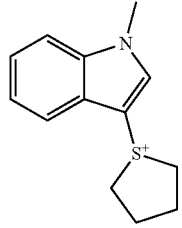 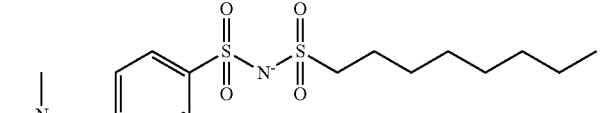
(PA-102)
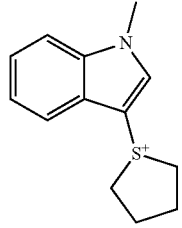 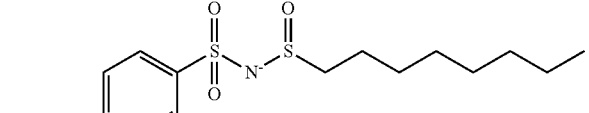
(PA-103)
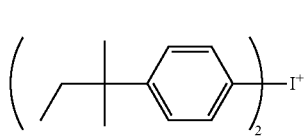 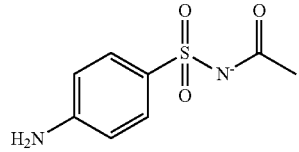
(PA-104)
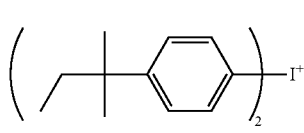 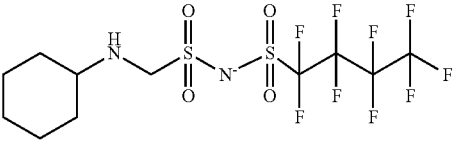

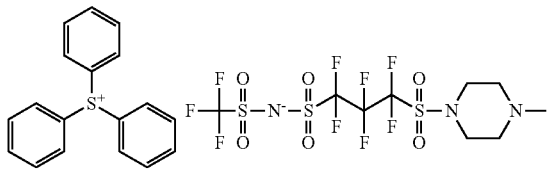

(PA-105)

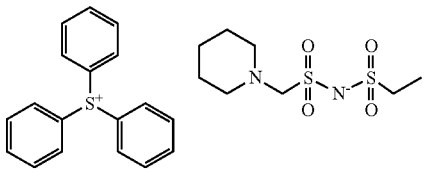

(PA-106)

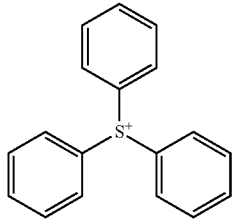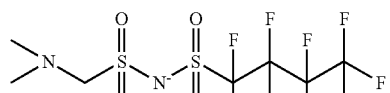

(PA-107)

These compounds can be easily synthesized using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) or (PA-III) can be synthesized by reacting an amine or alcohol with an anhydride (e.g., $(R'O_2C)_2O$, $(R'SO_2)_2O$) or an acid chloride compound (e.g., $R'O_2CCl$, $R'SO_2Cl$) ($R'$ is, for example, a methyl group, an n-octyl group, a trifluoromethyl group) under basic conditions. In particular, the synthesis may be performed in accordance with synthesis examples and the like in JP-A-2006-330098.

The molecular weight of the compound (PA) is preferably from 500 to 1,000.

The content of the compound (PA) in the resist composition for use in the present invention is preferably from 0.1 to 20 mass %, more preferably from 0.1 to 10 mass %, based on the solid content of the composition.

As for the compound (PA), one kind of a compound is used alone, or two or more kinds of compounds are used. Also, the compound (PA) may be used in combination with a basic compound described above.

[9] (G) Other Additives

The resist composition for use in the present invention may further contain, for example, a dye, a plasticizer, a photosensitizer, a light absorber, a dissolution inhibitor, and a dissolution accelerator, if desired.

The solid content concentration of the resist composition for use in the present invention is usually from 1.0 to 10 mass %, preferably from 2.0 to 5.7 mass %, more preferably from 2.0 to 5.3 mass %. When the solid content concentration is in this range, the resist solution can be uniformly applied on a substrate and moreover, a resist pattern improved in the line edge roughness can be formed. The reasons therefor are not clearly know, but it is considered that by setting the solid content concentration to 10 mass % or less, preferably 5.7 mass % or less, the materials, particularly the photo-acid generator, in the resist solution are prevented from aggregation and as a result, a uniform resist film can be formed.

The solid content concentration is a mass percentage of the mass of resist components excluding solvents, based on the total mass of the resist composition.

[10] Pattern Forming Method

The pattern forming method (negative pattern forming method) of the present invention includes:

(i) a step of forming a film from a chemical amplification resist composition, (ii) a step of exposing the film, and (iii) a step of developing the exposed film by using an organic solvent-containing developer.

The resist film is formed from the above-described chemical amplification resist composition of the present invention and more specifically, is preferably formed on a substrate.

In the pattern forming method of the present invention, the step of forming a film from a resist composition on a substrate, the step of exposing the film, and the development step can be performed by a generally known method.

Moreover, a pattern of the present invention is formed by the pattern forming method of the present invention.

The pattern forming method also preferably contains, after film formation, a pre-baking step (PB) before entering the exposure step.

Furthermore, the pattern forming method also preferably contains a post-exposure baking step (PEB) after the exposure step but before the development step.

As for the heating temperature, both PB and PEB are preferably performed at 70 to 120° C., more preferably at 80 to 110° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source wavelength of the exposure apparatus for use in the present invention is not limited, but, for example, a KrF excimer laser wavelength (248 nm), an ArF excimer laser wavelength (193 nm) and an $F_2$ excimer laser wavelength (157 nm) are applicable.

In the present invention, the exposure of the resist film may be performed by filling a liquid (immersion medium) having a refractive index higher than that of air between the film and the lens at the irradiation with an actinic ray or radiation (immersion exposure). By this exposure, the resolution can be enhanced. The immersion medium used may be any liquid as long as it has a refractive index higher than that of air, but pure water is preferred.

In this case, the above-described hydrophobic resin may be previously added to the resist composition, or after forming a resist film, a sparingly immersion liquid-soluble film (hereinafter, sometimes referred to as a "topcoat") may be provided thereon.

The performance required of the topcoat, the use method thereof and the like are described in Ekishin Lithography no Process to Zairyo (Process and Material of Immersion Lithography), Chapter 7, CMC Shuppan.

In view of transparency to laser at a wavelength of 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is suitable also as the topcoat. Furthermore, a commercially available topcoat material can also be appropriately used.

On peeling off the topcoat after exposure, a developer may be used or a releasing agent may be separately used. The releasing agent is preferably a solvent less permeating the film. From the standpoint that the peeling step can be performed simultaneously with the development step of the film, the topcoat is preferably peelable with a developer.

In the present invention, the substrate on which the film is formed is not particularly limited, and a substrate generally used in the production process of a semiconductor such as IC, in the production process of a liquid crystal device or a circuit board such as thermal head or in the lithography of other photo-fabrication processes, such as inorganic substrate (e.g., silicon, SiN, $SiO_2$, SiN) and coating-type inorganic substrate (e.g., SOG), can be used. If desired, an organic antireflection film may be formed between the film and the substrate.

Development Step:

As for the organic developer which can be used in performing development with an organic solvent-containing developer, a developer containing a polar solvent such as ketone-based solvent, ester-based solvent, alcohol-based solvent, amide-based solvent and ether-based solvent, or a hydrocarbon-based solvent can be used. It is preferred to contain at least one kind of an organic solvent selected from a ketone-based solvent, an ester-based solvent, an alcohol-based solvent, an amide-based solvent and an ether-based solvent.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Above all, an alkyl acetate such as methyl acetate, butyl acetate, ethyl acetate, isopropyl acetate and amyl acetate is preferred.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or within a range keeping the performance, the solvent may be used by mixing it with a solvent other than those described above or with water. However, in order to sufficiently bring out the effects of the present invention, the water content of the entire developer is preferably less than 10 mass %, and it is more preferred to contain substantially no water.

That is, the amount of the organic solvent used in the developer is preferably from 90 to 100 mass %, more preferably from 95 to 100 mass %, based on the entire amount of the developer.

In particular, the organic solvent-containing developer is preferably a developer containing at least one kind of a solvent selected from a ketone-based solvent, an ester-based solvent, an alcohol-based solvent, an amide-based solvent and an ether-based solvent.

The vapor pressure at 20° C. of the organic solvent-containing developer is preferably 5 kPa or less, more preferably 3 kPa or less, still more preferably 2 kPa or less. By setting the vapor pressure of the developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

Surfactant:

In the developer, a surfactant can be added in an appropriate amount, if desired.

As for the surfactant, those described above as the surfactant used in the resist composition can be used.

The amount of the surfactant used is usually from 0.001 to 5 mass %, preferably from 0.005 to 2 mass %, more preferably from 0.01 to 0.5 mass %, based on the entire amount of the developer.

Resin (A'):

The organic solvent-containing developer and the later-described rinsing solution may contain (A') a resin soluble in an organic solvent. In this case, it is presumed that the resin (A') is previously dissolved in the processing solution and the dissolution of resist film in the processing solution or the permeation of processing solution into the resist film is thereby accelerated.

The resin (A') is not particularly limited as long as it is soluble in an organic solvent, and resins for use in the resist composition may be suitably used, but an epoxy resin, a melamine resin, a urea resin, a polyester resin, a polyurethane resin, a polyimide resin and the like can also be used.

Examples of the (A') resin soluble in an organic solvent include a resin containing the following repeating units:
 a repeating unit having an alcoholic hydroxyl group (a1),
 a repeating unit having a nonpolar group (a2),
 a repeating unit having a lactone structure (a3),
 a repeating unit having an acid-decomposable group (a4),
 a repeating unit having an acid group,
 a repeating unit derived from hydroxystyrene or a derivative thereof, and
 a (meth)acryl ester repeating unit having an aromatic ring in the side chain.

Specific examples of this resin are the same as those of the resin contained in the resist composition.

The weight average molecular weight of the resin (A') for use in the present invention is preferably from 3,000 to 25,000, more preferably from 5,000 to 15,000, in terms of polystyrene as measured by the GPC method.

The polydispersity (molecular weight distribution) of the resin (A') is preferably from 1.2 to 3.0, more preferably from 1.4 to 1.8.

The blending amount of the resin (A') in the entire processing solution is preferably from 0.0001 to 10 mass %, more preferably from 0.001 to 5 mass %, based on the entire amount of the processing solution.

In the processing solution, one kind of resin (A') may be contained, or a plurality of kinds thereof may be contained.

The resin (A') for use in the present invention can be synthesized by a conventional method (for example, radical polymerization).

Examples of the developing method which can be applied include a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate spinning at a constant speed while scanning the developer ejecting nozzle at a constant rate (dynamic dispense method).

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist residue after development can be greatly reduced.

Details of this mechanism are not clearly known, but it is considered that thanks to the ejection pressure in the above-described range, the pressure imposed on the resist film by the developer possibly becomes small and the resist film or resist pattern is kept from inadvertent chipping or collapse.

Here, the ejection pressure (mL/sec/mm$^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and thereby adjusting the pressure to change the ejection pressure.

Rinsing Step:

After the step of performing the development, a step of stopping the development by replacement with another solvent may be practiced.

A step of rinsing the resist film with a rinsing solution is preferably provided after the development with an organic solvent-containing developer. The rinsing solution is preferably a rinsing solution containing an organic solvent.

The rinsing solution for use in the rinsing step after the development with an organic solvent-containing developer is not particularly limited as long as it does not dissolve the resist pattern, and a solution containing a general organic solvent may be used. As for the rinsing solution, a rinsing solution containing at least one kind of an organic solvent selected from a hydrocarbon-based solvent, a ketone-based solvent, an ester-based solvent, an alcohol-based solvent, an amide-based solvent and an ether-based solvent is preferably used. The rinsing solution more preferably contains at least one kind of an organic solvent selected from a ketone-based solvent, an ester-based solvent, an alcohol-based solvent and an amide-based solvent, still more preferably contains an alcohol-based solvent or an ester-based solvent, yet still more preferably contains a monohydric alcohol, and even yet still more preferably contains a monohydric alcohol having a carbon number of 5 or more. The monohydric alcohol used in the rinsing step after the development includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used. Among these, a branched alkyl alcohol having a carbon number of 5 or more is preferred.

A plurality of these components may be mixed, or the solvent may be used by mixing it with an organic solvent other than those described above.

The water content in the rinsing solution is preferably less than 10 mass %, more preferably less than 5 mass %, still more preferably less than 3 mass %. By setting the water content to less than 10 mass %, good development characteristics can be obtained.

In other words, the amount of the organic solvent used in the rinsing solution is preferably from 90 to 100 mass %, more preferably from 95 to 100 mass %, and most preferably from 97 to 100 mass %, based on the entire amount of the rinsing solution.

The vapor pressure at 20° C. of the rinsing solution used after the development with an organic solvent-containing developer is preferably from 0.05 to 5 kPa, more preferably from 0.1 to 5 kPa, and most preferably from 0.12 to 3 kPa. By setting the vapor pressure of the rinsing solution to be from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may also be used after adding thereto a surfactant and the resin (A') each in an appropriate amount. The kinds and amounts added of the surfactant and the resin (A') which can be contained are the same as those in the developer.

In the rinsing step, the wafer after development is washed using the above-described organic solvent-containing rinsing solution. The method for washing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the washing treatment by the spin coating method and after the washing, remove the rinsing solution from the substrate surface by spinning the substrate at a rotational speed of 2,000 to 4,000 rpm. A heating step (Post Bake) is also preferably provided after the rinsing step. Thanks to baking, the developer and rinsing solution remaining between patterns and in the inside of pattern are removed. The heating step after the rinsing step is performed usually at 40 to 160° C., preferably at 70 to 95° C., for usually from 10 seconds to 3 minutes, preferably from 30 to 90 seconds.

EXAMPLES

Synthesis Example 1

Synthesis of Resin (A)

In a nitrogen stream, a three-neck flask was charged with 40 g of cyclohexanone and heated at 80° C. (Solvent 1). Monomers corresponding to the following repeating units were dissolved in a molar ratio of 30/40/30 in cyclohexanone to prepare a 22 mass % monomer solution (400 g), and polymerization initiator V-601 (produced by Wako Pure Chemical Industries, Ltd.) in an amount of 7.2 mol % based on the monomers was added thereto and dissolved. The resulting solution was added dropwise to Solvent 1 over 6 hours. After the completion of dropwise addition, the reaction was further allowed to proceed at 80° C. for 2 hours. The resulting reaction solution was left to cool and then poured in 3,600 ml of heptane/400 ml of ethyl acetate, and the powder precipitated was collected by filtration and dried, as a result, 74 g of Resin (P-1) was obtained. The weight average molecular weight of Resin (P-1) was 8,600 and the polydispersity (Mw/Mn) was 1.78.

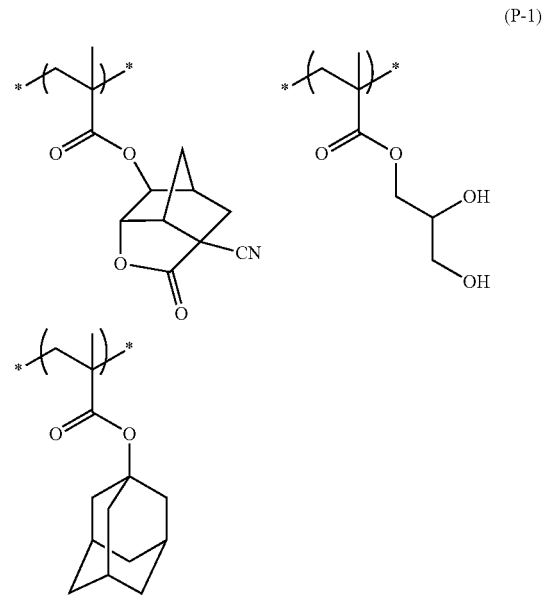

(P-1)

Synthesis Example 2

Synthesis of Hydrophobic Resin (6b)

Synthesis of Compound (4)

Compound (1) shown below was synthesized by the method described in International Publication No. 07/037, 213, pamphlet.

Subsequently, 150.00 g of water was added to 35.00 g of Compound (1), and 27.30 g of sodium hydroxide was further added. The mixture was stirred for 9 hours under heating and refluxing conditions. The resulting reaction solution was rendered acidic by adding hydrochloric acid and then extracted with ethyl acetate. The organic layers were combined and concentrated to obtain 36.90 g of Compound (2) (yield: 93%).

$^1$H-NMR (400 MHz in $(CD_3)_2CO$): σ (ppm)=1.56-1.59 (1H), 1.68-1.72 (1H), 2.13-2.15 (1H), 2.13-2.47 (2H), 3.49-3.51 (1H), 3.68 (1H), 4.45-4.46 (1H).

Thereafter, 200 ml of $CHCl_3$ was added to 20.00 g of Compound (2), and 50.90 g of 1,1,1,3,3,3-hexafluoroisopropyl alcohol and 30.00 g of 4-dimethylaminopyridine were further added, followed by stirring. To the resulting solution, 22.00 g of 1-ethyl-3-(3-dimethylaminopropyl)carbodiimide hydrochloride was added, and the mixture was stirred for 3 hours. The reaction solution was added to 500 ml of 1 N HCl to stop the reaction, and the organic layer was washed further with 1 N HCl and then washed with water. The obtained organic layer was concentrated to obtain 30.00 g of Compound (3) (yield: 85%).

$^1$H-NMR (400 MHz in $(CD_3)_2CO$): σ (ppm)=1.62 (1H), 1.91-1.95 (1H), 2.21-2.24 (1H), 2.45-2.53 (2H), 3.61-3.63 (1H), 3.76 (1H), 4.32-4.58 (1H), 6.46-6.53 (1H).

Furthermore, 300.00 g of toluene was added to 15.00 g of Compound (3), and 3.70 g of methacrylic acid and 4.20 g of p-toluenesulfonic acid monohydrate were added thereto. The mixture was refluxed for 15 hours while azeotropically removing the water produced, and the resulting reaction solution was concentrated. The concentrate was purified by column chromatography to obtain 11.70 g of Compound (4) (yield: 65%).

$^1$H-NMR (400 MHz in $(CD_3)_2CO$): σ (ppm)=1.76-1.79 (1H), 1.93 (3H), 2.16-2.22 (2H), 2.57-2.61 (1H), 2.76-2.81 (1H), 3.73-3.74 (1H), 4.73 (1H), 4.84-4.86 (1H), 5.69-5.70 (1H), 6.12 (1H), 6.50-6.56 (1H).

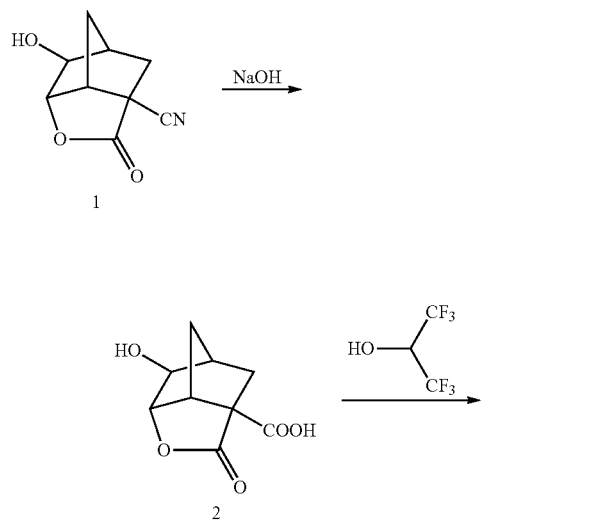

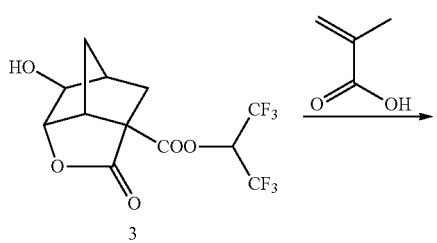

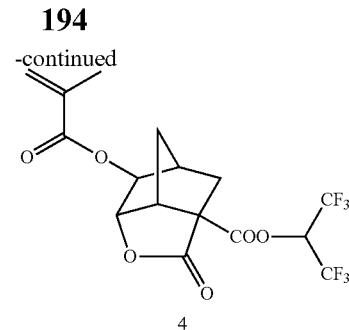

4

Synthesis of Hydrophobic Resin (6b)

In a nitrogen stream, a three-neck flask was charged with 7.7 g of MEK and heated at 75° C. and thereto, a solution prepared by dissolving 20.81 g of Compound (4), 0.345 g of polymerization initiator V-601 (produced by Wako Pure Chemical Industries, Ltd.), and 0.304 g of dodecanethiol in 30.9 g of MEK was added dropwise over 6 hours. After the completion of dropwise addition, the reaction was further allowed to proceed at 75° C. for 2 hours. The resulting reaction solution was left to cool and then added dropwise to a mixed solution of 400 g of heptane/100 g of ethyl acetate, and the powder precipitated was collected by filtration and dried, as a result, Polymer (6b) (18.1 g) was obtained. The weight average molecular weight of the obtained polymer was 12,000 in terms of standard polystyrene and the polydispersity (Mw/Mn) was 1.71.

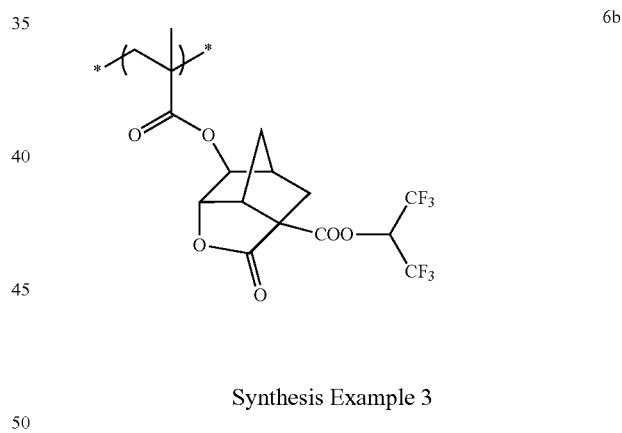

Synthesis Example 3

Synthesis of Hydrophobic Resin (1b)

Respective monomers corresponding to the following repeating units were charged in a ratio of 40/60 (by mol) and dissolved in propylene glycol monomethyl ether acetate (PGMEA) to prepare 450 g of a solution having a solid content concentration of 15 mass %. To this solution, 1 mol % of polymerization initiator V-60 produced by Wako Pure Chemical Industries, Ltd. was added and in a nitrogen atmosphere, the mixture was added dropwise over 6 hours to 50 g of PGMEA heated to 100° C. After the completion of dropwise addition, the reaction solution was stirred for 2 hours. Once the reaction was completed, the reaction solution was cooled to room temperature and crystallized from 5 L of methanol, and the precipitated white powder was filtered to collect the objective Resin (1b).

(1b)

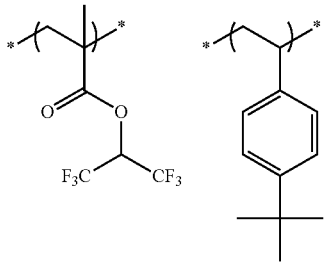 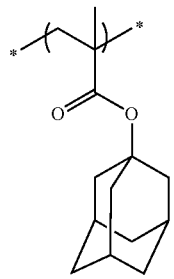

The compositional ratio of polymer determined from NMR was 40/60. Also, the weight average molecular weight in terms of standard polystyrene as determined by the GPC measurement was 8,000, and the polydispersity was 1.55.

Resins (P-2) to (P-10), (P-1') to (P-10') and (CP-1) and Hydrophobic Resins (2b) to (5b) were synthesized in the same manner as in Synthesis Examples 1 to 3 except for using monomers corresponding to respective repeating units to give a desired compositional ratio (molar ratio). Here, Hydrophobic Resins (1b) to (6b) correspond to the resin (HR).

Structures of Resins (P-1) to (P-10), (P-1') to (P-10') and (CP-1) and Hydrophobic Resins (1b) to (6b) are shown below. Also, the compositional ratio (by mol), weight average molecular weight and polydispersity of each of Resins (P-1) to (P-10), (P-1') to (P-10') and (CP-1) and Hydrophobic Resins (1b) to (6b) are shown in Table 2.

(Measurement of Dissolution Rate)

A composition prepared by dissolving only each of Resins (P-1) to (P-10), (P-1') to (P-10') and (CP-1) in butyl acetate to have an entire solid content concentration of 4 mass % was coated on a silicon wafer and baked at 100° C. for 60 seconds to form a resin film having a thickness of 100 nm, and the resin film was dipped in an aqueous 2.38 mass % TMAH solution for 1,000 seconds. From the thickness measured of the residual film when the film remained undissolved or from the time until complete dissolution of the film when the film was completely dissolved, the average dissolution rate (nm/sec) was calculated. The measurement of these results was performed using QCM at room temperature (25° C.). As a result, the alkali dissolution rate was 1.0 nm/sec or less in all of the films formed from Resins (P-1) to (P-10), (P-1') to (P-10') and (CP-1).

(P-1), (P-1')

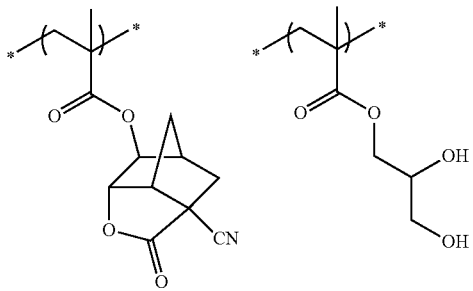

(P-2), (P-2')

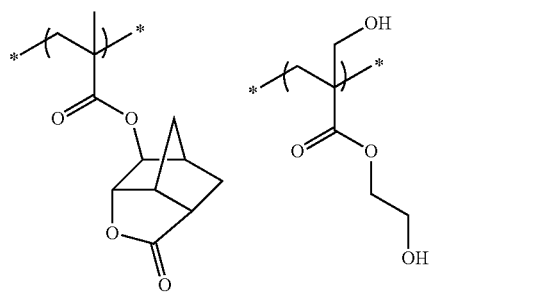

(P-3), (P-3')

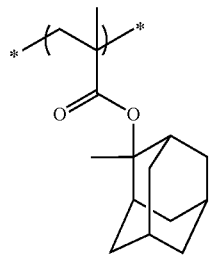

(P-4), (P-4')

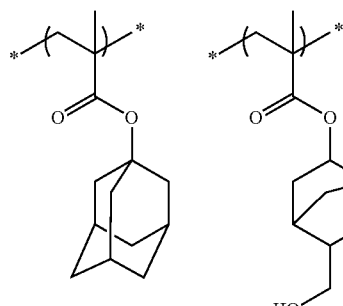

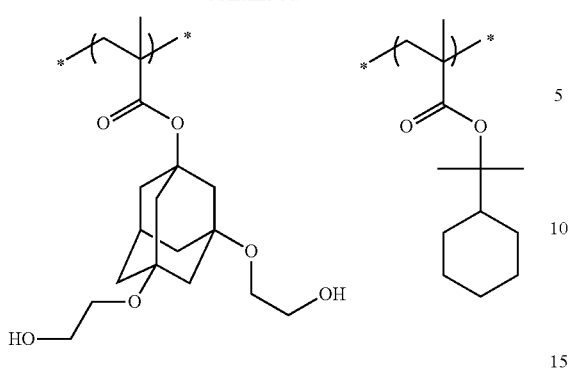
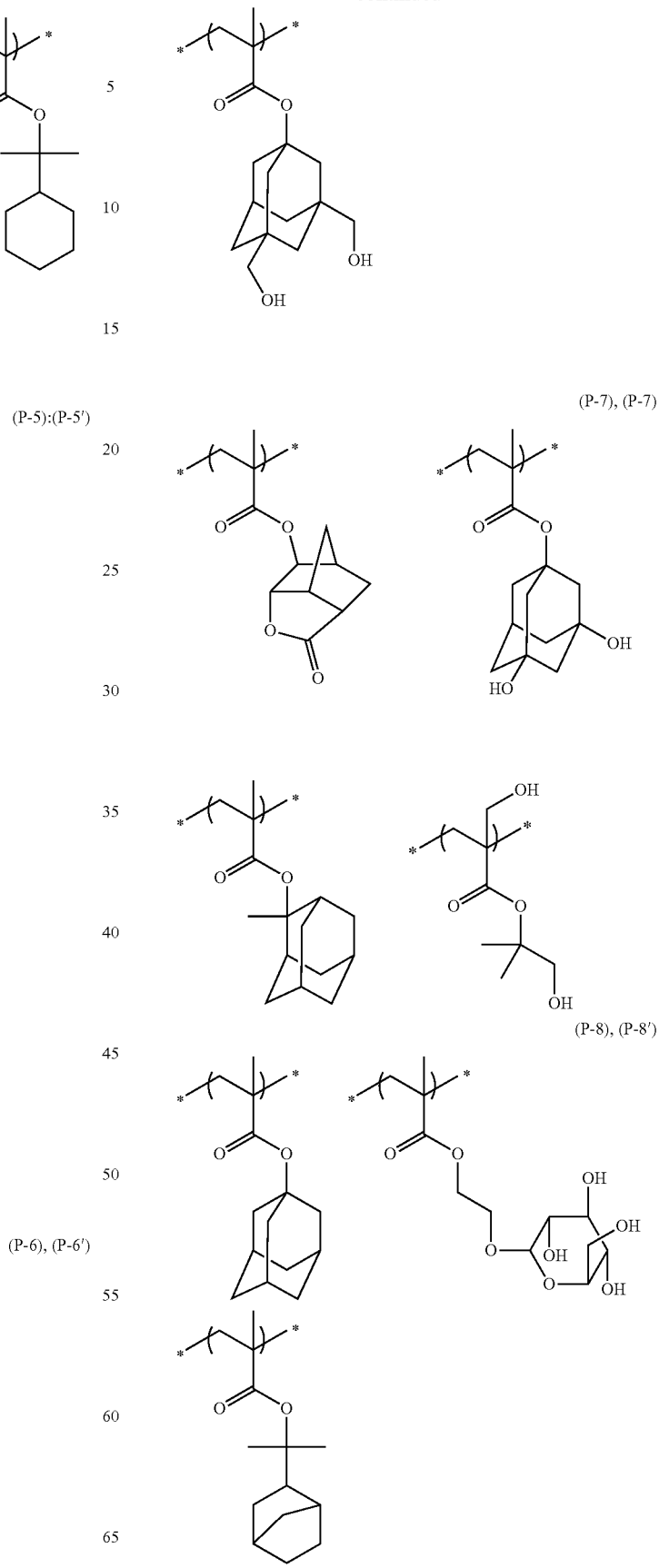

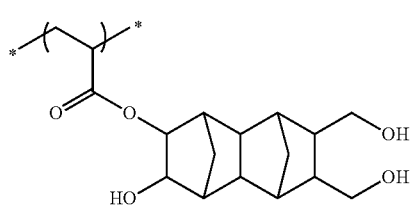
(P-9), (P-9')
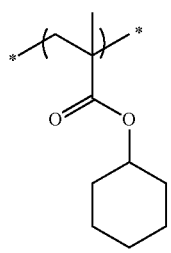
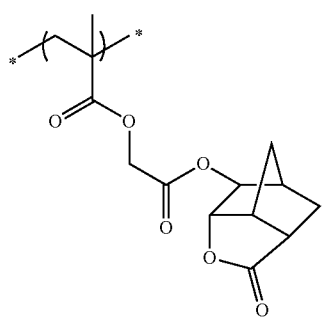
(P-10), (P-10')
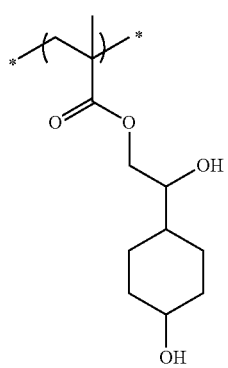
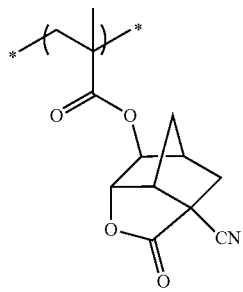
(CP-1)
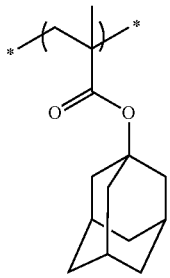
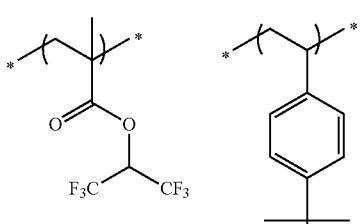
(1b)
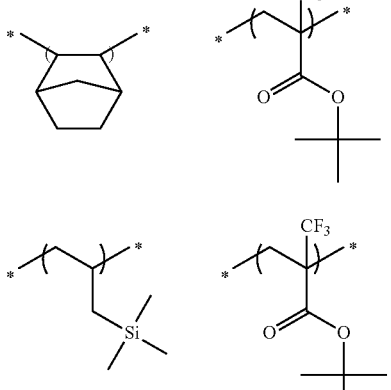
(2b)
(3b)
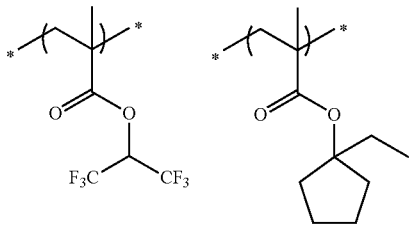
(4b)
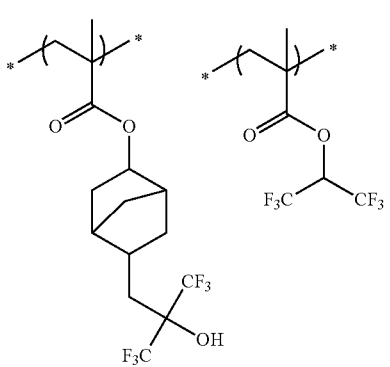
(5b)

-continued

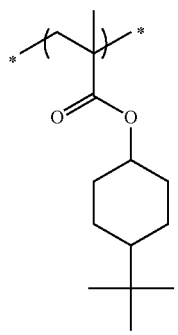

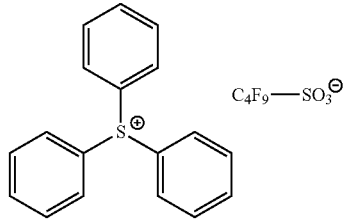
PAG-1

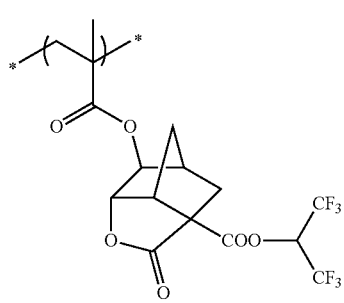
(6b)

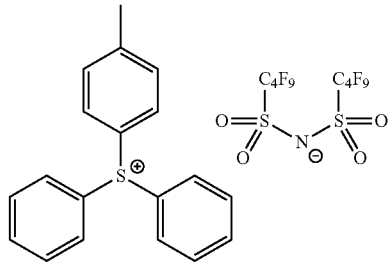
PAG-2

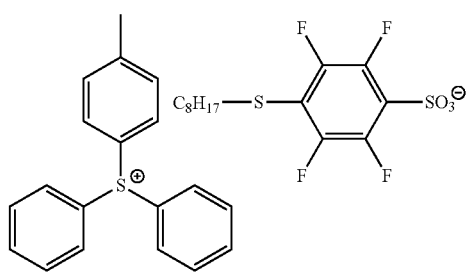
PAG-3

TABLE 2

| Resin | Composition (mol %) | Mw | Mw/Mn | Resin | Composition (mol %) | Mw | Mw/Mn |
|---|---|---|---|---|---|---|---|
| (P-1) | 30/40/30 | 8600 | 1.78 | (P-1') | 40/30/30 | 3100 | 1.81 |
| (P-2) | 40/30/30 | 10400 | 1.78 | (P-2') | 20/50/30 | 9600 | 1.76 |
| (P-3) | 60/40 | 8800 | 1.72 | (P-3') | 48/52 | 3900 | 1.74 |
| (P-4) | 20/40/40 | 6100 | 1.71 | (P-4') | 40/20/40 | 6300 | 1.71 |
| (P-5) | 45/25/30 | 4000 | 1.74 | (P-5') | 35/35/30 | 9100 | 1.70 |
| (P-6) | 20/50/30 | 6300 | 1.75 | (P-6') | 20/60/20 | 7700 | 1.76 |
| (P-7) | 30/10/40/20 | 7300 | 1.77 | (P-7') | 40/10/20/30 | 9700 | 1.71 |
| (P-8) | 40/20/40 | 8200 | 1.79 | (P-8') | 50/10/40 | 7900 | 1.69 |
| (P-9) | 40/60 | 5500 | 1.84 | (P-9') | 30/70 | 6100 | 1.80 |
| (P-10) | 25/55/20 | 6200 | 1.78 | (P-10') | 40/30/30 | 9300 | 1.68 |
| (CP-1) | 30/40/30 | 8400 | 1.77 | | | | |
| (1b) | 40/60 | 8000 | 1.55 | | | | |
| (2b) | 50/50 | 6400 | 1.61 | | | | |
| (3b) | 50/50 | 4500 | 1.49 | | | | |
| (4b) | 25/75 | 10500 | 1.61 | | | | |
| (5b) | 20/20/60 | 12000 | 1.70 | | | | |
| (6b) | 100 | 12000 | 1.71 | | | | |

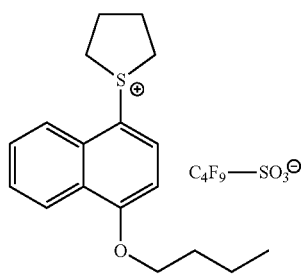
PAG-4

Synthesis Example 4

Synthesis of Acid Generator (PAG-10)

Acid Generator (PAG-10) was synthesized in accordance with WO2008/153110A1, paragraphs [0382] to [0385].

Photoacid Generators (PAG-1) to (PAG-9), (PAG-11) and (PAG-12) of the following formulae were synthesized in the same manner

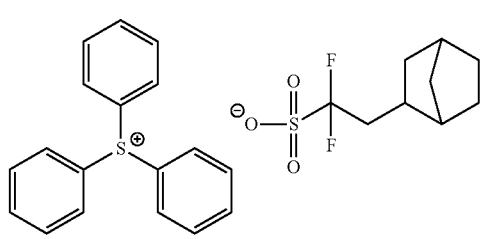
PAG-5

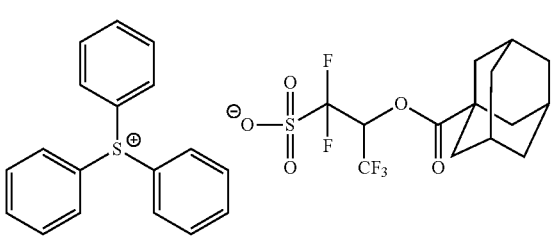
PAG-6

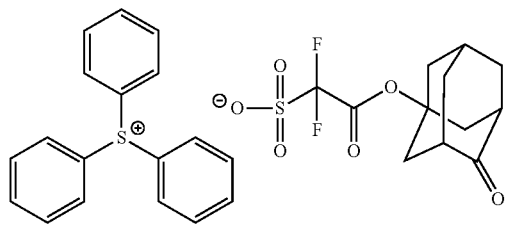

PAG-7

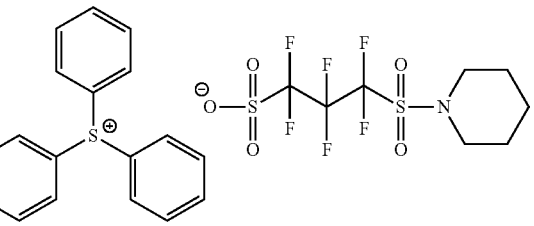

PAG-10

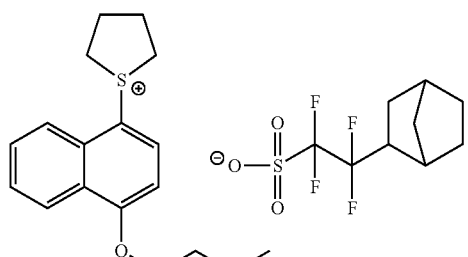

PAG-8

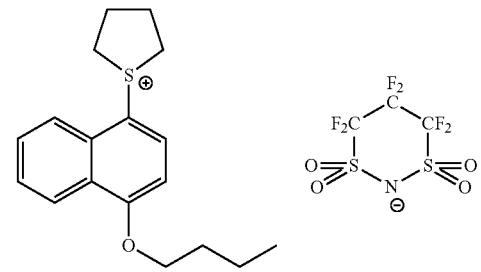

PAG-11

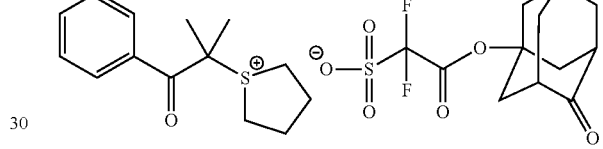

PAG-12

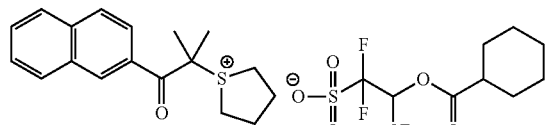

PAG-9

<Preparation of Resist Composition>

The components shown in Table 3 below were dissolved in the solvent shown in Table 3, and the obtained solution was filtered through a polyethylene filter having a pore size of 0.03 μm to prepare Resist Compositions Ar-1 to Ar-21.

TABLE 3

| Composition | Resin (A) | | Resin (C) | | Acid Generator 1 | | Acid Generator 2 | | Basic Compound 1 (or Compound (PA)) | | Basic Compound 2 (or Compound (PA)) | |
|---|---|---|---|---|---|---|---|---|---|---|---|---|
| | No. | parts by mass | Compound No. | parts by mass | Compound No. | parts by mass | Compound No. | parts by mass | Compound No. | parts by mass | Compound No. | parts by mass |
| Ar-1 | P-1 | 87.3 | 1b | 0.8 | PAG-7 | 8.0 | | | N-1 | 0.60 | N-4 | 0.30 |
| Ar-2 | P-2 | 87.6 | 1b | 0.6 | PAG-3 | 3.0 | PAG-8 | 4.0 | N-8 | 0.80 | | |
| Ar-3 | P-3 | 77.5 | 2b | 1.0 | PAG-1 | 5.0 | PAG-10 | 4.0 | N-3 | 0.50 | N-8 | 0.50 |
| Ar-4 | P-4 | 87.4 | 2b | 0.6 | PAG-1 | 5.0 | PAG-4 | 2.0 | N-5 | 0.50 | N-6 | 0.50 |
| Ar-5 | P-5 | 83.2 | 3b | 2.0 | PAG-6 | 6.0 | PAG-9 | 3.0 | N-2 | 0.50 | N-10 | 0.30 |
| Ar-6 | P-6 | 81.5 | 3b | 6.0 | PAG-3 | 6.0 | PAG-4 | 2.0 | N-8 | 1.00 | | |
| Ar-7 | P-7 | 78.5 | 4b | 5.0 | PAG-4 | 7.0 | PAG-10 | 3.0 | N-5 | 0.80 | N-1 | 0.20 |
| Ar-8 | P-8 | 78.0 | 4b | 6.0 | PAG-4 | 5.5 | PAG-12 | 3.0 | N-6 | 0.60 | N-3 | 0.40 |
| Ar-9 | P-9 | 85.5 | 5b | 4.0 | PAG-1 | 2.0 | PAG-2 | 4.0 | N-1 | 0.50 | N-10 | 0.50 |
| Ar-10 | P-10 | 72.2 | 5b | 4.0 | PAG-1 | 4.0 | PAG-11 | 2.0 | N-4 | 0.80 | | |
| Ar-11 | P-1' | 74.0 | 6b | 6.0 | PAG-2 | 4.0 | PAG-8 | 4.0 | N-7 | 1.00 | | |
| Ar-12 | P-2' | 76.2 | 6b | 4.0 | PAG-4 | 1.5 | PAG-11 | 4.0 | N-8 | 0.30 | N-2 | 1.00 |
| Ar-13 | P-3' | 83.3 | 1b | 5.0 | PAG-9 | 2.0 | PAG-6 | 4.0 | N-10 | 1.20 | | |
| Ar-14 | P-4' | 80.5 | 2b | 4.0 | PAG-5 | 4.0 | PAG-11 | 2.0 | N-6 | 0.60 | N-2 | 0.40 |
| Ar-15 | P-5' | 74.5 | 3b | 8.0 | PAG-4 | 2.0 | PAG-8 | 4.0 | N-5 | 0.80 | N-6 | 0.20 |
| Ar-16 | P-6' | 80.0 | 4b | 5.0 | PAG-7 | 5.0 | | | N-10 | 1.00 | | |
| Ar-17 | P-7' | 75.5 | 5b | 10.0 | PAG-7 | 3.0 | PAG-12 | 2.0 | N-9 | 1.00 | | |
| Ar-18 | P-8' | 83.0 | 6b | 5.0 | PAG-8 | 4.0 | PAG-11 | 2.5 | N-5 | 0.50 | N-3 | 0.50 |
| Ar-19 | P-9' | 87.2 | 1b | 4.0 | PAG-8 | 2.0 | PAG-3 | 2.0 | N-7 | 0.60 | N-8 | 0.20 |

TABLE 3-continued

| | | | | | | | | | | | |
|---|---|---|---|---|---|---|---|---|---|---|---|
| Ar-20 | P-10' | 86.0 | 2b | 4.0 | PAG-6 | 4.5 | | | N-1 | 0.60 | N-7 | 0.40 |
| Ar-21 | CP-1 | 86.5 | 1b | 1.0 | PAG-1 | 3.0 | PAG-7 | 3.0 | N-1 | 1.00 | | |

| | Crosslinking Agent 1 | | Crosslinking Agent 2 | | Additive | | Surfactant | | Solvent | | | | | | |
|---|---|---|---|---|---|---|---|---|---|---|---|---|---|---|---|
| Composition | Compound No. | parts by mass | Compound No. | parts by mass | Compound No. | parts by mass | Compound No. | parts by mass | Solvent 1 | parts by mass | Solvent 2 | parts by mass | Solvent 3 | parts by mass |
| Ar-1 | X-1 | 5.0 | | | | | | | SL-1 | 2180 | SL-6 | 500 | SL-8 | 120 |
| Ar-2 | X-2 | 3.0 | X-5 | 1.0 | | | | | SL-1 | 2200 | SL-5 | 500 | SL-8 | 100 |
| Ar-3 | X-1 | 10.0 | | | AD-2 | 1.0 | W-3 | 0.50 | SL-1 | 2300 | SL-6 | 500 | | |
| Ar-4 | X-7 | 3.5 | | | | | W-4 | 0.50 | SL-1 | 2300 | SL-4 | 500 | | |
| Ar-5 | X-4 | 1.0 | CL-1 | 4.0 | | | | | SL-1 | 2250 | SL-3 | 500 | SL-7 | 50 |
| Ar-6 | CL-1 | 3.0 | | | | | W-6 | 0.50 | SL-1 | 2750 | SL-8 | 50 | | |
| Ar-7 | X-2 | 5.0 | | | | | W-1 | 0.50 | SL-1 | 2750 | SL-7 | 50 | | |
| Ar-8 | X-4 | 5.0 | X-7 | 1.5 | | | | | SL-2 | 1250 | SL-6 | 1500 | SL-7 | 50 |
| Ar-9 | X-1 | 3.0 | | | | | W-2 | 0.50 | SL-2 | 1300 | SL-4 | 1500 | | |
| Ar-10 | X-1 | 15.0 | | | AD-3 | 1.0 | W-6 | 1.00 | SL-2 | 1300 | SL-6 | 1500 | | |
| Ar-11 | X-1 | 10.0 | | | | | W-2 | 1.00 | SL-3 | 1600 | SL-6 | 1200 | | |
| Ar-12 | X-4 | 12.0 | | | | | W-4 | 1.00 | SL-1 | 1950 | SL-3 | 750 | SL-7 | 100 |
| Ar-13 | X-1 | 1.0 | X-7 | 3.5 | | | | | SL-3 | 2250 | SL-6 | 500 | SL-7 | 50 |
| Ar-14 | X-3 | 8.0 | | | | | W-3 | 0.50 | SL-1 | 2300 | SL-6 | 500 | | |
| Ar-15 | X-4 | 10.0 | | | | | W-4 | 0.50 | SL-1 | 2300 | SL-4 | 500 | | |
| Ar-16 | X-1 | 5.0 | X-3 | 1.0 | AD-1 | 2.5 | W-5 | 0.50 | SL-1 | 2200 | SL-3 | 500 | SL-7 | 100 |
| Ar-17 | X-1 | 2.0 | X-5 | 6.0 | | | W-6 | 0.50 | SL-1 | 2550 | SL-6 | 250 | | |
| Ar-18 | X-5 | 4.0 | | | | | W-1 | 0.50 | SL-1 | 2550 | SL-3 | 250 | | |
| Ar-19 | X-4 | 4.0 | | | | | | | SL-2 | 1500 | SL-6 | 1200 | SL-7 | 100 |
| Ar-20 | X-6 | 4.0 | | | | | W-2 | 0.50 | SL-1 | 2300 | SL-4 | 500 | | |
| Ar-21 | X-1 | 5.0 | | | | | W-1 | 0.50 | SL-1 | 2550 | SL-6 | 250 | | |

Abbreviations in Table 3 are as follows.
N-1 to N-10: Each indicates the compound shown below.

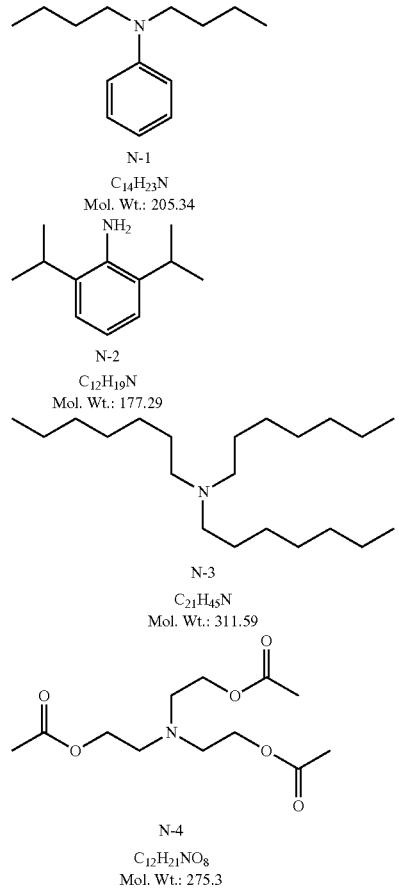

N-1
$C_{14}H_{23}N$
Mol. Wt.: 205.34

N-2
$C_{12}H_{19}N$
Mol. Wt.: 177.29

N-3
$C_{21}H_{45}N$
Mol. Wt.: 311.59

N-4
$C_{12}H_{21}NO_8$
Mol. Wt.: 275.3

TABLE 3-continued
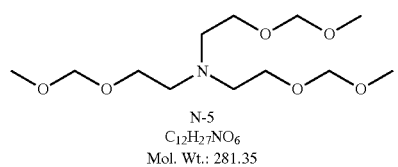
N-5
C₁₂H₂₇NO₆
Mol. Wt.: 281.35
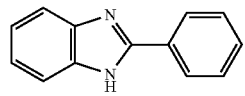
N-6
C₁₃H₁₀N₂
Mol. Wt.: 194.23
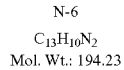
N-7
C₁₀H₁₉NO₃
Mol. Wt.: 201.26
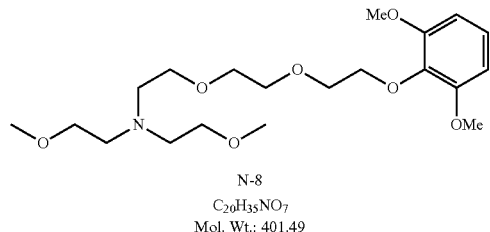
N-8
C₂₀H₃₅NO₇
Mol. Wt.: 401.49
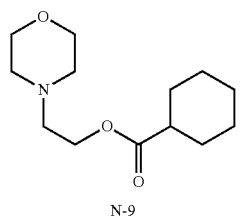
N-9
C₁₃H₂₃NO₃
Mol. Wt.: 241.33
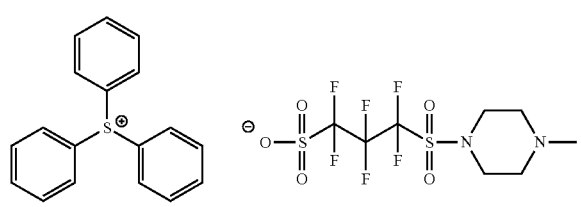
N-10
C₂₅H₂₆F₆N₂O₅S₃
Mol. Wt.: 656.68
X-1 to X-7, CL-1: Each indicates the compound shown below.
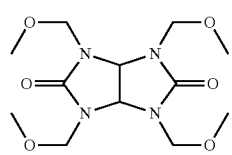
(X-1)

TABLE 3-continued
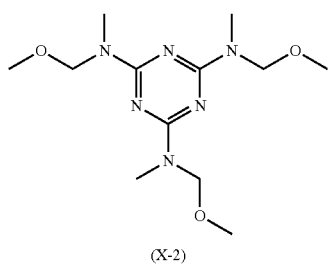
(X-2)
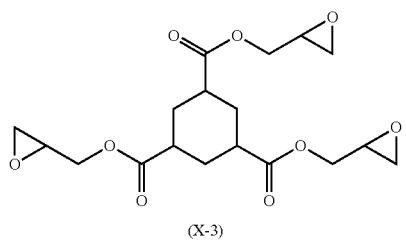
(X-3)
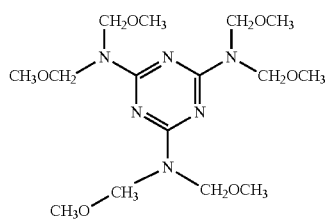
(CL-1)
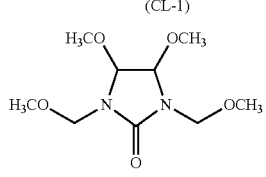
(X-4)
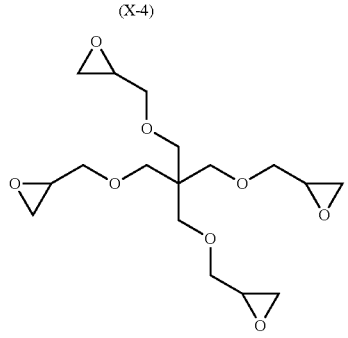
(X-5)
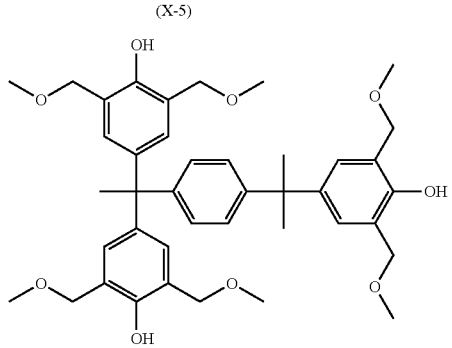
(X-6)

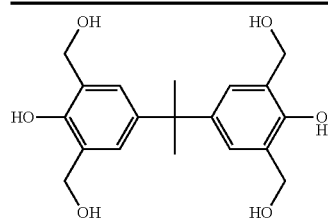

(X-7)

AD-1 to AD-3: Each indicates the compound shown below.

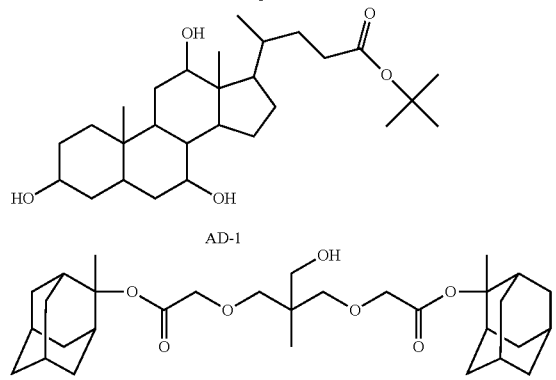

W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: polysiloxane polymer KP-341 (produced by Shin-Etsu Chemical Co., Ltd.) (silicon-containing)
W-4: Troysol S-366 (produced by Troy Chemical)
W-5: KH-20 (produced by Asahi Kase Chemicals Corporation)
W-6: PolyFox ™ PF-6320 (produced by OMNOVA Solution Inc.) (fluorine-containing)
Group a:
SL-1: Propylene glycol monomethyl ether acetate (PGMEA)
SL-2: Propylene glycol monomethyl propionate
SL-3: 2-Heptanone
Group b:
SL-4: Ethyl lactate
SL-5: Propylene glycol monomethyl ether (PGME)
SL-6: Cyclohexanone
Group c:
SL-7: γ-Butyrolactone
SL-8: Propylene carbonate Using the prepared resist composition, a resist pattern was foil led by the following method.

Example 1

Immersion

Exposure→Baking→Development→Rinsing: abbr. iE-B-D-R

An organic antireflection film, ARC29SR (produced by Nissan Chemical Industries, Ltd.), was coated on a silicon wafer and baked at 205° C. for 60 seconds to form a 86 nm-thick antireflection film, and Resist Composition Ar-1 was coated thereon and baked (PB) at 100° C. for 60 seconds to form a resist film having a thickness of 100 nm. The obtained wafer was subjected to pattern exposure using an ArF excimer laser immersion scanner (XT1700i, manufactured by ASML, NA: 1.20, C-Quad, outer sigma: 0.981, inner sigma: 0.895, XY deflection) through an exposure mask (line/space=1/1). As for the immersion liquid, ultrapure water was used. Thereafter, the resist film was heated at 100° C. for 60 seconds (PEB), developed by puddling a developer (butyl acetate) for 30 seconds, rinsed by puddling a rinsing solution (4-methyl-2-pentanol) for 30 seconds, then spun at a rotational speed of 4,000 rpm for 30 seconds and baked at 90° C. for 60 seconds to obtain a line-and-space resist pattern of 100 nm (1:1).

Examples 2 to 20 and Reference Example 1

Line-and-space resist patterns of 100 nm (1:1) were obtained in the same manner as in the method of Example 1 except for employing the resist composition shown in Table 4.

<Evaluation Method>

[Sensitivity]

The obtained pattern was observed for the line width by a scanning electron microscope (SEM; S-9380II, manufactured by Hitachi, Ltd.), and the irradiation energy when resolving a line-and-space resist pattern of 100 nm (1:1) was defined as the sensitivity ($E_{opt}$). As this value is smaller, the sensitivity is higher.

[Resolution]

The minimum value of the line width of a resolvable line when resolving a pattern of line:space=1:1 at the sensitivity above was observed by the above-described scanning electron microscope. As this value is smaller, the resolution is higher.

[Line Width Roughness (LWR)]

The line-and-space resist pattern of 100 nm (1:1) was observed using a Critical Dimension scanning electron microscope (SEM; S-9380II, manufactured by Hitachi, Ltd.). The line width was measured at 50 points at regular intervals in the range of 2μm in the longitudinal direction of the pattern, and from its standard deviation, 3σ (nm) was computed, whereby the line width roughness was measured. A smaller value indicates better performance.

[Exposure Latitude (EL)]

The exposure dose for forming a line-and-space resist pattern of 100 nm (1:1) was taken as an optimal exposure dose, the range of exposure dose allowing for a pattern size of the size above±10% was determined by varying the exposure dose, this value was divided by the optimal exposure dose, and the obtained value was expressed in percentage. A larger value indicates that the change in performance due to change in the exposure dose is smaller and the exposure latitude (EL) is better.

[Pattern Profile]

The cross-sectional profile of the obtained pattern was observed by a scanning electron microscope (SEM; S-9380II, manufactured by Hitachi, Ltd.) and rated as A when the pattern is a very good rectangular pattern, rated B when the pattern is slightly round-topped or T-topped but in an acceptable level, and rated C when film loss or severely T-topped shape is observed.

TABLE 4

| | | Performance Evaluation Results | | | | |
|---|---|---|---|---|---|---|
| | Resist Composition | Eopt (mJ/cm²) | Resolution (nm) | LWR (nm) | EL % | Pattern Profile |
| Example 1 | Ar-1 | 25.0 | 50 | 8.1 | 21.0 | B |
| Example 2 | Ar-2 | 26.0 | 41 | 6.9 | 20.0 | A |
| Example 3 | Ar-3 | 30.0 | 51 | 6.8 | 20.0 | A |
| Example 4 | Ar-4 | 28.0 | 40 | 8.2 | 19.0 | A |
| Example 5 | Ar-5 | 15.5 | 53 | 5.5 | 17.5 | A |
| Example 6 | Ar-6 | 29.0 | 52 | 6.5 | 21.0 | A |
| Example 7 | Ar-7 | 30.0 | 39 | 8.1 | 18.0 | A |
| Example 8 | Ar-8 | 17.0 | 40 | 8.8 | 18.0 | B |
| Example 9 | Ar-9 | 16.5 | 52 | 5.7 | 17.5 | A |
| Example 10 | Ar-10 | 26.0 | 38 | 8.1 | 18.5 | B |
| Example 11 | Ar-11 | 27.0 | 51 | 8.4 | 18.5 | B |
| Example 12 | Ar-12 | 30.0 | 38 | 7.1 | 19.0 | A |
| Example 13 | Ar-13 | 29.0 | 51 | 5.5 | 21.0 | A |
| Example 14 | Ar-14 | 28.5 | 40 | 8.0 | 20.0 | A |
| Example 15 | Ar-15 | 15.0 | 52 | 8.0 | 18.5 | A |
| Example 16 | Ar-16 | 27.0 | 51 | 5.5 | 19.0 | A |
| Example 17 | Ar-17 | 26.5 | 38 | 8.1 | 19.0 | A |
| Example 18 | Ar-18 | 16.0 | 37 | 8.7 | 19.5 | B |
| Example 19 | Ar-19 | 17.0 | 53 | 7.0 | 20.0 | A |

TABLE 4-continued

| | | Performance Evaluation Results | | | | |
|---|---|---|---|---|---|---|
| | Resist Composition | Eopt (mJ/cm²) | Resolution (nm) | LWR (nm) | EL % | Pattern Profile |
| Example 20 | Ar-20 | 28.5 | 41 | 8.0 | 20.5 | B |
| Reference Example 1 | Ar-21 | 38.0 | 55 | 8.7 | 16.5 | B |

As apparent from Table 4, by developing the resist composition of the present invention with an organic solvent-containing developer, a pattern having high sensitivity and high resolution, suffering less line width variation (LWR) and being excellent in the exposure latitude (EL) and pattern profile can be formed.

INDUSTRIAL APPLICABILITY

According to the present invention, a pattern forming method capable of forming a pattern having high sensitivity and high resolution, suffering less line width variation (LWR) and being excellent in the exposure latitude (EL) and pattern profile, a pattern formed by the pattern forming method, a chemical amplification resist composition (chemical amplification negative resist composition), and a resist film formed using the chemical amplification resist composition, can be provided.

The invention claimed is:

1. A pattern forming method comprising:
   (i) a step of forming a film from a chemical amplification resist composition,
   (ii) a step of exposing the film, and
   (iii) a step of developing the exposed film by using an organic solvent-containing developer,
   wherein the chemical amplification resist composition contains:
   (A) a resin containing a repeating unit having 2 to 4 hydroxyl groups,
   (B) a compound capable of generating an acid upon irradiation with an actinic ray or radiation,
   (C) a crosslinking agent, and
   (D) a solvent, and
   wherein the crosslinking agent contains at least one of a phenol compound, an epoxy compound or a compound having two or more partial structures represented by the following formula CLNM-1:

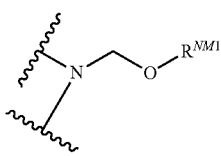

(CLNM-1)

wherein, in the formula CLNM-1, $R^{NM1}$ represents a hydrogen atom, an alkyl group, a cycloalkyl group or an oxoalkyl group.

2. The pattern forming method according to claim 1, wherein the repeating unit having 2 to 4 hydroxyl groups is a repeating unit having two or more alcoholic hydroxyl groups.

3. The pattern forming method according to claim 1, wherein the resin (A) contains a repeating unit represented by the following formula (I):

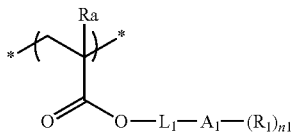

wherein Ra represents a hydrogen atom, a hydroxyl group, a halogen atom or an alkyl group which may be substituted with a hydroxyl group;

$L_1$ represents a single bond or a divalent linking group;

$A_1$ represents an (n1+1)-valent hydrocarbon group, $R_1$ represents a hydroxyl group or a hydroxyl group-containing organic group, and when a plurality of $R_1$'s are present, each $R_1$ may be the same as or different from every other $R_1$; and n1 represents an integer of 1 or more, provided that when n1 is 1, Ra represents a hydroxyl group or an alkyl group substituted with a hydroxyl group.

4. The pattern forming method according to claim 3, wherein in formula (I), the hydrocarbon group as $A_1$ is a linear or branched aliphatic hydrocarbon group.

5. The pattern forming method according to claim 3, wherein in formula (I), the hydrocarbon group as $A_1$ is a monocyclic or polycyclic alicyclic hydrocarbon group.

6. The pattern forming method according to claim 1, wherein the resin (A) is a substantially alkali-insoluble resin.

7. The pattern forming method according to claim 1, wherein the resin (A) contains a repeating unit having a lactone structure.

8. The pattern forming method according to claim 1, wherein the resin (A) contains a repeating unit having an acid-decomposable group.

9. The pattern forming method according to claim 1, wherein the crosslinking agent (C) contains at least one of a melamine-based crosslinking agent, a urea-based crosslinking agent, an alkylene urea-based crosslinking agent and a glycoluril-based crosslinking agent.

10. The pattern forming method according to claim 1, wherein the developer contains at least one kind of an organic solvent selected from a ketone-based solvent, an ester-based solvent, an alcohol-based solvent, an amide-based solvent and an ether-based solvent.

11. The pattern forming method according to claim 1, which further comprises:

(iv) a step of rinsing the film with a rinsing solution.

12. The pattern forming method according to claim 11, wherein the rinsing solution is at least one kind of an organic solvent selected from a hydrocarbon-based solvent, a ketone-based solvent, an ester-based solvent, an alcohol-based solvent, an amide-based solvent and an ether-based solvent.

13. The pattern forming method according to claim 1, wherein out of repeating units in the resin (A), a repeating unit having an acid group accounts for 5 mol % or less.

14. The pattern forming method according to claim 1, wherein exposure in the step (ii) is immersion exposure.

15. A pattern formed by the pattern forming method claimed in claim 1.

16. A chemical amplification resist composition comprising:

(A) a substantially alkali-insoluble resin containing a repeating unit having 2 to 4 hydroxyl groups, (B) a compound capable of generating an acid upon irradiation with an actinic ray or radiation, (C) a crosslinking agent, and (D) a solvent wherein the crosslinking agent contains at least one of a phenol compound, an epoxy compound or a compound having two or more partial structures represented by the following formula CLNM-1:

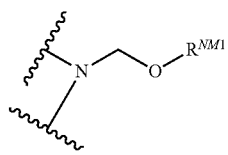

wherein, in the formula CLNM-1, $R^{NM1}$ represents a hydrogen atom, an alkyl group, a cycloalkyl group or an oxoalkyl group.

17. The chemical amplification resist composition according to claim 16, wherein the repeating unit having 2 to 4 hydroxyl groups is a unit having two or more alcoholic hydroxyl groups.

18. The chemical amplification resist composition according to claim 16, wherein the resin (A) contains a repeating unit represented by the following formula (I):

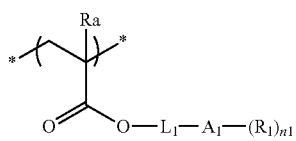

wherein Ra represents a hydrogen atom, a hydroxyl group, a halogen atom or an alkyl group which may be substituted with a hydroxyl group;

$L_1$ represents a single bond or a divalent linking group;

$A_1$ represents an (n1+1)-valent hydrocarbon group, $R_1$ represents a hydroxyl group or a hydroxyl group-containing organic group, and when a plurality of $R_1$'s are present, each $R_1$ may be the same as or different from every other $R_1$; and n1 represents an integer of 1 or more, provided that when n1 is 1, Ra represents a hydroxyl group or an alkyl group substituted with a hydroxyl group.

19. The chemical amplification resist composition according to claim 18, wherein in formula (I), the hydrocarbon group as $A_1$ is a linear or branched aliphatic hydrocarbon group.

20. The chemical amplification resist composition according to claim 18, wherein in formula (I), the hydrocarbon group as $A_1$ is a monocyclic or polycyclic alicyclic hydrocarbon group.

21. The chemical amplification resist composition according to claim 16, wherein the resin (A) contains a repeating unit having a lactone structure.

22. The chemical amplification resist composition according to claim 16, wherein the resin (A) contains a repeating unit having an acid-decomposable group.

23. The chemical amplification resist composition according to claim 16, wherein the crosslinking agent (C) contains at least one of a melamine-based crosslinking agent, a urea-based crosslinking agent, an alkylene urea-based crosslinking agent and a glycoluril-based crosslinking agent.

24. The chemical amplification resist composition according to claim 16, wherein out of repeating units in the resin (A), a repeating unit having an acid group accounts for 5 mol % or less.

25. A resist film formed of the chemical amplification resist composition according to claim 16.

26. A pattern forming method comprising:
    (i) a step of forming a film from a chemical amplification resist composition,
    (ii) a step of exposing the film, and
    (iii) a step of developing the exposed film by using an organic solvent-containing developer,
    wherein the chemical amplification resist composition contains:
    (A) a resin containing a repeating unit having two or more hydroxyl groups,
    (B) a compound capable of generating an acid upon irradiation with an actinic ray or radiation,
    (C) a crosslinking agent, and
    (D) a solvent,
    wherein the resin (A) does not contain a repeating unit having an acid-decomposable group.

27. A chemical amplification resist composition comprising:
    (A) a substantially alkali-insoluble resin containing a repeating unit having two or more hydroxyl groups,
    (B) a compound capable of generating an acid upon irradiation with an actinic ray or radiation,
    (C) a crosslinking agent, and
    (D) a solvent,
    wherein the resin (A) does not contain a repeating unit having an acid-decomposable group.

* * * * *